US012543500B2

(12) United States Patent
Kim et al.

(10) Patent No.: US 12,543,500 B2
(45) Date of Patent: Feb. 3, 2026

(54) LIGHT EMITTING ELEMENT

(71) Applicant: Samsung Display Co., Ltd., Yongin-si (KR)

(72) Inventors: Seran Kim, Suwon-si (KR); Chanseok Oh, Seoul (KR)

(73) Assignee: Samsung Display Co., Ltd., Yongin-si (KR)

( * ) Notice: Subject to any disclaimer, the term of this patent is extended or adjusted under 35 U.S.C. 154(b) by 793 days.

(21) Appl. No.: 17/878,505

(22) Filed: Aug. 1, 2022

(65) Prior Publication Data

US 2023/0165131 A1 May 25, 2023

(30) Foreign Application Priority Data

Oct. 28, 2021 (KR) ........................ 10-2021-0146021

(51) Int. Cl.

| | |
|---|---|
| ***H01L 51/54*** | (2006.01) |
| ***H10K 50/155*** | (2023.01) |
| ***H10K 85/30*** | (2023.01) |
| ***H10K 85/60*** | (2023.01) |
| *H10K 50/15* | (2023.01) |
| *H10K 50/16* | (2023.01) |

(52) U.S. Cl.

CPC ......... *H10K 85/658* (2023.02); *H10K 50/155* (2023.02); *H10K 85/346* (2023.02); *H10K 85/654* (2023.02); *H10K 85/6572* (2023.02); *H10K 85/6574* (2023.02); *H10K 50/15* (2023.02); *H10K 50/16* (2023.02)

(58) Field of Classification Search

None

See application file for complete search history.

(56) References Cited

U.S. PATENT DOCUMENTS

| | | | |
|---|---|---|---|
| 12,058,927 B2 | 8/2024 | Kuwabara et al. | |
| 2021/0122765 A1 | 4/2021 | Wolohan et al. | |
| 2021/0167288 A1 | 6/2021 | Hatakeyama et al. | |

FOREIGN PATENT DOCUMENTS

| | | |
|---|---|---|
| CN | 110790782 | 2/2020 |
| KR | 10-2020-0026182 | 3/2020 |
| KR | 10-2020-0062329 | 6/2020 |
| KR | 20210014799 A | 2/2021 |
| KR | 10-2021-0045339 | 4/2021 |
| KR | 10-2021-0052280 | 5/2021 |

OTHER PUBLICATIONS

Yasuhiro Kondo et al., "Narrowband deep-blue organic light-emitting diode featuring an organoboron-based emitter", Nature Photonics, 2019, vol. 13, 6 total pages.

Anton Pershin et al., "Highly emissive excitons with reduced exchange energy in thermally activated delayed fluorescent molecules", Nature Communications, 2019, pp. 1-5, vol. 10, Article No. 597.

*Primary Examiner* — Andrew K Bohaty

(74) *Attorney, Agent, or Firm* — Womble Bond Dickinson (US) LLP

(57) ABSTRACT

A light emitting element according to an embodiment includes a first electrode, a second electrode disposed on the first electrode, and an emission layer disposed between the first electrode and the second electrode. The emission layer comprises a first compound, a second compound, and a third compound, which are different from each other, and the first compound is a polycyclic compound represented by Formula 1, thereby achieving a light emitting element having high emission efficiency.

[Formula 1]

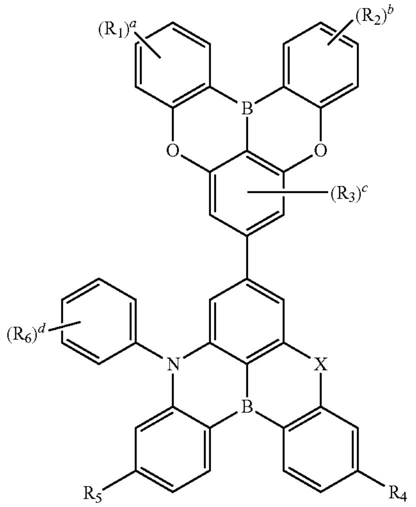

23 Claims, 8 Drawing Sheets

LIGHT EMITTING ELEMENT

CROSS-REFERENCE TO RELATED APPLICATION(S)

This application claims priority to and benefits of Korean Patent Application No. 10-2021-0146021 under 35 U.S.C. § 119, filed on Oct. 28, 2021 in the Korean Intellectual Property Office, the entire contents of which are incorporated herein by reference.

BACKGROUND

1. Technical Field

The disclosure relates to a light emitting element including a polycyclic compound in an emission layer.

2. Description of the Related Art

Active development continues for an organic electroluminescence display as an image display. The organic electroluminescence display is different from a liquid crystal display and is a so-called self-luminescent display in which holes and electrons respectively injected from a first electrode and a second electrode recombine in an emission layer so that a light emitting material in the emission layer emits light to achieve display.

In the application of a light emitting element to a display, there is a requirement for decreased driving voltage, increased emission efficiency, and increased life of the light emitting element, and there is a demand for continuous development on materials for a light emitting element that is capable of stably achieving such characteristics.

It is to be understood that this background of the technology section is, in part, intended to provide useful background for understanding the technology. However, this background of the technology section may also include ideas, concepts, or recognitions that were not part of what was known or appreciated by those skilled in the pertinent art prior to a corresponding effective filing date of the subject matter disclosed herein.

SUMMARY

The disclosure provides a light emitting element with high efficiency and a polycyclic compound used therein.

An embodiment provides a light emitting element which may include a first electrode, a second electrode disposed on the first electrode, and an emission layer disposed between the first electrode and the second electrode, wherein the emission layer may include a first compound, a second compound and a third compound, the first compound, the second compound, and the third compound may be different from each other, and the first compound may be represented by Formula 1.

[Formula 1]

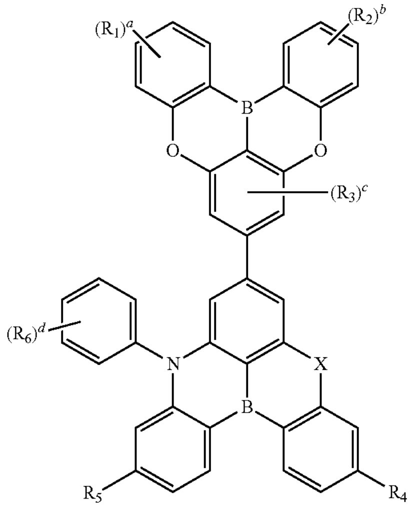

In Formula 1, a and b may each independently be an integer from 0 to 4, c may be an integer from 0 to 2, d may be an integer from 0 to 5, and X may be $N(R_x)$, O, or S.

In Formula 1, $R_x$, $R_1$ to $R_3$, and $R_6$ may each independently be a deuterium atom, a substituted or unsubstituted alkyl group of 1 to 20 carbon atoms, a substituted or unsubstituted alkenyl group of 2 to 20 carbon atoms, a substituted or unsubstituted aryl group of 6 to 30 ring-forming carbon atoms, or a substituted or unsubstituted heteroaryl group of 2 to 30 ring-forming carbon atoms, or may be combined with an adjacent group to form a ring; and $R_4$ and $R_5$ may each independently be a substituted or unsubstituted amine group, or a substituted or unsubstituted carbazole group.

In an embodiment, in Formula 1, $R_4$ and $R_5$ may each independently be a group represented by Formula A-1 or Formula A-2.

[Formula A-1]

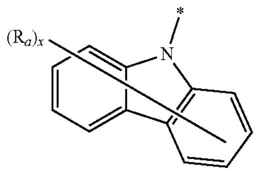

[Formula A-2]

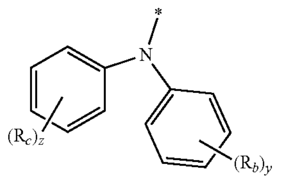

In Formula A-1, x may be an integer from 0 to 8, and $R_a$ may be a deuterium atom, a substituted or unsubstituted aryl group of 6 to 20 ring-forming carbon atoms, a substituted or unsubstituted alkyl group of 1 to 6 carbon atoms, or a cyano group. In Formula A-2, y and z may each independently be an integer from 0 to 5, and $R_b$ and $R_c$ may each independently be a deuterium atom, or a substituted or unsubstituted alkyl group of 1 to 6 carbon atoms.

In an embodiment, the group represented by Formula A-1 may be represented by any one of Formulas A1 to A6.

A1
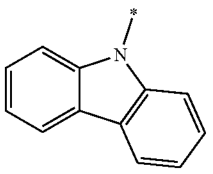
A2
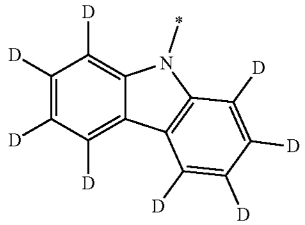
A3
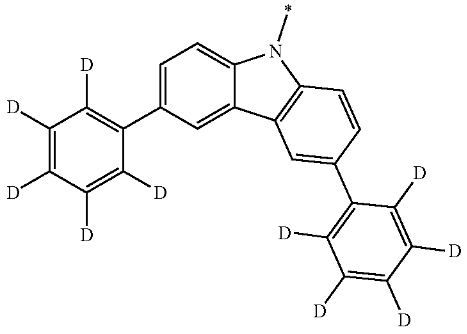
A4
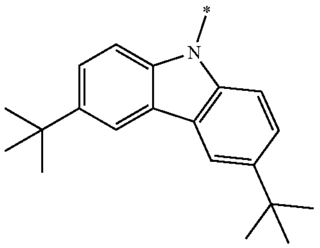
A5
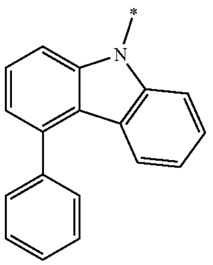
A6
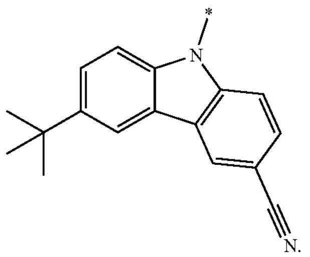
In an embodiment, the group represented by Formula A-2 may be represented by any one of Formulas A7 to A9.
A7
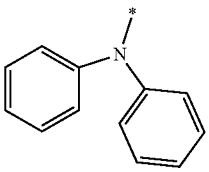
A8
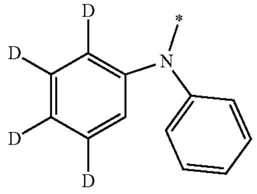
A9
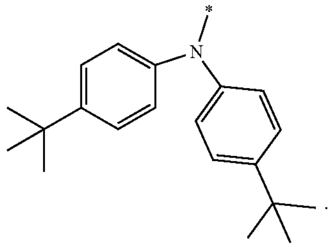
In an embodiment, in Formula 1, $R_1$ and $R_2$ may each independently be a group represented by any one of Formulas B1 to B18.
B1
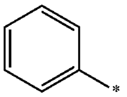
B2
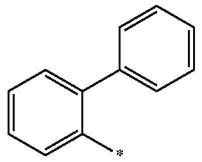
B3
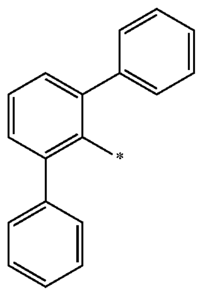
B4
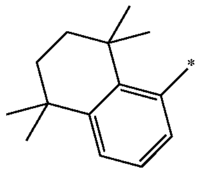

-continued
B5
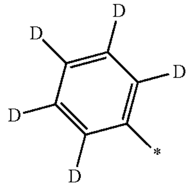
B6
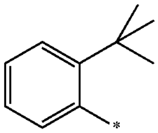
B7
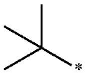
B8
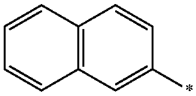
B9
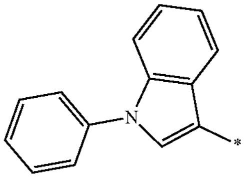
B10
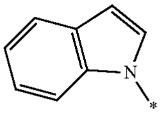
B11
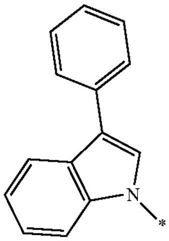
B12
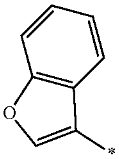
B13
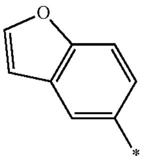
B14
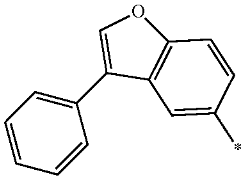
-continued
B15
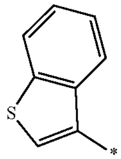
B16
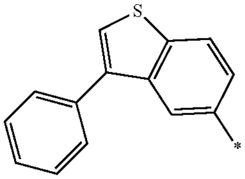
B17
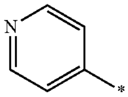
B18
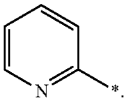
In an embodiment, in Formula 1, $R_3$ may be a group represented by any one of Formulas C1 to C5.
C1
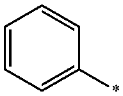
C2
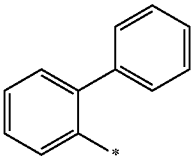
C3
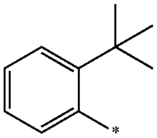
C4
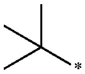
C5
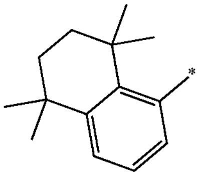
In an embodiment, in Formula 1, $R_6$ may be a group represented by any one of Formulas D1 to D3.

D1

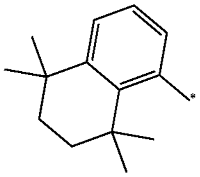

D2

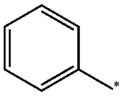

D3

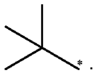

.

In an embodiment, the emission layer may emit blue light.

In an embodiment, the first compound may emit thermally activated delayed fluorescence.

In an embodiment, the second compound may be represented by any one of Compounds HT-1 to HT-4, which are explained below.

In an embodiment, the third compound may be represented by any one of Compounds ET-1 to ET-3, which are explained below.

In an embodiment, the emission layer may further include a fourth compound represented by Formula M-b.

[Formula M-b]

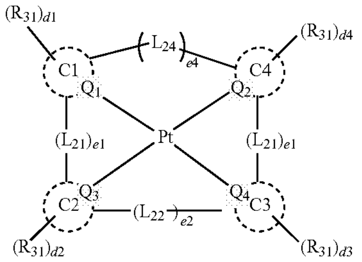

In Formula M-b, $Q_1$ to $Q_4$ may each independently be C or N; C1 to C4 may each independently be a substituted or unsubstituted hydrocarbon ring of 5 to 30 ring-forming carbon atoms, or a substituted or unsubstituted heterocycle of 2 to 30 ring-forming carbon atoms; $L_{21}$ to $L_{24}$ may each independently be a direct linkage,

*—O—* , *—S—* , 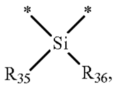

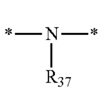 , 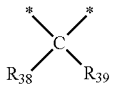 , 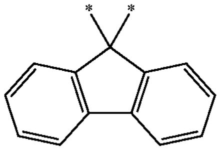 , a substituted or unsubstituted divalent alkyl group of 1 to 20 carbon atoms, a substituted or unsubstituted arylene group of 6 to 30 ring-forming carbon atoms, or a substituted or unsubstituted heteroarylene group of 2 to 30 ring-forming carbon atoms; e1 to e4 may each independently be 0 or 1; $R_{31}$ to $R_{39}$ may each independently be a hydrogen atom, a deuterium atom, a halogen atom, a cyano group, a substituted or unsubstituted amine group, a substituted or unsubstituted alkyl group of 1 to 20 carbon atoms, a substituted or unsubstituted aryl group of 6 to 30 ring-forming carbon atoms, or a substituted or unsubstituted heteroaryl group of 2 to 30 ring-forming carbon atoms, or may be combined with an adjacent group to form a ring; and d1 to d4 may each independently be an integer from 0 to 4.

In an embodiment, the first compound may be a light emitting dopant, the second compound may be a hole transport host, the third compound may be an electron transport host, and the fourth compound may be an auxiliary dopant.

In an embodiment, the emission layer may include at least one selected from Compound Group 1, which is explained below.

According to an embodiment, a light emitting element may include a first electrode, a second electrode disposed on the first electrode, and an emission layer disposed between the first electrode and the second electrode, wherein the emission layer may include a first compound, a second compound, and a third compound, the first compound, the second compound, and the third compound may be different from each other, the first compound may be represented by Formula 3, and an oscillator strength of the first compound may be equal to or greater than about 0.2500.

[Formula 3]

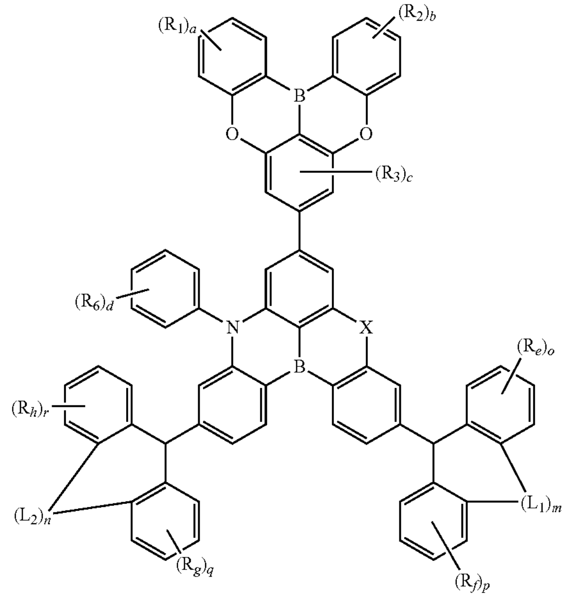

In Formula 3, a and b may each independently be an integer from 0 to 4; c may be an integer from 0 to 2; d may be an integer from 0 to 5; m and n may each independently be 0 or 1; in case that m is 0, o and p may each independently be an integer from 0 to 5; in case that m is 1, o and p may each independently be an integer from 0 to 4; in case that n is 0, r and q may each independently be an integer from 0 to 5; in case that n is 1, r and q may each independently be an integer from 0 to 4; $L_1$ and $L_2$ may each be a direct linkage; X may be $N(R_x)$, O, or S; and $R_x$, $R_e$ to $R_h$, $R_1$ to $R_3$, and $R_6$ may each independently be a deuterium atom, a substituted or unsubstituted alkyl group of 1 to 20 carbon atoms, a substituted or unsubstituted alkenyl group of 2 to 20 carbon atoms, a substituted or unsubstituted aryl group of 6 to 30 ring-forming carbon atoms, or a substituted or unsubstituted heteroaryl group of 2 to 30 ring-forming carbon atoms, or may be combined with an adjacent group to form a ring.

In an embodiment, the first compound represented by Formula 3 may be represented by Formula 4-1 or Formula 4-2.

[Formula 4-1]

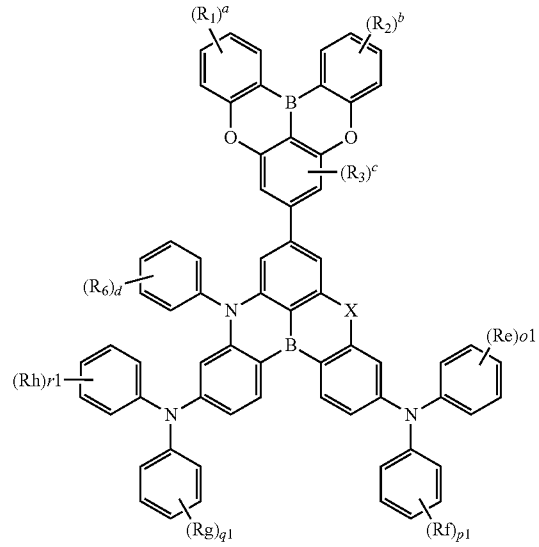

[Formula 4-2]

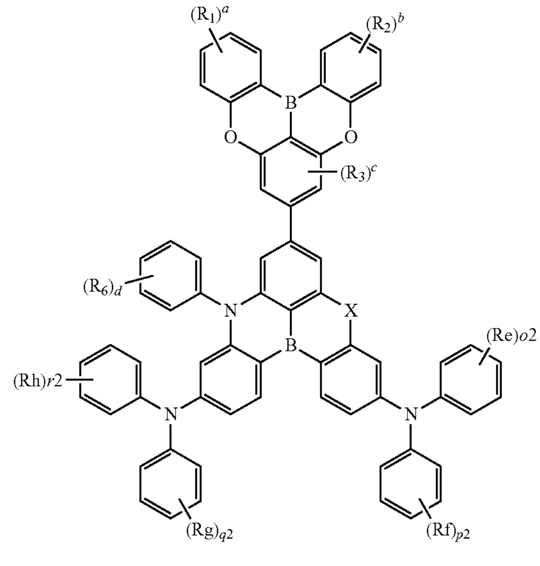

In Formula 4-1, of to r1 may each independently be an integer from 0 to 5. In Formula 4-2, o2 to r2 may each independently be an integer from 0 to 4. In Formula 4-1 and Formula 4-2, a to d, $R_1$ to $R_3$, $R_6$, X, and $R_e$ to $R_h$ are the same as defined in Formula 3.

In an embodiment, in Formula 4-1, $R_e$ to $R_h$ may each independently be a deuterium atom, or a substituted or unsubstituted t-butyl group.

In an embodiment, in Formula 4-2, $R_e$ to $R_h$ may each independently be a deuterium atom, a cyano group, a substituted or unsubstituted phenyl group, or a substituted or unsubstituted t-butyl group.

In an embodiment, in Formula 3, $R_1$ and $R_2$ may each independently be a substituted or unsubstituted t-butyl group, a substituted or unsubstituted phenyl group, a substituted or unsubstituted naphthyl group, a substituted or unsubstituted indole group, a substituted or unsubstituted benzofuran group, a substituted or unsubstituted benzothiophene group, a substituted or unsubstituted pyridine group, or a substituted or unsubstituted tetrahydrozoline naphthyl group.

In an embodiment, in Formula 3, $R_3$ may be a substituted or unsubstituted phenyl group, a substituted or unsubstituted tetrahydrozoline naphthyl group, or a substituted or unsubstituted t-butyl group.

In an embodiment, in Formula 3, $R_6$ may be a substituted or unsubstituted phenyl group, a substituted or unsubstituted t-butyl group, or a substituted or unsubstituted tetrahydrozoline naphthyl group.

In an embodiment, the emission layer may further include a fourth compound represented by Formula M-b.

[Formula M-b]

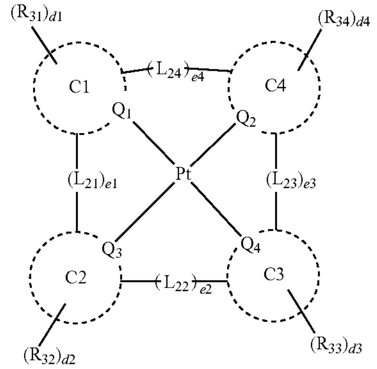

In Formula M-b, $Q_1$ to $Q_4$ may each independently be C or N; C1 to C4 may each independently be a substituted or unsubstituted hydrocarbon ring of 5 to 30 ring-forming carbon atoms, or a substituted or unsubstituted heterocycle of 2 to 30 ring-forming carbon atoms; $L_{21}$ to $L_{24}$ may each independently be a direct linkage,

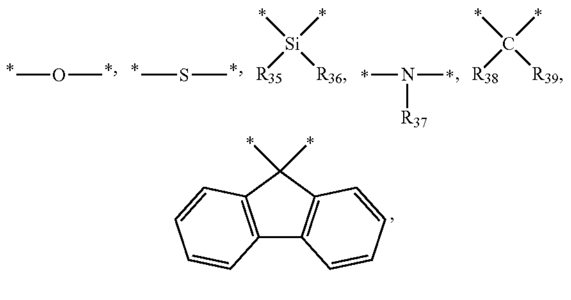

a substituted or unsubstituted divalent alkyl group of 1 to 20 carbon atoms, a substituted or unsubstituted arylene group of 6 to 30 ring-forming carbon atoms, or a substituted or unsubstituted heteroarylene group of 2 to 30 ring-forming carbon atoms; e1 to e4 may each independently be 0 or 1;

$R_{31}$ to $R_{39}$ may each independently be a hydrogen atom, a deuterium atom, a halogen atom, a cyano group, a substituted or unsubstituted amine group, a substituted or unsubstituted alkyl group of 1 to 20 carbon atoms, a substituted or unsubstituted aryl group of 6 to 30 ring-forming carbon atoms, or a substituted or unsubstituted heteroaryl group of 2 to 30 ring-forming carbon atoms, or may be combined with an adjacent group to form a ring; and d1 to d4 may each independently be an integer from 0 to 4.

In an embodiment, the emission layer may include at least one selected from Compound Group 1, which is explained below.

BRIEF DESCRIPTION OF THE DRAWINGS

The accompanying drawings are included to provide a further understanding of the embodiment, and are incorporated in and constitute a part of this specification. The drawings illustrate embodiments of the disclosure and principles thereof. The above and other aspects and features of the disclosure will become more apparent by describing in detail embodiments thereof with reference to the accompanying drawings, in which.

DETAILED DESCRIPTION OF THE EMBODIMENTS

Figure 1:
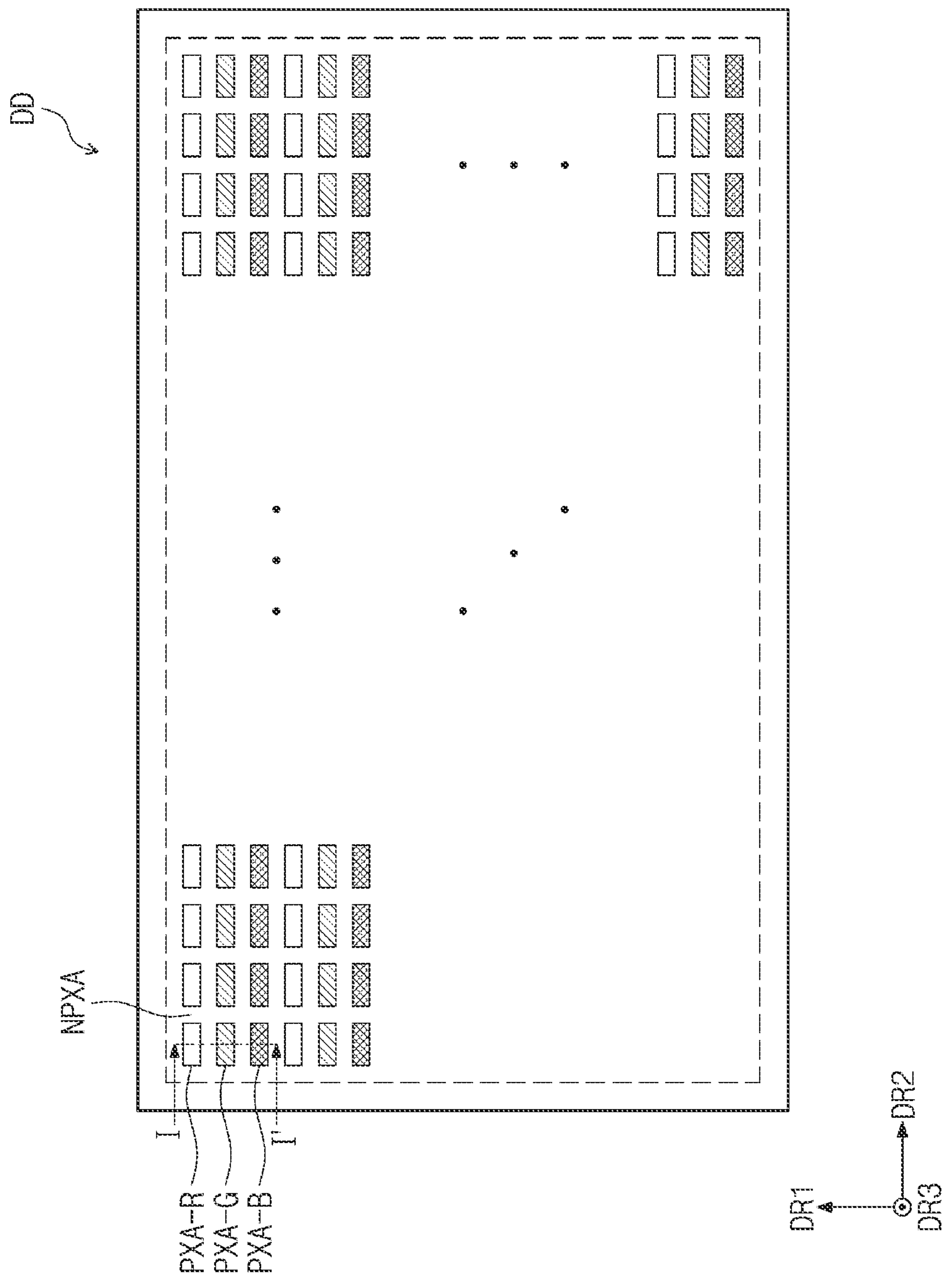
FIG. 1 is a plan view showing a display apparatus according to an embodiment.

The disclosure will now be described more fully hereinafter with reference to the accompanying drawings, in which embodiments are shown. This disclosure may, however, be embodied in different forms and should not be construed as limited to the embodiments set forth herein. Rather, these embodiments are provided so that this disclosure will be thorough and complete, and will fully convey the scope of the disclosure to those skilled in the art.

In the drawings, the sizes, thicknesses, ratios, and dimensions of the elements may be exaggerated for ease of description and for clarity. Like numbers refer to like elements throughout.

In the specification, it will be understood that when an element (or region, layer, part, etc.) is referred to as being "on", "connected to", or "coupled to" another element, it can be directly on, connected to, or coupled to the other element, or one or more intervening elements may be present therebetween. In a similar sense, when an element (or region, layer, part, etc.) is described as "covering" another element, it can directly cover the other element, or one or more intervening elements may be present therebetween.

In the specification, when an element is "directly on," "directly connected to," or "directly coupled to" another element, there are no intervening elements present. For example, "directly on" may mean that two layers or two elements are disposed without an additional element such as an adhesion element therebetween.

As used herein, the expressions used in the singular such as "a," "an," and "the," are intended to include the plural forms as well, unless the context clearly indicates otherwise.

As used herein, the term "and/or" includes any and all combinations of one or more of the associated listed items. For example, "A and/or B" may be understood to mean "A, B, or A and B." The terms "and" and "or" may be used in the conjunctive or disjunctive sense and may be understood to be equivalent to "and/or".

The term "at least one of" is intended to include the meaning of "at least one selected from the group of" for the purpose of its meaning and interpretation. For example, "at least one of A and B" may be understood to mean "A, B, or A and B." When preceding a list of elements, the term, "at least one of," modifies the entire list of elements and does not modify the individual elements of the list.

It will be understood that, although the terms first, second, etc. may be used herein to describe various elements, these elements should not be limited by these terms. These terms are only used to distinguish one element from another element. Thus, a first element could be termed a second element without departing from the teachings of the disclosure. Similarly, a second element could be termed a first element, without departing from the scope of the disclosure.

The spatially relative terms "below", "beneath", "lower", "above", "upper", or the like, may be used herein for ease of description to describe the relations between one element or component and another element or component as illustrated in the drawings. It will be understood that the spatially relative terms are intended to encompass different orientations of the device in use or operation, in addition to the orientation depicted in the drawings. For example, in the case where a device illustrated in the drawing is turned over, the device positioned "below" or "beneath" another device may be placed "above" another device. Accordingly, the illustrative term "below" may include both the lower and upper positions. The device may also be oriented in other directions and thus the spatially relative terms may be interpreted differently depending on the orientations.

The terms "about" or "approximately" as used herein is inclusive of the stated value and means within an acceptable range of deviation for the recited value as determined by one of ordinary skill in the art, considering the measurement in question and the error associated with measurement of the recited quantity (i.e., the limitations of the measurement system). For example, "about" may mean within one or more standard deviations, or within ±20%, ±10%, or ±5% of the stated value.

It should be understood that the terms "comprises," "comprising," "includes," "including," "have," "having," "contains," "containing," and the like are intended to specify the presence of stated features, integers, steps, operations, elements, components, or combinations thereof in the disclosure, but do not preclude the presence or addition of one or more other features, integers, steps, operations, elements, components, or combinations thereof.

Unless otherwise defined or implied herein, all terms (including technical and scientific terms) used have the same meaning as commonly understood by those skilled in the art to which this disclosure pertains. It will be further understood that terms, such as those defined in commonly used dictionaries, should be interpreted as having a meaning that is consistent with their meaning in the context of the relevant art and should not be interpreted in an ideal or excessively formal sense unless clearly defined in the specification.

In the description, the term "substituted or unsubstituted" may mean a group that is substituted or unsubstituted with at least one substituent selected from the group consisting of a deuterium atom, a halogen atom, a cyano group, a nitro group, an amino group, a silyl group, an oxy group, a thio group, a sulfinyl group, a sulfonyl group, a carbonyl group, a boron group, a phosphine oxide group, a phosphine sulfide group, an alkyl group, an alkenyl group, an alkynyl group, an alkoxy group, a hydrocarbon ring group, an aryl group, and a heterocyclic group. Each of the substituents listed above may itself be substituted or unsubstituted. For example, a biphenyl group may be interpreted as an aryl group, or it may be interpreted as a phenyl group substituted with a phenyl group.

In the description, the term "combined with an adjacent group to form a ring" may mean a group that is combined with an adjacent group to form a substituted or unsubstituted hydrocarbon ring, or a substituted or unsubstituted heterocycle. The hydrocarbon ring may be an aliphatic hydrocarbon ring or an aromatic hydrocarbon ring. The heterocycle may be an aliphatic heterocycle or an aromatic heterocycle. The hydrocarbon ring and the heterocycle may each independently be monocyclic or polycyclic. A ring that is formed via the combination with an adjacent group may itself be combined with another ring to form a spiro structure.

In the description, the term "adjacent group" may mean a substituent substituted for an atom which is directly combined with an atom substituted with a corresponding substituent, another substituent substituted for an atom which is substituted with a corresponding substituent, or a substituent sterically positioned at the nearest position to a corresponding substituent. For example, in 1,2-dimethylbenzene, two methyl groups may be interpreted as "adjacent groups" to each other, and in 1,1-diethylcyclopentene, two ethyl groups may be interpreted as "adjacent groups" to each other. In 4,5-dimethylphenanthrene, two methyl groups may be interpreted as "adjacent groups" to each other.

In the description, examples of a halogen atom may include a fluorine atom, a chlorine atom, a bromine atom, or an iodine atom.

In the description, an alkyl group may be linear, branched, or cyclic. The number of carbon atoms in the alkyl group may be 1 to 50, 1 to 30, 1 to 20, 1 to 10, or 1 to 6. Examples of the alkyl group may include methyl, ethyl, n-propyl, isopropyl, n-butyl, s-butyl, t-butyl, butyl, 2-ethylbutyl, 3,3-dimethylbutyl, n-pentyl, i-pentyl, neopentyl, t-pentyl, cyclopentyl, 1-methylpentyl, 3-methylpentyl, 2-ethylpentyl, 4-methyl-2-pentyl, n-hexyl, 1-methylhexyl, 2-ethylhexyl, 2-butylhexyl, cyclohexyl, 4-methylcyclohexyl, 4-t-butylcyclohexyl, n-heptyl, 1-methylheptyl, 2,2-dimethylheptyl, 2-ethylheptyl, 2-butylheptyl, n-octyl, t-octyl, 2-ethyloctyl, 2-butyloctyl, 2-hexyloctyl, 3,7-dimethyloctyl, cyclooctyl, n-nonyl, n-decyl, adamantyl, 2-ethyldecyl, 2-butyldecyl, 2-hexyldecyl, 2-octyldecyl, n-undecyl, n-dodecyl, 2-ethyldodecyl, 2-butyldodecyl, 2-hexyldocecyl, 2-octyldodecyl, n-tridecyl, n-tetradecyl, n-pentadecyl, n-hexadecyl, 2-ethylhexadecyl, 2-butylhexadecyl, 2-hexylhexadecyl, 2-octylhexadecyl, n-heptadecyl, n-octadecyl, n-nonadecyl, n-eicosyl, 2-ethyleicosyl, 2-butyleicosyl, 2-hexyleicosyl, 2-octyleicosyl, n-henicosyl, n-docosyl, n-tricosyl, n-tetracosyl, n-pentacosyl, n-hexacosyl, n-heptacosyl, n-octacosyl, n-nonacosyl, n-triacontyl, etc., without limitation.

In the description, an alkyl group may be linear or branched. The number of carbon atoms in the alkyl group may be 1 to 50, 1 to 30, 1 to 20, 1 to 10, or 1 to 6. Examples of the alkyl group may include methyl, ethyl, n-propyl, isopropyl, n-butyl, s-butyl, t-butyl, i-butyl, 2-ethylbutyl, 3,3-dimethylbutyl, n-pentyl, i-pentyl, neopentyl, t-pentyl, 1-methylpentyl, 3-methylpentyl, 2-ethylpentyl, 4-methyl-2-pentyl, n-hexyl, 1-methylhexyl, 2-ethylhexyl, 2-butylhexyl, n-heptyl, 1-methylheptyl, 2,2-dimethylheptyl, 2-ethylheptyl, 2-butylheptyl, n-octyl, t-octyl, 2-ethyloctyl, 2-butyloctyl, 2-hexyloctyl, 3,7-dimethyloctyl, n-nonyl, n-decyl, adamantyl, 2-ethyldecyl, 2-butyldecyl, 2-hexyldecyl, 2-octyldecyl, n-undecyl, n-dodecyl, 2-ethyldodecyl, 2-butyldodecyl, 2-hexyldocecyl, 2-octyldodecyl, n-tridecyl, n-tetradecyl, n-pentadecyl, n-hexadecyl, 2-ethylhexadecyl, 2-butylhexadecyl, 2-hexylhexadecyl, 2-octylhexadecyl, n-heptadecyl, n-octadecyl, n-nonadecyl, n-eicosyl, 2-ethyleicosyl, 2-butyleicosyl, 2-hexyleicosyl, 2-octyleicosyl, n-henicosyl, n-docosyl, n-tricosyl, n-tetracosyl, n-pentacosyl, n-hexacosyl, n-heptacosyl, n-octacosyl, n-nonacosyl, n-triacontyl, etc., without limitation.

In the description, a cycloalkyl group may be a ring-type alkyl group. The number of carbon atoms in the cycloalkyl group may be 3 to 50, 3 to 30, 3 to 20, or 3 to 10. Examples of the cycloalkyl group may include a cyclopropyl group, a cyclobutyl group, a cyclopentyl group, a cyclohexyl group, a 4-methylcyclohexyl group, a 4-t-butylcyclohexyl group, a cycloheptyl group, a cyclooctyl group, a cyclononyl group, a cyclodecyl group, a norbornyl group, a 1-adamantyl group, a 2-adamantyl group, an isobornyl group, a bicycloheptyl group, etc., without limitation.

In the description, an alkenyl group may be a hydrocarbon group including one or more carbon-carbon double bonds in the middle or at a terminus of an alkyl group having 2 or more carbon atoms. The alkenyl group may be linear or branched. The number of carbon atoms is not specifically limited, but may be 2 to 30, 2 to 20, or 2 to 10. Examples of the alkenyl group may include a vinyl group, a 1-butenyl group, a 1-pentenyl group, a 1,3-butadienyl aryl group, a styrenyl group, a styrylvinyl group, etc., without limitation.

In the description, an alkynyl group may be a hydrocarbon group including one or more carbon-carbon triple bonds in the middle or at a terminus of an alkyl group having 2 or more carbon atoms. The alkynyl group may be linear or branched. The number of carbon atoms is not specifically limited, but may be 2 to 30, 2 to 20, or 2 to 10. Examples of the alkynyl group may include an ethynyl group, a propynyl group, etc., without limitation.

In the description, a hydrocarbon ring group may be any functional group or substituent derived from an aliphatic hydrocarbon ring. For example, the hydrocarbon ring group may be a saturated hydrocarbon ring group of 5 to 20 ring-forming carbon atoms.

In the description, an aryl group may be any functional group or substituent derived from an aromatic hydrocarbon ring. The aryl group may be monocyclic or polycyclic. The number of ring-forming carbon atoms in the aryl group may be 6 to 30, 6 to 20, or 6 to 15. Examples of the aryl group may include phenyl, naphthyl, fluorenyl, anthracenyl, phenanthryl, biphenyl, terphenyl, quaterphenyl, quinquephenyl, sexiphenyl, triphenylenyl, pyrenyl, benzofluoranthenyl, chrysenyl, etc., without limitation.

In the description, a fluorenyl group may be substituted, and two substituents may be combined with each other to form a spiro structure. Examples of substituted fluorenyl groups are as follows, but embodiments are not limited thereto.

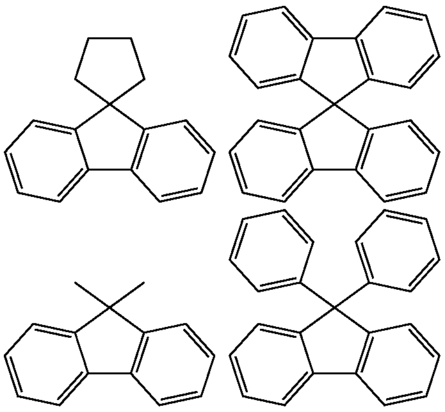

In the description, a heterocyclic group may be any functional group or substituent derived from a ring including one or more of B, O, N, P, Si, or S as a heteroatom. The heterocyclic group may be an aliphatic heterocyclic group or an aromatic heterocyclic group. The aromatic heterocyclic group may be a heteroaryl group. The aliphatic heterocyclic group and the aromatic heterocyclic group may each independently be monocyclic or polycyclic.

In the description, a heterocyclic group may include one or more of B, O, N, P, Si, or S as a heteroatom. If the heterocyclic group includes two or more heteroatoms, the two or more heteroatoms may be the same as or different from each other. The heterocyclic group may be monocyclic or polycyclic, and the heterocyclic group may be a heteroaryl group. The number of ring-forming carbon atoms in the heterocyclic group may be 2 to 30, 2 to 20, or 2 to 10.

In the description, an aliphatic heterocyclic group may include one or more of B, O, N, P, Si, or S as a heteroatom. The number of ring-forming carbon atoms in the aliphatic heterocyclic group may be 2 to 30, 2 to 20, or 2 to 10. Examples of the aliphatic heterocyclic group may include an oxirane group, a thiirane group, a pyrrolidine group, a piperidine group, a tetrahydrofuran group, a tetrahydrothiophene group, a thiane group, a tetrahydropyran group, a 1,4-dioxane group, etc., without limitation.

In the description, a heteroaryl group may include one or more of B, O, N, P, Si, or S as a heteroatom. If the heteroaryl group includes two or more heteroatoms, the two or more heteroatoms may be the same as or different from each other. The heteroaryl group may be monocyclic or polycyclic. The number of ring-forming carbon atoms in the heteroaryl group may be 2 to 30, 2 to 20, or 2 to 10. Examples of the heteroaryl group may include thiophene, furan, pyrrole, imidazole, triazole, pyridine, bipyridine, pyrimidine, triazine, acridyl, pyridazine, pyrazinyl, quinoline, quinazoline, quinoxaline, phenoxazine, phthalazine, pyrido pyrimidine, pyrido pyrazine, pyrazino pyrazine, isoquinoline, indole, carbazole, N-arylcarbazole, N-heteroarylcarbazole, N-alkylcarbazole, benzoxazole, benzoimidazole, benzothiazole, benzocarbazole, benzothiophene, dibenzothiophene, thienothiophene, benzofuran, phenanthroline, thiazole, isooxazole, oxazole, oxadiazole, thiadiazole, phenothiazine, dibenzosilole, dibenzofuran, etc., without limitation.

In the description, the explanation on the above-described aryl group may be applied to an arylene group except that the arylene group is a divalent group. The explanation on the above-described heteroaryl group may be applied to a heteroarylene group except that the heteroarylene group is a divalent group.

In the description, a silyl group may be an alkyl silyl group or an aryl silyl group. Examples of the silyl group may include a trimethylsilyl group, a triethylsilyl group, a t-butyldimethylsilyl group, a vinyldimethylsilyl group, a propyldimethylsilyl group, a triphenylsilyl group, a diphenylsilyl group, a phenylsilyl group, etc., without limitation.

In the description, the number of carbon atoms in an amino group is not specifically limited, but may be 1 to 30. The amino group may be an alkyl amino group, an aryl amino group, or a heteroaryl amino group. Examples of the amino group may include a methylamino group, a dimethylamino group, a phenylamino group, a diphenylamino group, a naphthylamino group, a 9-methyl-anthracenylamino group, a triphenylamino group, etc., without limitation.

In the description, the number of carbon atoms in a carbonyl group is not specifically limited, but may be 1 to 40, 1 to 30, or 1 to 20. For example, the carbonyl group may have one of the structures as shown below, but is not limited thereto.

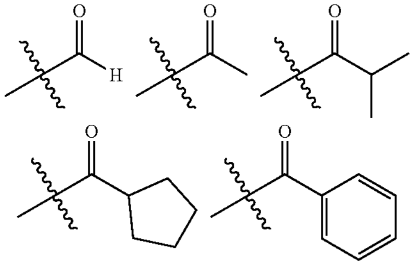

In the description, the number of carbon atoms in a sulfinyl group or a sulfonyl group is not specifically limited, but may be 1 to 30. The sulfinyl group may be an alkyl sulfinyl group or an aryl sulfinyl group. The sulfonyl group may be an alkyl sulfonyl group or an aryl sulfonyl group.

In the description, a thio group may be an alkyl thio group or an aryl thio group. The thio group may be a sulfur atom that is bonded to an alkyl group or an aryl group as defined above. Examples of the thio group may include a methylthio group, an ethylthio group, a propylthio group, a pentylthio group, a hexylthio group, an octylthio group, a dodecylthio group, a cyclopentylthio group, a cyclohexylthio group, a phenylthio group, a naphthylthio group, etc., without limitation.

In the description, an oxy group may be an oxygen atom that is bonded to an alkyl group or an aryl group as defined above. The oxy group may be an alkoxy group or an aryl oxy group. The alkoxy group may be linear, branched, or cyclic. The number of carbon atoms in the alkoxy group is not specifically limited but may be, for example, 1 to 20 or 1 to 10. Examples of the oxy group may include methoxy, ethoxy, n-propoxy, isopropoxy, butoxy, pentyloxy, hexyloxy, octyloxy, nonyloxy, decyloxy, benzyloxy, etc. However, embodiments are not limited thereto.

In the description, a boron group may be a boron atom that is bonded to an alkyl group or an aryl group as defined above. The boron group may be an alkyl boron group or an aryl boron group. Examples of the boron group may include a trimethylboron group, a triethylboron group, a t-butylmethylboron group, a triphenylboron group, a diphenylboron group, a phenylboron group, etc., without limitation.

In the description, an alkenyl group may be linear or branched. The number of carbon atoms in an alkenyl group is not specifically limited but may be 2 to 30, 2 to 20, or 2 to 10. Examples of the alkenyl group may include a vinyl group, a 1-butenyl group, a 1-pentenyl group, a 1,3-butadienyl aryl group, a styrenyl group, a styryl vinyl group, etc., without limitation.

In the description, the number of carbon atoms in an amine group is not specifically limited, but may be 1 to 30. The amine group may be an alkyl amine group or an aryl amine group. Examples of the amine group may include a methylamine group, a dimethylamine group, a phenylamine group, a diphenylamine group, a naphthylamine group, a 9-methyl-anthracenylamine group, a triphenylamine group, etc., without limitation.

In the description, alkyl groups in an alkylthio group, an alkylsulfoxy group, an alkylaryl group, an alkylamino group, an alkylboron group, an alkyl silyl group, and an alkyl amine group may be the same as the examples of the above-described alkyl group.

In the description, aryl groups in an aryloxy group, an arylthio group, an arylsulfoxy group, an aryl amino group, an arylboron group, and an aryl silyl group may be the same as the examples of the above-described aryl group.

In the description, a direct linkage may be a single bond.

In the description, the symbols  and  each represents a bonding site to a neighboring atom.

Hereinafter, embodiments will be explained with reference to the drawings.

Figure 2:
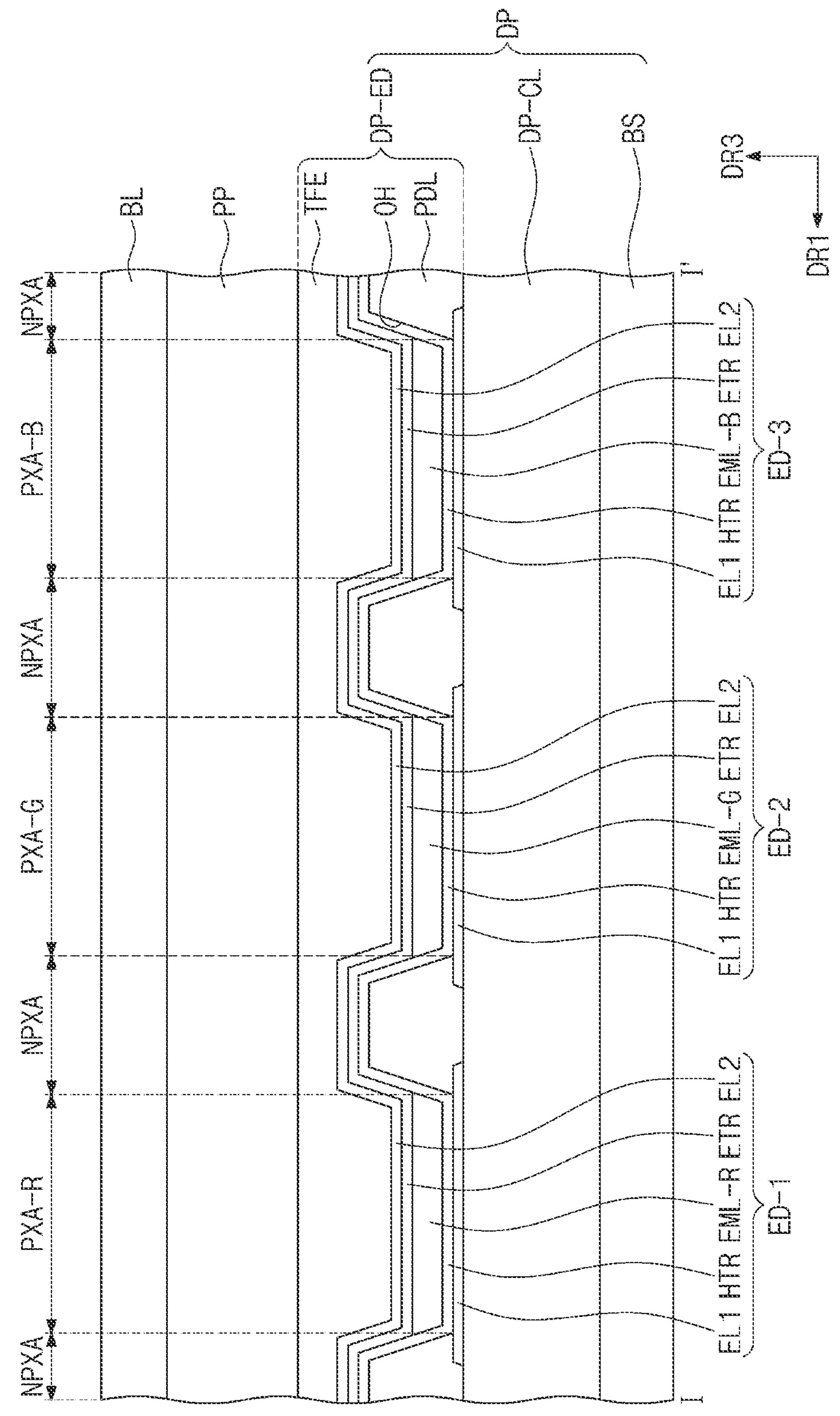
FIG. 2 is a schematic cross-sectional view showing a display apparatus according to an embodiment.

FIG. 1 is a plan view showing an embodiment of a display apparatus DD. FIG. 2 is a schematic cross-sectional view of a display apparatus DD according to an embodiment. FIG. 2 is a schematic cross-sectional view showing a part corresponding to line I-I' of FIG. 1.

The display apparatus DD may include a display panel DP and an optical layer PP disposed on the display panel DP. The display panel DP includes light emitting elements ED-1, ED-2, and ED-3. The display apparatus DD may include multiples of the light emitting elements ED-1, ED-2, and ED-3. The optical layer PP may be disposed on the display panel DP and may control light reflected at the display panel DP from an external light. The optical layer PP may include, for example, a polarization layer or a color filter layer. Although not shown in the drawings, in an embodiment, the optical layer PP may be omitted from the display apparatus DD.

A On base substrate BL may be disposed on the optical layer PP. The base substrate BL may provide a base surface where the optical layer PP is disposed. The base substrate BL may be a glass substrate, a metal substrate, a plastic substrate, etc. However, embodiments are not limited thereto, and the base substrate BL may include an inorganic layer, an organic layer, or a composite material layer. Although not shown in the drawings, in an embodiment, the base substrate BL may be omitted.

The display apparatus DD according to an embodiment may further include a plugging layer (not shown). The plugging layer (not shown) may be disposed between a display device layer DP-ED and a base substrate BL. The plugging layer (not shown) may be an organic layer. The plugging layer (not shown) may include at least one of an acrylic resin, a silicon-based resin, or an epoxy-based resin.

The display panel DP may include a base layer BS, a circuit layer DP-CL provided on the base layer BS, and a display device layer DP-ED. The display device layer DP-ED may include a pixel definition layer PDL, light emitting elements ED-1, ED-2, and ED-3 disposed between portions of the pixel definition layer PDL, and an encapsulating layer TFE disposed on the light emitting elements ED-1, ED-2, and ED-3.

The base layer BS may provide a base surface where the display device layer DP-ED is disposed. The base layer BS may be a glass substrate, a metal substrate, a plastic substrate, etc. However, embodiments are not limited thereto, and the base layer BS may include an inorganic layer, an organic layer, or a composite material layer.

In an embodiment, the circuit layer DP-CL is disposed on the base layer BS, and the circuit layer DP-CL may include transistors (not shown). Each of the transistors (not shown) may include a control electrode, an input electrode, and an output electrode. For example, the circuit layer DP-CL may include switching transistors and driving transistors for driving the light emitting elements ED-1, ED-2, and ED-3 of the display device layer DP-ED.

Each of the light emitting elements ED-1, ED-2, and ED-3 may have a structure of a light emitting element ED according to an embodiment in FIG. 3 to FIG. 6, which will be explained later. Each of the light emitting elements ED-1, ED-2, and ED-3 may include a first electrode EL1, a hole transport region HTR, emission layers EML-R, EML-G, and EML-B, an electron transport region ETR, and a second electrode EL2.

FIG. 2 shows an embodiment where the emission layers EML-R, EML-G, and EML-B of light emitting elements ED-1, ED-2, and ED-3 are disposed in openings OH defined in a pixel definition layer PDL, and a hole transport region HTR, an electron transport region ETR and a second electrode EL2 are each provided as common layers for all of the light emitting elements ED-1, ED-2, and ED-3. However, embodiments are not limited thereto. Although not shown in FIG. 2, in an embodiment, the hole transport region HTR and the electron transport region ETR may each be patterned and provided in the openings OH defined in the pixel definition layer PDL. For example, in an embodiment, the hole transport region HTR, the emission layers EML-R, EML-G, and EML-B, and the electron transport region ETR of the light emitting elements ED-1, ED-2, and ED-3 may each be patterned by an ink jet printing method and provided.

An encapsulating layer TFE may cover the light emitting elements ED-1, ED-2, and ED-3. The encapsulating layer TFE may encapsulate the display device layer DP-ED. The encapsulating layer TFE may be a thin film encapsulating layer. The encapsulating layer TFE may be a single layer or a stack of multiple layers. The encapsulating layer TFE may include at least one insulating layer. The encapsulating layer TFE according to an embodiment may include at least one inorganic layer (hereinafter, encapsulating inorganic layer). The encapsulating layer TFE according to an embodiment may include at least one organic layer (hereinafter, encapsulating organic layer) and at least one encapsulating inorganic layer.

The encapsulating inorganic layer may protect the display device layer DP-ED from moisture and/or oxygen, and the encapsulating organic layer may protect the display device layer DP-ED from foreign materials such as dust particles. The encapsulating inorganic layer may include silicon nitride, silicon oxy nitride, silicon oxide, titanium oxide, or aluminum oxide, without specific limitation. The encapsulating organic layer may include an acrylic compound, an epoxy-based compound, etc. The encapsulating organic layer may include a photopolymerizable organic material, without specific limitation.

The encapsulating layer TFE may be disposed on the second electrode EL2 and may be disposed to fill the openings OH.

Referring to FIG. 1 and FIG. 2, the display apparatus DD may include a non-luminous area NPXA and luminous areas PXA-R, PXA-G, and PXA-B. The luminous areas PXA-R, PXA-G, and PXA-B may each be an area emitting light produced from the light emitting elements ED-1, ED-2, and ED-3, respectively. The luminous areas PXA-R, PXA-G, and PXA-B may be separated from each other in a plan view.

The luminous areas PXA-R, PXA-G, and PXA-B may each be an area separated by the pixel definition layer PDL. The non-luminous areas NPXA may be areas between neighboring luminous areas PXA-R, PXA-G, and PXA-B and may be areas corresponding to the pixel definition layer PDL. For example, in an embodiment, each of the luminous areas PXA-R, PXA-G, and PXA-B may correspond to a pixel. The pixel definition layer PDL may separate the light emitting elements ED-1, ED-2, and ED-3. The emission layers EML-R, EML-G, and EML-B of the light emitting elements ED-1, ED-2, and ED-3 may be disposed in the openings OH defined in the pixel definition layer PDL and separated from each other.

The luminous areas PXA-R, PXA-G, and PXA-B may be arranged into groups according to the color of light produced from the light emitting elements ED-1, ED-2, and ED-3. In the display apparatus DD according to an embodiment, shown in FIG. 1 and FIG. 2, three luminous areas PXA-R, PXA-G, and PXA-B respectively emitting red light, green light, and blue light are illustrated as an example. For example, the display apparatus DD according to an embodiment may include a red luminous area PXA-R, a green luminous area PXA-G, and a blue luminous area PXA-B, which are separated from each other.

In the display apparatus DD according to an embodiment, the light emitting elements ED-1, ED-2, and ED-3 may emit light having different wavelength regions from each other. For example, in an embodiment, the display apparatus DD may include a first light emitting element ED-1 emitting red light, a second light emitting element ED-2 emitting green light, and a third light emitting element ED-3 emitting blue light. For example, the red luminous area PXA-R, the green luminous area PXA-G, and the blue luminous area PXA-B of the display apparatus DD may respectively correspond to the first light emitting element ED-1, the second light emitting element ED-2, and the third light emitting element ED-3.

However, embodiments are not limited thereto, and the first to third light emitting elements ED-1, ED-2, and ED-3 may emit light in a same wavelength region, or at least one thereof may emit light in a different wavelength region. For example, all the first to third light emitting elements ED-1, ED-2, and ED-3 may emit blue light.

The luminous areas PXA-R, PXA-G, and PXA-B in the display apparatus DD according to an embodiment may be arranged in a stripe configuration. Referring to FIG. 1, the red luminous areas PXA-R, the green luminous areas PXA-G, and the blue luminous areas PXA-B may each be arranged along a second directional axis DR2. In another embodiment, the red luminous area PXA-R, the green luminous area PXA-G, and the blue luminous area PXA-B may be arranged by turns along a first directional axis DR1.

In FIG. 1 and FIG. 2, the luminous areas PXA-R, PXA-G, and PXA-B are shown as having a similar area to each other, but embodiments are not limited thereto. The areas of the luminous areas PXA-R, PXA-G, and PXA-B may be different from each other according to a wavelength region of light emitted. The areas of the luminous areas PXA-R, PXA-G, and PXA-B may be areas in a plan view that are defined by the first directional axis DR1 and the second directional axis DR2.

The arrangement of the luminous areas PXA-R, PXA-G, and PXA-B is not limited to the configuration shown in FIG. 1, and the order in which the red luminous areas PXA-R, the green luminous areas PXA-G, and the blue luminous areas PXA-B are arranged may be provided in various combinations according to the display quality characteristics which are required for the display apparatus DD. For example, the arrangement type of the luminous areas PXA-R, PXA-G, and PXA-B may be a PENTILE™ configuration or a diamond configuration.

In an embodiment, the areas of the luminous areas PXA-R, PXA-G, and PXA-B may be different in size from each other. For example, in an embodiment, an area of the green luminous area PXA-G may be smaller than an area of the blue luminous area PXA-B, but embodiments are not limited thereto.

Hereinafter, FIG. 3 to FIG. 6 are schematic cross-sectional views showing light emitting elements according to embodiments. Each of the light emitting elements ED according to embodiments may include a first electrode EL1, a hole transport region HTR, an emission layer EML, an electron transport region ETR and a second electrode EL2, stacked in that stated order.

Figure 3:
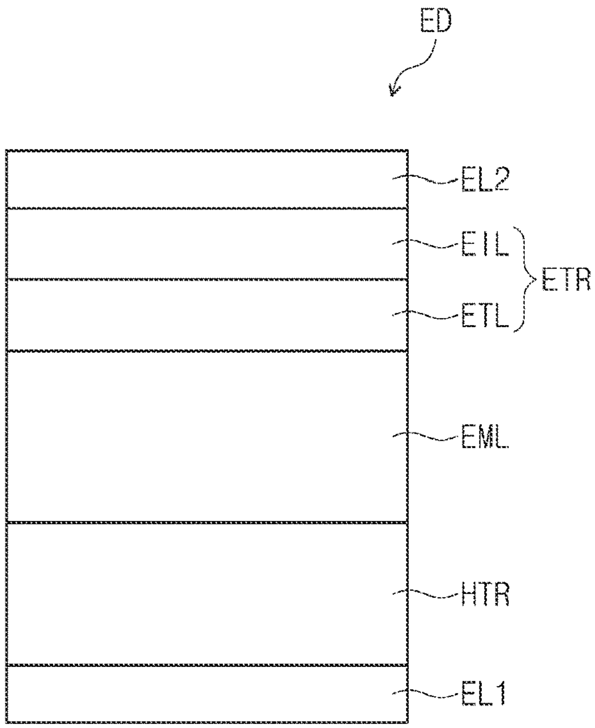
FIG. 3 is a schematic cross-sectional view showing a light emitting element according to an embodiment.
Figure 4:
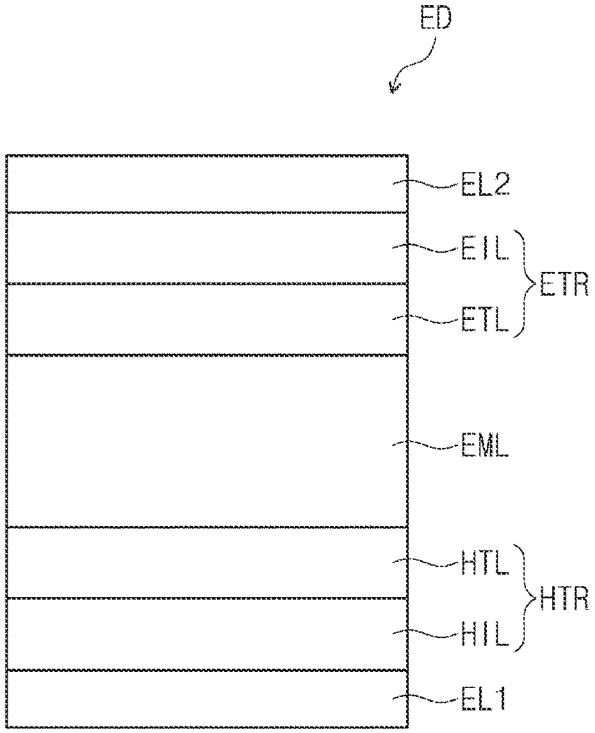
FIG. 4 is a schematic cross-sectional view showing a light emitting element according to an embodiment.
Figure 5:
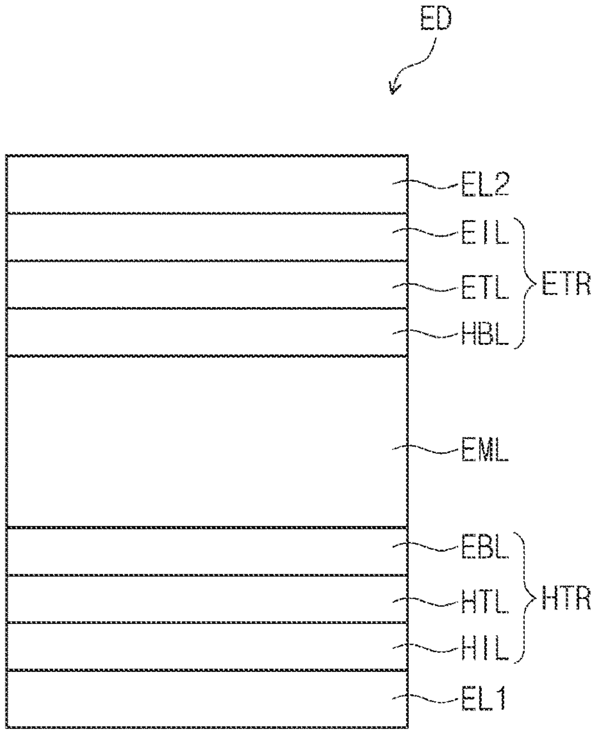
FIG. 5 is a schematic cross-sectional view showing a light emitting element according to an embodiment.
Figure 6:
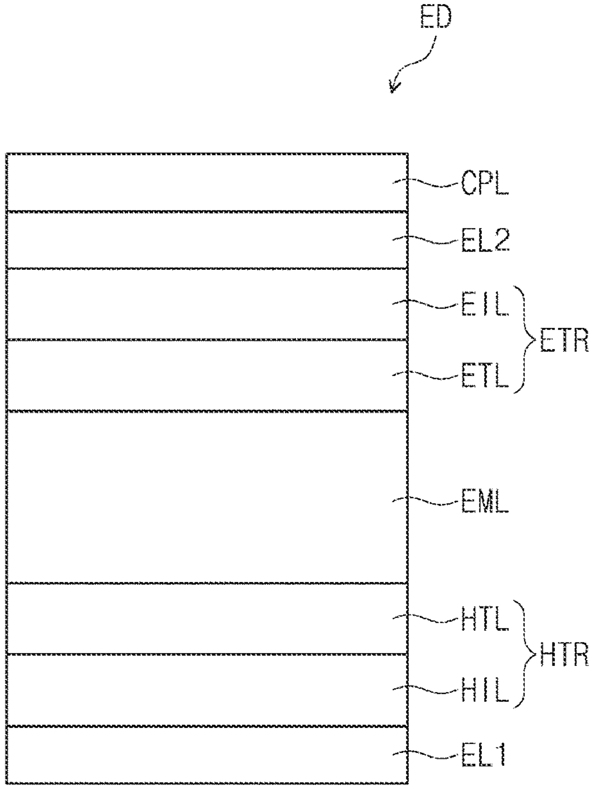
FIG. 6 is a schematic cross-sectional view showing a light emitting element according to an embodiment.

In comparison to FIG. 3, FIG. 4 shows a schematic cross-sectional view of a light emitting element ED according to an embodiment, wherein a hole transport region HTR includes a hole injection layer HIL and a hole transport layer HTL, and an electron transport region ETR includes an electron injection layer EIL and an electron transport layer ETL. In comparison to FIG. 3, FIG. 5 shows a schematic cross-sectional view of a light emitting element ED according to an embodiment, wherein a hole transport region HTR includes a hole injection layer HIL, a hole transport layer HTL, and an electron blocking layer EBL, and an electron transport region ETR includes an electron injection layer EIL, an electron transport layer ETL, and a hole blocking layer HBL. In comparison to FIG. 4, FIG. 6 shows a schematic cross-sectional view of a light emitting element ED according to an embodiment, including a capping layer CPL disposed on the second electrode EL2.

The first electrode EL1 has conductivity. The first electrode EL1 may be formed of a metal material, a metal alloy, or a conductive compound. The first electrode EL1 may be an anode or a cathode. However, embodiments are not limited thereto. For example, the first electrode EL1 may be a pixel electrode. The first electrode EL1 may be a transmissive electrode, a transflective electrode, or a reflective electrode. If the first electrode EL1 is a transmissive electrode, the first electrode EL1 may include a transparent metal oxide such as indium tin oxide (ITO), indium zinc oxide (IZO), zinc oxide (ZnO), or indium tin zinc oxide (ITZO). If the first electrode EL1 is a transflective electrode or a reflective electrode, the first electrode EL1 may include Ag, Mg, Cu, Al, Pt, Pd, Au, Ni, Nd, Ir, Cr, Li, Ca, LiF/Ca, LiF/Al, Mo, Ti, W, compounds thereof, or mixtures thereof (for example, a mixture of Ag and Mg). In another embodiment, the first electrode EL1 may have a structure including multiple layers including a reflective layer or a transflective layer formed of the above materials, and a transmissive conductive layer formed of ITO, IZO, ZnO, or ITZO. For example, the first electrode EL1 may have a three-layer structure of ITO/Ag/ITO. However, embodiments are not limited thereto. The first electrode EL1 may include the above-described metal materials, combinations of two or more metal materials selected from the above-described metal materials, or oxides of the above-described metal materials. A thickness of the first electrode EL1 may be in a range of about 700 Å to about 10,000 Å. For example, the thickness of the first electrode EL1 may be in a range of about 1,000 Å to about 3,000 Å.

The hole transport region HTR is provided on the first electrode ELL The hole transport region HTR may include at least one of a hole injection layer HIL, a hole transport layer HTL, a buffer layer (not shown), an emission auxiliary layer (not shown), or an electron blocking layer EBL. A thickness of the hole transport region HTR may be, for example, in a range of about 50 Å to about 15,000 Å.

The hole transport region HTR may be a layer formed of a single material, a layer formed of different materials, or a structure including multiple layers formed of different materials.

For example, the hole transport region HTR may have a structure of a single layer of a hole injection layer HIL or a hole transport layer HTL, and may have a structure of a single layer formed of a hole injection material and a hole transport material. In an embodiment, the hole transport region HTR may have a structure of a single layer formed of different materials, or may have a structure in which a hole injection layer HIL/hole transport layer HTL, a hole injection layer HIL/hole transport layer HTL/buffer layer (not shown), a hole injection layer HIL/buffer layer (not shown), a hole transport layer HTL/buffer layer (not shown), or a hole injection layer HIL/hole transport layer HTL/electron blocking layer EBL, are stacked in its respective stated order from the first electrode EL1, but embodiments are not limited thereto.

The hole transport region HTR may be formed using various methods such as a vacuum deposition method, a spin coating method, a cast method, a Langmuir-Blodgett (LB) method, an inkjet printing method, a laser printing method, and a laser induced thermal imaging (LITI) method.

The hole transport region HTR may include a compound represented by Formula H-1.

[Formula H-1]

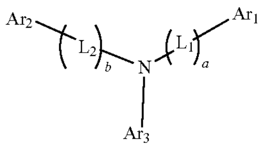

In Formula H-1, $L_1$ and $L_2$ may each independently be a direct linkage, a substituted or unsubstituted arylene group of 6 to 30 ring-forming carbon atoms, or a substituted or unsubstituted heteroarylene group of 2 to 30 ring-forming carbon atoms; and a and b may each independently be an integer from 0 to 10. When a orb are 2 or more, multiple $L_1$ groups and multiple $L_2$ groups may each independently be a substituted or unsubstituted arylene group of 6 to 30 ring-forming carbon atoms, or a substituted or unsubstituted heteroarylene group of 2 to 30 ring-forming carbon atoms.

In Formula H-1, $Ar_1$ and $Ar_2$ may each independently be a substituted or unsubstituted aryl group of 6 to 30 ring-forming carbon atoms, or a substituted or unsubstituted heteroaryl group of 2 to 30 ring-forming carbon atoms. In Formula H-1, $Ar_3$ may be a substituted or unsubstituted aryl group of 6 to 30 ring-forming carbon atoms.

In an embodiment, the compound represented by Formula H-1 may be a monoamine compound. In another embodiment, the compound represented by Formula H-1 may be a diamine compound in which at least one of $Ar_1$ to $Ar_3$ includes an amine group as a substituent. In still another embodiment, the compound represented by Formula H-1 may be a carbazole-based compound in which at least one of $Ar_1$ and $Ar_2$ includes a substituted or unsubstituted carbazole group, or a fluorene-based compound in which at least one of $Ar_1$ and $Ar_2$ includes a substituted or unsubstituted fluorene group.

The compound represented by Formula H-1 may be any one selected from Compound Group H. However, the compounds shown in Compound Group H are only examples, and the compound represented by Formula H-1 is not limited to Compound Group H:

[Compound Group H]

H-1-1

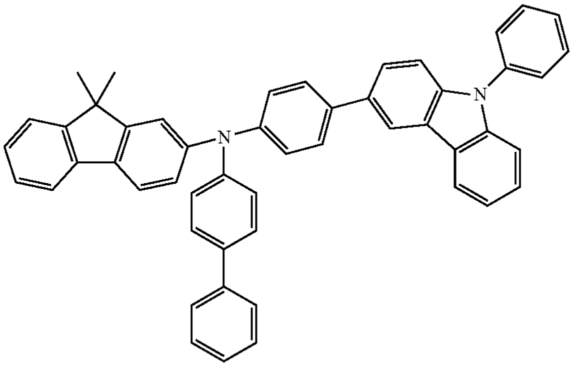

H-1-2

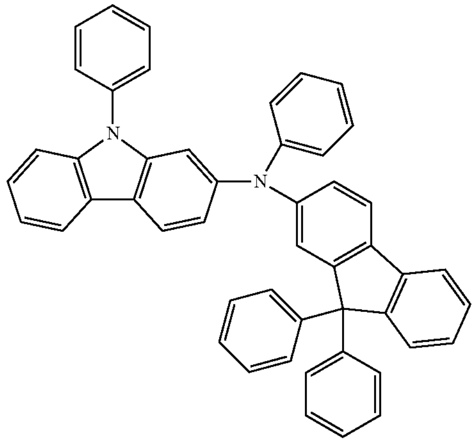

-continued
H-1-3
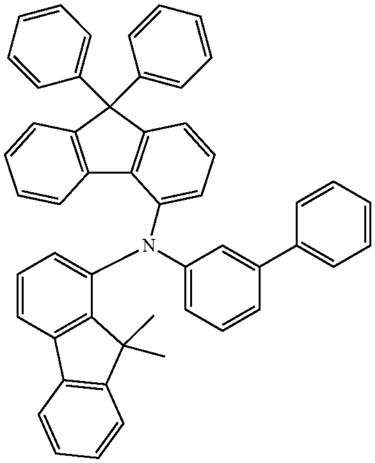
H-1-4
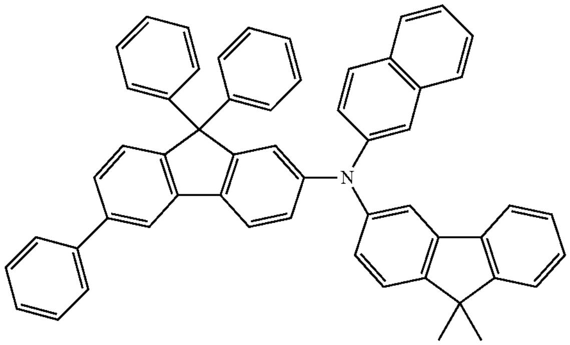
H-1-5
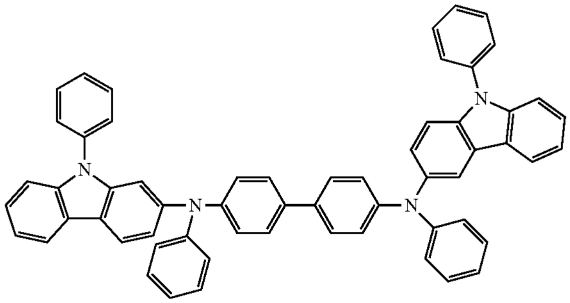
-continued
H-1-6
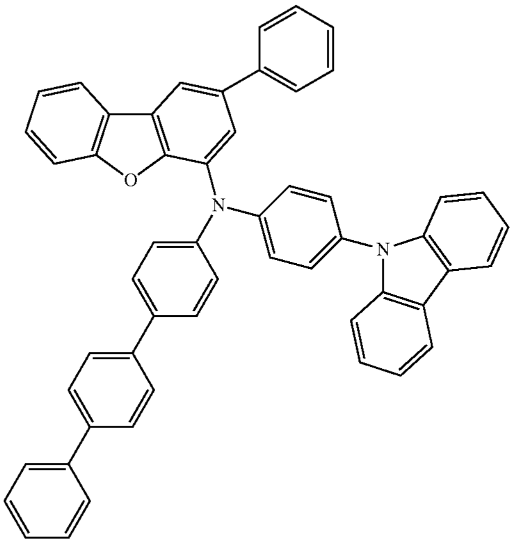
H-1-7
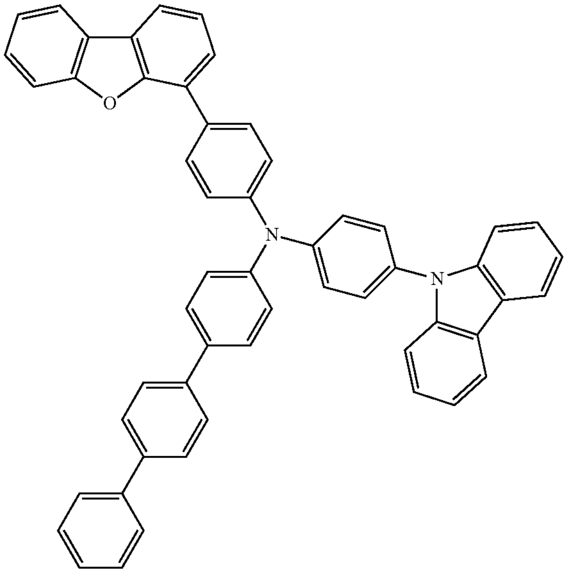
H-1-8
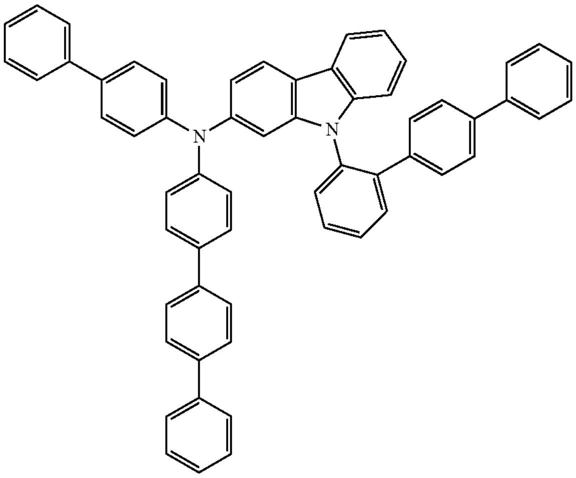

-continued
H-1-9
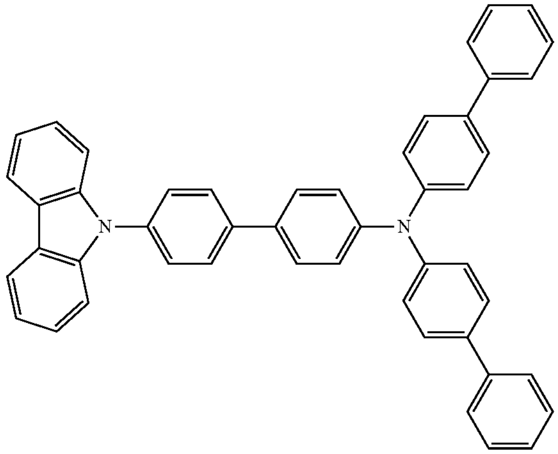
H-1-10
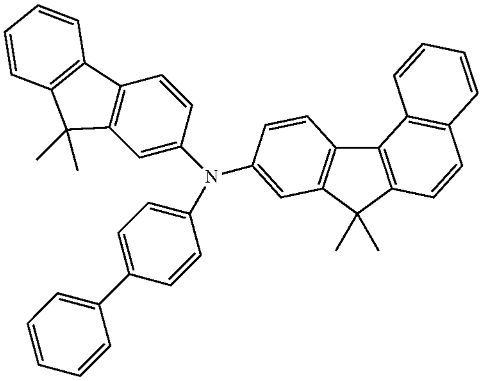
H-1-11
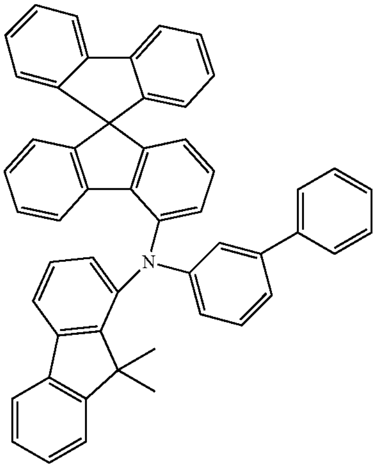
-continued
H-1-12
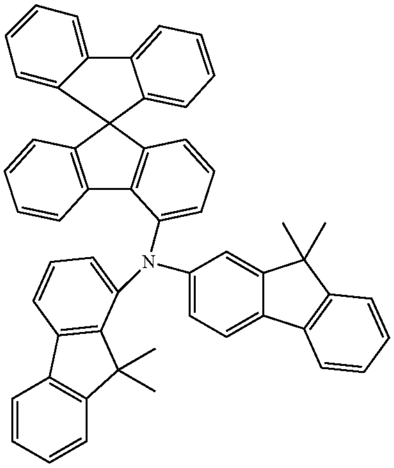
H-1-13
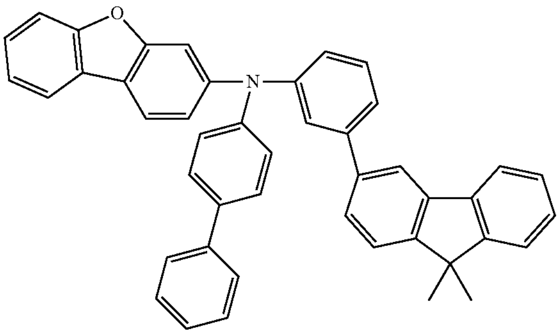
H-1-14
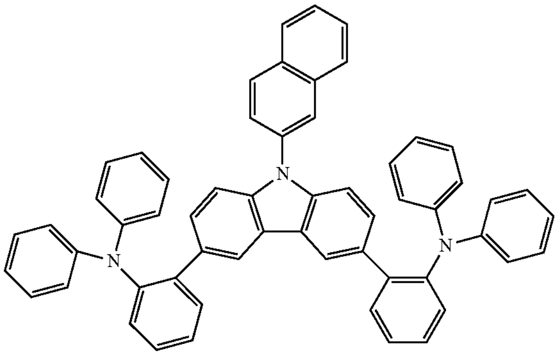

-continued

H-1-15

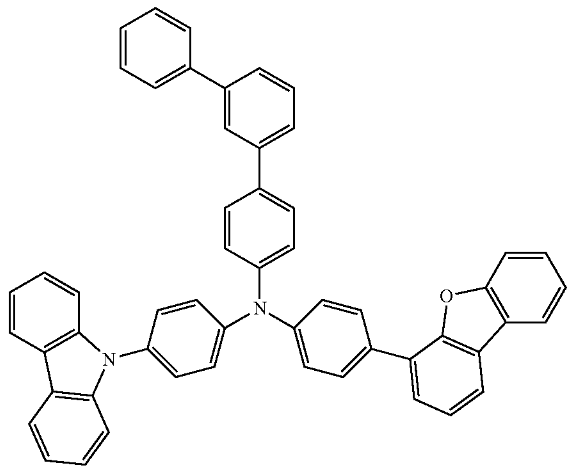

H-1-16

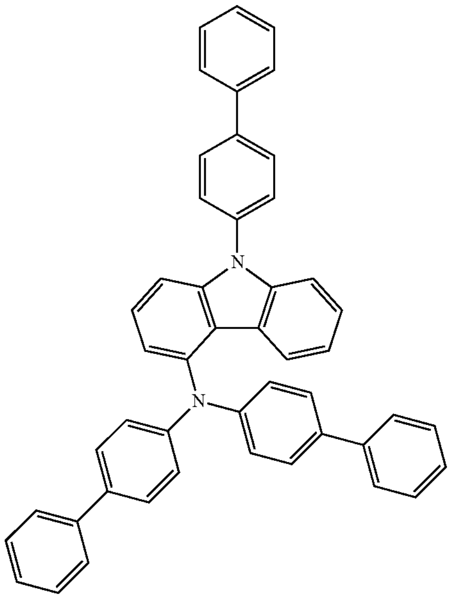

H-1-17

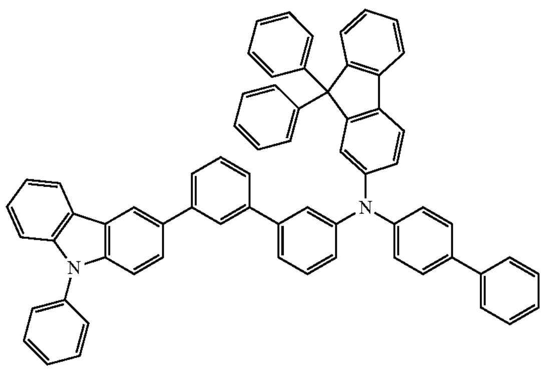

-continued

H-1-18

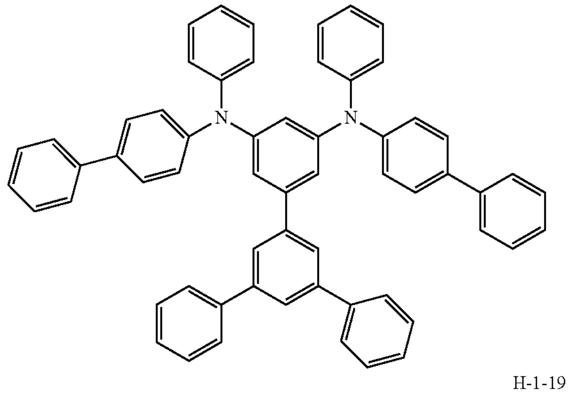

H-1-19

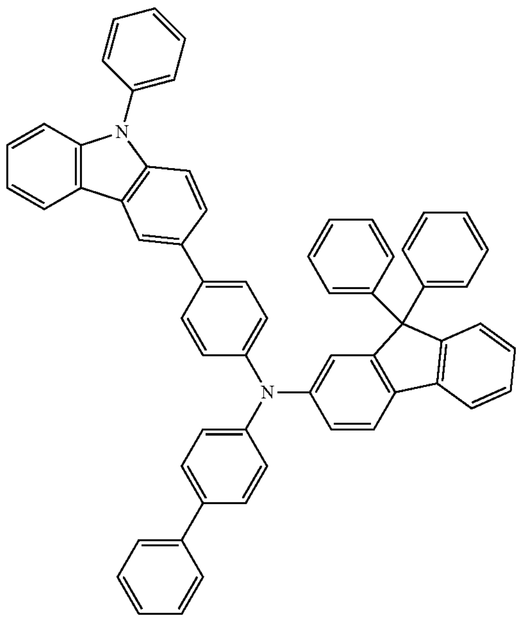

The hole transport region HTR may include a phthalocyanine compound such as copper phthalocyanine, $N^1$,$N^{1'}$-([1,1'-biphenyl]-4,4'-diyl)bis($N^1$-phenyl-$N^4$,$N^4$-di-m-tolyl-benzene-1,4-diamine) (DNTPD), 4,4',4"-[tris(3-methylphenyl)phenylamino] triphenylamine (m-MTDATA), 4,4',4"-tris(N,N-diphenylamino)triphenylamine (TDATA), 4,4',4"-tris[N(2-naphthyl)-N-phenylamino]-triphenylamine (2-TNATA), poly(3,4-ethylenedioxythiophene)/poly(4-styrenesulfonate) (PEDOT/PSS), polyaniline/dodecylbenzenesulfonic acid (PANI/DBSA), polyaniline/camphor sulfonic acid (PANI/CSA), polyanine/poly(4-styrenesulfonate) (PANI/PSS), N,N'-di(1-naphthalene-1-yl)-N,N'-diphenyl-benzidine (NPB or NPD), triphenylamine-containing polyetherketone (TPAPEK), 4-isopropyl-4'-methyldiphenyliodonium [tetrakis(pentafluorophenyl)borate], and dipyrazino[2,3-f:2',3'-h] quinoxaline-2,3,6,7,10,11-hexacarbonitrile (HAT-CN).

The hole transport region HTR may include carbazole derivatives such as N-phenyl carbazole and polyvinyl carbazole, fluorene-based derivatives, N,N'-bis(3-methylphenyl)-N,N'-diphenyl-[1,1'-biphenyl]-4,4'-diamine (TPD), triphenylamine-based derivatives such as 4,4',4"-tris(N-carbazolyl)triphenylamine (TCTA), N,N'-di(1-naphthalene-1-yl)-N,N'-diphenyl-benzidine (NPB), 4,4'-cyclohexylidene bis[N,N-bis(4-methylphenyl)benzeneamine] (TAPC), 4,4'-bis[N,N'-(3-tolyl)amino]-3,3'-dimethylbiphenyl (HMTPD), 1,3-bis(N-carbazolyl)benzene (mCP), etc.

The hole transport region HTR may include 9-(4-tert-butylphenyl)-3,6-bis(triphenylsilyl)-9H-carbazole (CzSi), 9-phenyl-9H-3,9'-bicarbazole (CCP), 1,3-bis(1,8-dimethyl-9H-carbazol-9-yl)benzene (mDCP), etc.

The hole transport region HTR may include the compounds of the hole transport region in at least one of a hole injection layer HIL, a hole transport layer HTL, or an electron blocking layer EBL.

A thickness of the hole transport region HTR may be in a range of about 100 Å to about 10,000 Å. For example, the thickness of the hole transport region HTR may be in a range of about 100 Å to about 5,000 Å. In case that the hole transport region HTR includes a hole injection layer HIL, a thickness of the hole injection layer HIL may be, for example, in a range of about 30 Å to about 1,000 Å. In case that the hole transport region HTR includes a hole transport layer HTL, a thickness of the hole transport layer HTL may be in a range of about 30 Å to about 1,000 Å. In case that the hole transport region HTR includes an electron blocking layer, a thickness of the electron blocking layer EBL may be in a range of about 10 Å to about 1,000 Å. If the thicknesses of the hole transport region HTR, the hole injection layer HIL, the hole transport layer HTL and the electron blocking layer EBL satisfy the above-described ranges, satisfactory hole transport properties may be achieved without a substantial increase in driving voltage.

The hole transport region HTR may further include a charge generating material to increase conductivity, in addition to the above-described materials. The charge generating material may be dispersed uniformly or non-uniformly in the hole transport region HTR. The charge generating material may be, for example, a p-dopant. The p-dopant may include at least one of metal halide compounds, quinone derivatives, metal oxides, and cyano group-containing compounds, without limitation. For example, the p-dopant may include metal halide compounds such as CuI and RbI, quinone derivatives such as tetracyanoquinodimethane (TCNQ) and 2,3,5,6-tetrafluoro-7,7',8,8-tetracyanoquinodimethane (F4-TCNQ), metal oxides such as tungsten oxide and molybdenum oxide, cyano group-containing compounds such as dipyrazino[2,3-f: 2',3'-h] quinoxaline-2,3,6,7,10,11-hexacarbonitrile (HATCN) and 4-[[2,3-bis[cyano-(4-cyano-2,3,5,6-tetrafluorophenyl)methylidene]cyclopropylidene]-cyanomethyl]-2,3,5,6-tetrafluorobenzonitrile (NDP9), etc., without limitation.

As described above, the hole transport region HTR may further include at least one of a buffer layer (not shown) or an electron blocking layer EBL, in addition to the hole injection layer HIL and the hole transport layer HTL. The buffer layer (not shown) may compensate for a resonance distance according to a wavelength of light emitted from an emission layer EML and may increase emission efficiency. As materials included in the buffer layer (not shown), materials which may be included in the hole transport region HTR may be used. The electron blocking layer EBL may block the injection of electrons from the electron transport region ETR to the hole transport region HTR.

The emission layer EML is provided on the hole transport region HTR. The emission layer EML may have a thickness in a range of about 100 Å to about 1,000 Å. For example, the emission layer EML may have a thickness in a range of about 100 Å to about 300 Å. The emission layer EML may be a layer formed of a single material, a layer formed of different materials, or a structure having multiple layers formed of different materials.

In the light emitting element ED according to an embodiment, the emission layer EML may include a polycyclic compound represented by Formula 1:

[Formula 1]

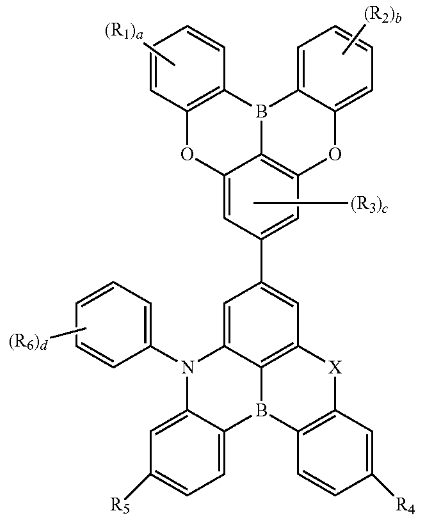

In Formula 1, a and b may each independently be an integer from 0 to 4. If a is 2 or more, multiple $R_1$ groups may be all the same, or at least one may be different from the remainder. If b is 2 or more, multiple $R_2$ groups may be all the same, or at least one may be different from the remainder.

In Formula 1, c may be an integer from 0 to 2. If c is 2, two $R_3$ groups may be the same as or different from each other. In Formula 1, d may be an integer from 0 to 5. If d is 2 or more, multiple $R_6$ groups may be all the same, or at least one may be different from the remainder.

In Formula 1, X may be $N(R_x)$, O, or S; and $R_x$, $R_1$ to $R_3$, and $R_6$ may each independently be a deuterium atom, a substituted or unsubstituted alkyl group of 1 to 20 carbon atoms, a substituted or unsubstituted alkenyl group of 2 to 20 carbon atoms, a substituted or unsubstituted aryl group of 6 to 30 ring-forming carbon atoms, or a substituted or unsubstituted heteroaryl group of 2 to 30 ring-forming carbon atoms, or may be combined with an adjacent group to form a ring.

In Formula 1, $R_4$ and $R_5$ may each independently be a substituted or unsubstituted amine group, or a substituted or unsubstituted carbazole group. $R_4$ and $R_5$ may be the same as or different from each other.

In an embodiment, in Formula 1, $R_4$ and $R_5$ may each independently be a group represented by Formula A-1 or Formula A-2:

[Formula A-1]

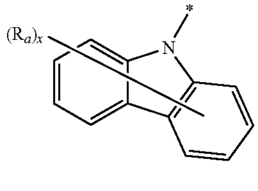

-continued

[Formula A-2]

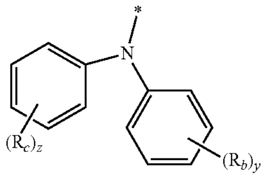

In Formula A-1, x may be an integer from 0 to 8. If x is 2 or more, multiple $R_a$ groups may be all the same, or at least one may be different from the remainder. In Formula A-1, $R_a$ may be a deuterium atom, a substituted or unsubstituted aryl group of 6 to 20 ring-forming carbon atoms, a substituted or unsubstituted alkyl group of 1 to 6 carbon atoms, or a cyano group.

In Formula A-2, y and z may each independently be an integer from 0 to 5. If y is 2 or more, multiple $R_b$ groups may be all the same, or at least one may be different from the remainder. If z is 2 or more, multiple $R_c$ groups may be all the same, or at least one may be different from the remainder. In Formula A-2, $R_b$ and $R_c$ may each independently be a deuterium atom, or a substituted or unsubstituted alkyl group of 1 to 6 carbon atoms. $R_b$ and $R_c$ may be the same as or different from each other.

In an embodiment, the group represented by Formula A-1 may be represented by any one of Formulas A1 to A6:

A1

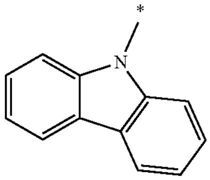

A2

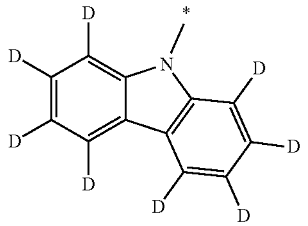

A3

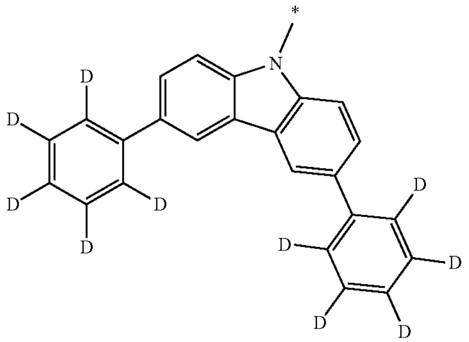

-continued

A4

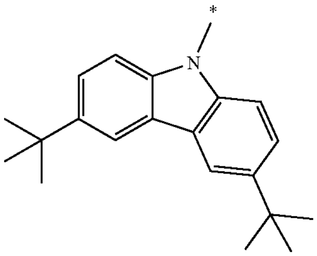

A5

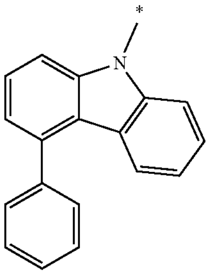

A6

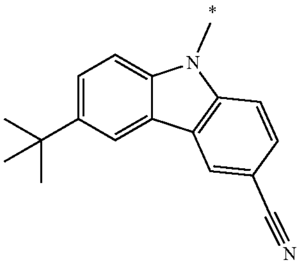

In Formulas A1 to A6, —* indicates a bonding site of $R_4$ or $R_5$ to Formula 1.

In an embodiment, the group represented by Formula A-2 may be represented by any one of Formulas A7 to A9:

A7

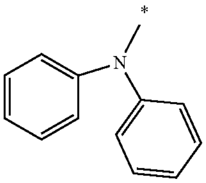

A8

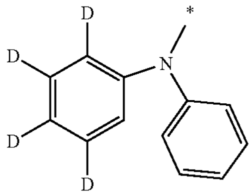

-continued
A9
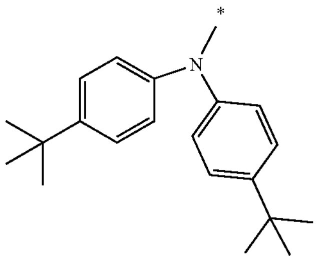
In Formulas A7 to A9, ——— * indicates a bonding site of $R_4$ or $R_5$ to Formula 1.
In an embodiment, in Formula 1, $R_1$ and $R_2$ may each independently be a group represented by any one of Formulas B1 to B18:
B1
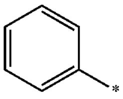
B2
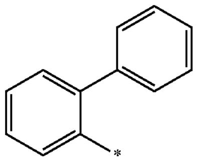
B3
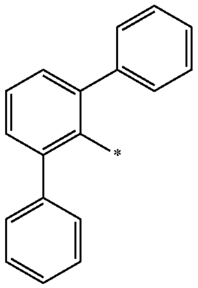
B4
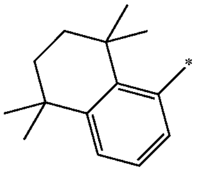
B5
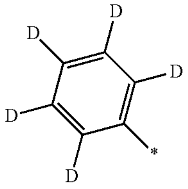
B6
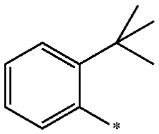
-continued
B7
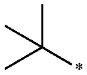
B8
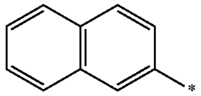
B9
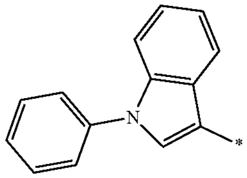
B10
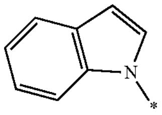
B11
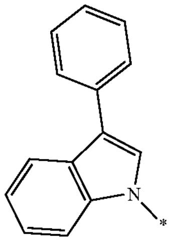
B12
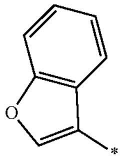
B13
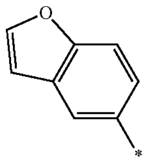
B14
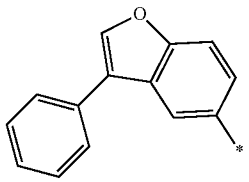
B15
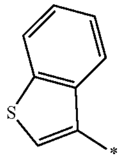

-continued

B16

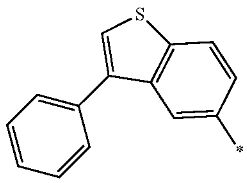

B17

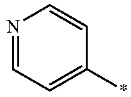

B18

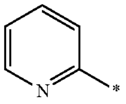

In Formulas B1 to B18, —— * indicates a bonding site of $R_1$ or $R_2$ to Formula 1.

In an embodiment, in Formula 1, $R_3$ may be a group represented by any one of Formulas C1 to C5:

C1

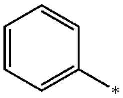

C2

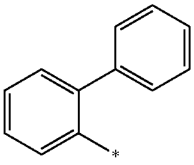

C3

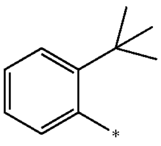

C4

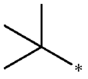

C5

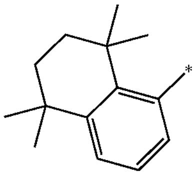

In Formulas C1 to C5, —— * indicates a bonding site of $R_3$ to Formula 1.

In an embodiment, in Formula 1, $R_6$ may be a group represented by any one of Formulas D1 to D3:

D1

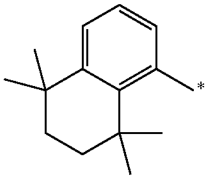

D2

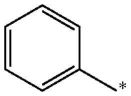

D3

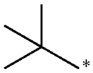

In Formulas D1 to D3, —— * indicates a bonding site of $R_6$ to Formula 1.

In an embodiment, the emission layer EML may include at least one compound selected from Compound Group 1:

[Compound Group 1]

1

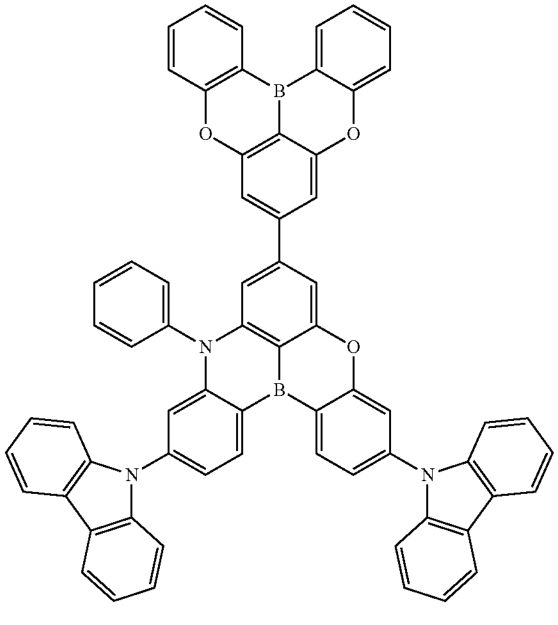

-continued
2
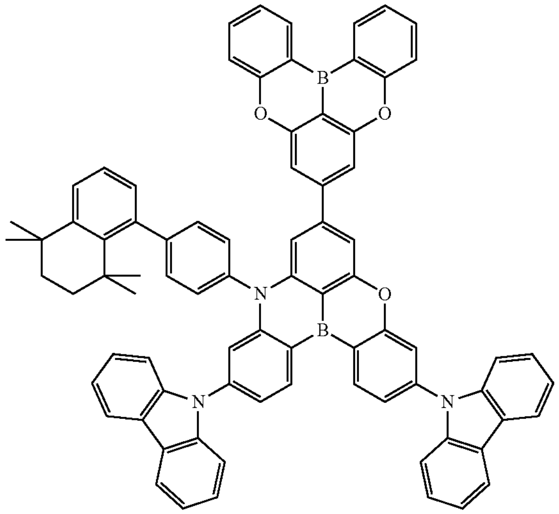
3
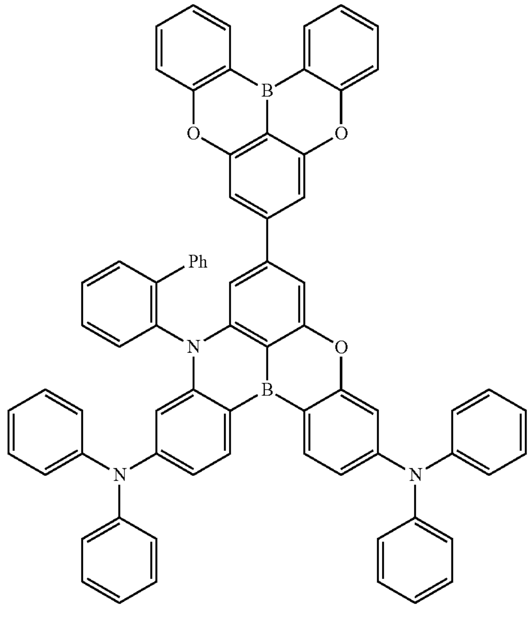
-continued
4
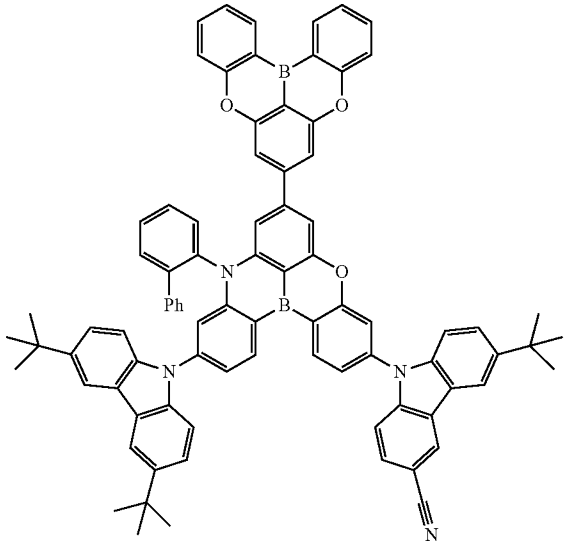
5
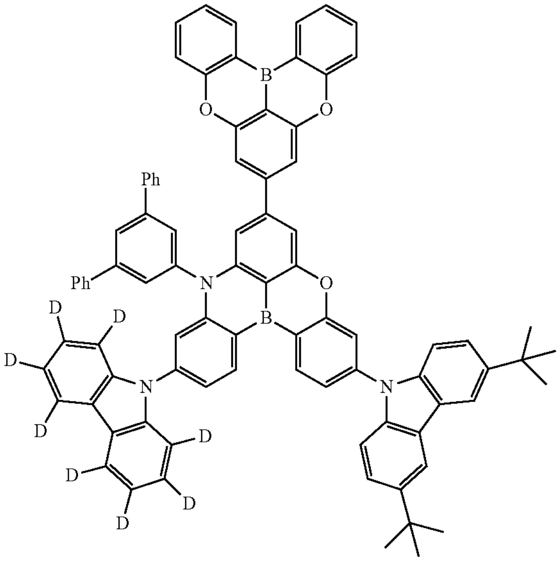

-continued
6
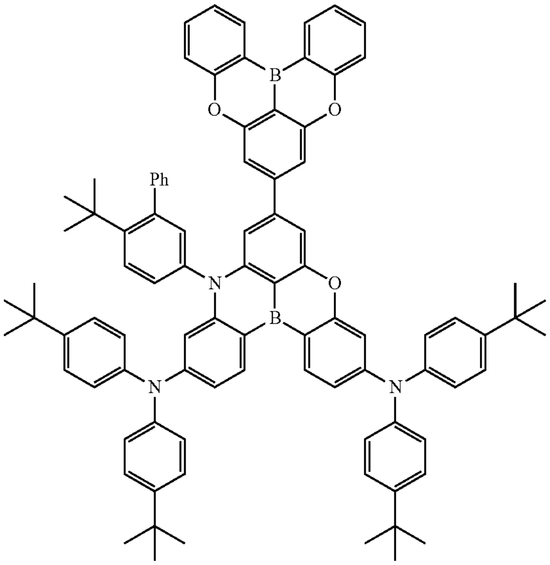
7
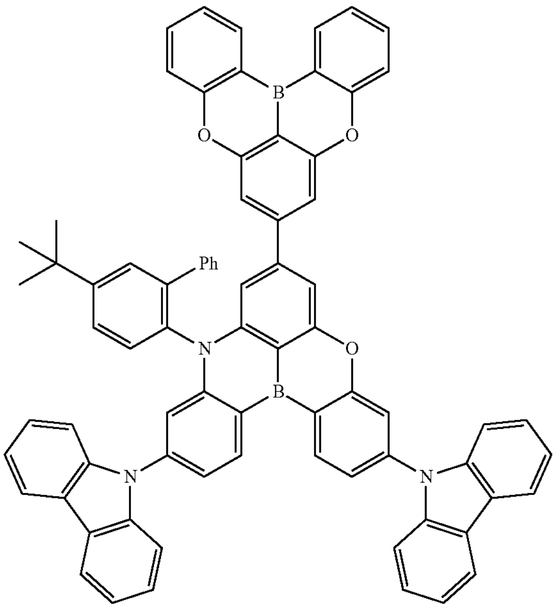
-continued
8
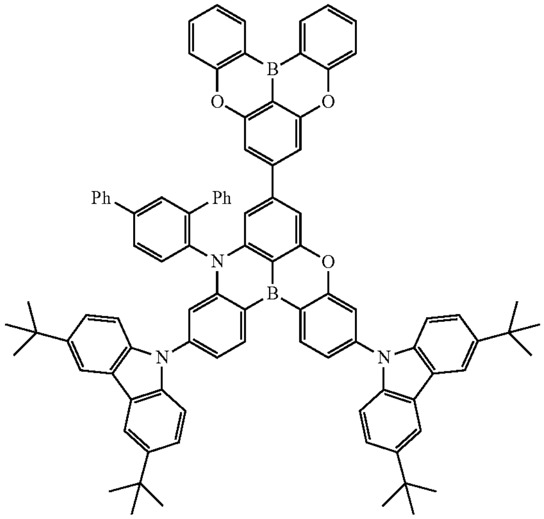
9
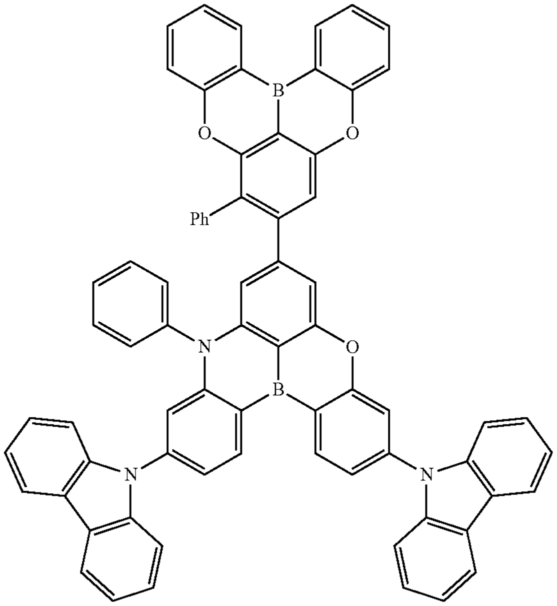

10
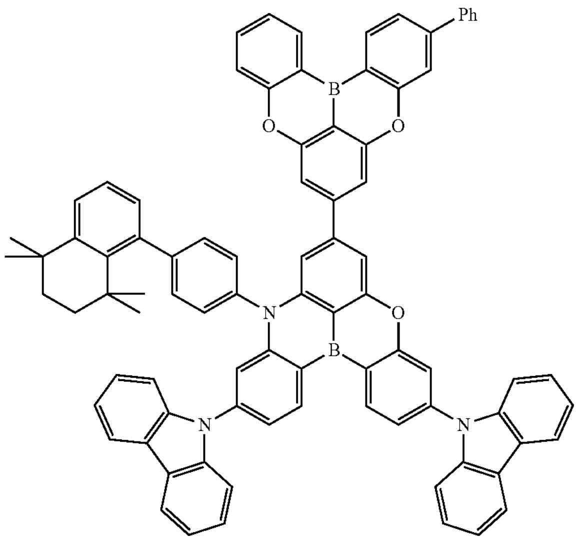
11
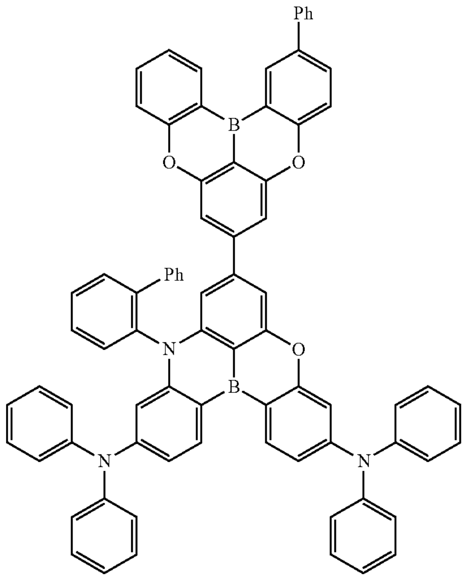
12
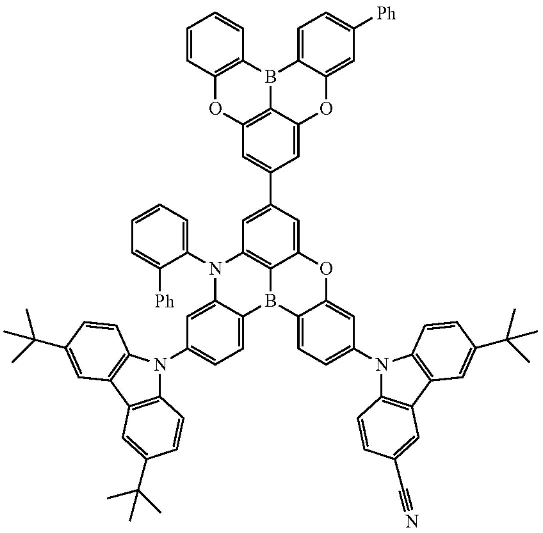
13
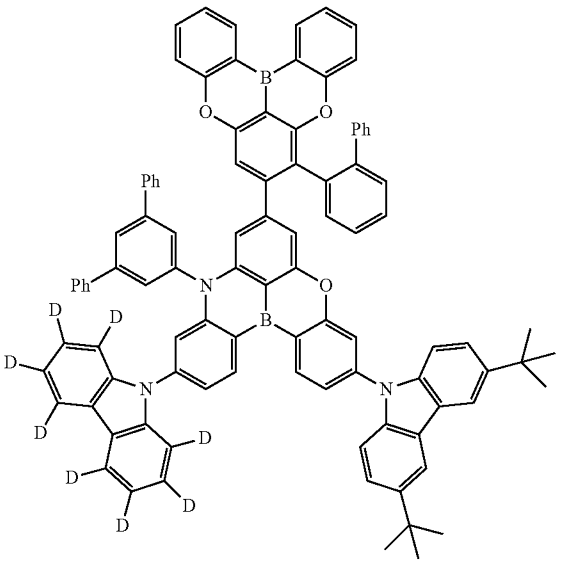

-continued
14
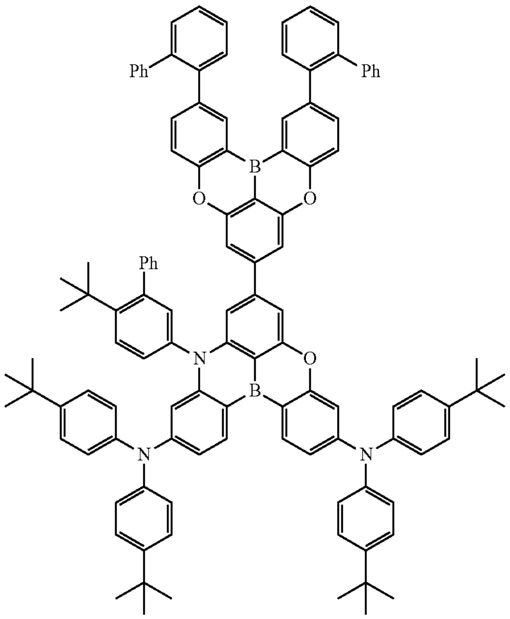
16
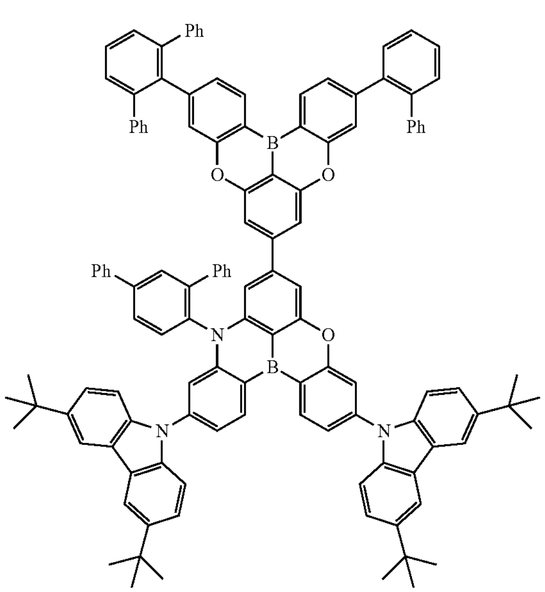
15
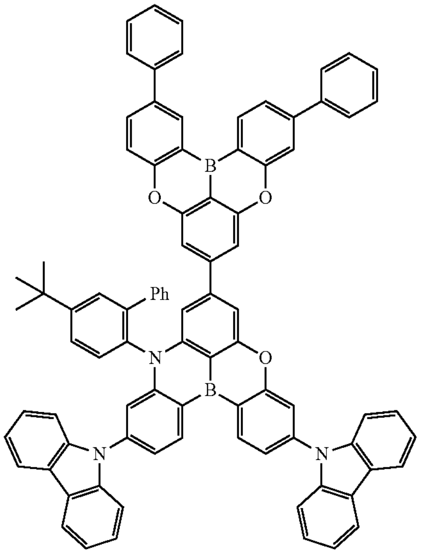
17
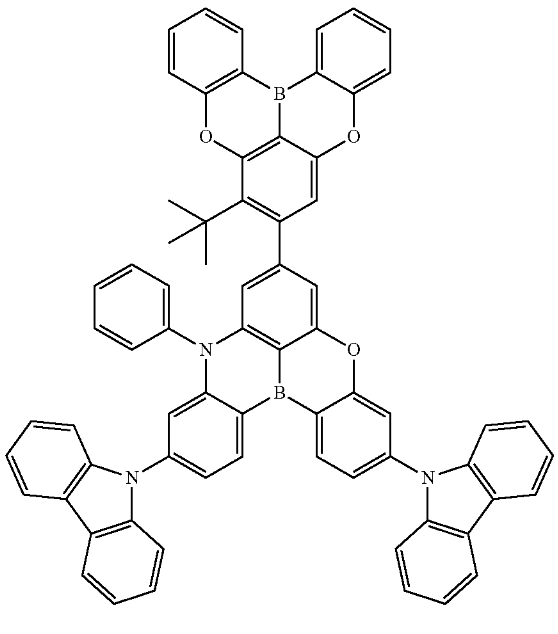

-continued
18
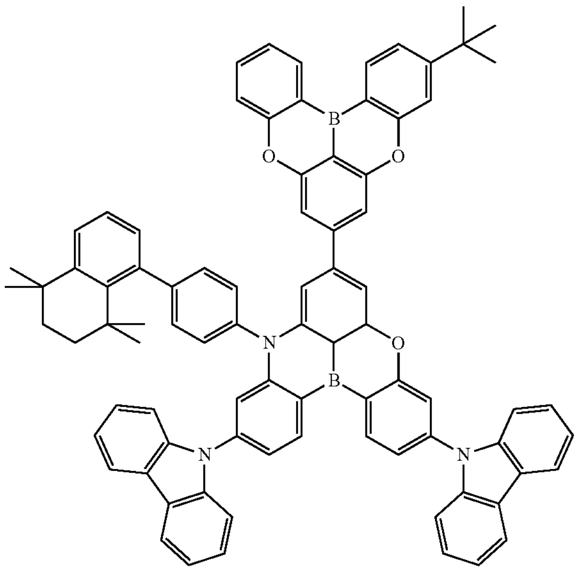
19
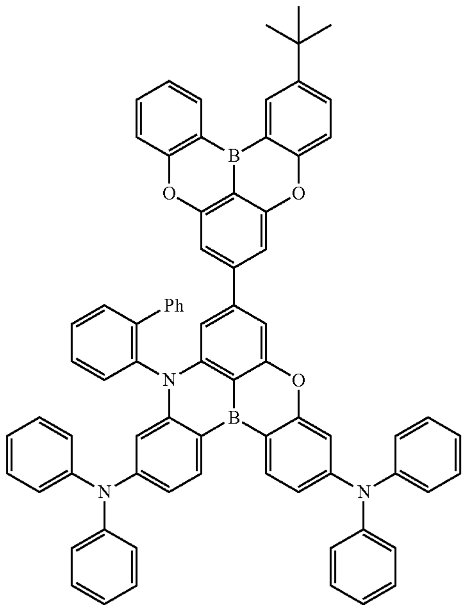
-continued
20
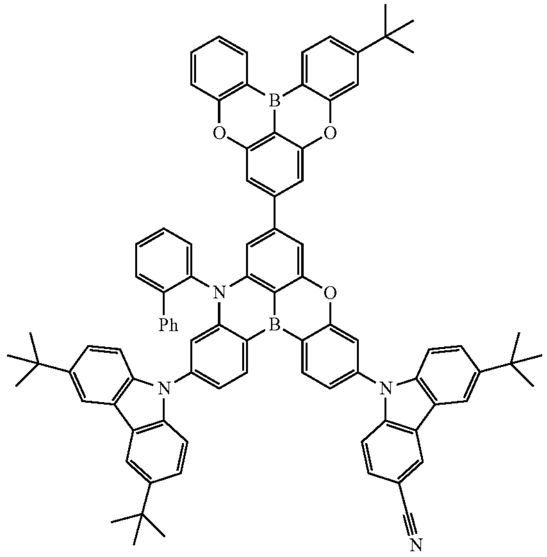
21
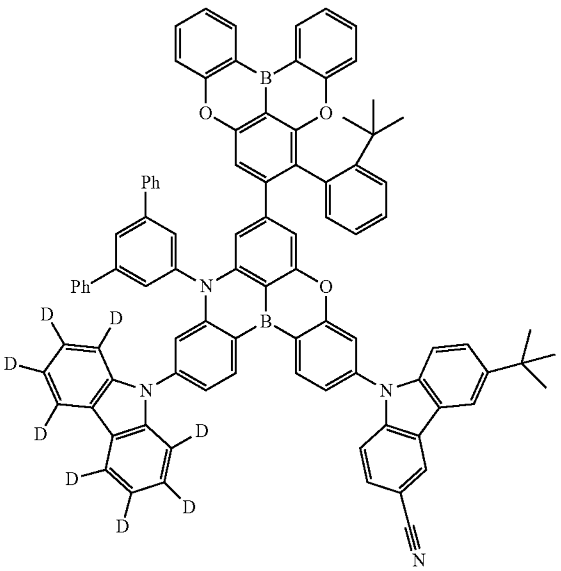

-continued
22
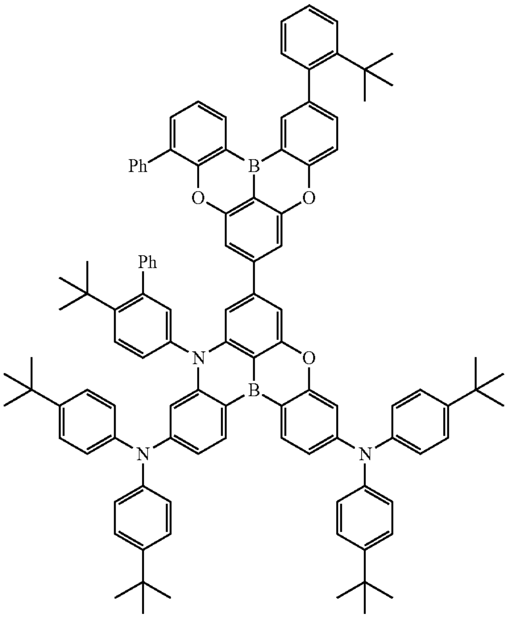
23
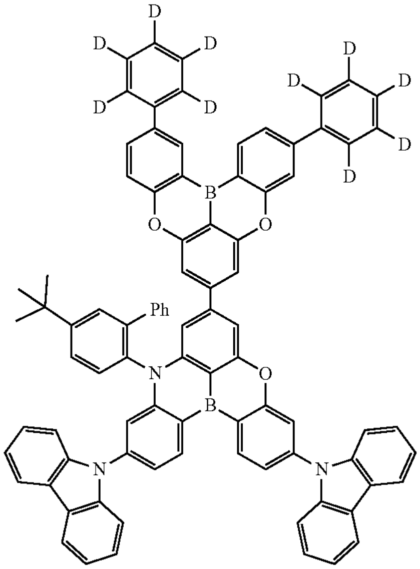
-continued
24
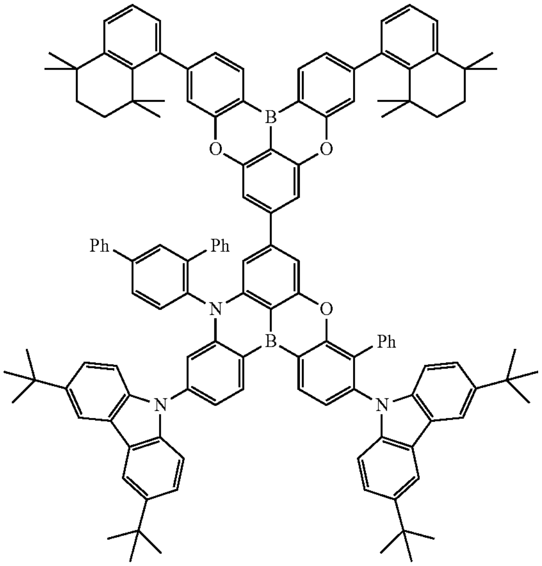
25
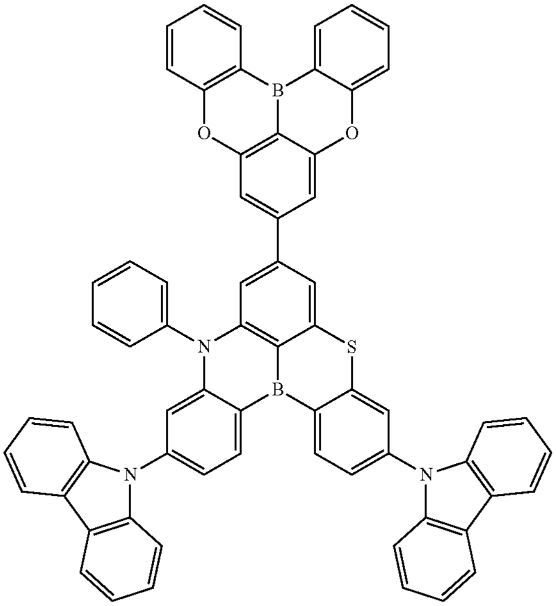

-continued
26
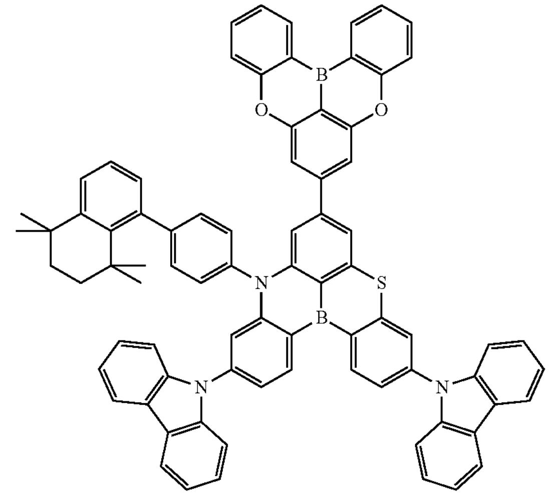
27
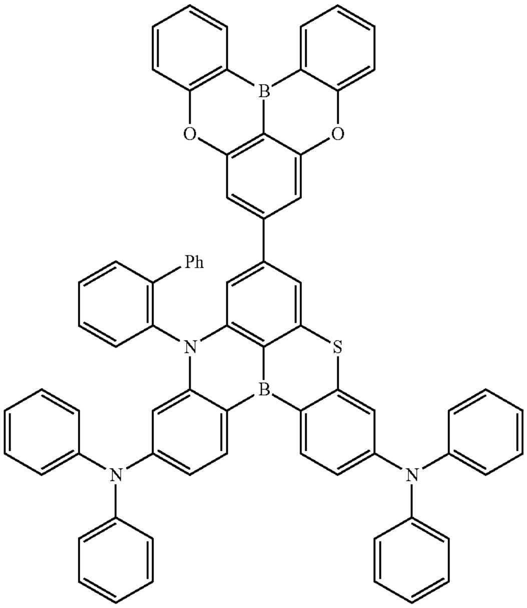
-continued
28
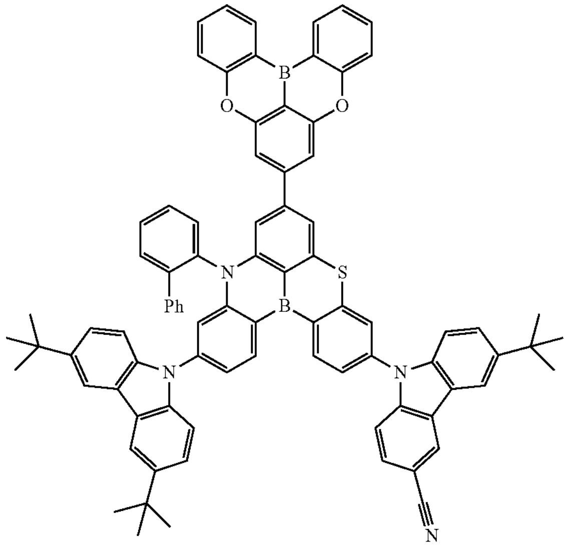
29
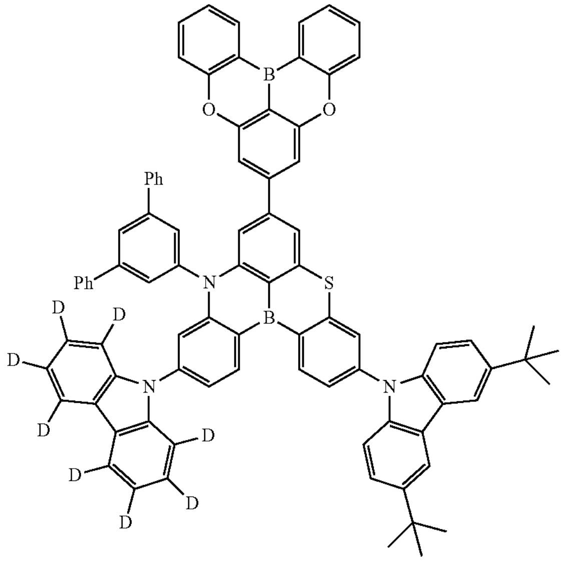

-continued
30
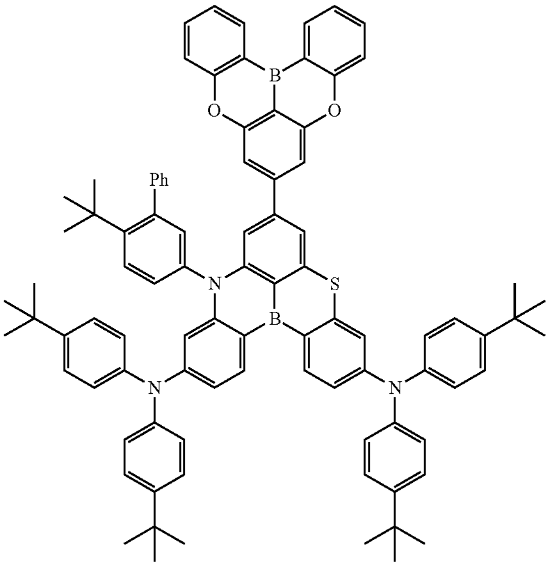
31
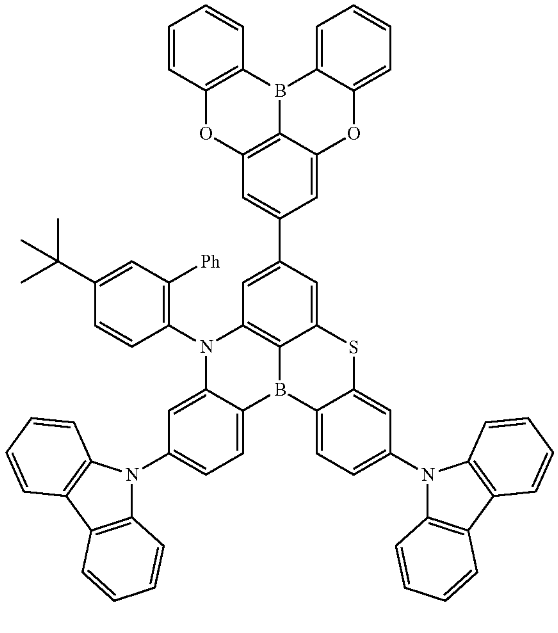
-continued
32
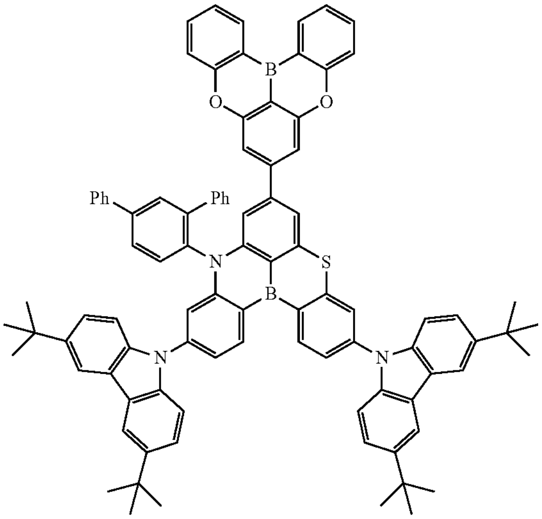
33
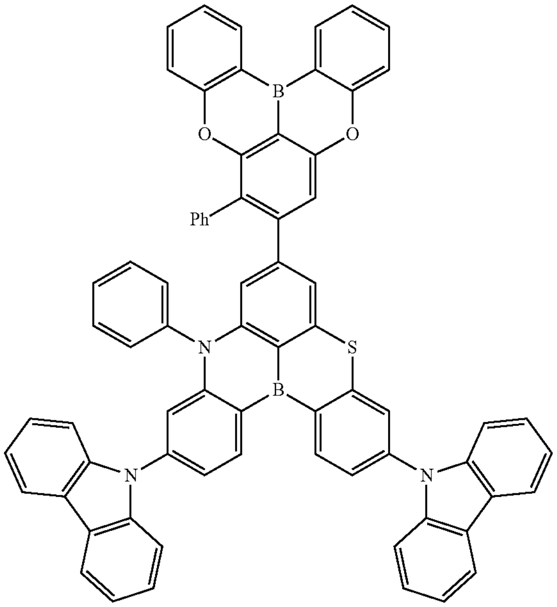
34
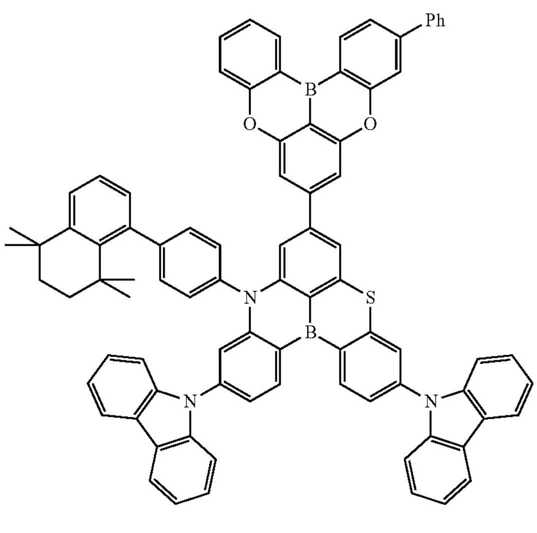

-continued
35
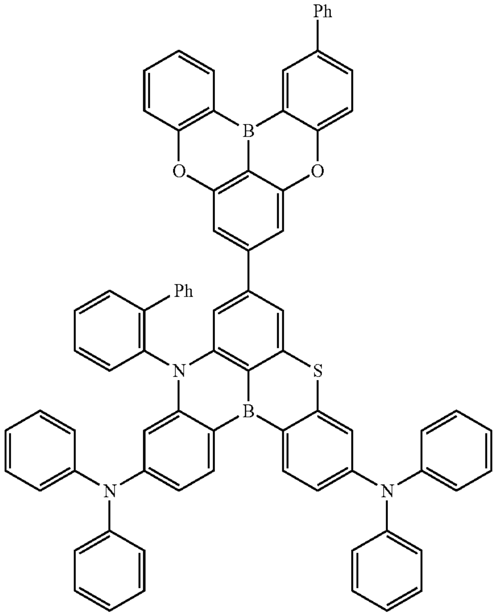
36
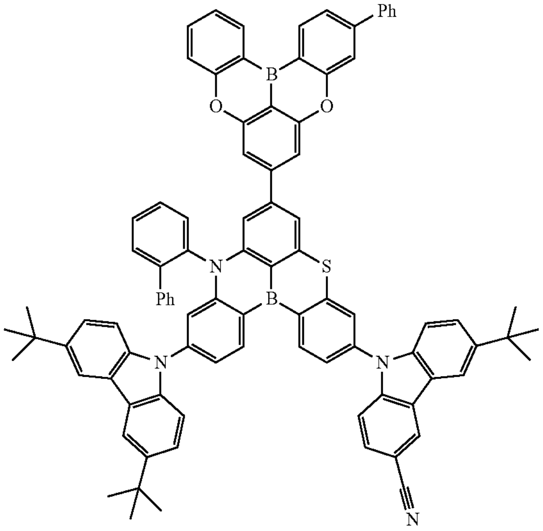
-continued
37
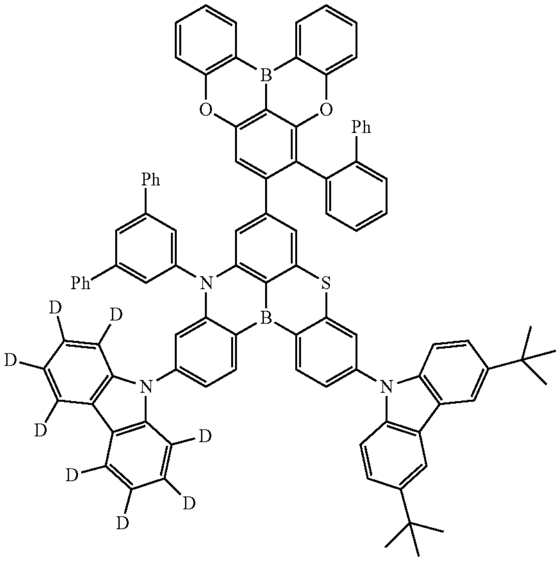
38
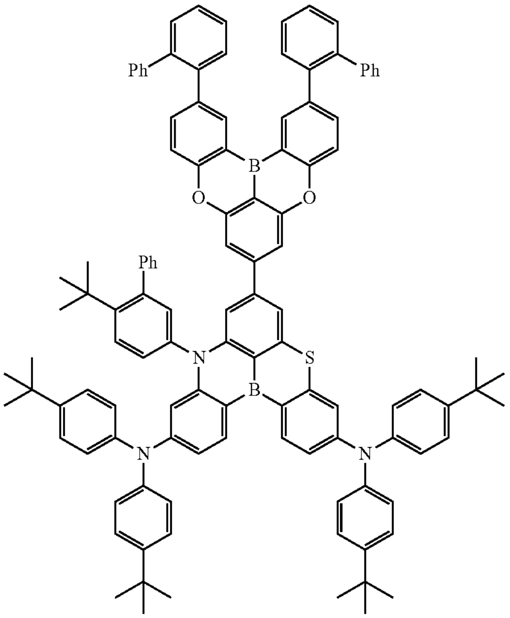

-continued
39
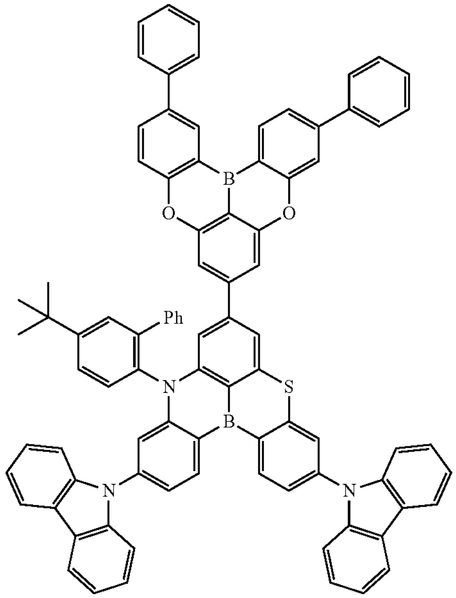
40
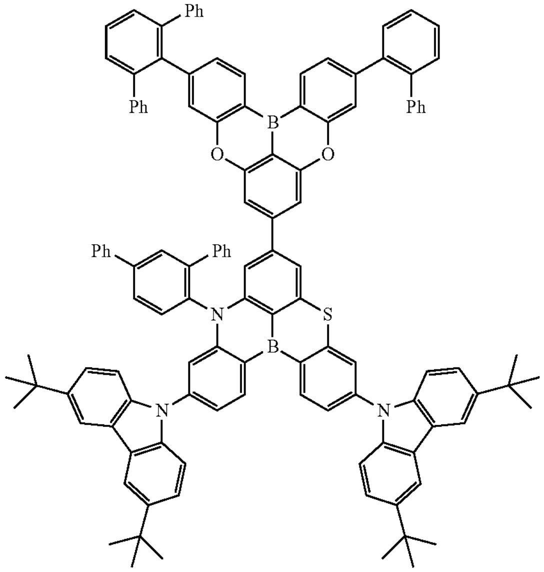
-continued
41
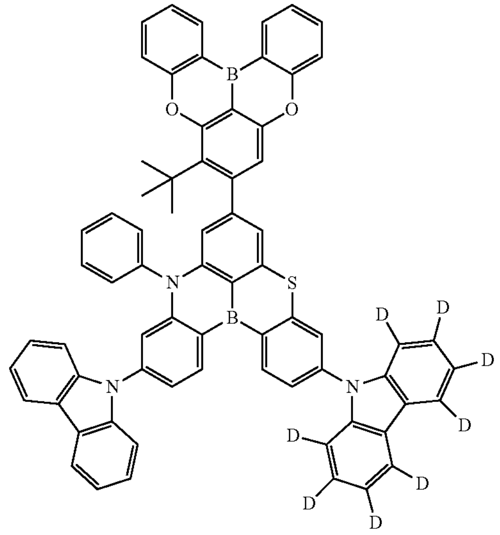
42
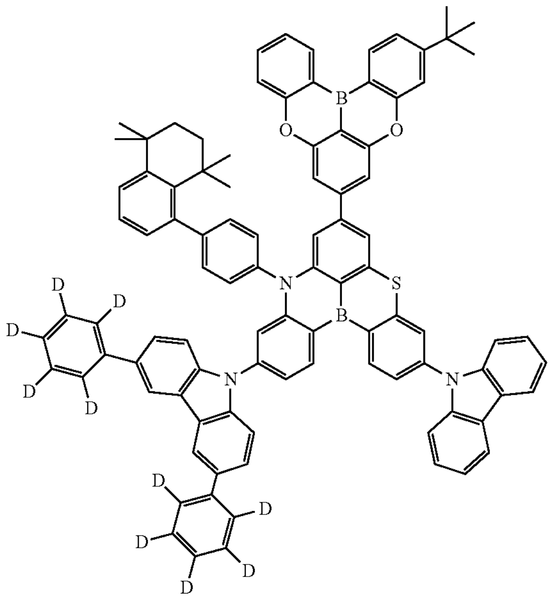

-continued
43
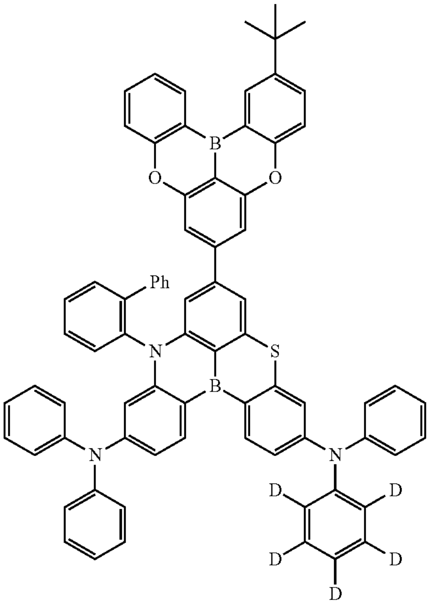
-continued
45
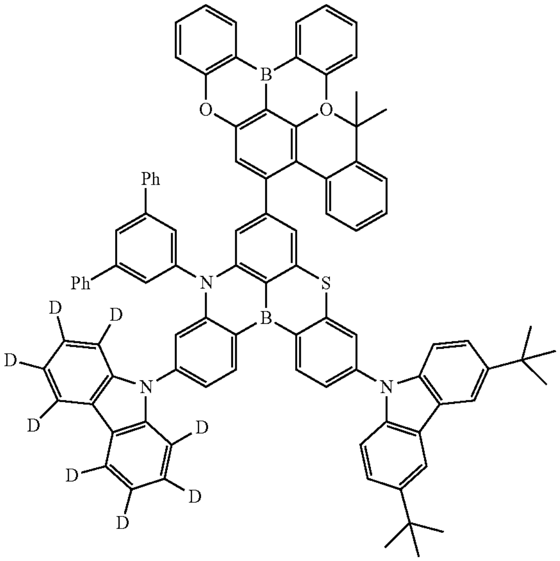
44
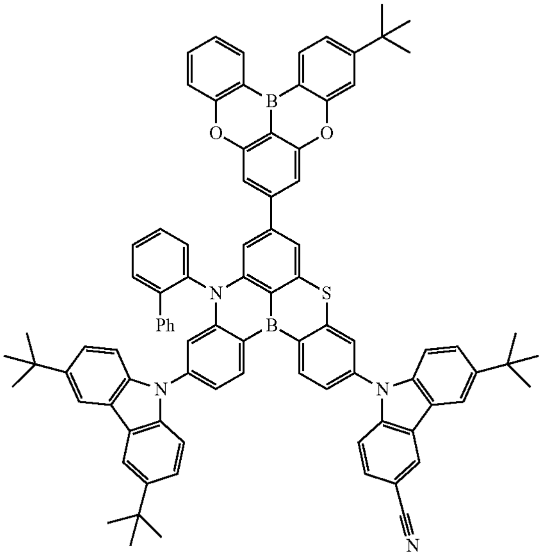
46
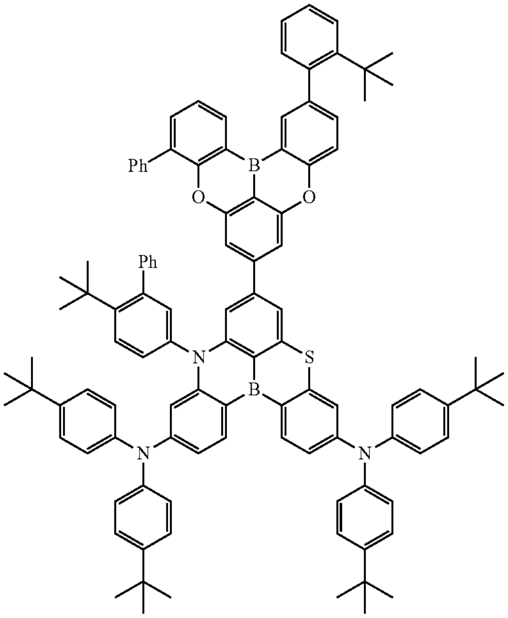

-continued
47
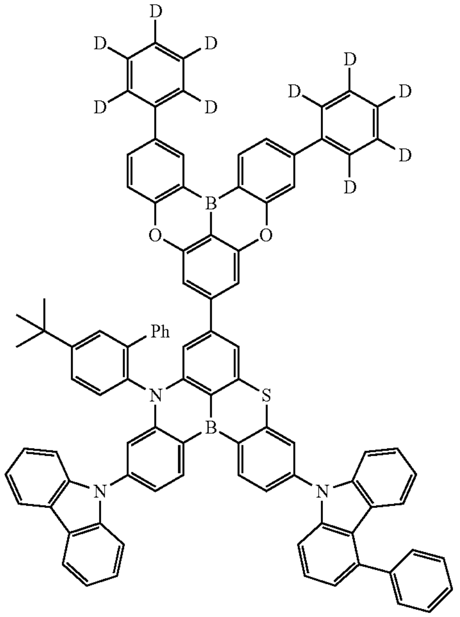
48
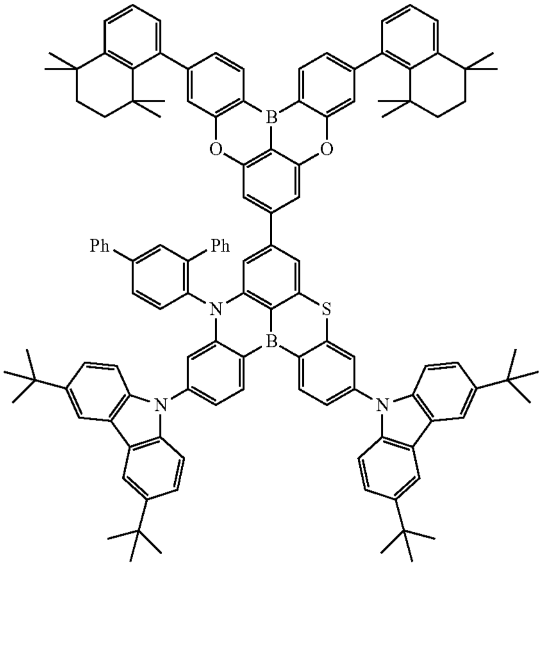
-continued
49
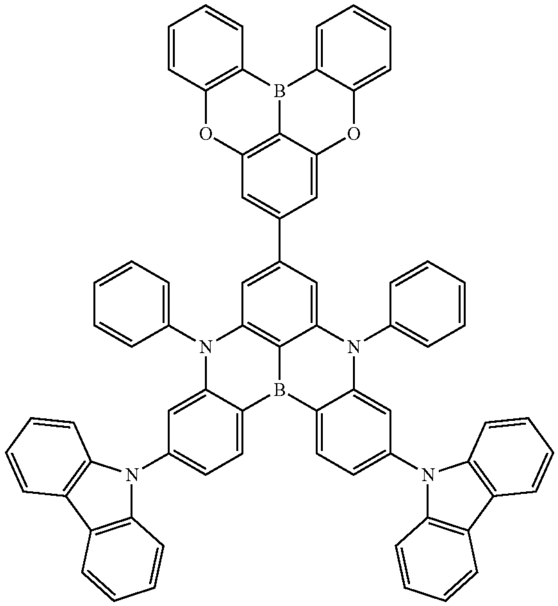
50
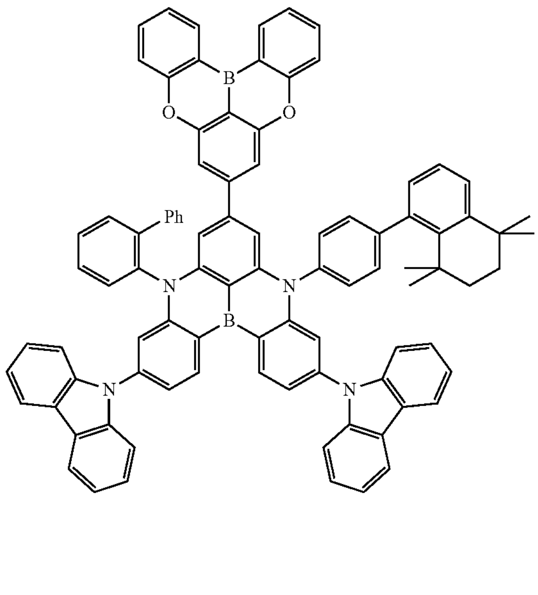

-continued
51
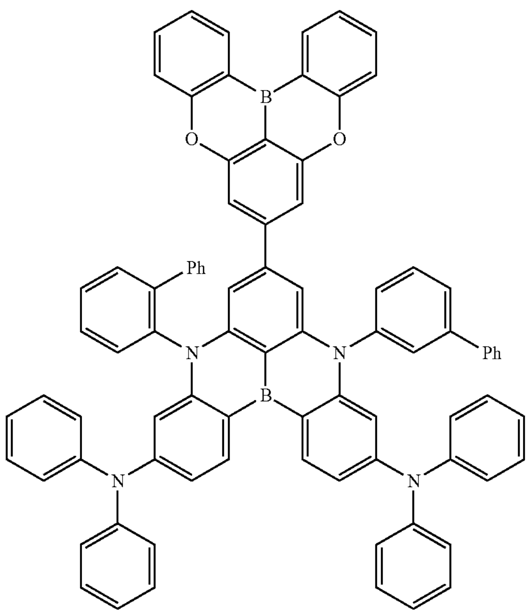
52
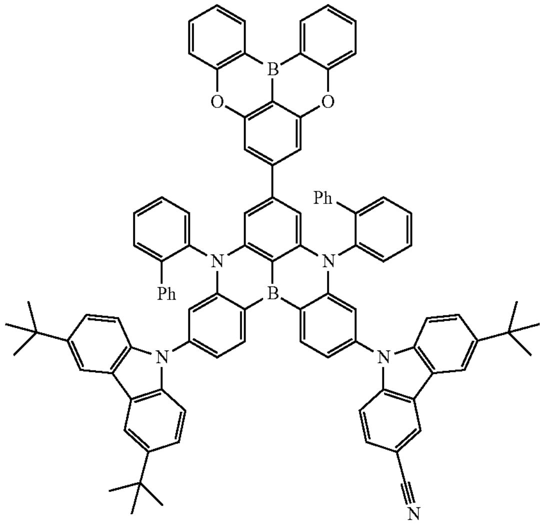
-continued
53
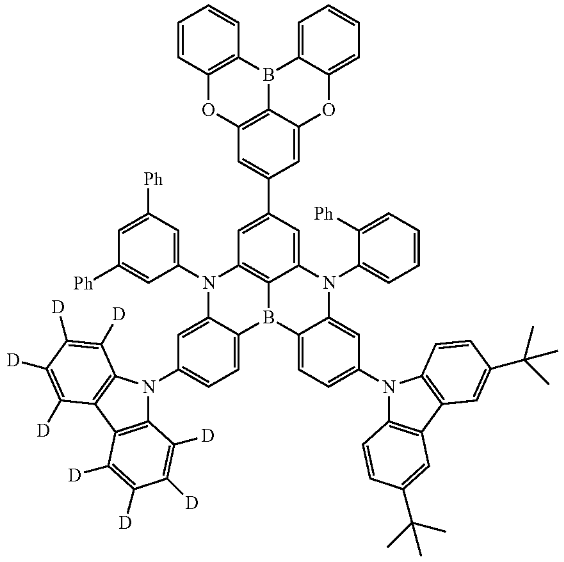
54
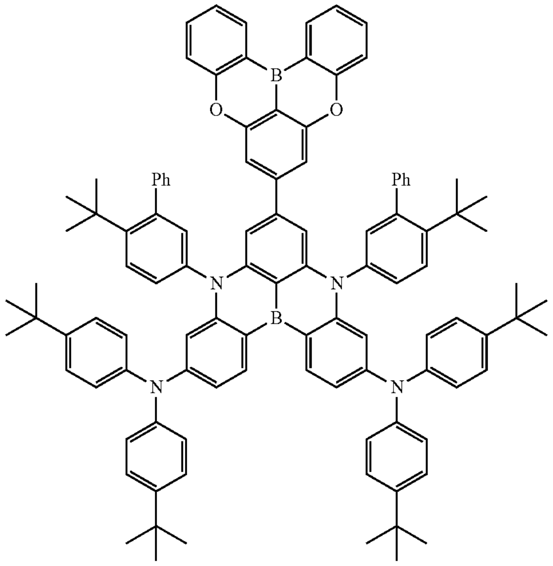

-continued
55
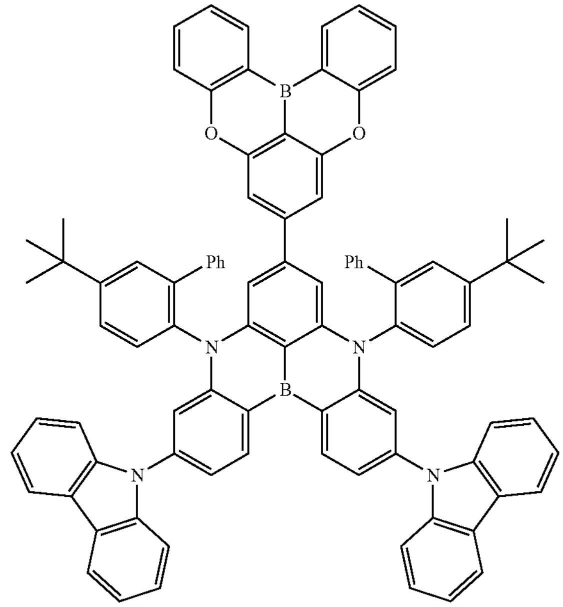
56
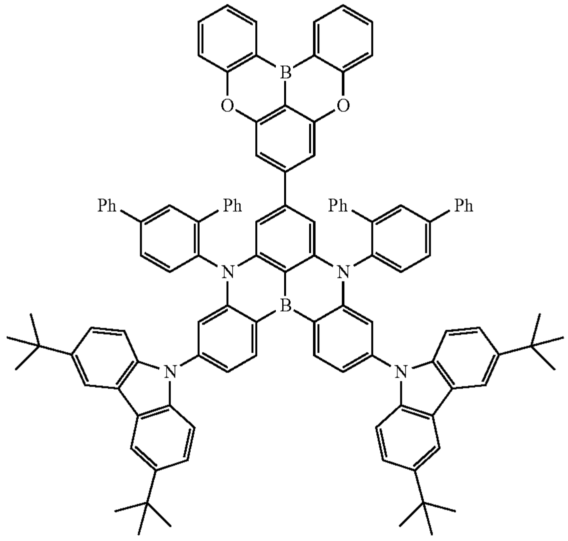
-continued
57
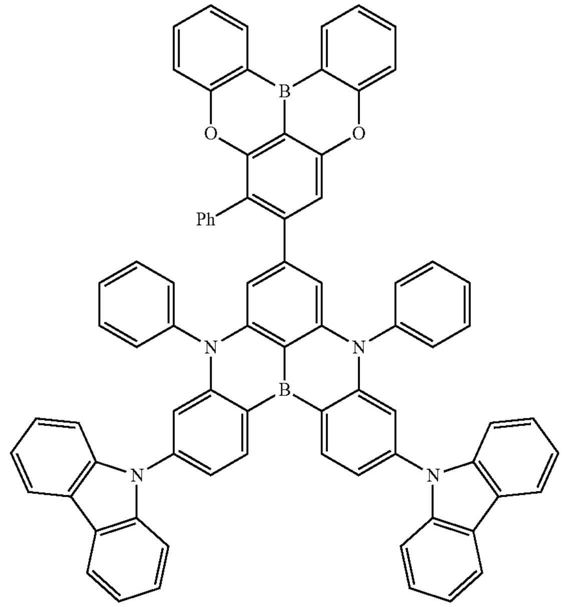
58
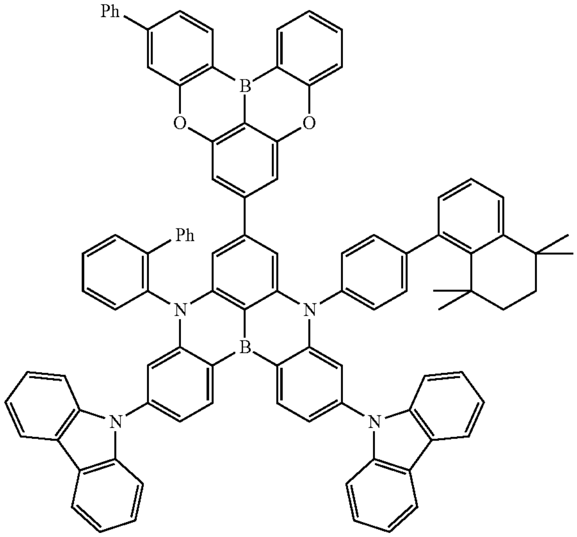

-continued
59
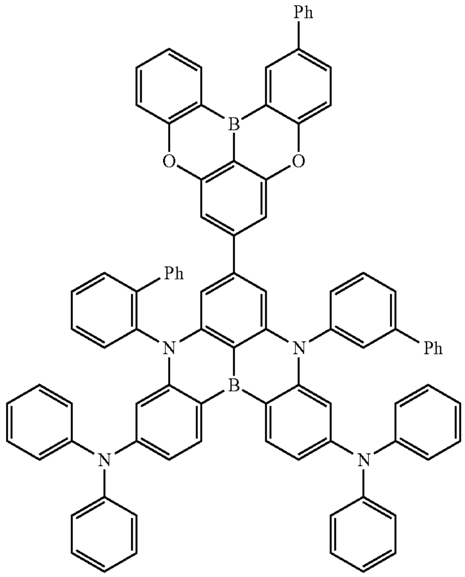
60
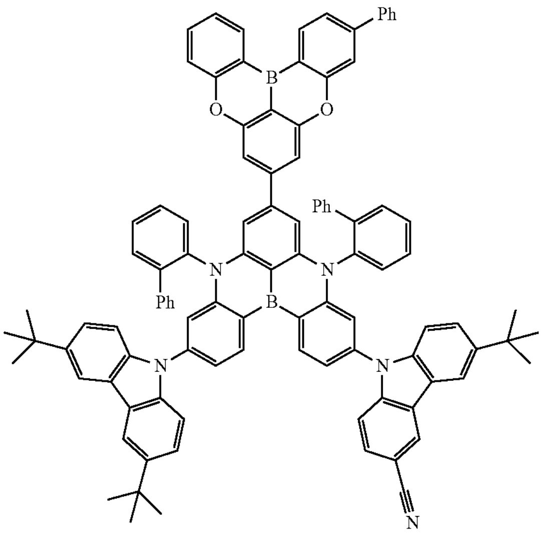
-continued
61
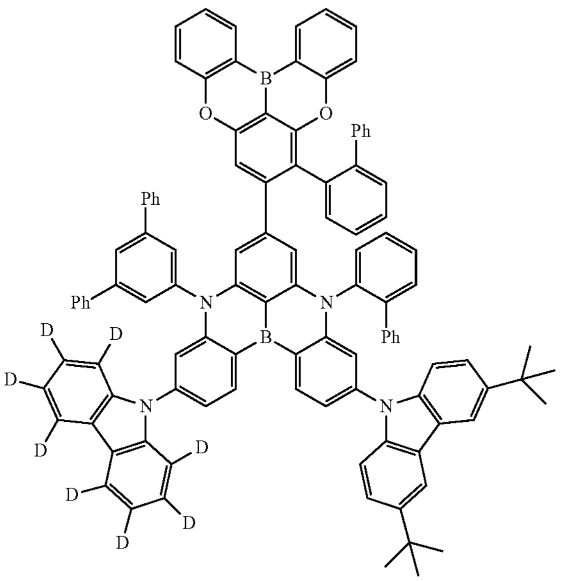
62
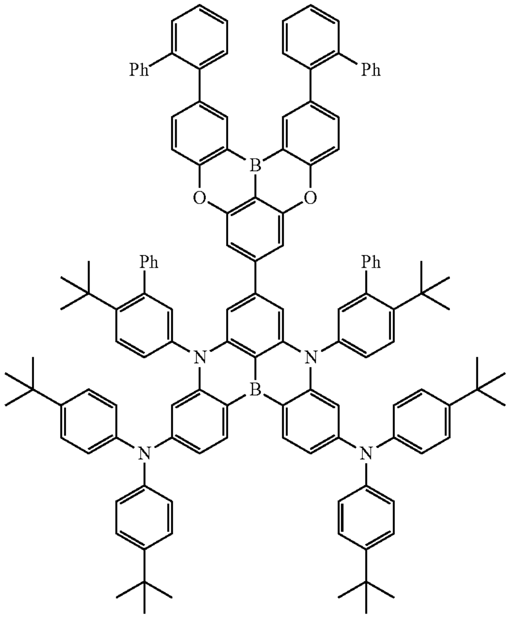

-continued
63
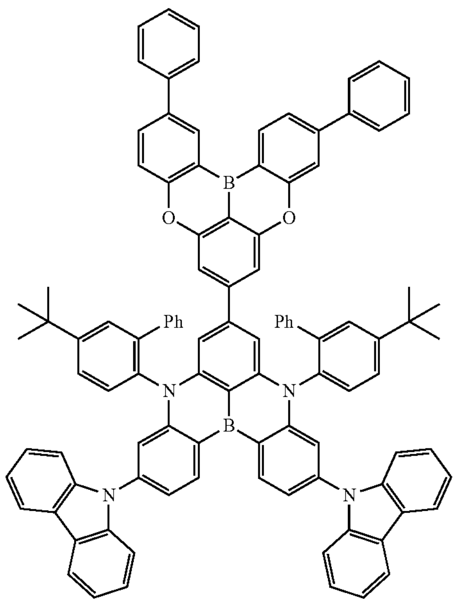
64
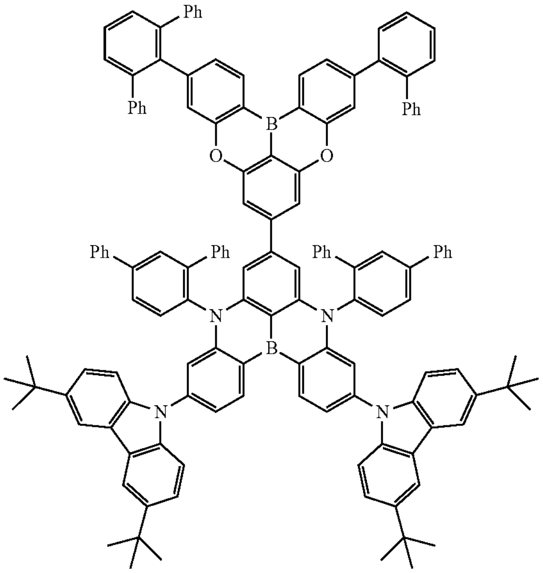
-continued
65
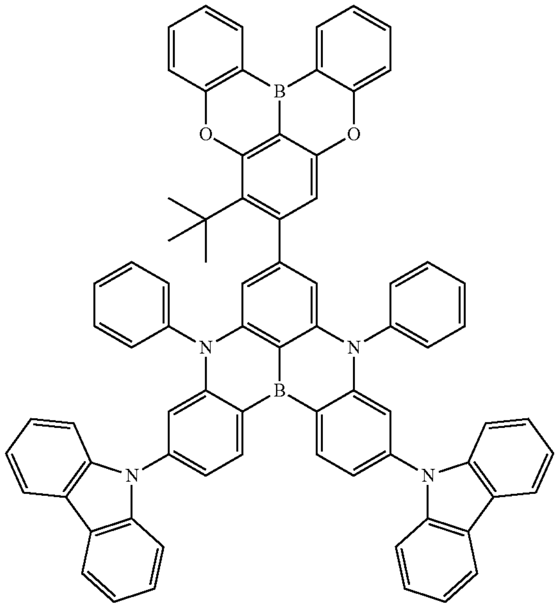
66
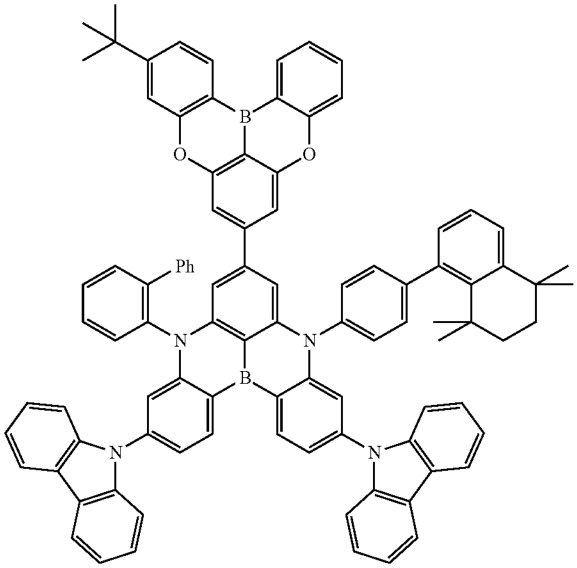

-continued
67
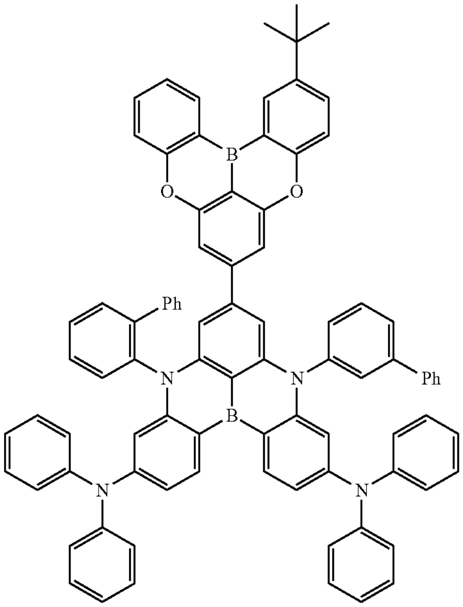
68
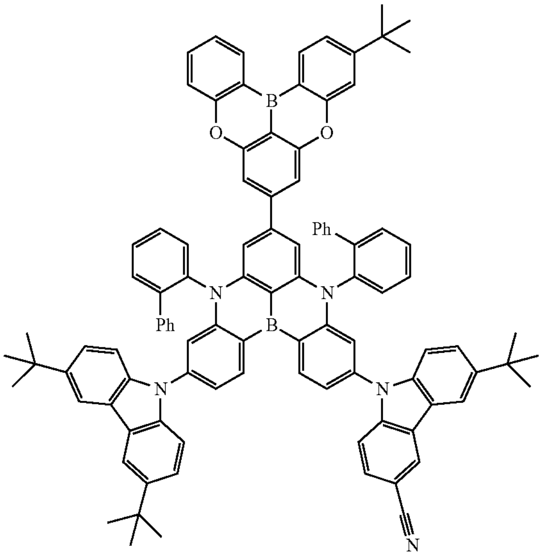
-continued
69
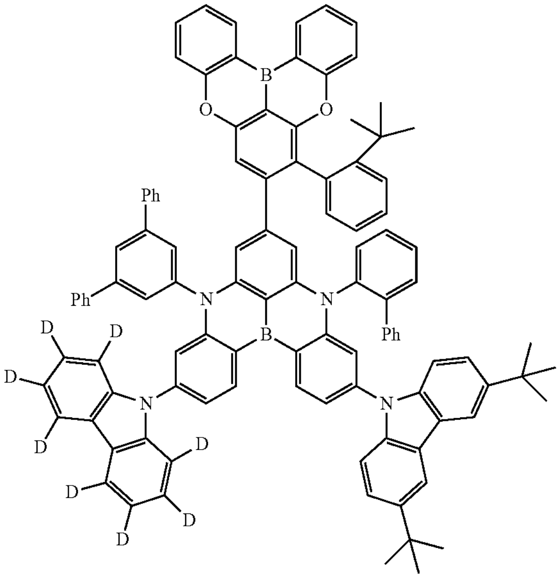
70
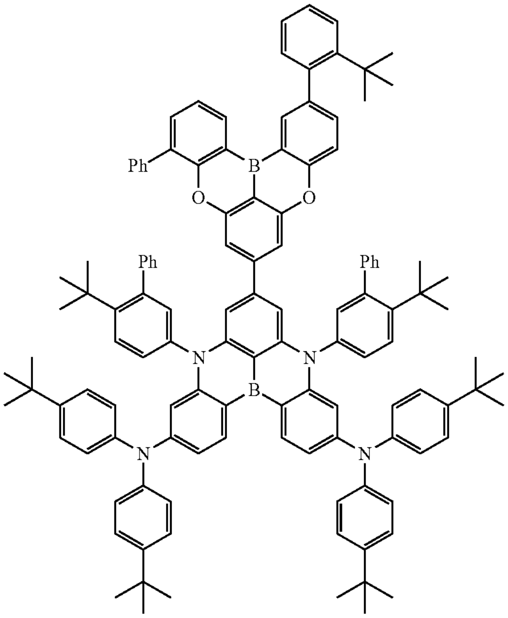

-continued
71
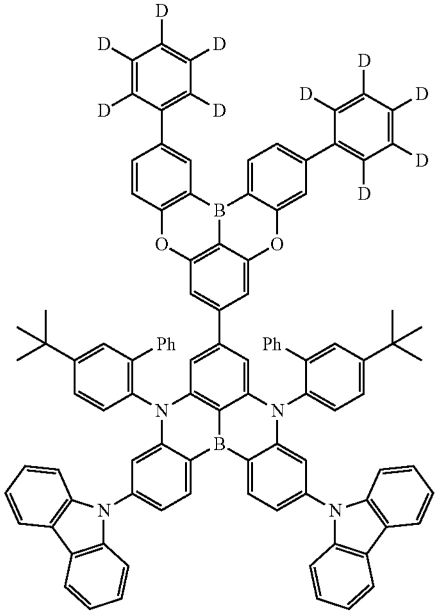
72
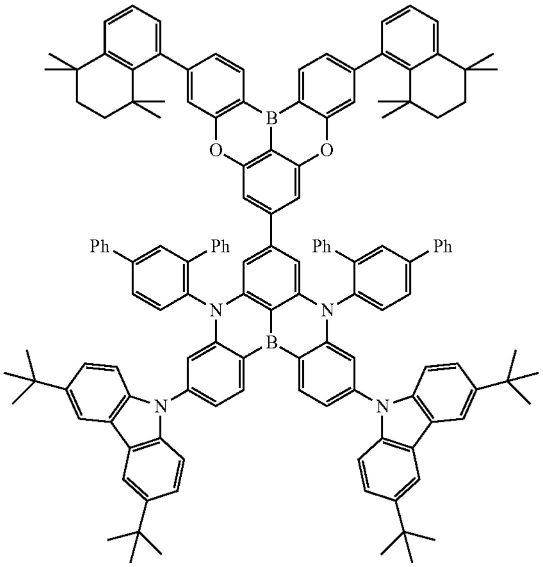
-continued
73
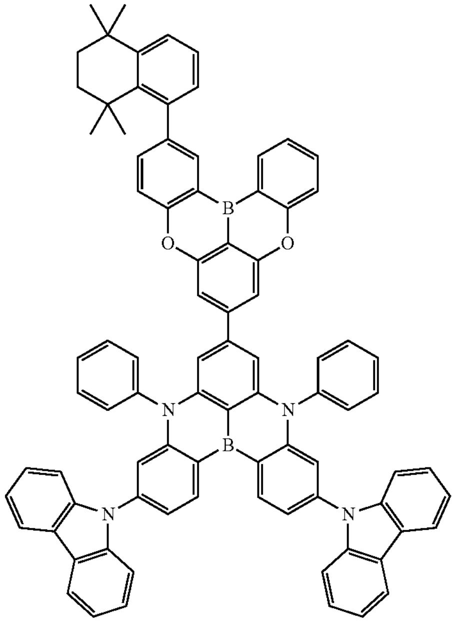
74
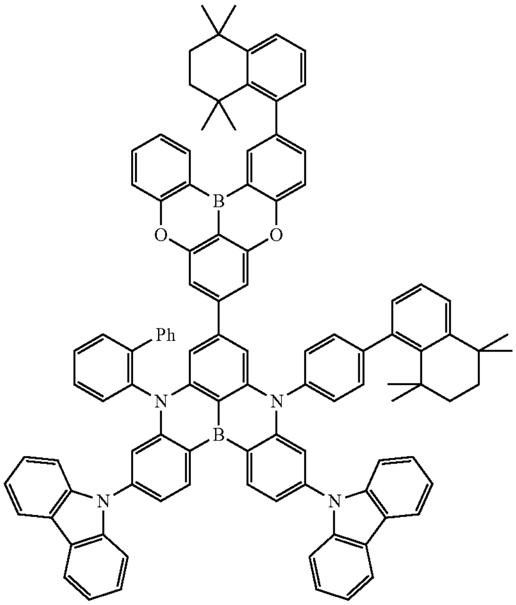

-continued
75
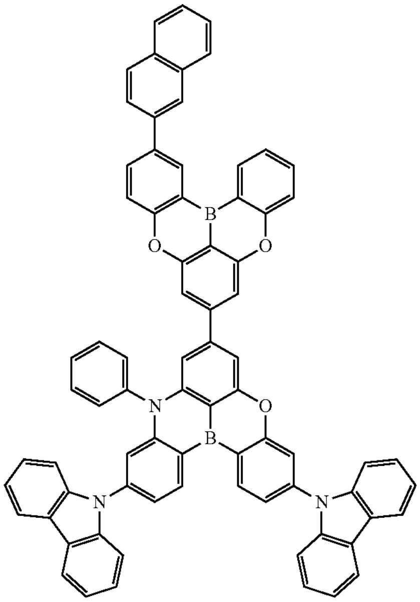
76
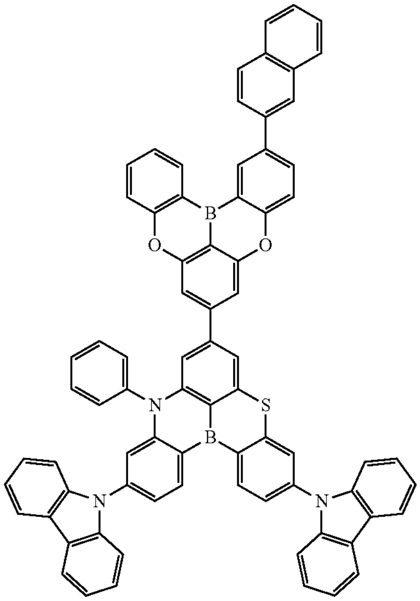
-continued
77
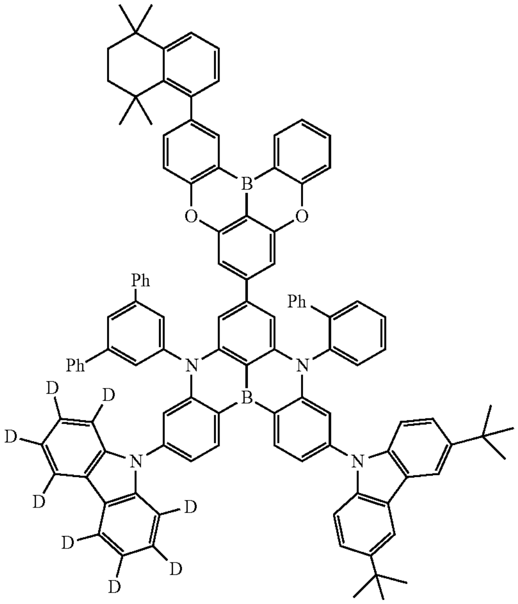
78
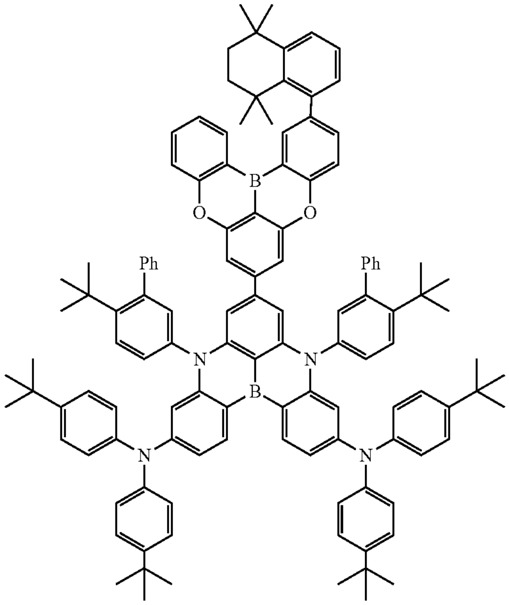

79
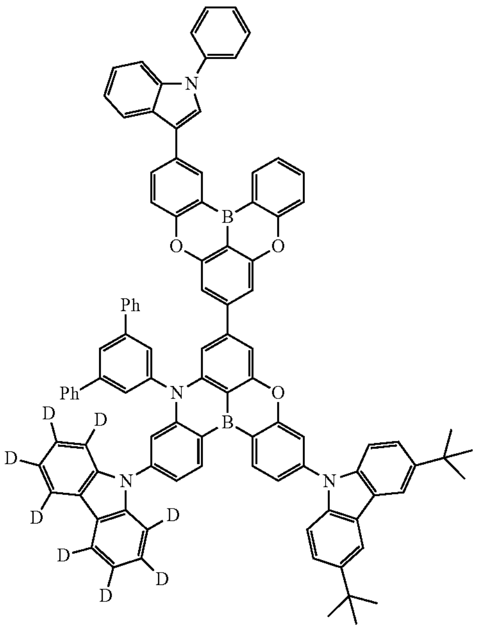
80
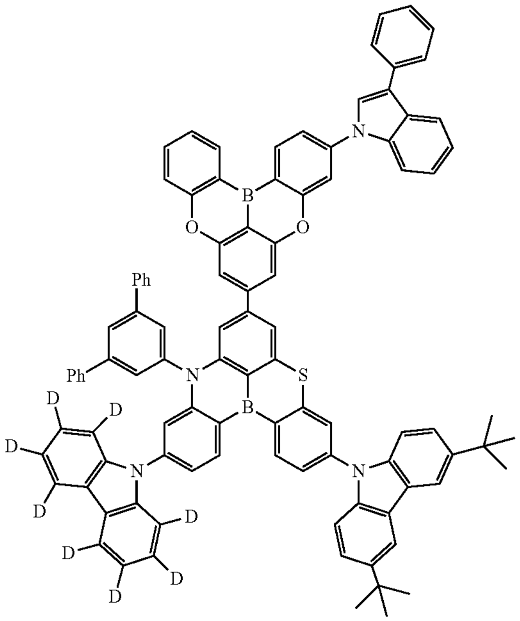
81
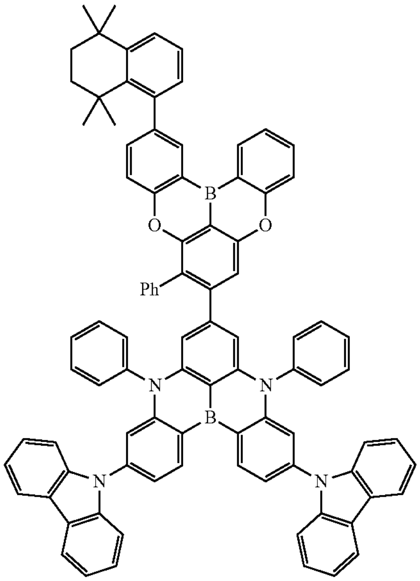
82
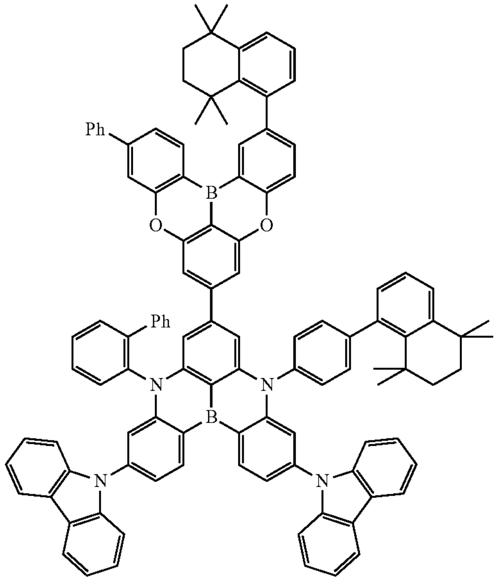

-continued
83
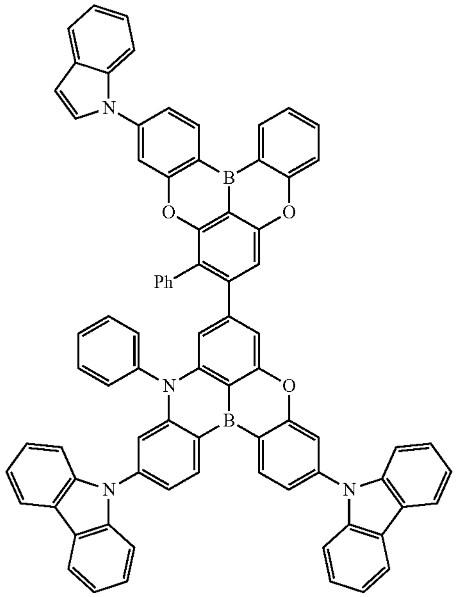
84
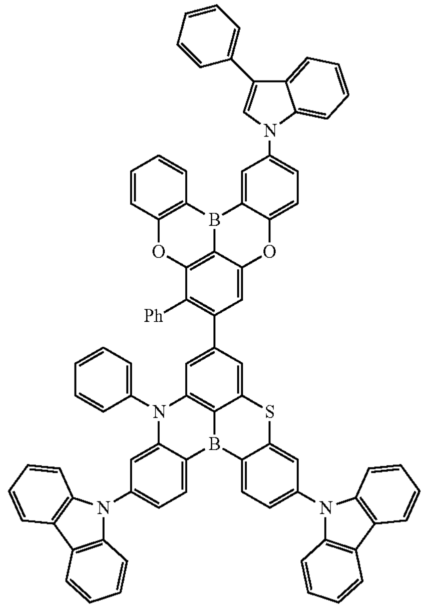
-continued
85
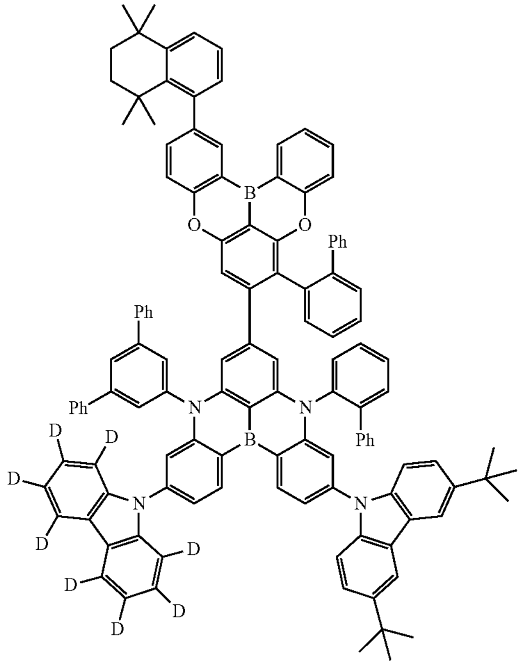
86
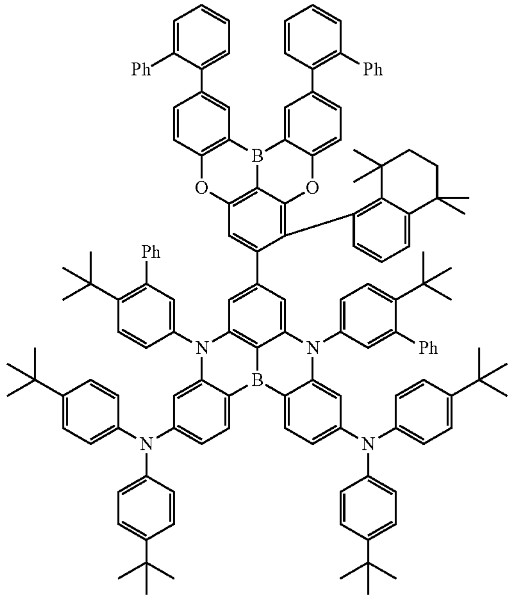

-continued
87
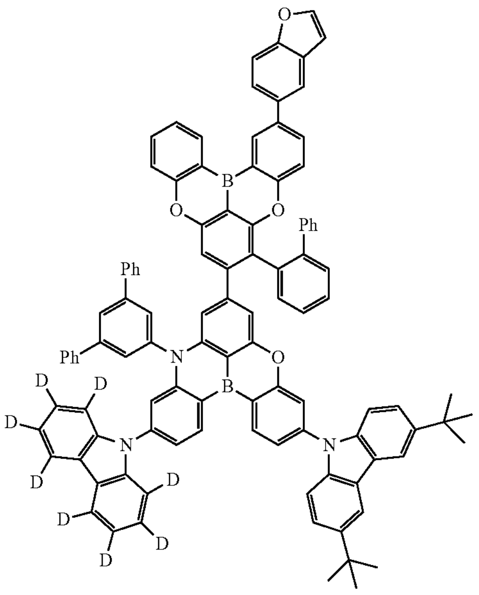
88
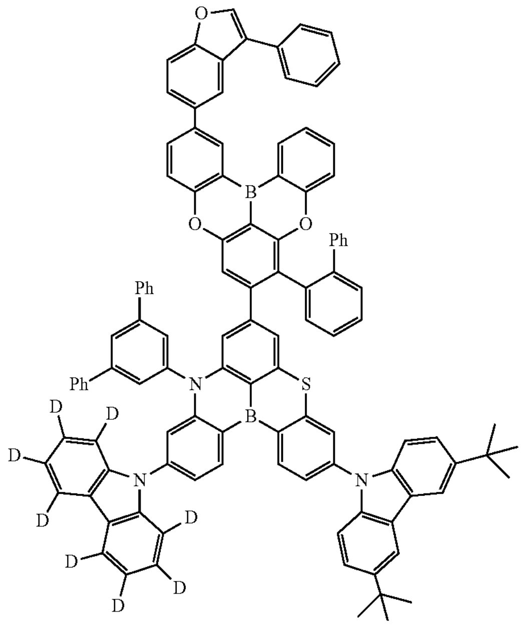
-continued
89
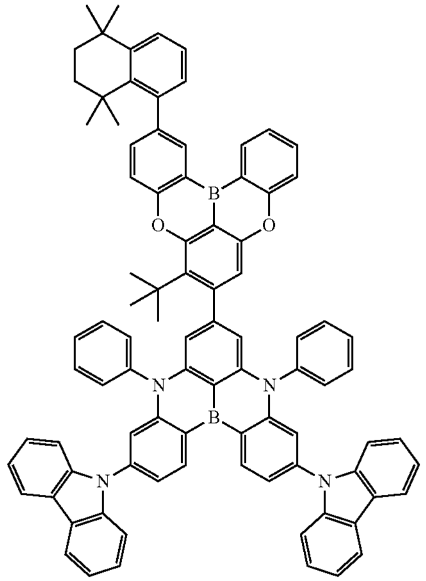
90
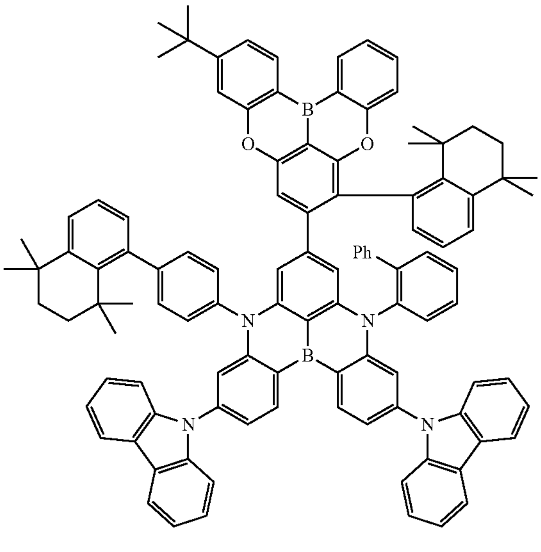

-continued
91
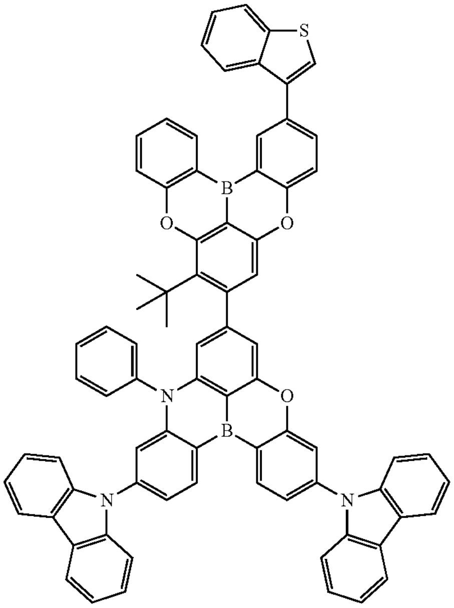
92
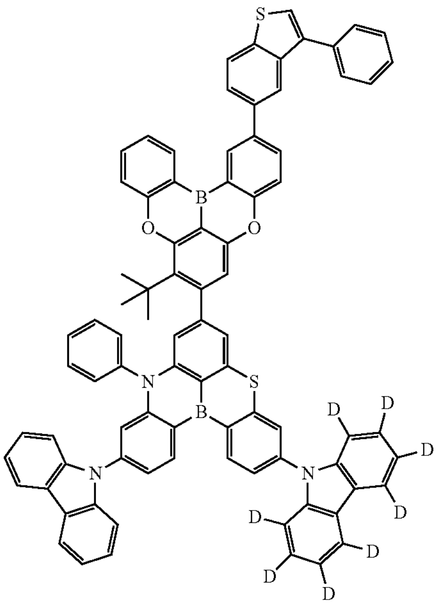
-continued
93
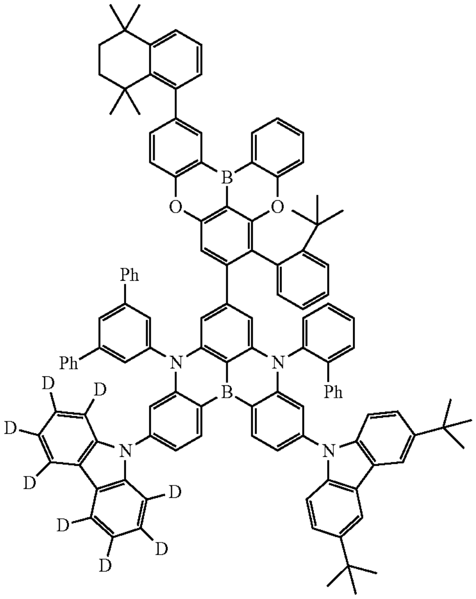
94
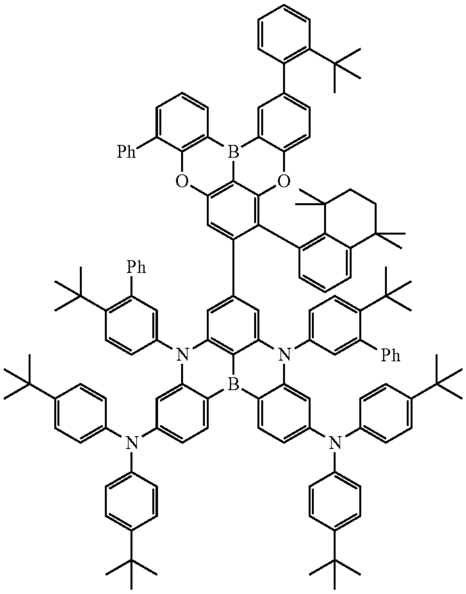

-continued

95

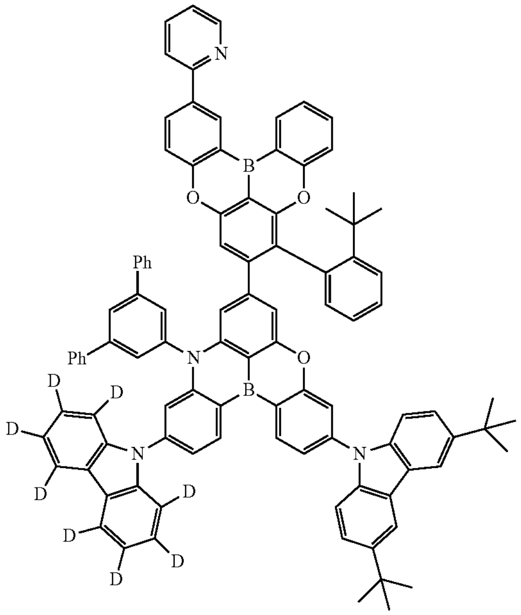

96

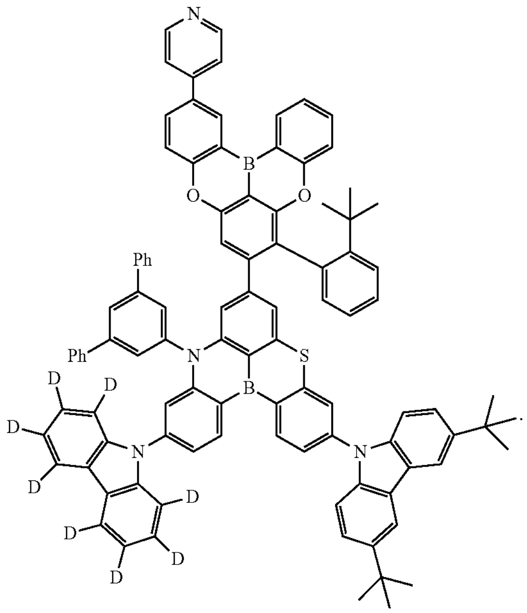

In the light emitting element ED according to an embodiment, an emission layer EML may include a polycyclic compound represented by Formula 3:

[Formula 3]

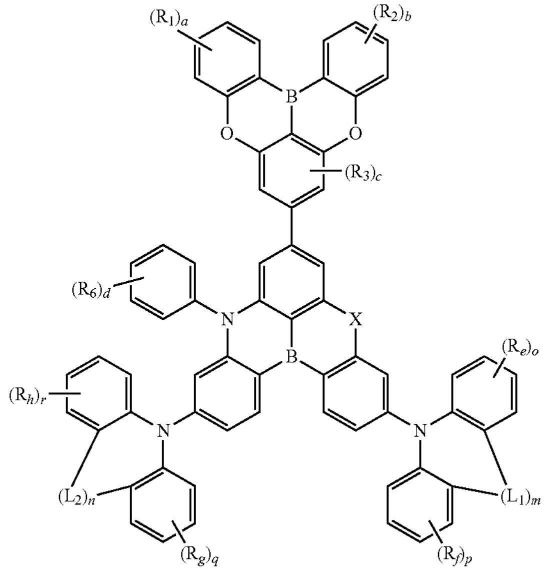

In Formula 3, a and b may each independently be an integer from 0 to 4. If a is 2 or more, multiple $R_1$ groups may be all the same, or at least one may be different from the remainder. If b is 2 or more, multiple $R_2$ groups may be all the same, or at least one may be different from the remainder. In Formula 3, c may be an integer from 0 to 2. If c is 2, two $R_3$ groups may be the same as or different from each other. In Formula 3, d may be an integer from 0 to 5. If d is 2 or more, multiple $R_6$ groups may be all the same, or at least one may be different from the remainder.

In Formula 3, m and n may each independently be 0 or 1. In Formula 3, m and n may be the same as or different from each other. In case that m is 0, o and p may each independently be an integer from 0 to 5. In case that m is 1, o and p may each independently be an integer from 0 to 4. In Formula 3, o and p may be the same as or different from each other. In case that n is 0, q and r may each independently be an integer from 0 to 5. In case that n is 1, q and r may each independently be an integer from 0 to 4. In Formula 3, q and r may be the same as or different from each other.

In Formula 3, $L_1$ and $L_2$ may each be a direct linkage. In Formula 3, X may be $N(R_x)$, O, or S.

In Formula 3, $R_x$, $R_e$ to $R_h$, $R_1$ to $R_3$, and $R_6$ may each independently be a deuterium atom, a substituted or unsubstituted alkyl group of 1 to 20 carbon atoms, a substituted or unsubstituted alkenyl group of 2 to 20 carbon atoms, a substituted or unsubstituted aryl group of 6 to 30 ring-forming carbon atoms, or a substituted or unsubstituted heteroaryl group of 2 to 30 ring-forming carbon atoms, or may be combined with an adjacent group to form a ring.

In an embodiment, the polycyclic compound represented by Formula 3 may be represented by Formula 4-1 or Formula 4-2. Formula 4-1 is a case of Formula 3 where m and n are each 0. Formula 4-2 is a case of Formula 3 where m and n are each 1.

[Formula 4-1]

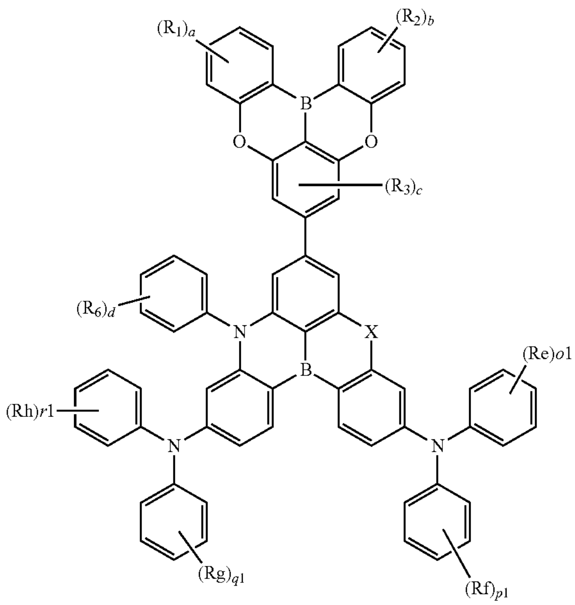

[Formula 4-2]

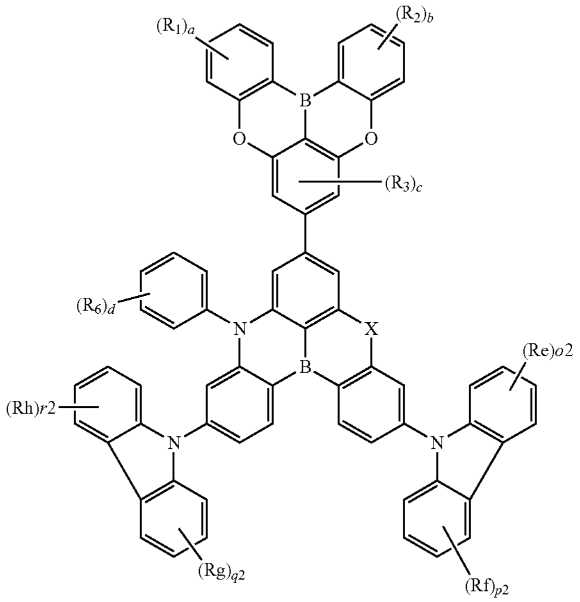

In Formula 4-1, o1 and p1 may each independently be an integer from 0 to 5. In Formula 4-1, o1 and p1 may be the same as or different from each other. If o1 is 2 or more, multiple $R_e$ groups may be all the same, or at least one may be different from the remainder. If p1 is 2 or more, multiple $R_f$ groups may be all the same, or at least one may be different from the remainder. In Formula 4-1, q1 and r1 may each independently be an integer from 0 to 5. In Formula 4-1, q1 and r1 may be the same as or different from each other. If q1 is 2 or more, multiple $R_g$ groups may be all the same, or at least one may be different from the remainder. If r1 is 2 or more, multiple $R_h$ groups may be all the same, or at least one may be different from the remainder.

In Formula 4-2, o2 and p2 may each independently be an integer from 0 to 4. In Formula 4-2, o2 and p2 may be the same as or different from each other. If o2 is 2 or more, multiple $R_e$ groups may be all the same, or at least one may be different from the remainder. If p2 is 2 or more, multiple $R_f$ groups may be all the same, or at least one may be different from the remainder. In Formula 4-2, q2 and r2 may each independently be an integer from 0 to 4. In Formula 4-2, q2 and r2 may be the same as or different from each other. If q2 is 2 or more, multiple $R_g$ groups may be all the same, or at least one may be different from the remainder. If r2 is 2 or more, multiple $R_h$ groups may be all the same, or at least one may be different from the remainder.

In Formula 4-1 and Formula 4-2, a to d, $R_1$ to $R_3$, $R_6$, X, and $R_e$ to $R_h$ are the same as defined in Formula 3.

In an embodiment, in Formula 4-1, $R_e$ to $R_h$ may each independently be a deuterium atom, or a substituted or unsubstituted t-butyl group. $R_e$ to $R_h$ may be all the same, or at least one may be different from the remainder.

In an embodiment, in Formula 4-2, $R_e$ to $R_h$ may each independently be a deuterium atom, a cyano group, a substituted or unsubstituted phenyl group, or a substituted or unsubstituted t-butyl group. $R_e$ to $R_h$ may be all the same, or at least one may be different from the remainder.

In an embodiment, in Formula 3, $R_1$ and $R_2$ may each independently be a substituted or unsubstituted t-butyl group, a substituted or unsubstituted phenyl group, a substituted or unsubstituted naphthyl group, a substituted or unsubstituted indole group, a substituted or unsubstituted benzofuran group, a substituted or unsubstituted benzothiophene group, a substituted or unsubstituted pyridine group, or a substituted or unsubstituted tetrahydrozoline naphthyl group. $R_1$ and $R_2$ may be the same or different from the remainder.

In an embodiment, in Formula 3, $R_3$ may be a substituted or unsubstituted phenyl group, a substituted or unsubstituted tetrahydrozoline naphthyl group, or a substituted or unsubstituted t-butyl group. In an embodiment, in Formula 3, $R_6$ may be a substituted or unsubstituted phenyl group, a substituted or unsubstituted t-butyl group, or a substituted or unsubstituted tetrahydrozoline naphthyl group.

The polycyclic compound of an embodiment, represented by Formula 1 or Formula 3, may be used as a fluorescence emitting material or a thermally activated delayed fluorescence (TADF) material. For example, the polycyclic compound of an embodiment may be used as a light emitting dopant emitting blue light. In the light emitting element ED according to embodiments, the emission layer EML may include the polycyclic compound of an embodiment represented by Formula 1 or Formula 3, and the emission layer EML may emit blue light. The polycyclic compound of an embodiment may be used as a TADF dopant material. In the light emitting element ED according to embodiment, the emission layer EML may include the polycyclic compound of an embodiment represented by Formula 1 or Formula 3, and the polycyclic compound may emit thermally activated delayed fluorescence.

The polycyclic compound of an embodiment may be a light emitting material having a light emitting central wavelength ($\lambda_{max}$) in a wavelength region equal to or less than about 490 nm. For example, the polycyclic compound of an embodiment, represented by Formula 1 or Formula 3, may be a light emitting material having a light emitting central wavelength in a wavelength region of about 450 nm to about 470 nm. For example, the polycyclic compound of an embodiment may be a blue thermally activated delayed fluorescence dopant. However, embodiments are not limited thereto.

In the light emitting elements ED according to embodiments, shown in FIG. 3 to FIG. 6, an emission layer EML may include a host and a dopant, and the emission layer EML may include the polycyclic compound of an embodiment as a light emitting dopant.

In an embodiment, an oscillator strength (OSC) of the polycyclic compound represented by Formula 1 or Formula 3 may be equal to or greater than about 0.2500. If the oscillator strength of the polycyclic compound included in the light emitting element ED increases, the internal quantum efficiency and maximum external quantum efficiency of the light emitting element ED may increase. Accordingly, the light emitting element ED according to an embodiment includes a polycyclic compound having an oscillator strength equal to or greater than about 0.2500, and may have high maximum external quantum efficiency.

In the light emitting element ED according to an embodiment, an emission layer EML may include a first compound, a second compound, and a third compound, which are different from each other. The first compound may be represented by Formula 1 or Formula 3. The first compound may be a light emitting dopant, the second compound may be a first host, and the third compound may be a second host. In an embodiment, the second compound may be a hole transport host, and the third compound may be an electron transport host.

In an embodiment, the light emitting element ED may include at least one selected from Compounds HT-1 to HT-4 in an emission layer EML as a hole transport host:

HT-1

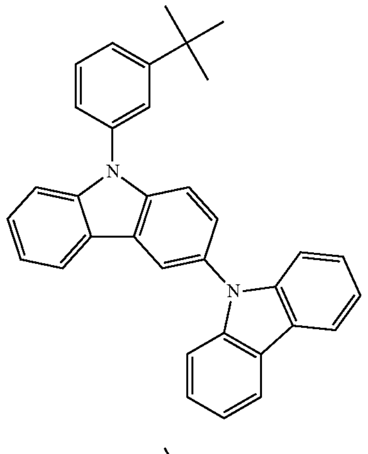

HT-2

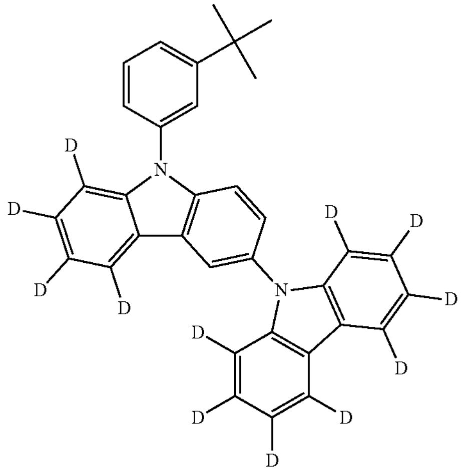

-continued

HT-3

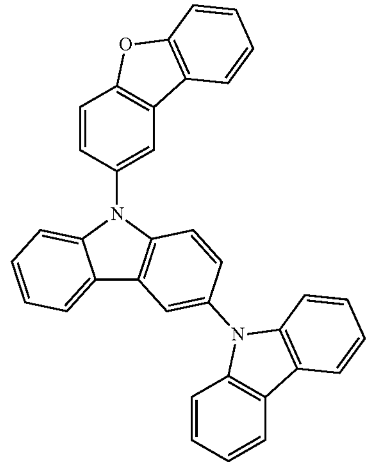

HT-4

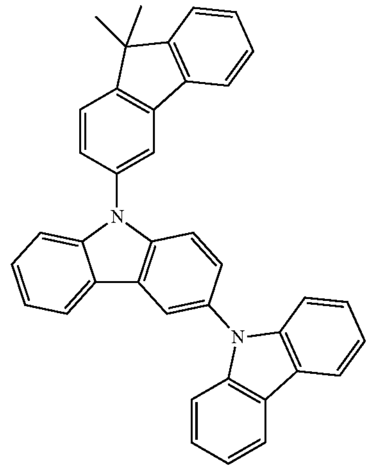

In an embodiment, the light emitting element ED may include at least one selected from Compounds ET-1 to ET-3 in an emission layer EML as an electron transport host:

ET-1

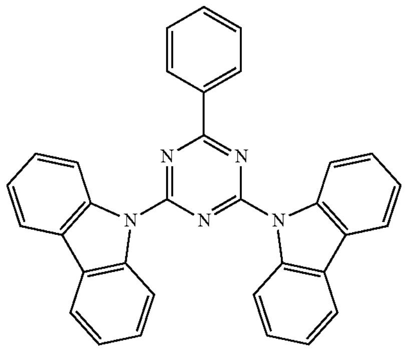

-continued

ET-2

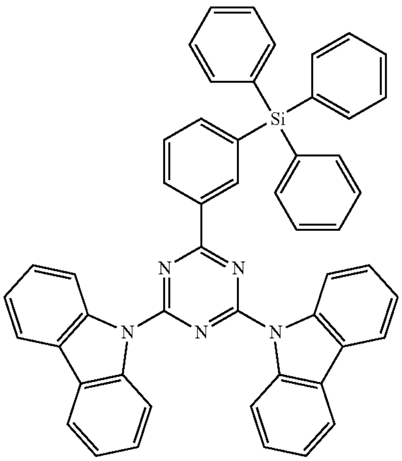

ET-3

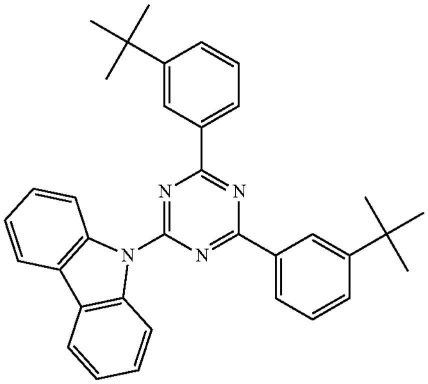

The electron transport host and the hole transport host may be combined to form an exciplex. The exciplex may transfer energy through energy transition to a phosphorescence dopant and a thermally activated delayed fluorescence dopant to achieve light emission.

A triplet energy of the exciplex formed by the hole transport host and the electron transport host may correspond to a difference between an energy level of the lowest unoccupied molecular orbital (LUMO) of the electron transport host and an energy level of the highest occupied molecular orbital (HOMO) of the hole transport host. For example, a triplet energy of the exciplex formed by the hole transport host and the electron transport host in the light emitting element may be in a range of about 2.4 eV to about 3.0 eV. The triplet energy of the exciplex may be a value smaller than the energy gap of each host material. The energy gap may be a difference between the LUMO energy level and the HOMO energy level. For example, an energy gap of each of the hole transport host and the electron transport host may each independently be equal to or greater than about 3.0 eV, and the exciplex may have a triplet energy equal to or less than about 3.0 eV.

In the light emitting element ED according to an embodiment, the emission layer EML may further include a fourth compound represented by Formula M-b. The fourth compound may be an auxiliary dopant. In the light emitting element ED according to an embodiment, the auxiliary dopant included in the emission layer EML may transfer energy to a light emitting dopant to increase the ratio of emitting fluorescence by the light emitting dopant.

[Formula M-b]

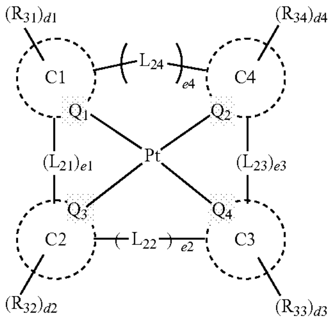

In Formula M-b, $Q_1$ to $Q_4$ may each independently be C or N, and C1 to C4 may each independently be a substituted or unsubstituted hydrocarbon ring of 5 to 30 ring-forming carbon atoms, or a substituted or unsubstituted heterocycle of 2 to 30 ring-forming carbon atoms. In Formula M-b, $L_{21}$ to $L_{24}$ may each independently be a direct linkage,

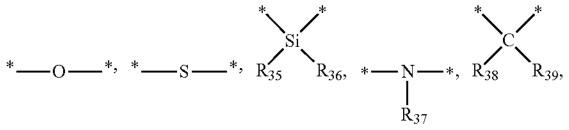

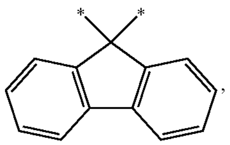

a substituted or unsubstituted divalent alkyl group of 1 to 20 carbon atoms, a substituted or unsubstituted arylene group of 6 to 30 ring-forming carbon atoms, or a substituted or unsubstituted heteroarylene group of 2 to 30 ring-forming carbon atoms.

In Formula M-b, e1 to e4 may each independently be 0 or 1; $R_{31}$ to $R_{39}$ may each independently be a hydrogen atom, a deuterium atom, a halogen atom, a cyano group, a substituted or unsubstituted amine group, a substituted or unsubstituted alkyl group of 1 to 20 carbon atoms, a substituted or unsubstituted aryl group of 6 to 30 ring-forming carbon atoms, or a substituted or unsubstituted heteroaryl group of 2 to 30 ring-forming carbon atoms, or may be combined with an adjacent group to form a ring; and d1 to d4 may each independently be an integer from 0 to 4.

In the light emitting element ED according to embodiment, the emission layer EML may include at least one selected from Compounds M-b-1 to M-b-13 as the auxiliary dopant:

-continued
M-b-1
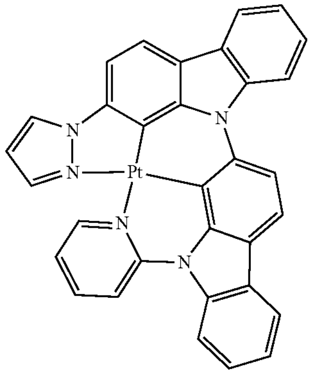
M-b-2
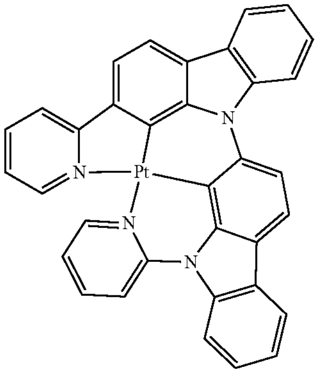
M-b-3
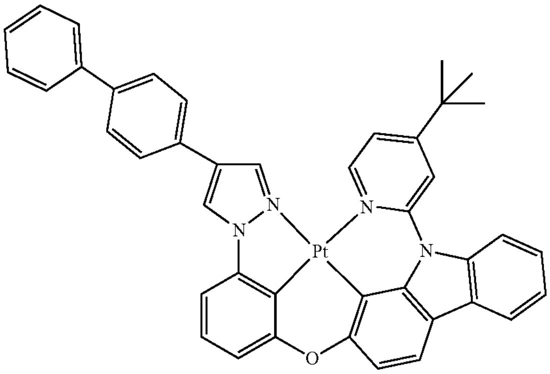
M-b-4
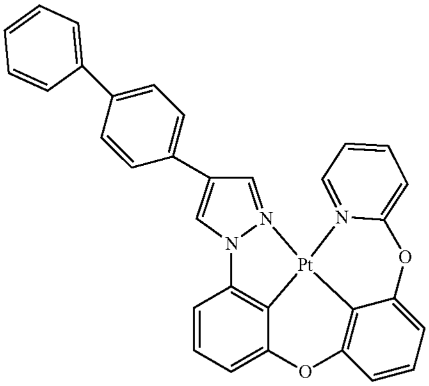
M-b-5
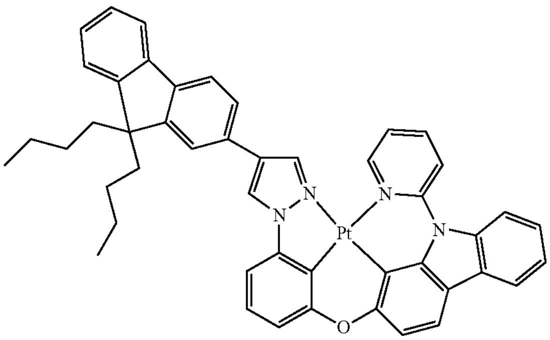
M-b-6
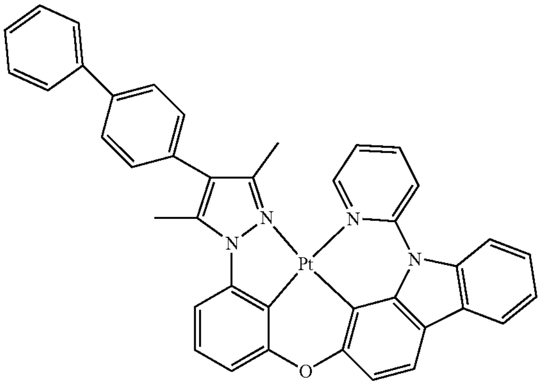
M-b-7
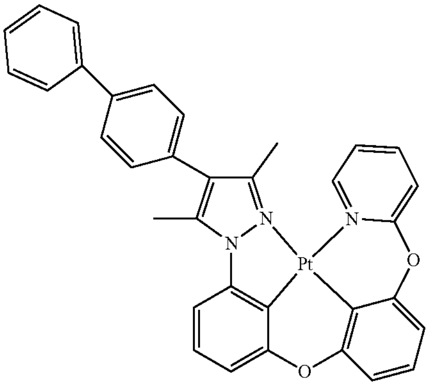
M-b-8
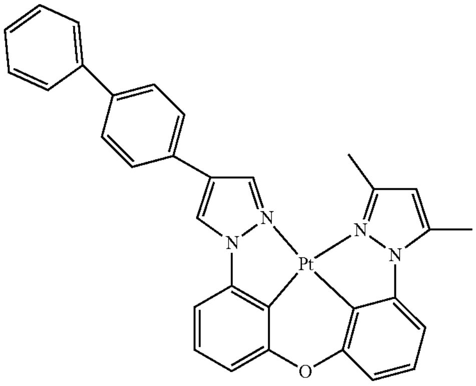

-continued

M-b-9

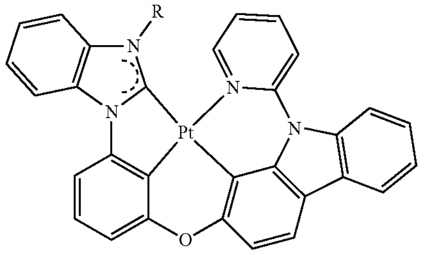

M-b-10

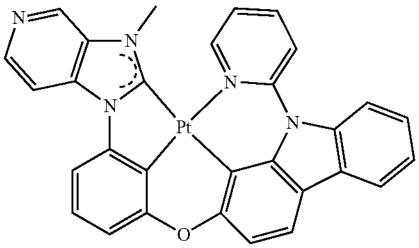

M-b-11

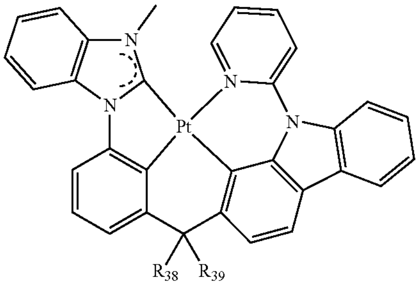

M-b-12

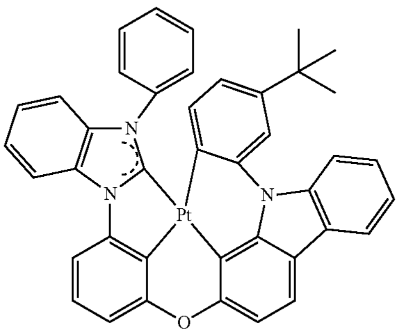

M-b-13

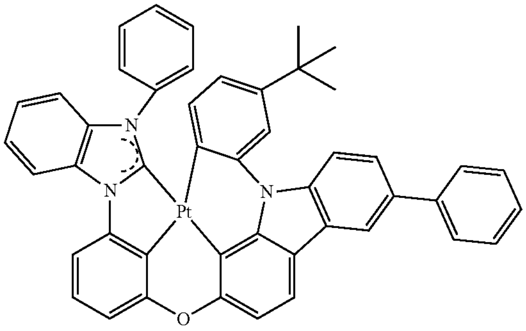

In Compounds M-b-1 to M-b-13, R, $R_{38}$, and $R_{39}$ may each independently be a hydrogen atom, a deuterium atom, a halogen atom, a cyano group, a substituted or unsubstituted amine group, a substituted or unsubstituted alkyl group of 1 to 20 carbon atoms, a substituted or unsubstituted aryl group of 6 to 30 ring-forming carbon atoms, or a substituted or unsubstituted heteroaryl group of 2 to 30 ring-forming carbon atoms.

However, embodiments are not limited thereto, and the light emitting element ED according to an embodiment may include a phosphorescence dopant material of the related art which is an organometallic complex.

The light emitting element ED according to an embodiment may include the first host, the second host, the auxiliary dopant, and the light emitting dopant represented by the polycyclic compound of an embodiment in the emission layer EML, and may show improved emission efficiency properties.

The light emitting element ED according to an embodiment may further include an emission layer material below in addition to the polycyclic compound of an embodiment, the first and second hosts, and the auxiliary dopant material. In the light emitting element ED according to an embodiment, the emission layer EML may include anthracene derivatives, pyrene derivatives, fluoranthene derivatives, chrysene derivatives, dihydrobenzanthracene derivatives, or triphenylene derivatives. For example, the emission layer EML may include anthracene derivatives or pyrene derivatives.

In the light emitting elements ED according to embodiments, shown in FIG. 3 to FIG. 6, the emission layer EML may include a host and a dopant, and the emission layer EML may include a compound represented by Formula E-1. The compound represented by Formula E-1 may be used as a fluorescence host material.

[Formula E-1]

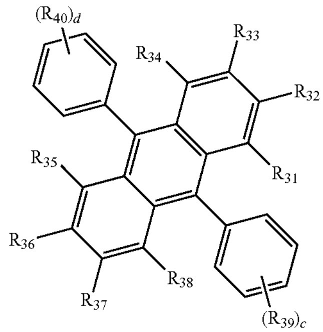

In Formula E-1, $R_{31}$ to $R_{40}$ may each independently be a hydrogen atom, a deuterium atom, a halogen atom, a substituted or unsubstituted silyl group, a substituted or unsubstituted thio group, a substituted or unsubstituted oxy group, a substituted or unsubstituted alkyl group of 1 to 10 carbon atoms, a substituted or unsubstituted alkenyl group of 2 to 10 carbon atoms, a substituted or unsubstituted aryl group of 6 to 30 ring-forming carbon atoms, or a substituted or unsubstituted heteroaryl group of 2 to 30 ring-forming carbon atoms, or may be combined with an adjacent group to form a ring. For example, $R_{31}$ to $R_{40}$ may be combined with an adjacent group to form a saturated hydrocarbon ring, an unsaturated hydrocarbon ring, a saturated heterocycle, or an unsaturated heterocycle.

In Formula E-1, c and d may each independently be an integer from 0 to 5.

The compound represented by Formula E-1 may be any one selected from Compound E1 to Compound E19:
E1
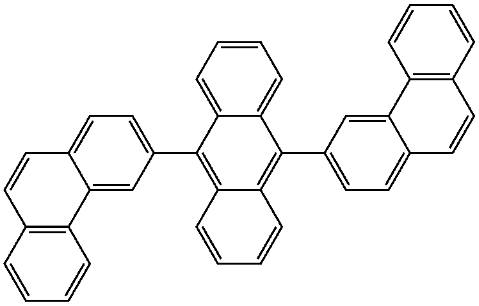
E2
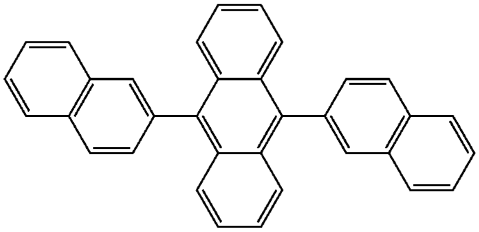
E3
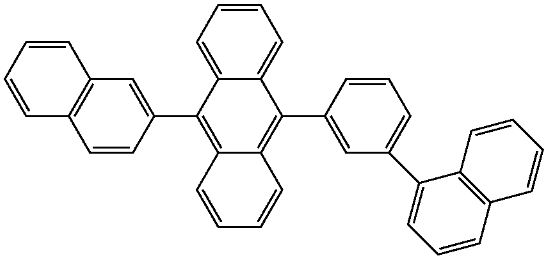
E4
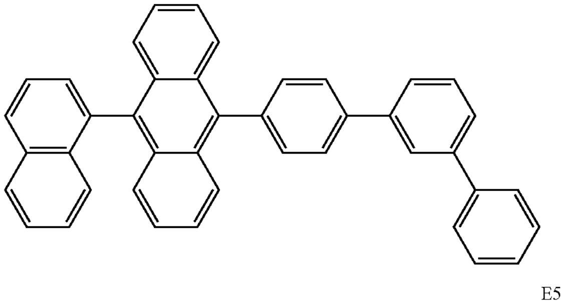
E5
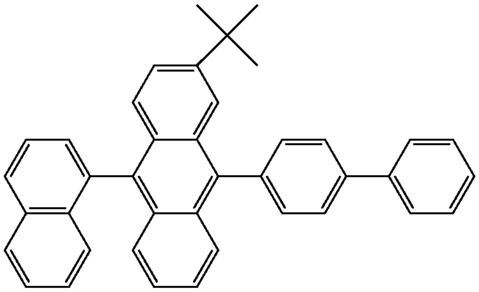
-continued
E6
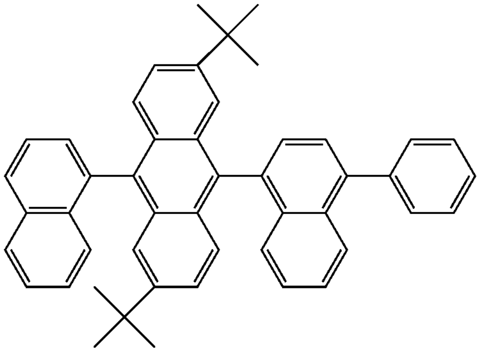
E7
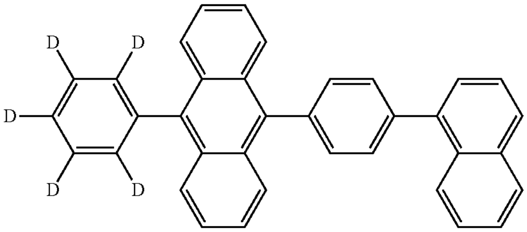
E8
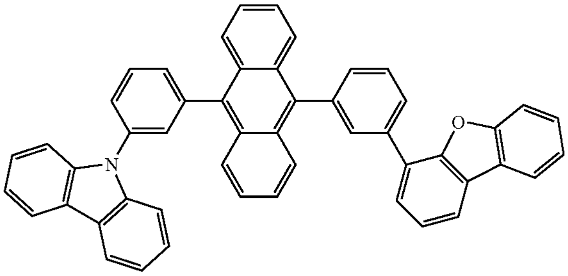
E9
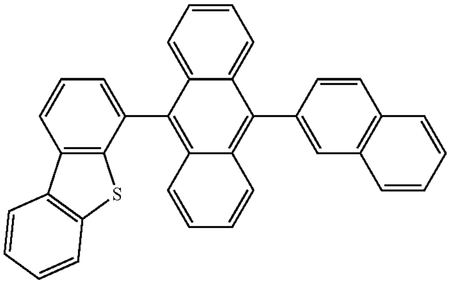
E10
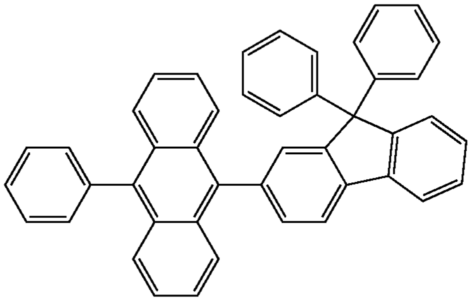

-continued
E11
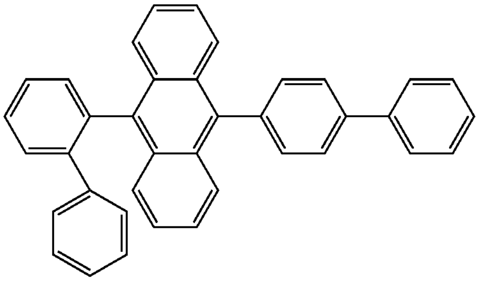
E12
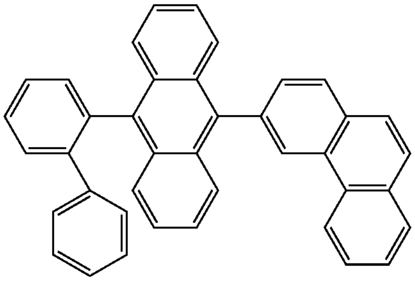
E13
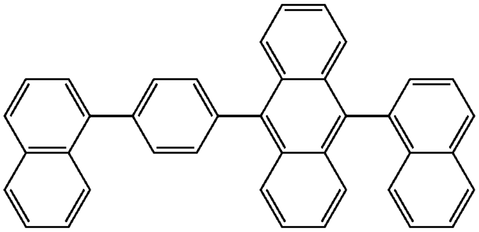
E14
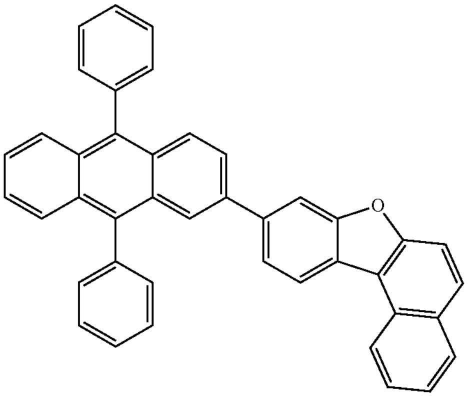
-continued
E15
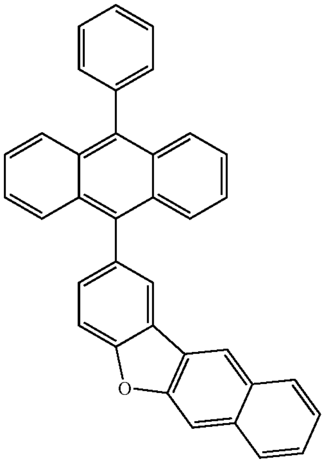
E16
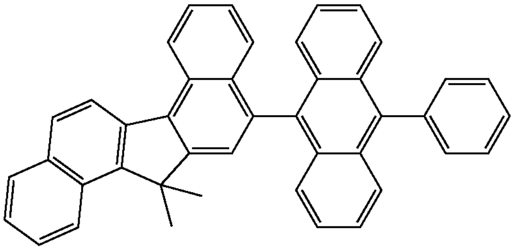
E17
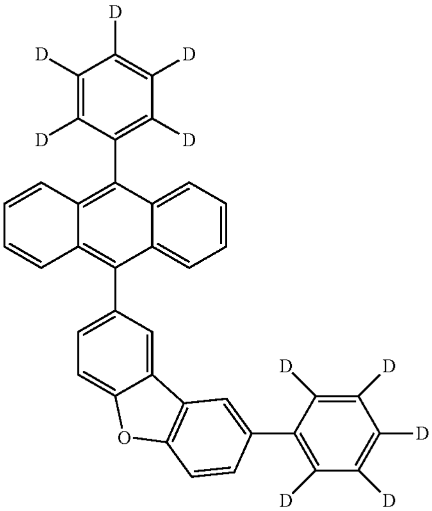
E18
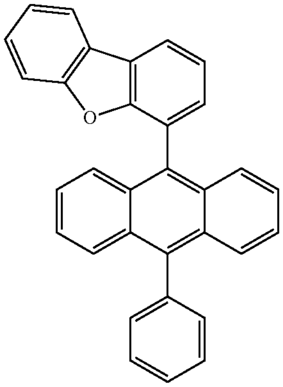

-continued

E19

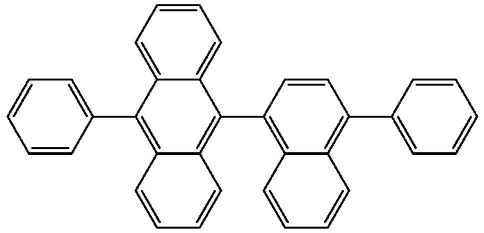

In an embodiment, the emission layer EML may include a compound represented by Formula E-2a or Formula E-2b. The compound represented by Formula E-2a or Formula E-2b may be used as a phosphorescence host material.

[Formula E-2a]

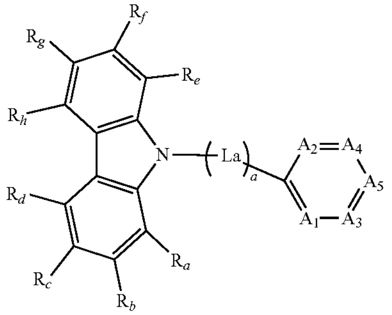

In Formula E-2a, a may be an integer from 0 to 10, and La may be a direct linkage, a substituted or unsubstituted arylene group of 6 to 30 ring-forming carbon atoms, or a substituted or unsubstituted heteroarylene group of 2 to 30 ring-forming carbon atoms. If a is 2 or more, multiple La groups may each independently be a substituted or unsubstituted arylene group of 6 to 30 ring-forming carbon atoms, or a substituted or unsubstituted heteroarylene group of 2 to 30 ring-forming carbon atoms.

In Formula E-2a, $A_1$ to $A_5$ may each independently be N or $C(R_i)$. In Formula E-2a, $R_a$ to $R_i$ may each independently be a hydrogen atom, a deuterium atom, a substituted or unsubstituted amine group, a substituted or unsubstituted thio group, a substituted or unsubstituted oxy group, a substituted or unsubstituted alkyl group of 1 to 20 carbon atoms, a substituted or unsubstituted alkenyl group of 2 to 20 carbon atoms, a substituted or unsubstituted aryl group of 6 to 30 ring-forming carbon atoms, or a substituted or unsubstituted heteroaryl group of 2 to 30 ring-forming carbon atoms, or may be combined with an adjacent group to form a ring. For example, $R_a$ to $R_i$ may be combined with an adjacent group to form a hydrocarbon ring or a heterocycle including N, O, S, etc. as a ring-forming atom.

In Formula E-2a, two or three of $A_1$ to $A_5$ may be N, and the remainder of $A_1$ to $A_5$ may be $C(R_i)$.

[Formula E-2b]

$$(Cbz1)-(L_b)_b-(Cbz2)$$

In Formula E-2b, Cbz1 and Cbz2 may each independently be an unsubstituted carbazole group, or a carbazole group substituted with an aryl group of 6 to 30 ring-forming carbon atoms. In Formula E-2b, $L_b$ may be a direct linkage, a substituted or unsubstituted arylene group of 6 to 30 ring-forming carbon atoms, or a substituted or unsubstituted heteroarylene group of 2 to 30 ring-forming carbon atoms. In Formula E-2b, b may be an integer from 0 to 10, and if b is 2 or more, multiple $L_b$ groups may each independently be a substituted or unsubstituted arylene group of 6 to 30 ring-forming carbon atoms, or a substituted or unsubstituted heteroarylene group of 2 to 30 ring-forming carbon atoms.

The compound represented by Formula E-2a or Formula E-2b may be any one selected from Compound Group E-2. However, the compounds shown in Compound Group E-2 are only examples, and the compound represented by Formula E-2a or Formula E-2b is not limited to Compound Group E-2.

[Compound Group E-2]

E-2-1

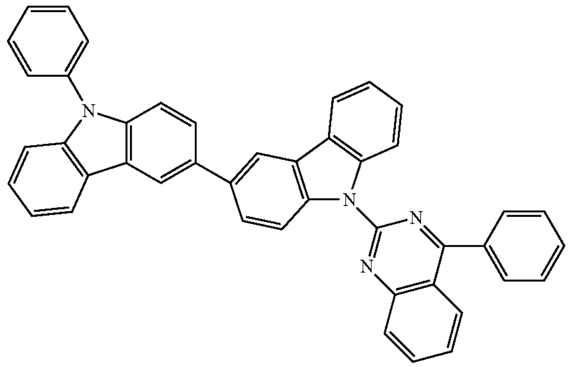

E-2-2

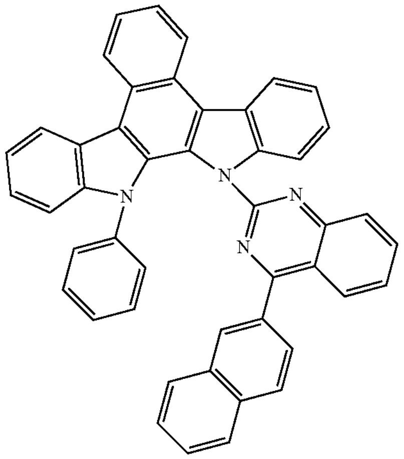

-continued
E-2-3
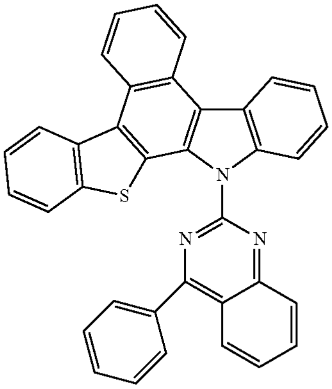
E-2-4
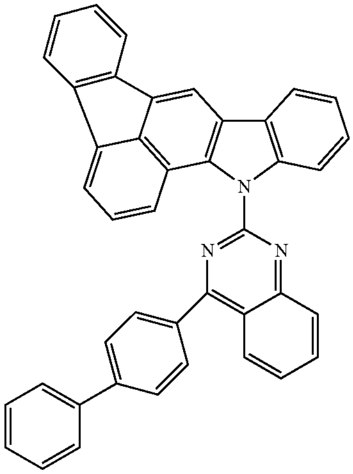
E-2-5
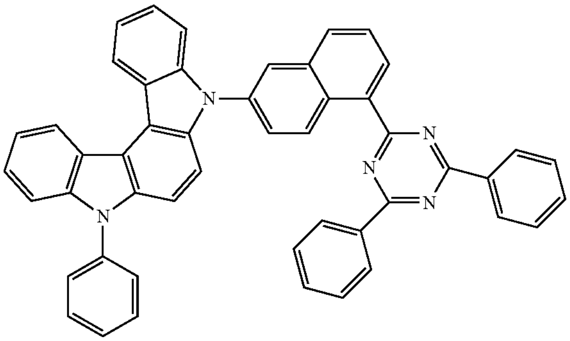
-continued
E-2-6
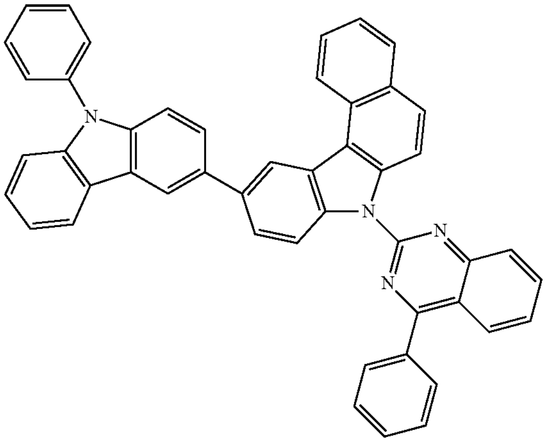
E-2-7
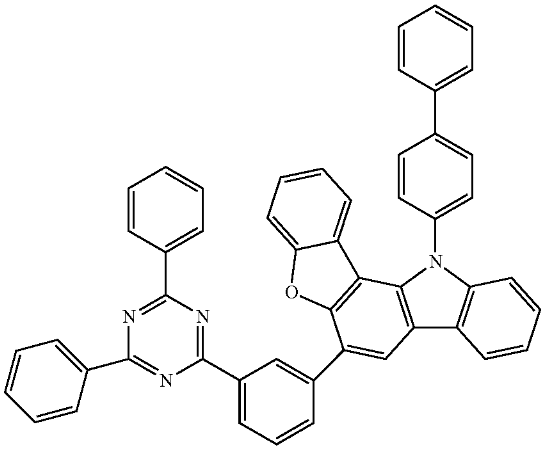
E-2-8
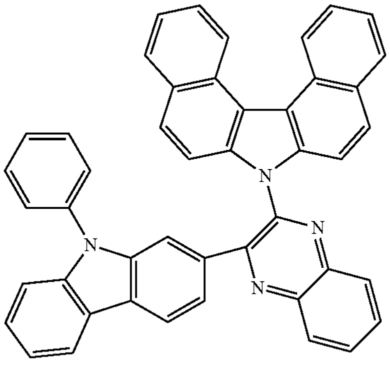

-continued
E-2-9
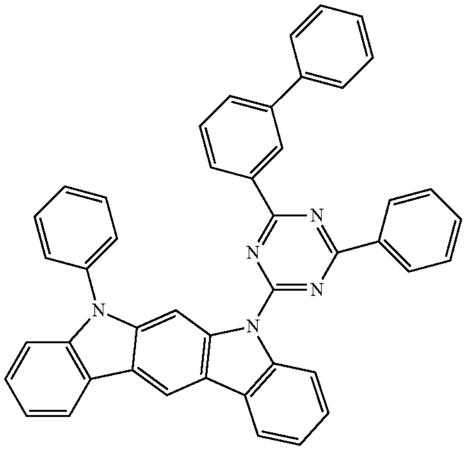
E-2-10
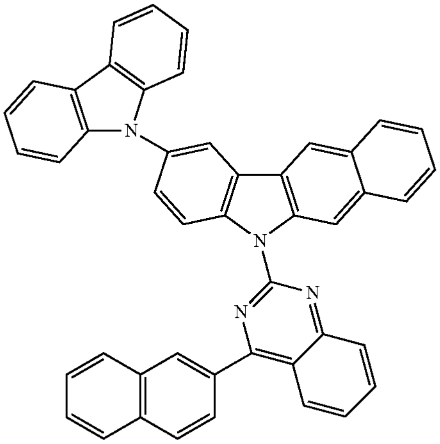
E-2-11
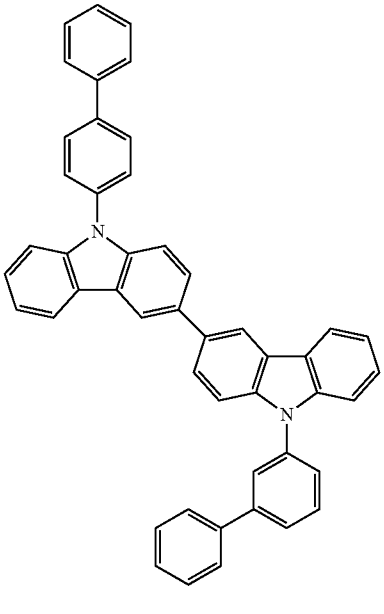
-continued
E-2-12
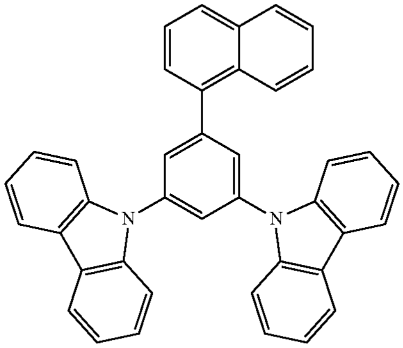
E-2-13
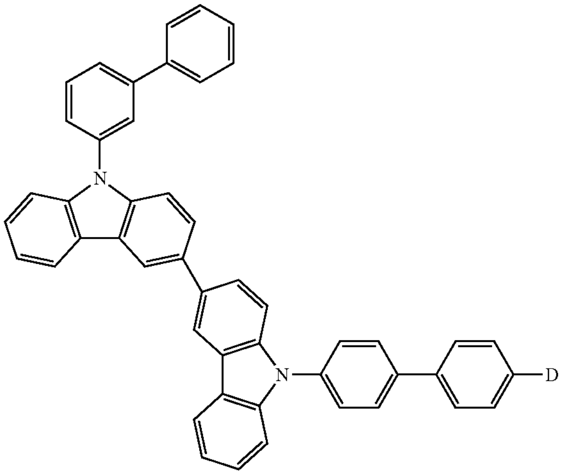
E-2-14
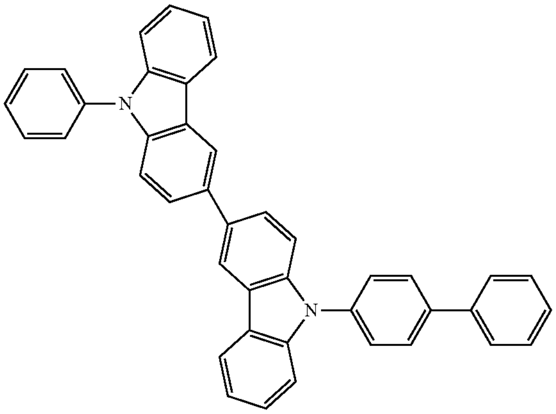
E-2-15
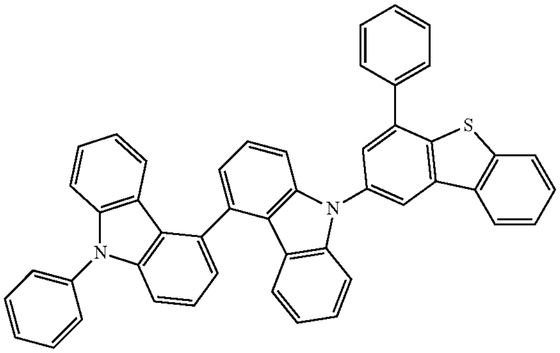

-continued
E-2-16
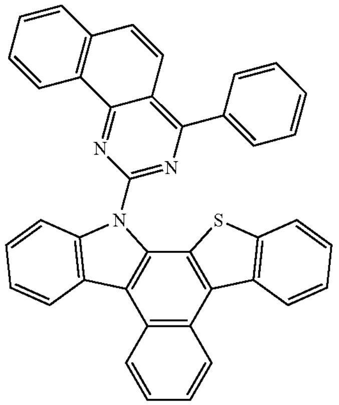
E-2-17
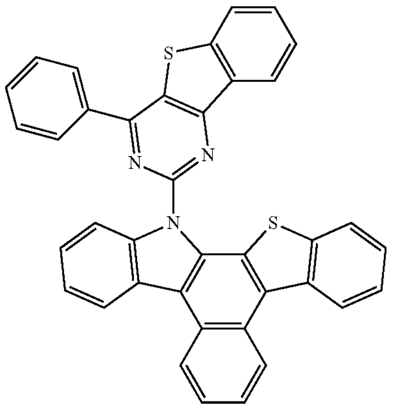
E-2-18
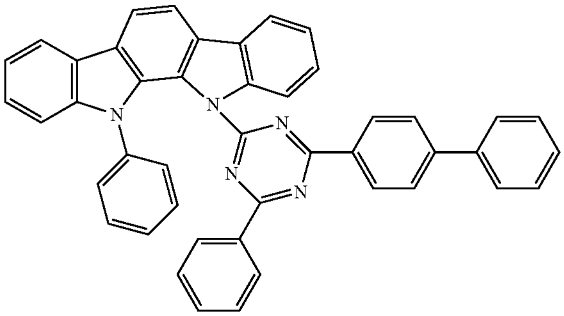
E-2-19
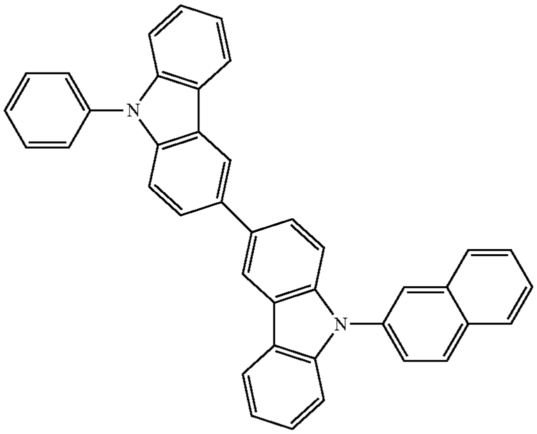
-continued
E-2-20
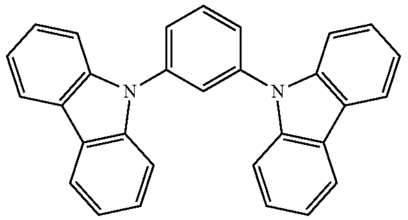
E-2-21
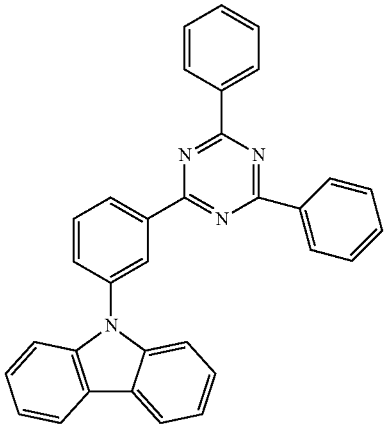
E-2-22
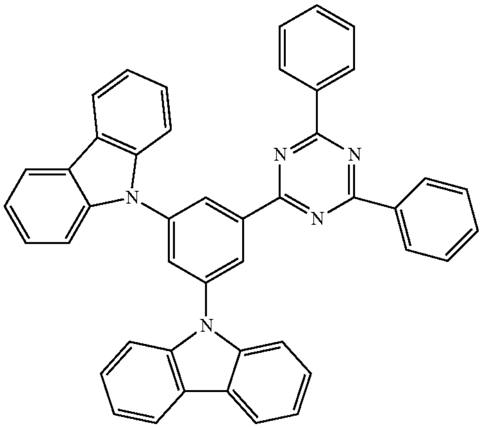
E-2-23
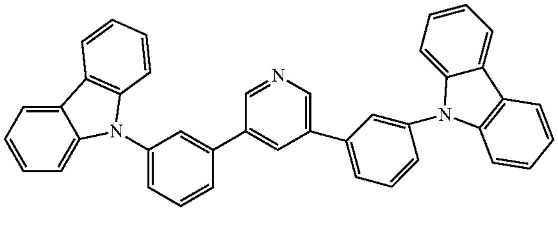

-continued

E-2-24

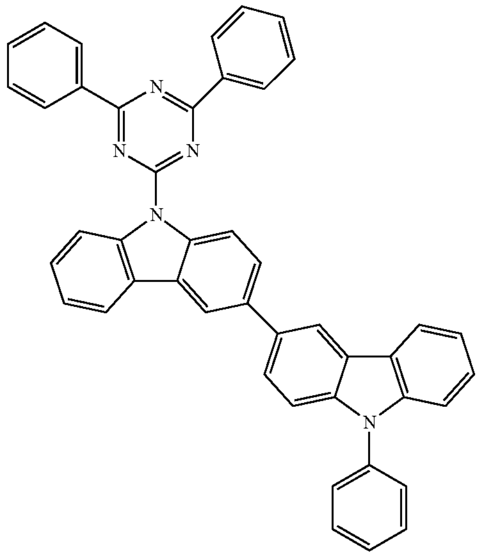

The emission layer EML may further include a material of the related art as a host material. For example, the emission layer EML may include as a host material, at least one of bis (4-(9H-carbazol-9-yl) phenyl) diphenylsilane (BCPDS), (4-(1-(4-(diphenylamino) phenyl) cyclohexyl) phenyl) diphenyl-phosphine oxide (POPCPA), bis[2-(diphenylphosphino) phenyl] ether oxide (DPEPO), 4,4'-bis(carbazol-9-yl) biphenyl (CBP), 1,3-bis(carbazol-9-yl)benzene (mCP), 2,8-bis(diphenylphosphoryl)dibenzo[b,d]furan (PPF), 4,4',4"-tris(carbazol-9-yl)-triphenylamine (TCTA), or 1,3,5-tris(1-phenyl-1H-benzo[d]imidazole-2-yl)benzene (TPBi). However, embodiments are not limited thereto. For example, tris(8-hydroxyquinolino)aluminum ($Alq_3$), 9,10-di (naphthalene-2-yl)anthracene (ADN), 2-tert-butyl-9,10-di (naphth-2-yl)anthracene (TBADN), distyrylarylene (DSA), 4,4'-bis(9-carbazolyl)-2,2'-dimethyl-biphenyl (CDBP), 2-methyl-9,10-bis(naphthalen-2-yl)anthracene (MADN), hexaphenyl cyclotriphosphazene (CP1), 1,4-bis(triphenylsilyl)benzene (UGH2), hexaphenylcyclotrisiloxane ($DPSiO_3$), octaphenylcyclotetra siloxane ($DPSiO_4$), etc. may be used as the host material.

The emission layer EML may include a compound represented by Formula M-a or Formula M-b. The compound represented by Formula M-a or Formula M-b may be used as a phosphorescence dopant material.

[Formula M-a]

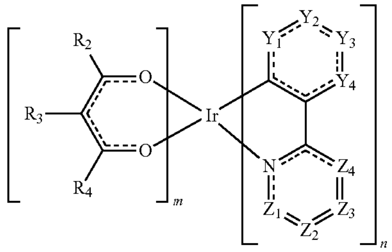

In Formula M-a, $Y_1$ to $Y_4$ and $Z_1$ to $Z_4$ may each independently be $C(R_1)$ or N, and $R_1$ to $R_4$ may each independently be a hydrogen atom, a deuterium atom, a substituted or unsubstituted amine group, a substituted or unsubstituted thio group, a substituted or unsubstituted oxy group, a substituted or unsubstituted alkyl group of 1 to 20 carbon atoms, a substituted or unsubstituted alkenyl group of 2 to 20 carbon atoms, a substituted or unsubstituted aryl group of 6 to 30 ring-forming carbon atoms, or a substituted or unsubstituted heteroaryl group of 2 to 30 ring-forming carbon atoms, or may be combined with an adjacent group to form a ring. In Formula M-a, m may be 0 or 1, and n may be 2 or 3. In Formula M-a, if m is 0, n may be 3, and if m is 1, n may be 2.

The compound represented by Formula M-a may be used as a phosphorescence dopant material.

The compound represented by Formula M-a may be any one selected from Compounds M-a1 to M-a25. However, Compounds M-a1 to M-a25 are only examples, and the compound represented by Formula M-a is not limited to Compounds M-a1 to M-a25.

M-a1

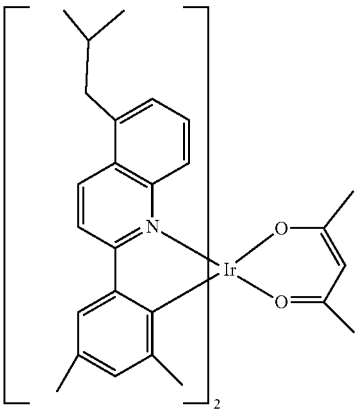

M-a2

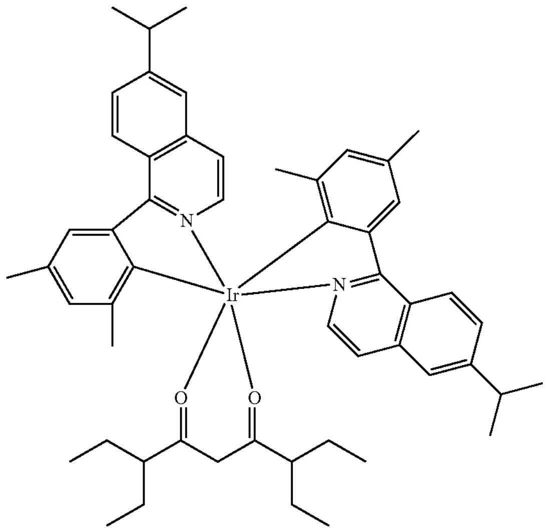

-continued
M-a3
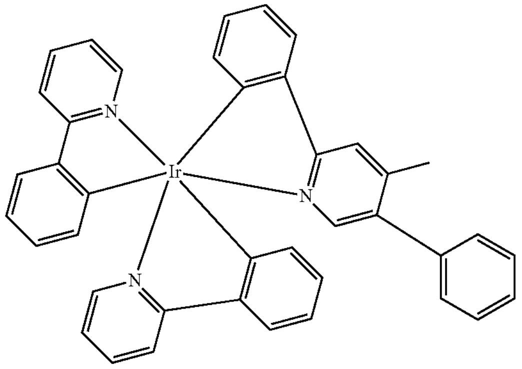
M-a4
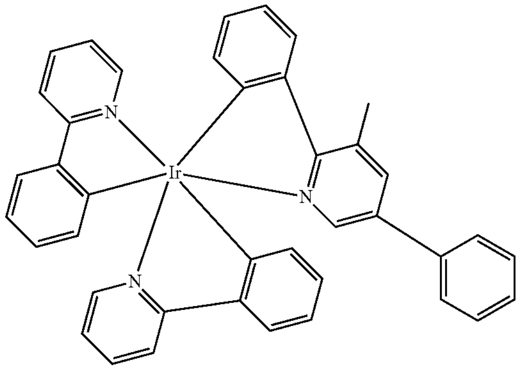
M-a5
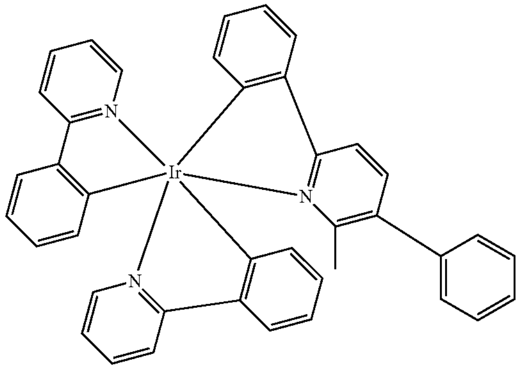
M-a6
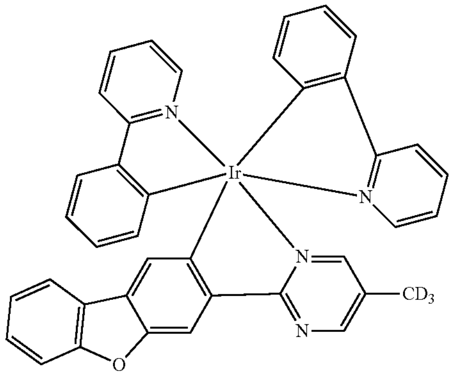
-continued
M-a7
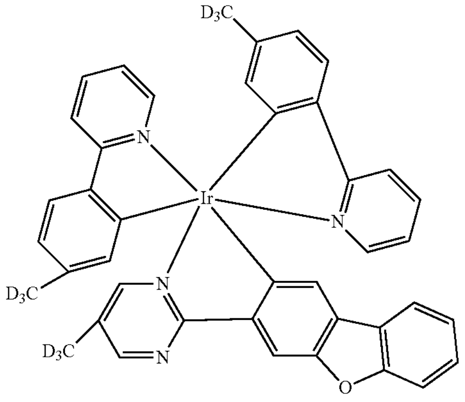
M-a8
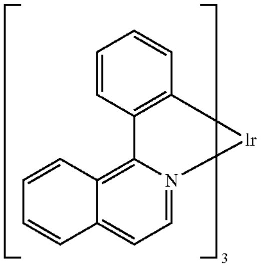
M-a9
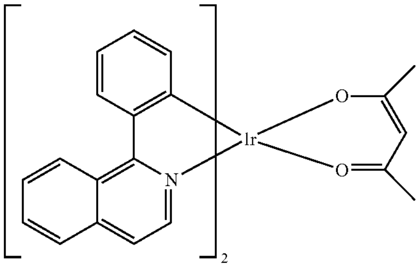
M-a10
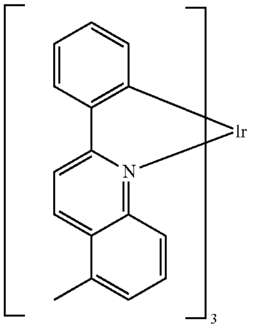
M-a11
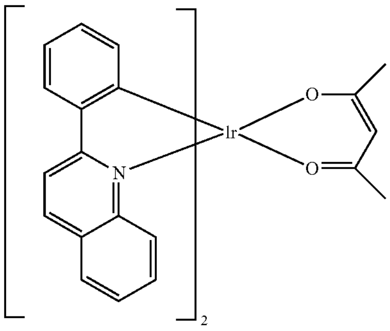

-continued
M-a12
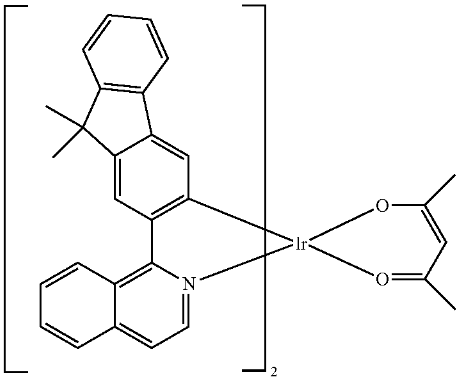
M-a13
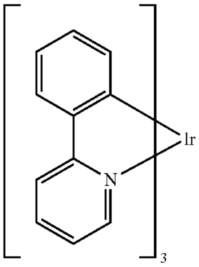
M-a14
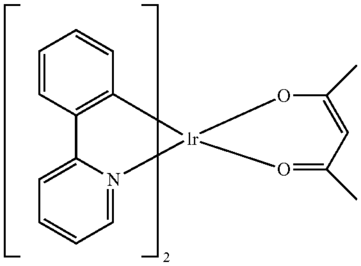
M-a15
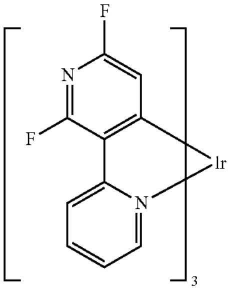
M-a16
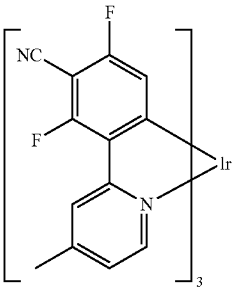
-continued
M-a17
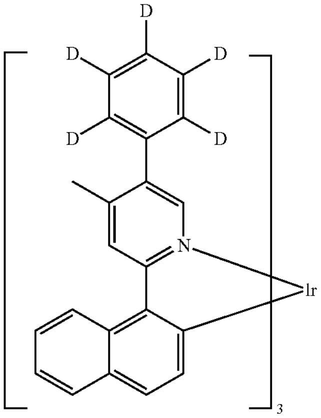
M-a18
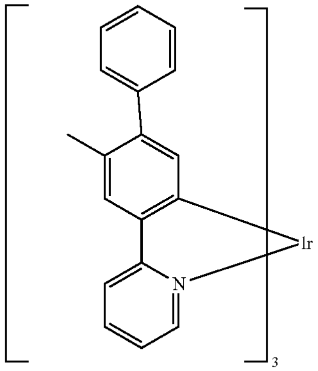
M-a19
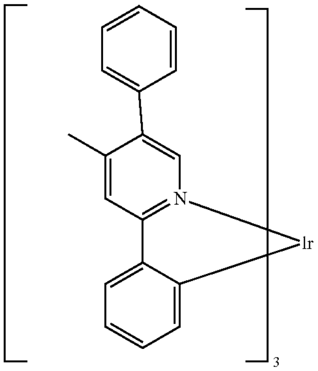
M-a20
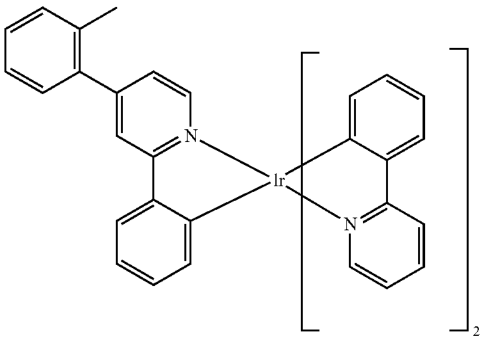

-continued

M-a21

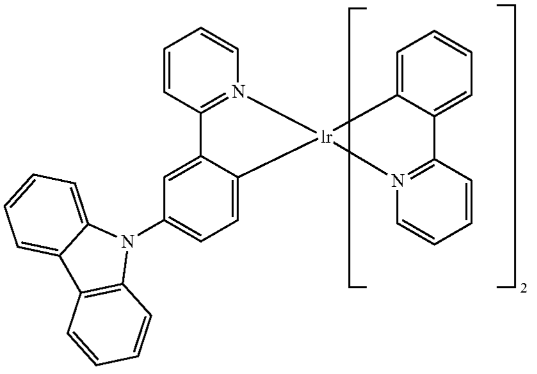

M-a22

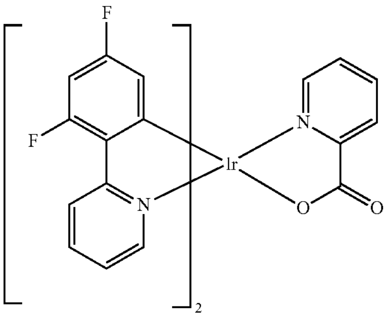

M-a23

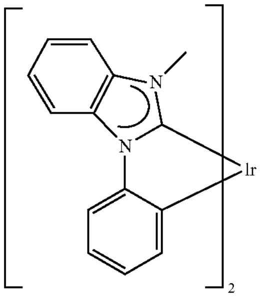

M-a24

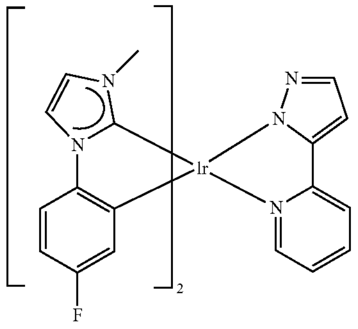

-continued

M-a25

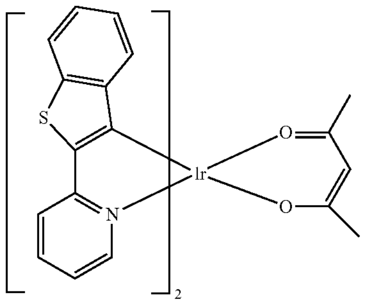

The emission layer EML may include a compound represented by Formula F-a, Formula F-b, or Formula F-c. The compounds represented by Formula F-a to Formula F-c may be used as fluorescence dopant materials.

[Formula F-a]

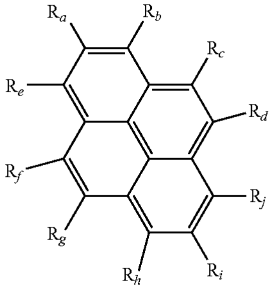

In Formula F-a, two of $R_a$ to $R_j$ may each independently be substituted with a group represented by $*—NAr_1Ar_2$. The remainder of $R_a$ to $R_j$ which are not substituted with the group represented by $*—NAr_1Ar_2$ may each independently be a hydrogen atom, a deuterium atom, a halogen atom, a cyano group, a substituted or unsubstituted amine group, a substituted or unsubstituted alkyl group of 1 to 20 carbon atoms, a substituted or unsubstituted aryl group of 6 to 30 ring-forming carbon atoms, or a substituted or unsubstituted heteroaryl group of 2 to 30 ring-forming carbon atoms.

In the group represented by $*—NAr_1Ar_2$, $Ar_1$ and $Ar_2$ may each independently be a substituted or unsubstituted aryl group of 6 to 30 ring-forming carbon atoms, or a substituted or unsubstituted heteroaryl group of 2 to 30 ring-forming carbon atoms. For example, at least one of $Ar_1$ and $Ar_2$ may be a heteroaryl group including O or S as a ring-forming atom.

[Formula F-b]

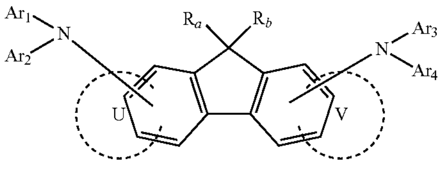

In Formula F-b, $R_a$ and $R_b$ may each independently be a hydrogen atom, a deuterium atom, a substituted or unsubstituted alkyl group of 1 to 20 carbon atoms, a substituted or unsubstituted alkenyl group of 2 to 20 carbon atoms, a substituted or unsubstituted aryl group of 6 to 30 ring-forming carbon atoms, or a substituted or unsubstituted heteroaryl group of 2 to 30 ring-forming carbon atoms, or may be combined with an adjacent group to form a ring.

In Formula F-b, U and V may each independently be a substituted or unsubstituted hydrocarbon ring of 5 to 30 ring-forming carbon atoms, or a substituted or unsubstituted heterocycle of 2 to 30 ring-forming carbon atoms.

In Formula F-b, the number of rings represented by U and V may each independently be 0 or 1. For example, if the number of U or V is 1, a fused ring may be present at the part designated by U or V, and if the number of U or V is 0, a fused ring may not be present at the part designated by U or V. If the number of U is 0 and the number of V is 1, or if the number of U is 1 and the number of V is 0, a fused ring having a fluorene core of Formula F-b may be a polycyclic compound with four rings. If the number of both U and V is 0, a fused ring having a fluorene core of Formula F-b may be a polycyclic compound with three rings. If the number of U and V is each 1, a fused ring having a fluorene core of Formula F-b may be a polycyclic compound with five rings.

[Formula F-c]

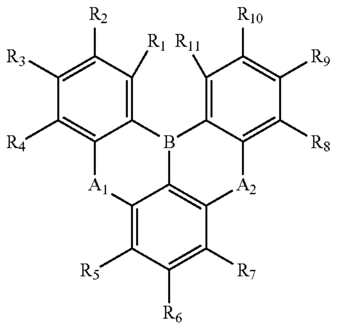

In Formula F-c, $A_1$ and $A_2$ may each independently be O, S, Se, or $N(R_m)$; and $R_m$ may be a hydrogen atom, a deuterium atom, a substituted or unsubstituted alkyl group of 1 to 20 carbon atoms, a substituted or unsubstituted aryl group of 6 to 30 ring-forming carbon atoms, or a substituted or unsubstituted heteroaryl group of 2 to 30 ring-forming carbon atoms. In Formula F-c, $R_1$ to $R_{11}$ may each independently be a hydrogen atom, a deuterium atom, a halogen atom, a cyano group, a substituted or unsubstituted amine group, a substituted or unsubstituted boryl group, a substituted or unsubstituted oxy group, a substituted or unsubstituted thio group, a substituted or unsubstituted alkyl group of 1 to 20 carbon atoms, a substituted or unsubstituted aryl group of 6 to 30 ring-forming carbon atoms, or a substituted or unsubstituted heteroaryl group of 2 to 30 ring-forming carbon atoms, or may be combined with an adjacent group to form a ring.

In Formula F-c, $A_1$ and $A_2$ may each independently be combined with the substituents of an adjacent ring to form a fused ring. For example, if $A_1$ and $A_2$ are each independently $N(R_m)$, $A_1$ may be combined with $R_4$ or $R_5$ to form a ring. For example, $A_2$ may be combined with $R_7$ or $R_5$ to form a ring.

In an embodiment, the emission layer EML may include, as a dopant material of the related art, styryl derivatives (for example, 1,4-bis[2-(3-N-ethylcarbazoryl)vinyl]benzene (BCzVB), 4-(di-p-tolylamino)-4'-[(di-p-tolylamino)styryl]stilbene (DPAVB), N-(4-((E)-2-(6-((E)-4-(diphenylamino)styryl)naphthalen-2-yl)vinyl)phenyl)-N-phenylbenzenamine (N-BDAVBi), and 4,4'-bis[2-(4-(N,N-diphenylamino)phenyl)vinyl]biphenyl (DPAVBi)), perylene and the derivatives thereof (for example, 2,5,8,11-tetra-t-butylperylene (TBP)), pyrene and the derivatives thereof (for example, 1,1-dipyrene, 1,4-dipyrenylbenzene, and 1,4-bis(N,N-diphenylamino)pyrene), etc.

The EML may include a phosphorescence dopant material of the related art. For example, the phosphorescence dopant may include a metal complex including iridium (Ir), platinum (Pt), osmium (Os), gold (Au), titanium (Ti), zirconium (Zr), hafnium (Hf), europium (Eu), terbium (Tb), or thulium (Tm). For example, iridium(III) bis(4,6-difluorophenylpyridinato-N,C2') (Flrpic), bis(2,4-difluorophenylpyridinato)-tetrakis(1-pyrazolyl)borate iridium(III) (Fir6), or platinum octaethyl porphyrin (PtOEP) may be used as the phosphorescence dopant. However, embodiments are not limited thereto.

The emission layer EML may include a quantum dot material. The quantum dot may be selected from a Group II-VI compound, a Group III-VI compound, a Group compound, a Group III-V compound, a Group III-II-V compound, a Group IV-VI compound, a Group IV element, a Group IV compound, and combinations thereof.

The Group II-VI compound may be selected from: a binary compound selected from the group consisting of CdSe, CdTe, CdS, ZnS, ZnSe, ZnTe, ZnO, HgS, HgSe, HgTe, MgSe, MgS, and mixtures thereof; a ternary compound selected from the group consisting of CdSeS, CdSeTe, CdSTe, ZnSeS, ZnSeTe, ZnSTe, HgSeS, HgSeTe, HgSTe, CdZnS, CdZnSe, CdZnTe, CdHgS, CdHgSe, CdHgTe, HgZnS, HgZnSe, HgZnTe, MgZnSe, MgZnS, and mixtures thereof; a quaternary compound selected from the group consisting of HgZnTeS, CdZnSeS, CdZnSeTe, CdZnSTe, CdHgSeS, CdHgSeTe, CdHgSTe, HgZnSeS, HgZnSeTe, HgZnSTe, and mixtures thereof; or any combination thereof.

The Group III-V compound may be selected from: a binary compound such as $In_2S_3$, and $In_2Se_3$; a ternary compound such as $InGaS_3$, and $InGaSe_3$; or any combination thereof.

The Group compound may be selected from: a ternary compound selected from the group consisting of AgInS, $AgInS_2$, CuInS, $CuInS_2$, $AgGaS_2$, $CuGaS_2$, $CuGaO_2$, $AgGaO_2$, $AgAlO_2$ and mixtures thereof; a quaternary compound such as $AgInGaS_2$, and $CuInGaS_2$; or any combination thereof.

The Group III-V compound may be selected from: a binary compound selected from the group consisting of GaN, GaP, GaAs, GaSb, AlN, AlP, AlAs, AlSb, InN, InP, InAs, InSb, and mixtures thereof; a ternary compound selected from the group consisting of GaNP, GaNAs, GaNSb, GaPAs, GaPSb, AlNP, AlNAs, AlNSb, AlPAs, AlPSb, InGaP, InAlP, InNP, InNAs, InNSb, InPAs, InPSb, and mixtures thereof; a quaternary compound selected from the group consisting of GaAlNP, GaAlNAs, GaAlNSb, GaAlPAs, GaAlPSb, GaInNP, GaInNAs, GaInNSb, GaInPAs, GaInPSb, InAlNP, InAlNAs, InAlNSb, InAlPAs, InAlPSb, and mixtures thereof; or any combination thereof. The Group III-V compound may further include a Group II metal. For example, InZnP, etc. may be selected as a Group III-II-V compound.

The Group IV-VI compound may be selected from: a binary compound selected from the group consisting of SnS, SnSe, SnTe, PbS, PbSe, PbTe, and mixtures thereof; a ternary compound selected from the group consisting of SnSeS, SnSeTe, SnSTe, PbSeS, PbSeTe, PbSTe, SnPbS, SnPbSe, SnPbTe, and mixtures thereof; a quaternary compound selected from the group consisting of SnPbSSe, SnPbSeTe, SnPbSTe, and mixtures thereof; or any combination thereof. The Group IV element may be selected from the group consisting of Si, Ge, and a mixture thereof. The Group IV compound may be a binary compound selected from the group consisting of SiC, SiGe, and a mixture thereof.

A binary compound, a ternary compound, or a quaternary compound may be present in a particle at a uniform concentration, or may be present in a particle at a partially different concentration distribution state. In an embodiment, the quantum dot may have a core/shell structure in which a quantum dot surrounds another quantum dot. A quantum dot having a core/shell structure may have a concentration gradient in which the concentration of an element that is present in the shell decreases toward the center of the quantum dot.

In embodiments, the quantum dot may have the above-described core-shell structure including a core including a nanocrystal and a shell surrounding the core. The shell of the quantum dot may serve as a protection layer for preventing the chemical deformation of the core to maintain semiconductor properties and/or may serve as a charging layer for imparting the quantum dot with electrophoretic properties. The shell may be a single layer or a multilayer. Examples of the shell of the quantum dot may include a metal oxide, a non-metal oxide, a semiconductor compound, or combinations thereof.

For example, examples of the metal oxide or the non-metal oxide may include a binary compound such as $SiO_2$, $Al_2O_3$, $TiO_2$, ZnO, MnO, $Mn_2O_3$, $Mn_3O_4$, CuO, FeO, $Fe_2O_3$, $Fe_3O_4$, CoO, $Co_3O_4$ and NiO, or a ternary compound such as $MgAl_2O_4$, $CoFe_2O_4$, $NiFe_2O_4$ and $CoMn_2O_4$, but embodiments are not limited thereto.

Examples of the semiconductor compound may include CdS, CdSe, CdTe, ZnS, ZnSe, ZnTe, ZnSeS, ZnTeS, GaAs, GaP, GaSb, HgS, HgSe, HgTe, InAs, InP, InGaP, InSb, AlAs, AlP, AlSb, etc., but embodiments are not limited thereto.

The quantum dot may have a full width of half maximum (FWHM) of an emission wavelength spectrum equal to or less than about 45 nm. For example, the quantum dot may have a FWHM of an emission wavelength spectrum equal to or less than about 40 nm. For example, the quantum dot may have a FWHM of an emission wavelength spectrum equal to or less than about 30 nm. Within these ranges, color purity or color reproducibility may be improved. Light emitted through a quantum dot may be emitted in all directions, so that light viewing angle properties may be improved.

The shape of the quantum dot may be any form that is used in the related art, without limitation. For example, the quantum dot may have a spherical shape, a pyramidal shape, a multi-arm shape, or a cubic shape, or the quantum dot may be in the form of a nanoparticle, a nanotube, a nanowire, a nanofiber, a nanoplate particle, etc.

The quantum dot may control the color of light emitted according to a particle size thereof, and accordingly, the quantum dot may have various emission colors such as blue, red, or green.

In the light emitting elements ED of embodiments, as shown in FIG. 3 to FIG. 6, the electron transport region ETR is provided on the emission layer EML. The electron transport region ETR may include at least one of a hole blocking layer HBL, an electron transport layer ETL, or an electron injection layer EIL. However, embodiments are not limited thereto.

The electron transport region ETR may be a layer formed of a single material, a layer formed of different materials, or a structure having multiple layers formed of different materials.

For example, the electron transport region ETR may have a single layer structure of an electron injection layer EIL or an electron transport layer ETL, or may have a single layer structure formed of an electron injection material and an electron transport material. In other embodiments, the electron transport region ETR may have a single layer structure formed of different materials, or may have a structure in which an electron transport layer ETL/electron injection layer EIL, or a hole blocking layer HBL/electron transport layer ETL/electron injection layer EIL are stacked in its respective stated order from the emission layer EML, but embodiments are not limited thereto. A thickness of the electron transport region ETR may be, for example, in a range of about 1,000 Å to about 1,500 Å.

The electron transport region ETR may be formed using various methods such as a vacuum deposition method, a spin coating method, a cast method, a Langmuir-Blodgett (LB) method, an inkjet printing method, a laser printing method, and a laser induced thermal imaging (LITI) method.

The electron transport region ETR may include a compound represented by Formula ET-1.

[Formula ET-1]

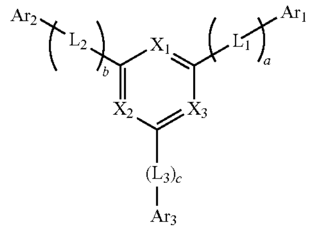

In Formula ET-1, at least one of $X_1$ to $X_3$ may be N, and the remainder of $X_1$ to $X_3$ may be $C(R_a)$; and $R_a$ may be a hydrogen atom, a deuterium atom, a substituted or unsubstituted alkyl of 1 to 20 carbon atoms, a substituted or unsubstituted aryl group of 6 to 30 ring-forming carbon atoms, or a substituted or unsubstituted heteroaryl group of 2 to 30 ring-forming carbon atoms. In Formula ET-1, $Ar_1$ to Ara may each independently be a hydrogen atom, a deuterium atom, a substituted or unsubstituted alkyl group of 1 to 20 carbon atoms, a substituted or unsubstituted aryl group of 6 to 30 ring-forming carbon atoms, or a substituted or unsubstituted heteroaryl group of 2 to 30 ring-forming carbon atoms.

In Formula ET-1, a to c may each independently be an integer from 0 to 10. In Formula ET-1, $L_1$ to $L_3$ may each independently be a direct linkage, a substituted or unsubstituted arylene group of 6 to 30 ring-forming carbon atoms, or a substituted or unsubstituted heteroarylene group of 2 to 30 ring-forming carbon atoms. If a to c are 2 or more, $L_1$ to $L_3$ may each independently be a substituted or unsubstituted arylene group of 6 to 30 ring-forming carbon atoms, or a substituted or unsubstituted heteroarylene group of 2 to 30 ring-forming carbon atoms.

The electron transport region ETR may include an anthracene-based compound. However, embodiments are not limited thereto, and the electron transport region ETR may include, for example, tris(8-hydroxyquinolinato)aluminum ($Alq_3$), 1,3,5-tri[(3-pyridyl)-phen-3-yl]benzene, 2,4,6-tris(3'-(pyridin-3-yl)biphenyl-3-yl)-1,3,5-triazine, 2-(4-(N-phenylbenzoimidazolyl-1-ylphenyl)-9,10-dinaphthylanthracene, 1,3,5-tri(1-phenyl-1H-benzo[d]imidazol-2-yl)benzene (TPBi), 2,9-dimethyl-4,7-diphenyl-1,10-phenanthroline (BCP), 4,7-diphenyl-1,10-phenanthroline (Bphen), 3-(4-biphenylyl)-4-phenyl-5-tert-butylphenyl-1,2,4-triazole (TAZ), 4-(naphthalen-1-yl)-3,5-diphenyl-4H-1,2,4-triazole (NTAZ), 2-(4-biphenylyl)-5-(4-tert-butylphenyl)-1,3,4-oxadiazole (tBu-PBD), bis(2-methyl-8-quinolinolato-N1,O8)-(1,1'-biphenyl-4-olato)aluminum (BAlq), berylliumbis(benzoquinolin-10-olate ($Bebq_2$), 9,10-di(naphthalene-2-yl) anthracene (ADN), 1,3-bis[3,5-di(pyridin-3-yl)phenyl] benzene (BmPyPhB), and mixtures thereof, without limitation.

The electron transport region ETR may include at least one of Compounds ET1 to ET36.

ET1

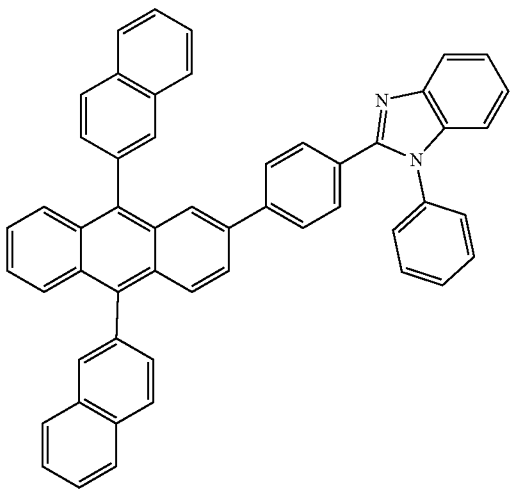

ET2

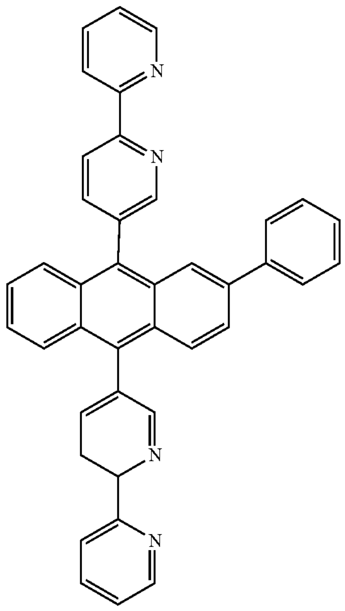

-continued

ET3

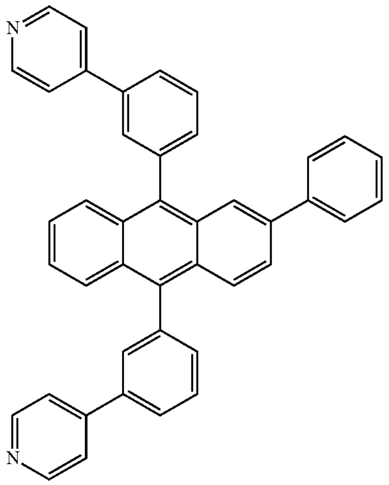

ET4

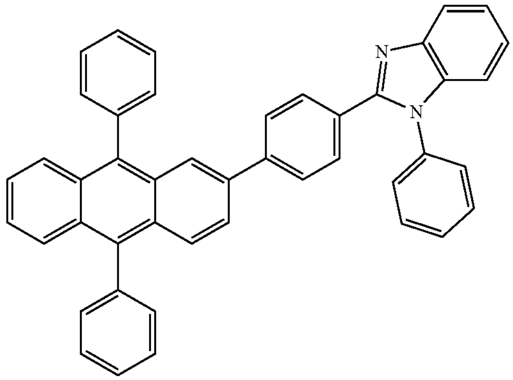

ET5

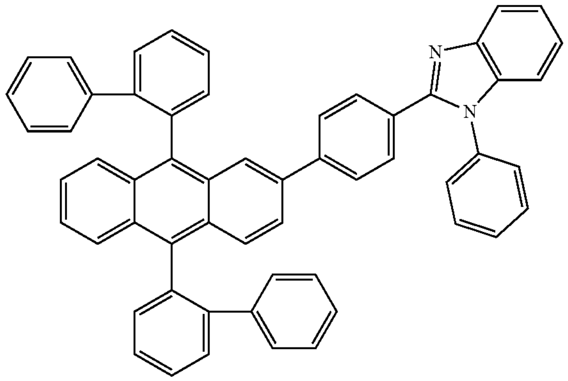

ET6
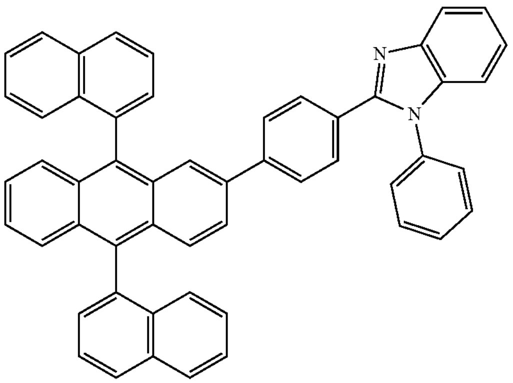
ET7
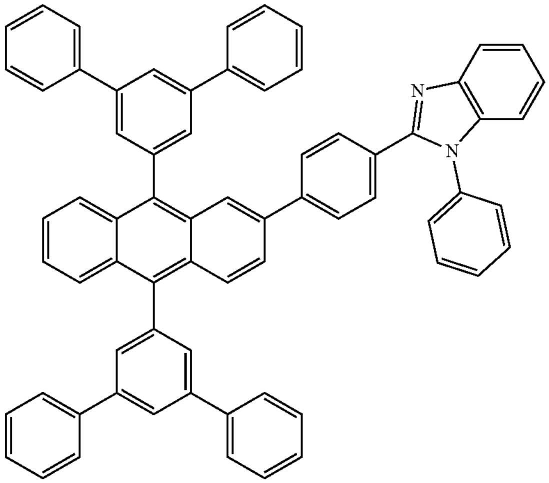
ET8
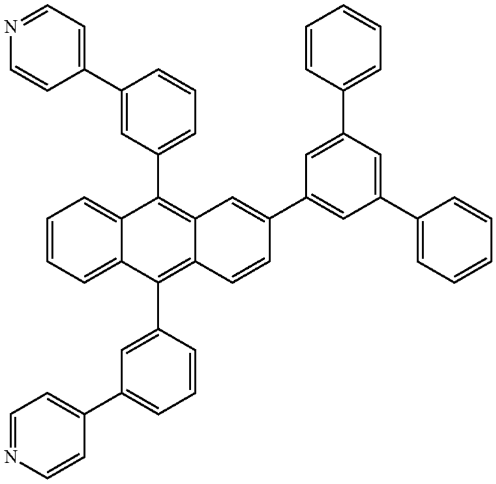
ET9
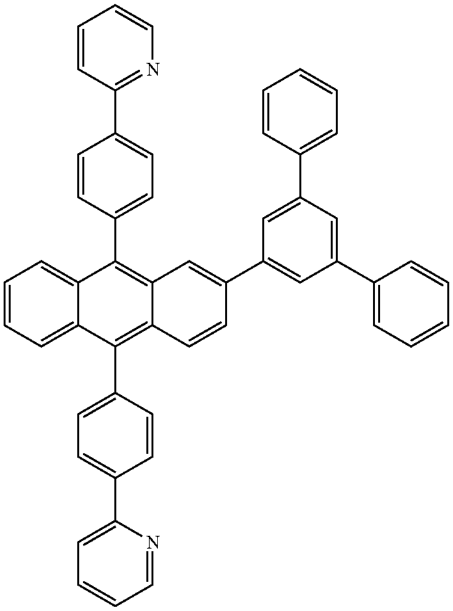
ET10
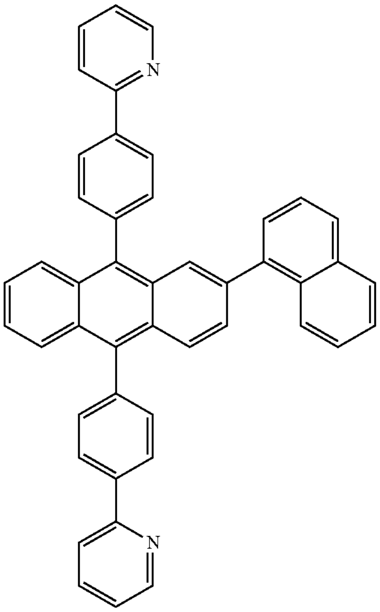

-continued
ET11
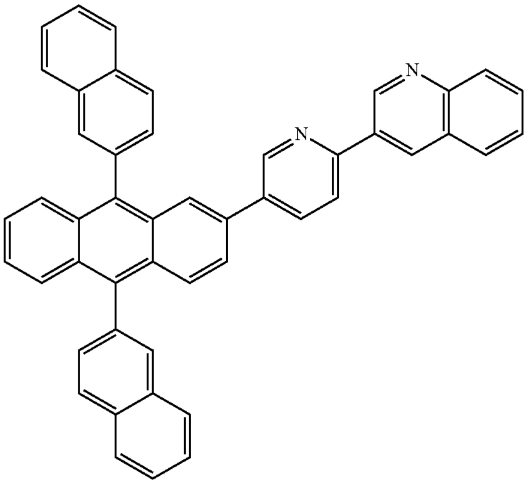
ET12
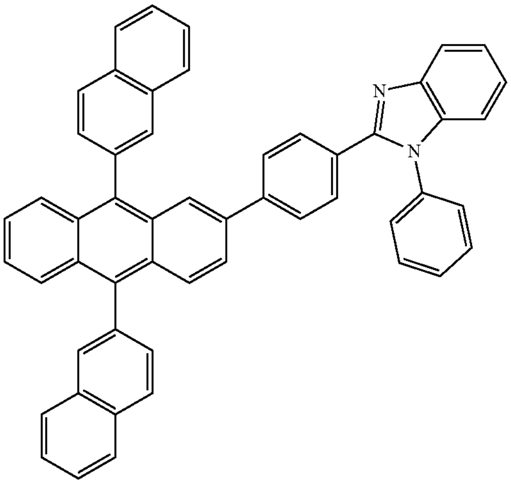
ET13
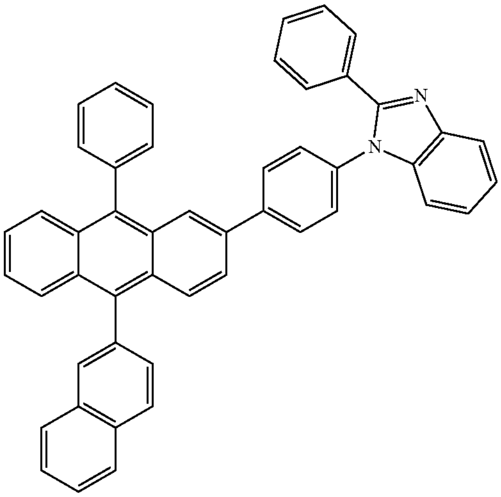
-continued
ET14
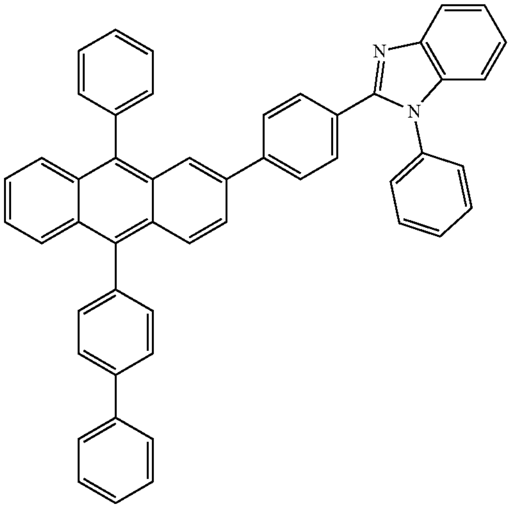
ET15
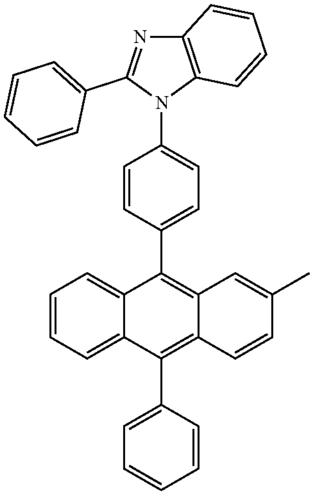
ET16
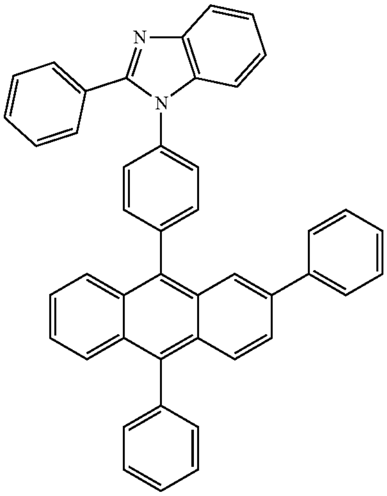

-continued
ET17
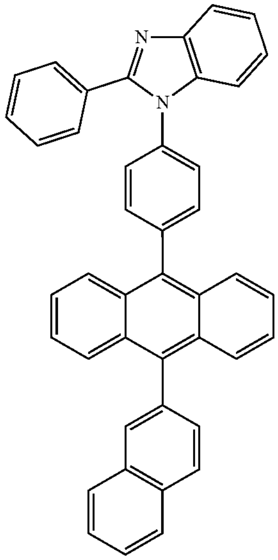
ET18
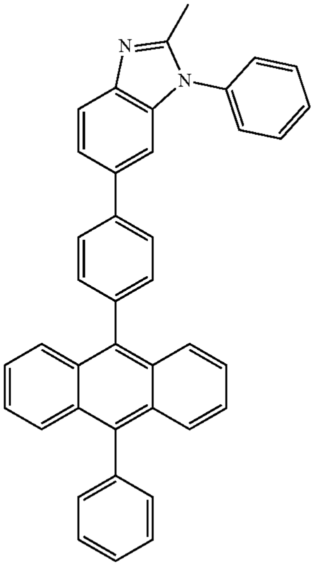
ET19
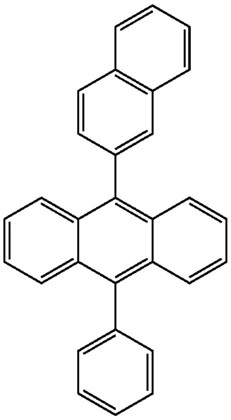
-continued
ET20
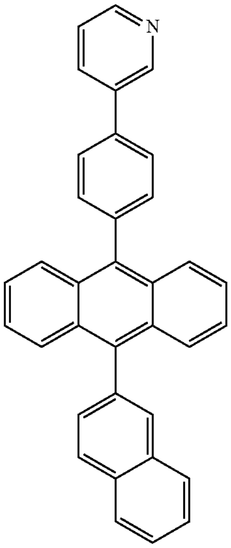
ET21
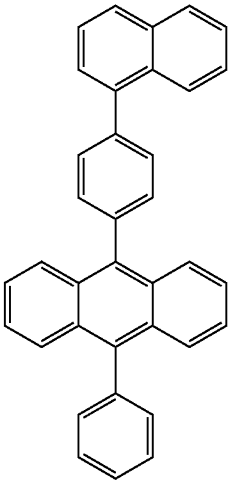
ET22
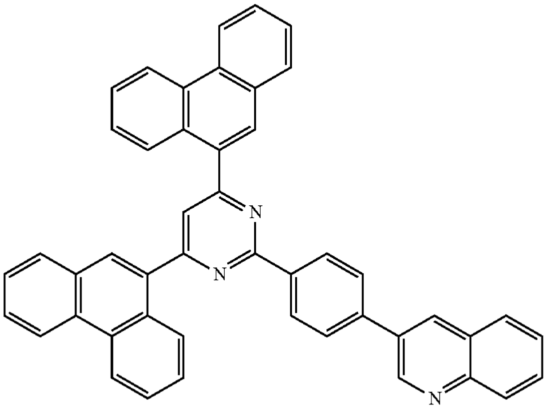

-continued
ET23
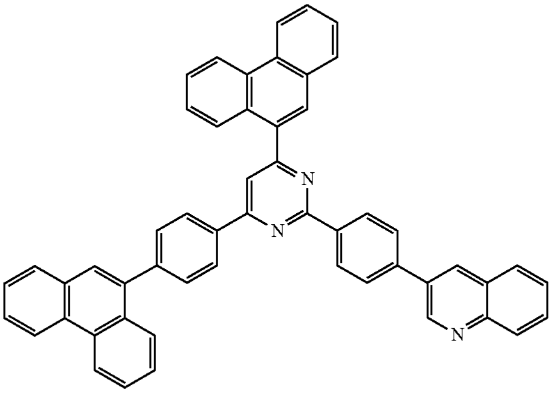
ET24
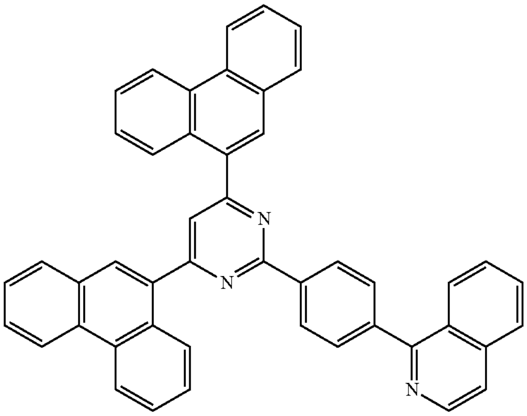
ET25
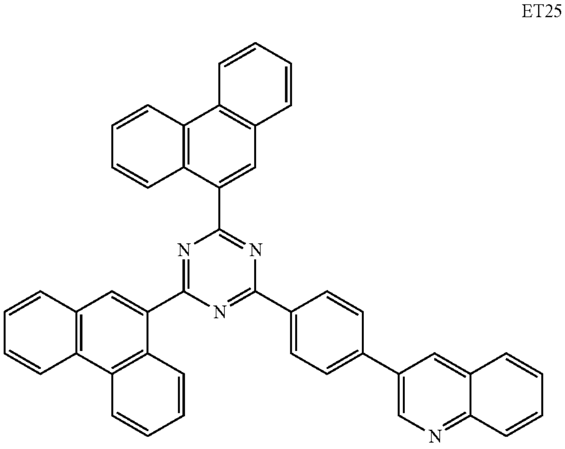
-continued
ET26
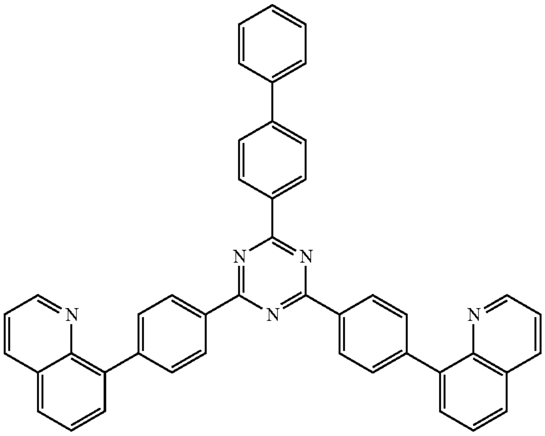
ET27
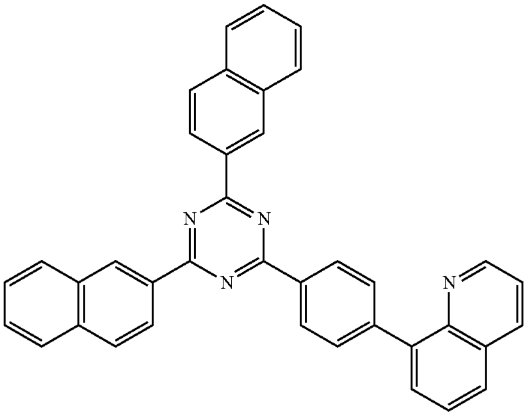
ET28
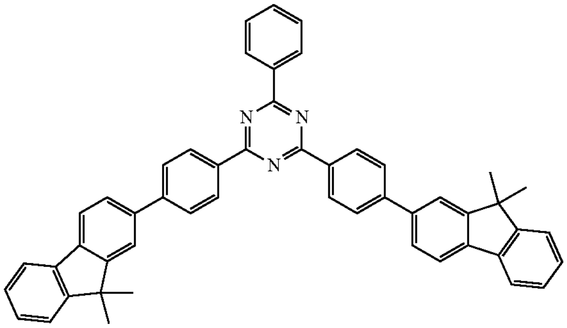

-continued
ET29
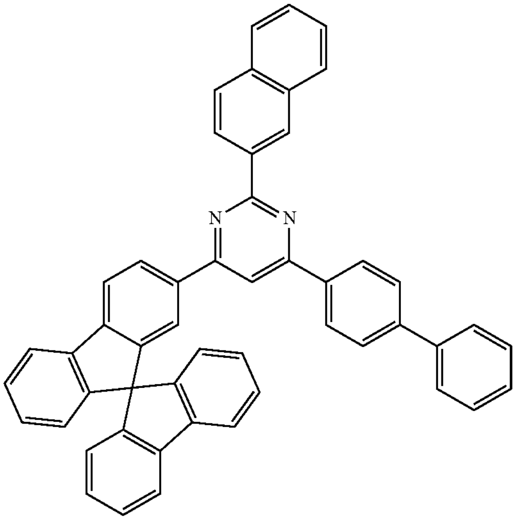
ET30
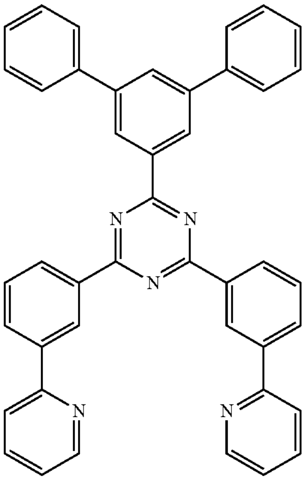
ET31
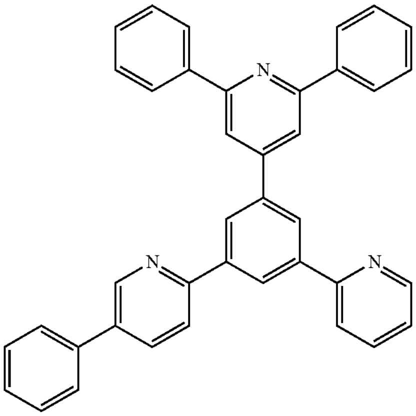
-continued
ET32
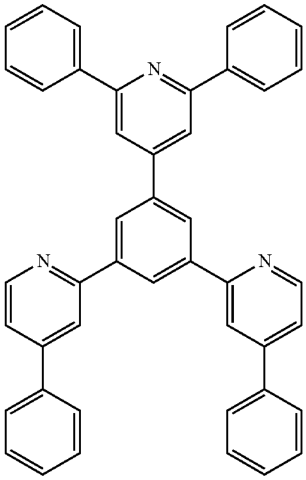
ET33
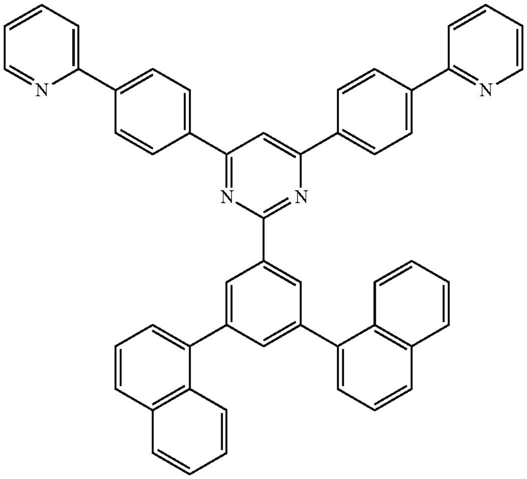
ET34
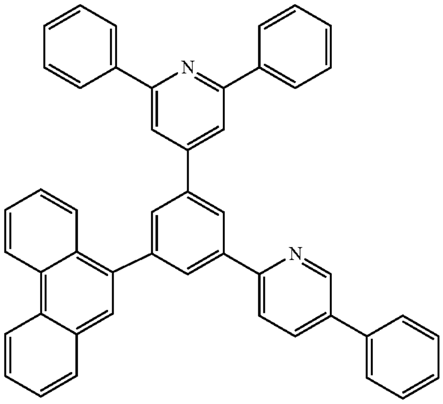

-continued

ET35

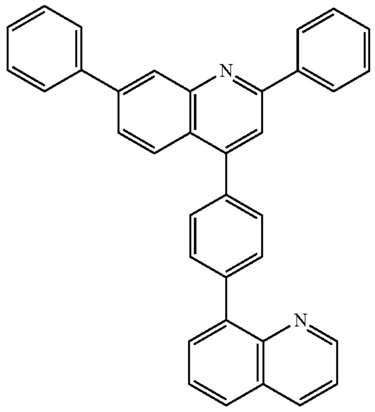

ET36

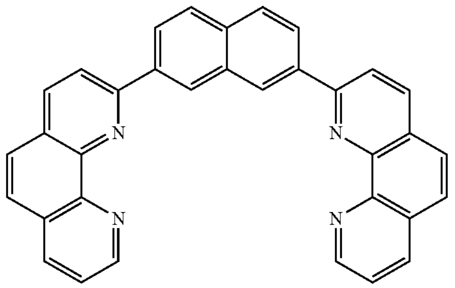

The electron transport region ETR may include a metal halide such as LiF, NaCl, CsF, RbCl, RbI, CuI, or KI, a lanthanide such as Yb, or a co-depositing material of the metal halide and the lanthanide. For example, the electron transport region ETR may include KI:Yb, RbI:Yb, LiF:Yb, etc., as the co-depositing material. The electron transport region ETR may include a metal oxide such as $Li_2O$ and BaO, or 8-hydroxy-lithium quinolate (Liq). However, embodiments are not limited thereto. The electron transport region ETR also may be formed of a mixture material of an electron transport material and an insulating organo metal salt. The organo metal salt may be a material having an energy band gap equal to or greater than about 4 eV. For example, the organo metal salt may include metal acetates, metal benzoates, metal acetoacetates, metal acetylacetonates, or metal stearates.

The electron transport region ETR may include at least one of 2,9-dimethyl-4,7-diphenyl-1,10-phenanthroline (BCP), diphenyl(4-(triphenyl silyl)phenyl)phosphine oxide (TSPO1) or 4,7-diphenyl-1,10-phenanthroline (Bphen) in addition to the aforementioned materials. However, embodiments are not limited thereto.

The electron transport region ETR may include the compounds of the electron transport region in at least one of an electron injection layer EIL, an electron transport layer ETL, or a hole blocking layer HBL.

If the electron transport region ETR includes an electron transport layer ETL, a thickness of the electron transport layer ETL may be in a range of about 100 Å to about 1,000 Å. For example, the thickness of the electron transport layer ETL may be in a range of about 150 Å to about 500 Å. If the thickness of the electron transport layer ETL satisfies the above-described range, satisfactory electron transport properties may be obtained without a substantial increase in driving voltage. If the electron transport region ETR includes an electron injection layer EIL, a thickness of the electron injection layer EIL may be in a range of about 1 Å to about 100 Å. For example, the thickness of the electron injection layer EIL may be in a range of about 3 Å to about 90 Å. If the thickness of the electron injection layer EIL satisfies the above described range, satisfactory electron injection properties may be obtained without inducing a substantial increase in driving voltage.

The second electrode EL2 is provided on the electron transport region ETR. The second electrode EL2 may be a common electrode. The second electrode EL2 may be a cathode or an anode, but embodiments are not limited thereto. For example, if the first electrode EL1 is an anode, the second cathode EL2 may be a cathode, and if the first electrode EL1 is a cathode, the second electrode EL2 may be an anode.

The second electrode EL2 may be a transmissive electrode, a transflective electrode, or a reflective electrode. If the second electrode EL2 is a transmissive electrode, the second electrode EL2 may include a transparent metal oxide, for example, ITO, IZO, ZnO, ITZO, etc.

If the second electrode EL2 is a transflective electrode or a reflective electrode, the second electrode EL2 may include Ag, Mg, Cu, Al, Pt, Pd, Au, Ni, Nd, Ir, Cr, Li, Ca, LiF/Ca, LiF/Al, Mo, Ti, Yb, W, a compound thereof, or a mixture thereof (for example, AgMg, AgYb, or MgAg). In another embodiment, the second electrode EL2 may have a multi-layered structure including a reflective layer or a transflective layer formed of the above-described materials and a transmissive conductive layer formed of ITO, IZO, ZnO, ITZO, etc. For example, the second electrode EL2 may include the aforementioned metal materials, combinations of two or more metal materials selected from the aforementioned metal materials, or oxides of the aforementioned metal materials.

Although not shown in the drawings, the second electrode EL2 may be electrically connected to an auxiliary electrode. If the second electrode EL2 is electrically connected to the auxiliary electrode, the resistance of the second electrode EL2 may decrease.

In an embodiment, the light emitting element ED may further include a capping layer CPL disposed on the second electrode EL2. The capping layer CPL may be a multilayer or a single layer.

In an embodiment, the capping layer CPL may include an organic layer or an inorganic layer. For example, if the capping layer CPL includes an inorganic material, the inorganic material may include an alkali metal compound such as LiF, an alkaline earth metal compound such as $MgF_2$, SiON, SiNx, SiOy, etc.

For example, if the capping layer CPL includes an organic material, the organic material may include α-NPD, NPB, TPD, m-MTDATA, $Alq_3$, CuPc, N4,N4,N4',N4'-tetra(biphenyl-4-yl) biphenyl-4,4'-diamine (TPD15), 4,4',4"-tris(carbazol sol-9-yl) triphenylamine (TCTA), etc., or may include an epoxy resin, or acrylate such as methacrylate. The capping layer CPL may include at least one of Compounds P1 to P5, but embodiments are not limited thereto.

P1

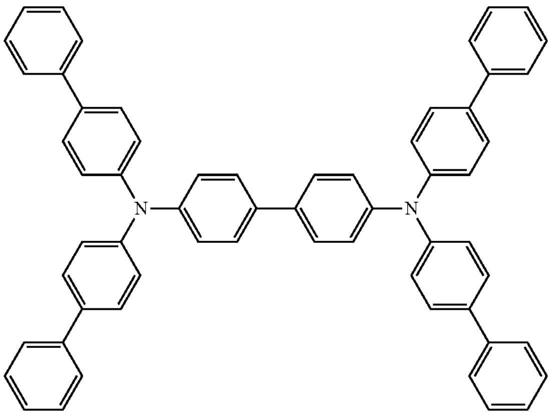

P2

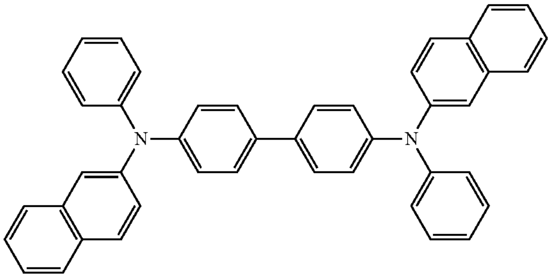

P3

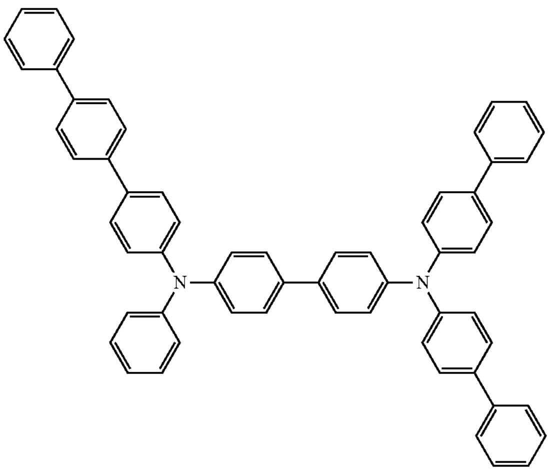

P4

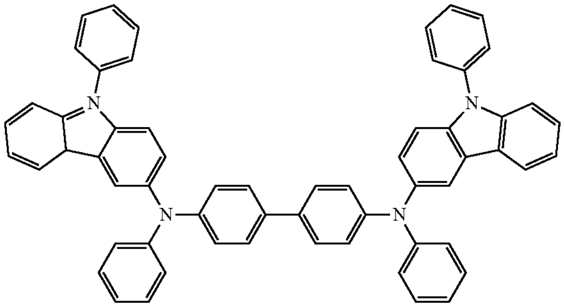

-continued

P5

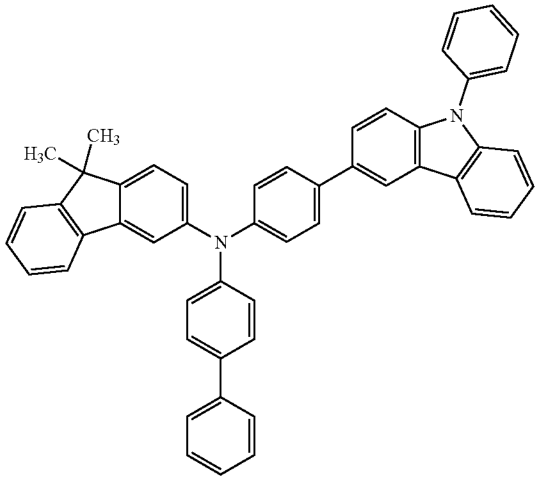

A refractive index of the capping layer CPL may be equal to or greater than about 1.6. For example, the refractive index of the capping layer CPL may be equal to or greater than about 1.6 with respect to light in a wavelength range of about 550 nm to about 660 nm.

FIG. 7 to FIG. 10 are each a schematic cross-sectional view of a display apparatus according to embodiments. In the explanation on the display apparatuses of embodiments, referring to FIG. 7 to FIG. 10, the features that have been described with reference to FIG. 1 to FIG. 6 will not be explained again, and the description will be focused on the differing features.

Figure 7:
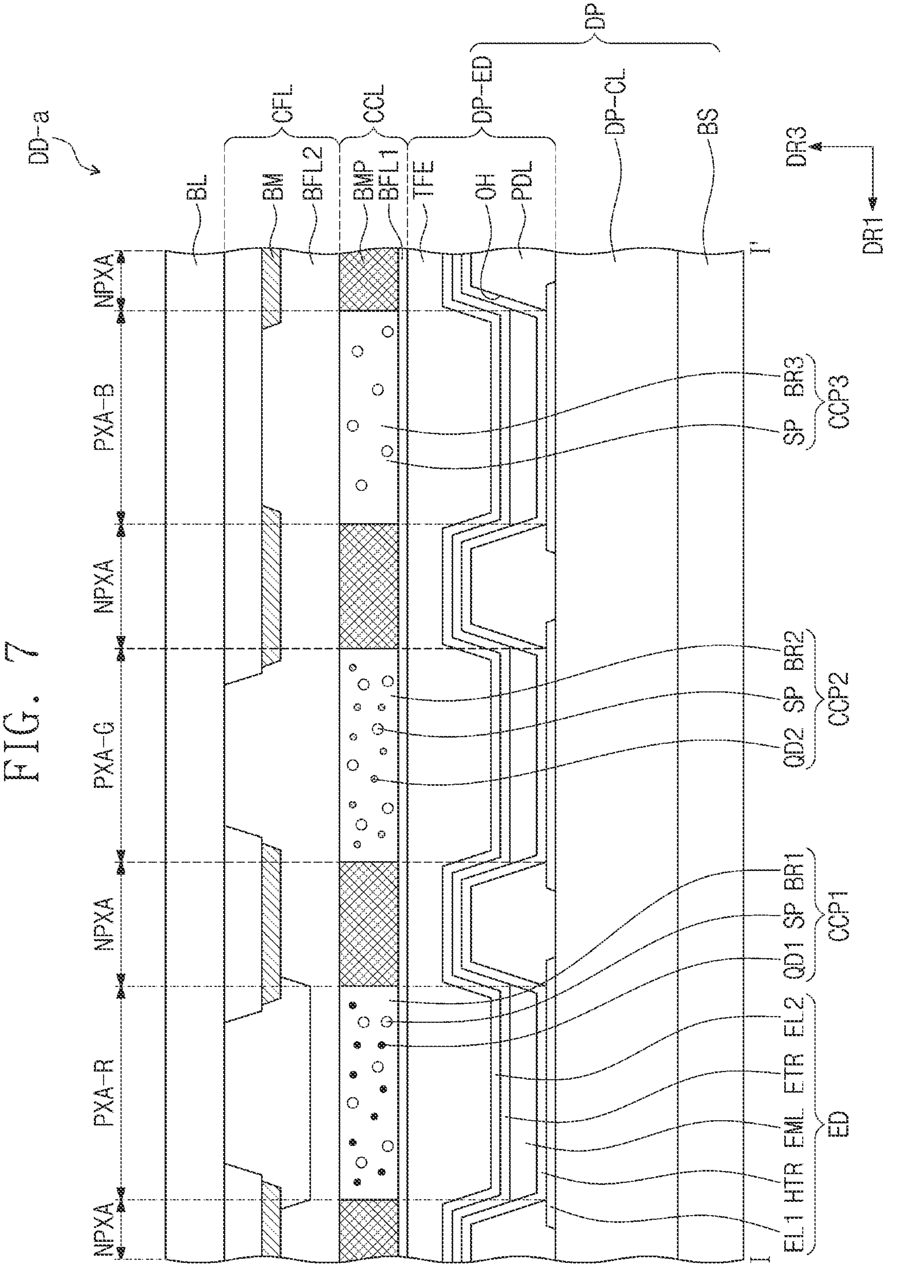
FIG. 7 is a schematic cross-sectional view showing a display apparatus according to an embodiment.

Referring to FIG. 7, a display apparatus DD-a according to an embodiment may include a display panel DP including a display device layer DP-ED, a light controlling layer CCL disposed on the display panel DP, and a color filter layer CFL.

In an embodiment shown in FIG. 7, the display panel DP includes a base layer BS, a circuit layer DP-CL provided on the base layer BS, and a display device layer DP-ED, and the display device layer DP-ED may include a light emitting element ED.

The light emitting element ED may include a first electrode ELL a hole transport region HTR disposed on the first electrode ELL an emission layer EML disposed on the hole transport region HTR, an electron transport region ETR disposed on the emission layer EML, and a second electrode EL2 disposed on the electron transport region ETR. A structure of the light emitting element ED shown in FIG. 7 may be the same as a structure of a light emitting element according to one of FIG. 3 to FIG. 6.

Referring to FIG. 7, the emission layers EML may be disposed in openings OH defined in a pixel definition layer PDL. For example, the emission layers EML, which are separated by the pixel definition layer PDL and correspondingly provided to each of the luminous areas PXA-R, PXA-G, and PXA-B, may emit light in a same wavelength region. In the display apparatus DD-a according to an embodiment, the emission layer EML may emit blue light. Although not shown in the drawings, in an embodiment, the emission layer EML may be provided as a common layer for all luminous areas PXA-R, PXA-G, and PXA-B.

The light controlling layer CCL may be disposed on the display panel DP. The light controlling layer CCL may include a light converter. The light converter may be a quantum dot or a phosphor. The light converter may convert the wavelength of a provided light and may emit the resulting light. For example, the light controlling layer CCL may be a layer including a quantum dot or a layer including a phosphor.

The light controlling layer CCL may include light controlling parts CCP1, CCP2, and CCP3. The light controlling parts CCP1, CCP2, and CCP3 may be separated from one another.

Figure 8:
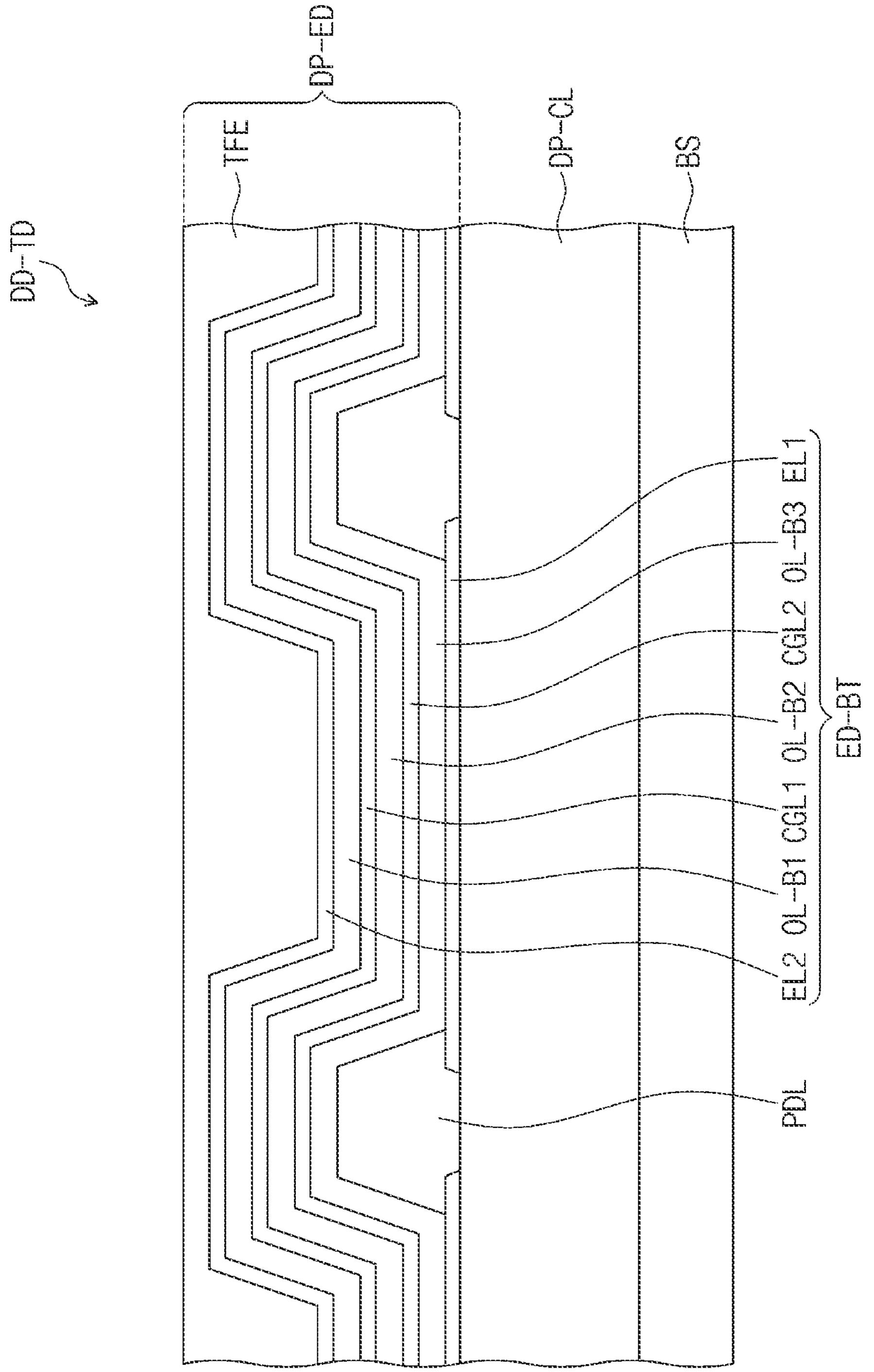
FIG. 8 is a schematic cross-sectional view showing a display apparatus according to an embodiment.

Referring to FIG. 7, a partition pattern BMP may be disposed between the separated light controlling parts CCP1, CCP2, and CCP3, but embodiments are not limited thereto. In FIG. 8, the partition pattern BMP is shown not to overlap the light controlling parts CCP1, CCP2, and CCP3, but at least a portion of the edges of the light controlling parts CCP1, CCP2, and CCP3 may overlap the partition pattern BMP.

The light controlling layer CCL may include a first light controlling part CCP1 including a first quantum dot QD1 converting first color light provided from the light emitting element ED into second color light, a second light controlling part CCP2 including a second quantum dot QD2 converting first color light into third color light, and a third light controlling part CCP3 transmitting first color light.

In an embodiment, the first light controlling part CCP1 may provide red light which is the second color light, and the second light controlling part CCP2 may provide green light which is the third color light. The third color controlling part CCP3 may transmit and provide blue light which is the first color light provided from the light emitting element ED. For example, the first quantum dot QD1 may be a red quantum dot, and the second quantum dot QD2 may be a green quantum dot. The same description of quantum dots as provided above may be applied to the quantum dots QD1 and QD2.

The light controlling layer CCL may further include a scatterer SP. The first light controlling part CCP1 may include the first quantum dot QD1 and the scatterer SP, the second light controlling part CCP2 may include the second quantum dot QD2 and the scatterer SP, and the third light controlling part CCP3 may not include a quantum dot but may include the scatterer SP.

The scatterer SP may be an inorganic particle. For example, the scatterer SP may include at least one of $TiO_2$, ZnO, $Al_2O_3$, $SiO_2$, or hollow silica. The scatterer SP may include at least one of $TiO_2$, ZnO, $Al_2O_3$, $SiO_2$, or hollow silica, or the scatterer SP may be a mixture of two or more materials selected from $TiO_2$, ZnO, $Al_2O_3$, $SiO_2$, and hollow silica.

The first light controlling part CCP1, the second light controlling part CCP2, and the third light controlling part CCP3 may respectively include base resins BR1, BR2, and BR3 for dispersing the quantum dots QD1 and QD2 and the scatterer SP. In an embodiment, the first light controlling part CCP1 may include the first quantum dot QD1 and the scatterer SP dispersed in the first base resin BR1, the second light controlling part CCP2 may include the second quantum dot QD2 and the scatterer SP dispersed in the second base resin BR2, and the third light controlling part CCP3 may include the scatterer particle SP dispersed in the third base resin BR3. The base resins BR1, BR2, and BR3 may each be a medium in which the quantum dots QD1 and QD2 and the scatterer SP are dispersed, and may be composed of various resin compositions which may be generally referred to as a binder. For example, the base resins BR1, BR2, and BR3 may be acrylic resins, urethane-based resins, silicone-based resins, epoxy-based resins, etc. The base resins BR1, BR2, and BR3 may be transparent resins. In an embodiment, the first base resin BR1, the second base resin BR2, and the third base resin BR3 may be the same as or different from each other.

The light controlling layer CCL may include a barrier layer BFL1. The barrier layer BFL1 may block the penetration of moisture and/or oxygen (hereinafter, referred to as "humidity/oxygen"). The barrier layer BFL1 may be disposed on the light controlling parts CCP1, CCP2, and CCP3 to block the exposure of the light controlling parts CCP1, CCP2, and CCP3 to humidity/oxygen. The barrier layer BFL1 may cover the light controlling parts CCP1, CCP2, and CCP3. A barrier layer BFL2 may be provided between the light controlling parts CCP1, CCP2, and CCP3 and a color filter layer CFL.

The barrier layers BFL1 and BFL2 may include at least one inorganic layer. For example, the barrier layers BFL1 and BFL2 may be formed of an inorganic material. For example, the barrier layers BFL1 and BFL2 may each independently include silicon nitride, aluminum nitride, zirconium nitride, titanium nitride, hafnium nitride, tantalum nitride, silicon oxide, aluminum oxide, titanium oxide, tin oxide, cerium oxide, silicon oxynitride or a metal thin film securing light transmittance. The barrier layers BFL1 and BFL2 may further include an organic layer. The barrier layers BFL1 and BFL2 may be composed of a single layer or of multiple layers.

In the display apparatus DD-a according to an embodiment, the color filter layer CFL may be disposed on the light controlling layer CCL. In an embodiment, the color filter layer CFL may be disposed directly on the light controlling layer CCL. For example, the barrier layer BFL2 may be omitted.

The color filter layer CFL may include a light blocking part BM and filters CF1, CF2, and CF3. The color filter layer CFL may include a first filter CF1 transmitting second color light, a second filter CF2 transmitting third color light, and a third filter CF3 transmitting first color light. For example, the first filter CF1 may be a red filter, the second filter CF2 may be a green filter, and the third filter CF3 may be a blue filter. Each of the filters CF1, CF2, and CF3 may include a polymer photosensitive resin and a pigment or dye. The first filter CF1 may include a red pigment or dye, the second filter CF2 may include a green pigment or dye, and the third filter CF3 may include a blue pigment or dye. However, embodiments are not limited thereto, and the third filter CF3 may not include a pigment or a dye. The third filter CF3 may include a polymer photosensitive resin and may not include a pigment or dye. The third filter CF3 may be transparent. The third filter CF3 may be formed of a transparent photosensitive resin.

In an embodiment, the first filter CF1 and the second filter CF2 may each be a yellow filter. The first filter CF1 and the second filter CF2 may be provided without distinction as a single filter.

The light blocking part BM may be a black matrix. The light blocking part BM may include an organic light blocking material or an inorganic light blocking material including a black pigment or a black dye. The light blocking part BM may prevent light leakage and separate the boundaries between adjacent filters CF1, CF2, and CF3. In an embodiment, the light blocking part BM may be formed as a blue filter.

The first to third filters CF1, CF2, and CF3 may be respectively disposed corresponding to each of a red luminous area PXA-R, green luminous area PXA-G, and blue luminous area PXA-B.

A base substrate BL may be disposed on the color filter layer CFL. The base substrate BL may provide a base surface on which the color filter layer CFL, the light controlling layer CCL, etc. are disposed. The base substrate BL may be a glass substrate, a metal substrate, a plastic substrate, etc. However, embodiments are not limited thereto, and the base substrate BL may include an inorganic layer, an organic layer, or a composite material layer. Although not shown in the drawings, in an embodiment, the base substrate BL may be omitted.

FIG. 8 is a schematic cross-sectional view showing a portion of the display apparatus according to an embodiment. FIG. 8 illustrates a schematic cross-sectional view of a portion corresponding to the display panel DP in FIG. 7. In a display apparatus DD-TD according to an embodiment, the light emitting element ED-BT may include light emitting structures OL-B1, OL-B2, and OL-B3. The light emitting element ED-BT may include a first electrode EL1 and an oppositely disposed second electrode EL2, and light emitting structures OL-B1, OL-B2, and OL-B3 stacked in a thickness direction and provided between the first electrode EL1 and the second electrode EL2. Each of the light emitting structures OL-B1, OL-B2, and OL-B3 may include an emission layer EML (FIG. 7), and a hole transport region HTR and an electron transport region ETR, disposed with the emission layer EML (FIG. 7) therebetween.

For example, the light emitting element ED-BT included in the display apparatus DD-TD according to an embodiment may be a light emitting element having a tandem structure including multiple emission layers.

In an embodiment shown in FIG. 8, light emitted from each of the light emitting structures OL-B1, OL-B2, and OL-B3 may be all blue light. However, embodiments are not limited thereto, and the wavelength regions of light emitted from the light emitting structures OL-B1, OL-B2, and OL-B3 may be different from each other. For example, the light emitting element ED-BT including the light emitting structures OL-B1, OL-B2, and OL-B3 which emit light in different wavelength regions may emit white light.

Charge generating layers CGL1 and CGL2 may be disposed between neighboring light emitting structures OL-B1, OL-B2, and OL-B3. Charge generating layers CGL1 and CGL2 may each independently include a p-type charge generating layer and/or an n-type charge generating layer.

Figure 9:
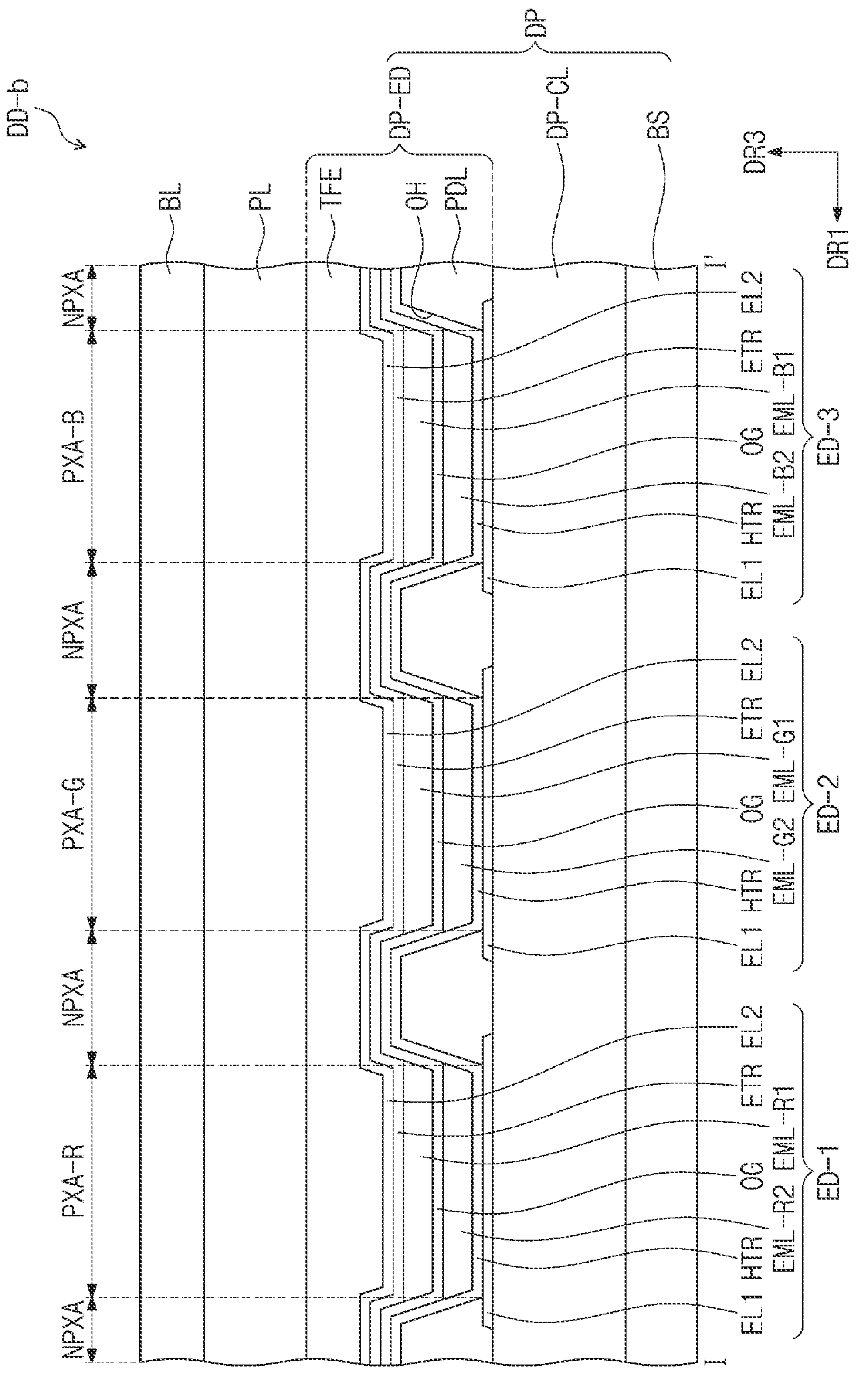
FIG. 9 is a schematic cross-sectional view showing a display apparatus according to an embodiment.

FIG. 9 is a schematic cross-sectional view of a display apparatus DD-b according to an embodiment. Hereinafter, in the explanation on the display apparatus DD-b of an embodiment according to FIG. 9, the features which have been described with reference to FIG. 1 to FIG. 6 will not be explained again, and differing features will be explained.

The display apparatus DD-b according to an embodiment illustrated in FIG. 9 may differ from the display apparatuses DD shown in FIG. 1 to FIG. 6 at least in that the light emitting elements ED-1, ED-2, and ED-3 that are respectively provided to luminous areas PXA-R, PXA-G and PXA-B each include multiple emission layers.

In an embodiment, the first to third light emitting elements ED-1, ED-2, and ED-3 respectively include first emission layers EML-R1, EML-G1, and EML-B1, and second emission layers EML-R2, EML-G2 and EML-B2, stacked between the first electrode EL1 and the second electrode EL2. In the first to third light emitting elements ED-1, ED-2, and ED-3, the first emission layers EML-R1, EML-G1, and EML-B1, and the second emission layers EML-R2, EML-G2 and EML-B2, may respectively emit light of a same wavelength. For example, both the first emission layer EML-R1 and the second emission layer EML-R2 of the first light emitting element ED1 may emit red light, both the first emission layer EML-G1 and the second emission layer EML-G2 of the second light emitting element ED2 may emit green light, and both the first emission layer EML-B1 and the second emission layer EML-B2 of the third light emitting element ED3 may emit blue light.

The first to third light emitting elements ED-1, ED-2, and ED-3 may each include a hole transport region HTR and an electron transport region ETR disposed with the first emission layers EML-R1, EML-G1, and EML-B1 and the second emission layers EML-R2, EML-G2 and EML-B2, therebetween.

An organic layer OG may be disposed between the second emission layers EML-R2, EML-G2 and EML-B2, and the first emission layers EML-R1, EML-G1, and EML-B1. The organic layer OG may include an electron transport region ETR, charge generating layers CGL1 and CGL2 (FIG. 8) and a hole transport region HTR, stacked in that order. The charge generating layers CGL1 and CGL2 (FIG. 8) may each independently include a p-type charge generating layer and/or an n-type charge generating layer.

Figure 10:
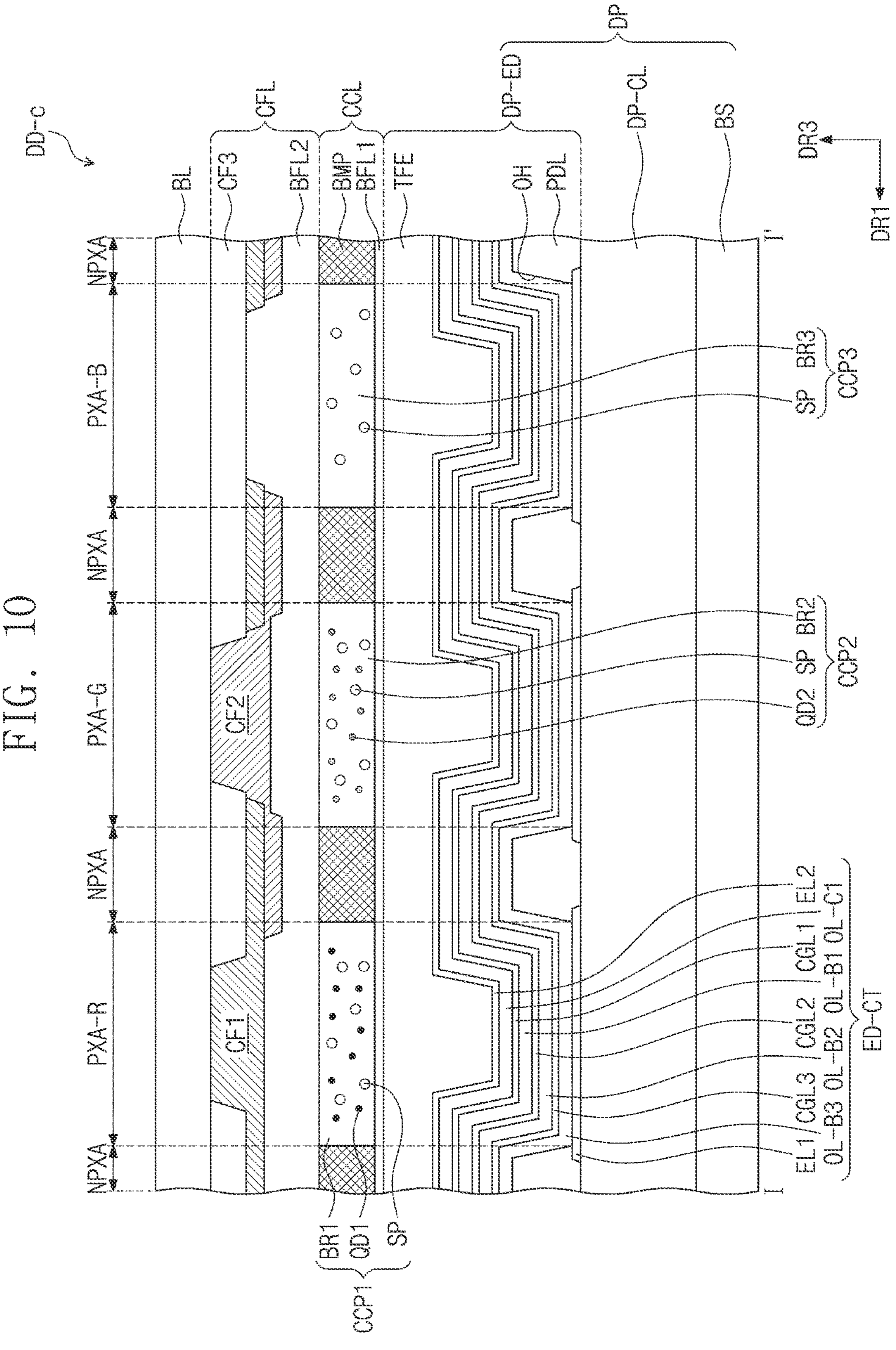
FIG. 10 is a schematic cross-sectional view showing a display apparatus according to an embodiment.

FIG. 10 is a schematic cross-sectional view on a display apparatus DD-c according to an embodiment. Hereinafter, in the explanation on the display apparatus DD-c of an embodiment according to FIG. 10, the features which have been described with reference to FIG. 1 to FIG. 7 will not be explained again, and the differing features will be explained.

Referring to FIG. 10, a display apparatus DD-c according to an embodiment may differ from the display apparatus DD-a shown in FIG. 7 at least in that the display apparatus DD-c includes four light-emitting structures OL-B1, OL-B2, OL-B3, and OL-C1. In the display apparatus DD-c according to an embodiment, each of the first to third light emitting structures OL-B1, OL-B2, and OL-B3 may emit blue light, and the fourth light emitting structure OL-C1 may emit green light. Charge generating layers CGL1, CGL2 and CGL3 may be disposed between neighboring light emitting structures OL-B1, OL-B2, OL-B3, and OL-C1. The charge generating layers CGL1, CGL2 and CGL3 may each independently include a p-type charge generating layer and/or an n-type charge generating layer.

The light emitting element ED according to an embodiment includes the polycyclic compound of an embodiment in an emission layer EML disposed between a first electrode EL1 and a second electrode EL2 and may show improved emission efficiency.

The polycyclic compound of an embodiment has a structure in which a first substituent of an electron withdrawing group is substituted via a carbon-carbon bond at a para position with respect to a boron atom included in a DABNA core structure, and second and third substituents of electron donor groups are substituted at the remaining para positions. In the polycyclic compound of an embodiment, the first substituent is substituted at the DABNA core structure via a carbon-carbon bond, and may have higher bonding energy when compared to a case where the first substituent is substituted via a nitrogen-carbon bond. Since the polycyclic compound of an embodiment has a structure in which two electron donor groups and one electron withdrawing group are substituted at the para positions to the boron atom in the DABNA core structure, the polycyclic compound of an embodiment may have higher multiple resonance effects when compared to a case where one electron withdrawing group is substituted at a para position to the boron atom in the DABNA core structure. As a result, the polycyclic compound of an embodiment may have high material stability. Accordingly, in an embodiment, the light emitting element including the polycyclic compound of an embodiment in an emission layer may have improved emission efficiency.

The light emitting element according to an embodiment includes a hole transport host, an electron transport host, an organometallic complex which is an auxiliary dopant, and the light emitting dopant which is the polycyclic compound of an embodiment in an emission layer, and may reduce energy loss in a triplet state and increase a fluorescence emission ratio to show improved emission efficiency.

Hereinafter, a polycyclic compound according to an embodiment and a light emitting element according to an embodiment will be explained with reference to the Examples and the Comparative Examples. The Examples described below are only provided as illustrations to assist in understanding the disclosure, and the scope thereof is not limited thereto.

EXAMPLES

1. Synthesis of Polycyclic Compound

A synthesis method of the polycyclic compound according to embodiments will be explained by describing the synthesis methods of Compound 4, Compound 19, Compound 39, and Compound 44 in Compound Group 1. The synthesis methods of the polycyclic compounds explained hereinafter are only provided as examples, and the synthesis method of the polycyclic compound according to embodiments is not limited to the Examples below.

Synthesis of Intermediates A, B, C, and D

Intermediates A, B, C, and D, for the synthesis of embodiments may be synthesized by, for example, the steps of Reaction 1.

[Reaction 1]

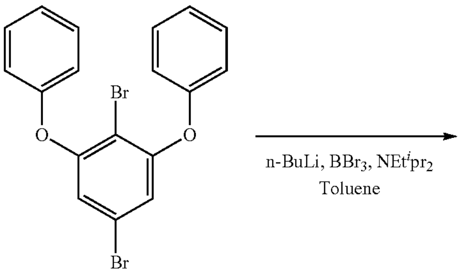

A-1

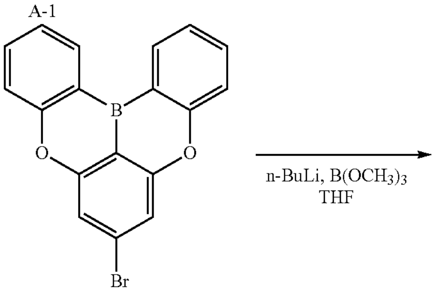

A-2

-continued

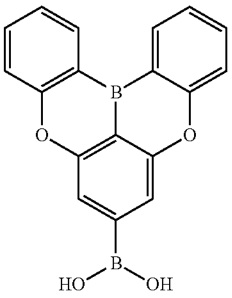

A

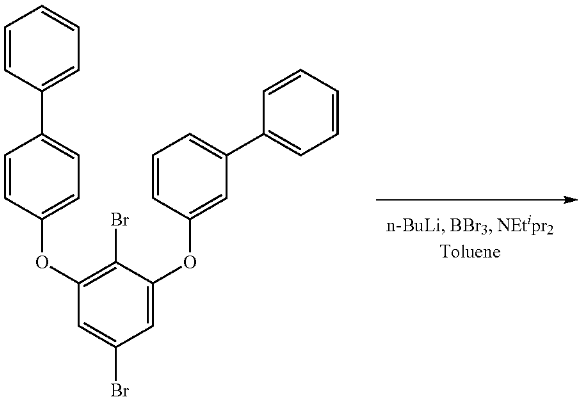

B-1

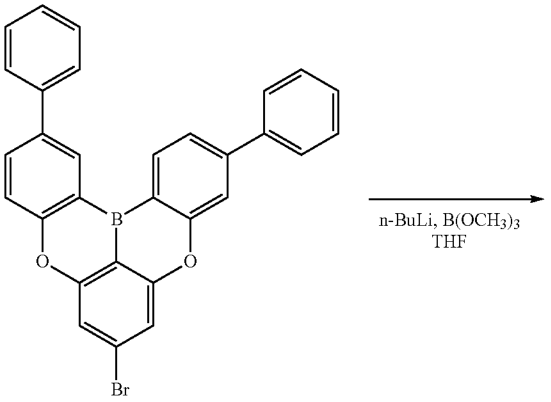

B-2

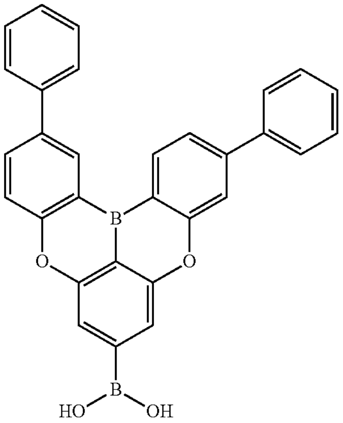

B

-continued

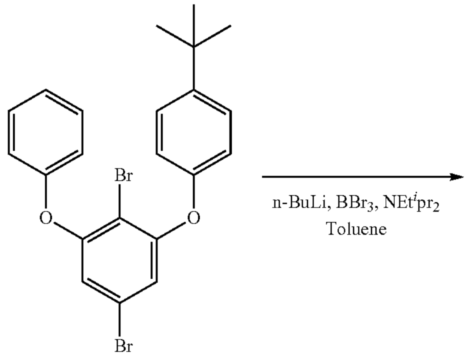

C-1

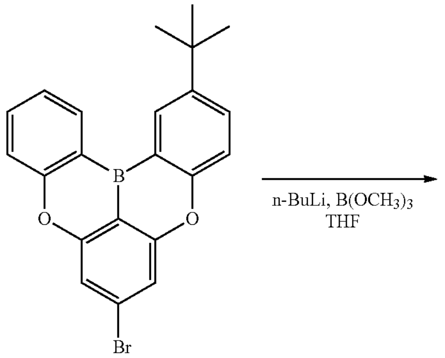

C-2

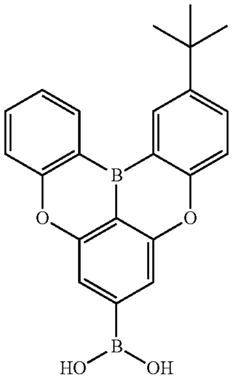

C

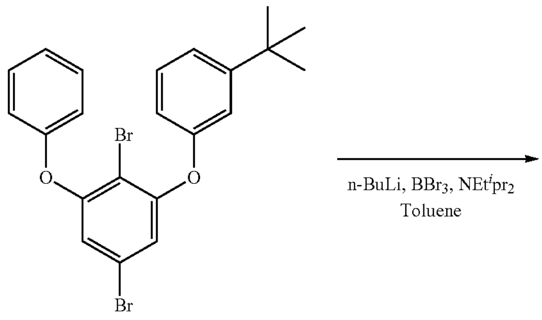

D-1

-continued

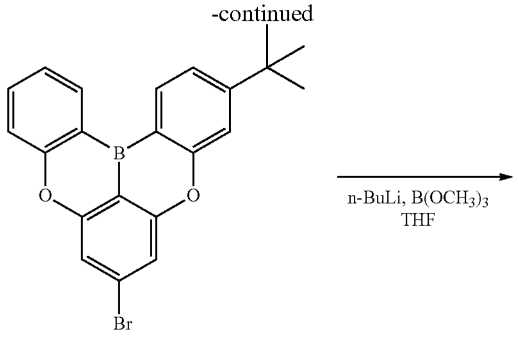

D-2

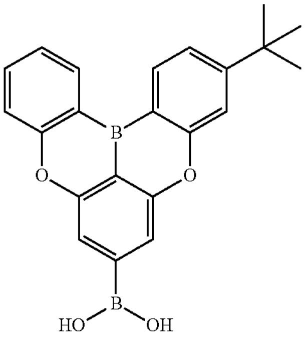

D

Synthesis of Intermediate A-2

Intermediate A-1 (1 eq) was dissolved in toluene and stirred at about −50° C.; and n-butyllithium (2 eq, 1.6 M) was slowly injected thereto, followed by heating to about 60° C. and stirring for about 30 minutes. At about −60° C., boron tribromide (1.1 eq) was slowly injected, followed by stirring at room temperature for about 30 minutes. N,N-diisopropylethylamine (1.5 eq) was injected at about 0° C., followed by stirring at room temperature for about 1 hour. After stirring at about 110° C. for about 24 hours, the reaction product was cooled and dried under a reduced pressure to remove the solvent. An organic layer obtained by washing with ethyl acetate and water was dried and dried under a reduced pressure. Through separation by column chromatography and recrystallization (dichloromethane:n-hexane), Intermediate A-2 was obtained (yield: 37%). Intermediates B-2 (yield: 28%), C-2 (yield: 31%) and D-2 (yield: 34%) were synthesized by the same method above.

Synthesis of Intermediate A

Intermediate A-2 (1 eq) was dissolved in THF and stirred at about −78° C.; and n-butyllithium (1.1 eq, 1.6 M) was slowly injected thereto, followed by heating to about 60° C. and stirring for about 30 minutes. At about −78° C., trimethyl borate (5 eq) was slowly injected, followed by stirring at room temperature for about 3 hours. After finishing the reaction, 2 N—HCl was added, and an organic layer obtained by washing with ethyl acetate and water was dried and dried under a reduced pressure. Through separation by column chromatography and recrystallization (ethyl acetate: n-hexane), Intermediate A was obtained (yield: 47%). Intermediates B (yield: 36%), C (yield: 42%) and D (yield: 33%) were synthesized by the same method above.

2. Synthesis of Compound 4

Compound 4 according to an embodiment may be synthesized by, for example, the steps of Reaction 2.

[Reaction 2]
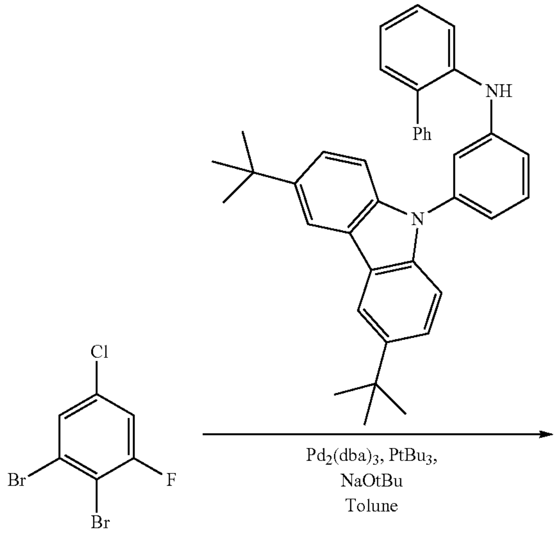
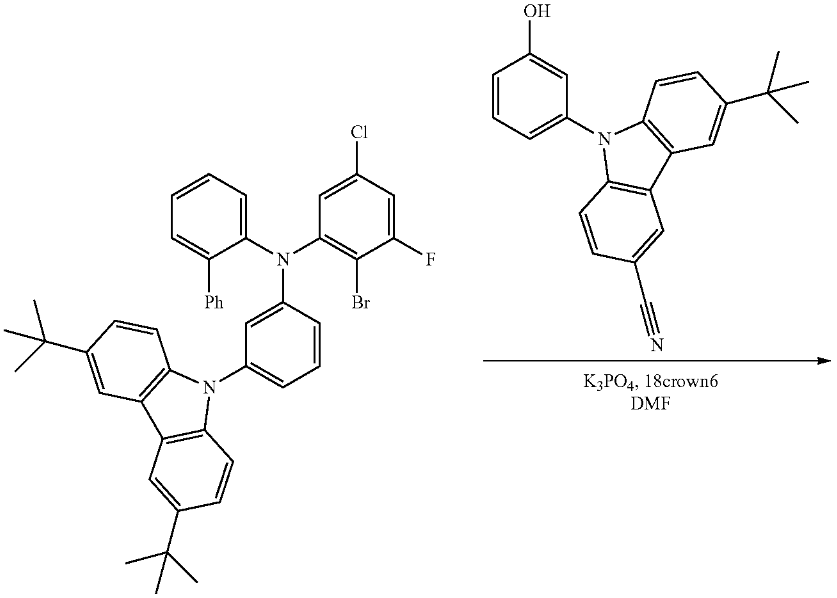
4-1
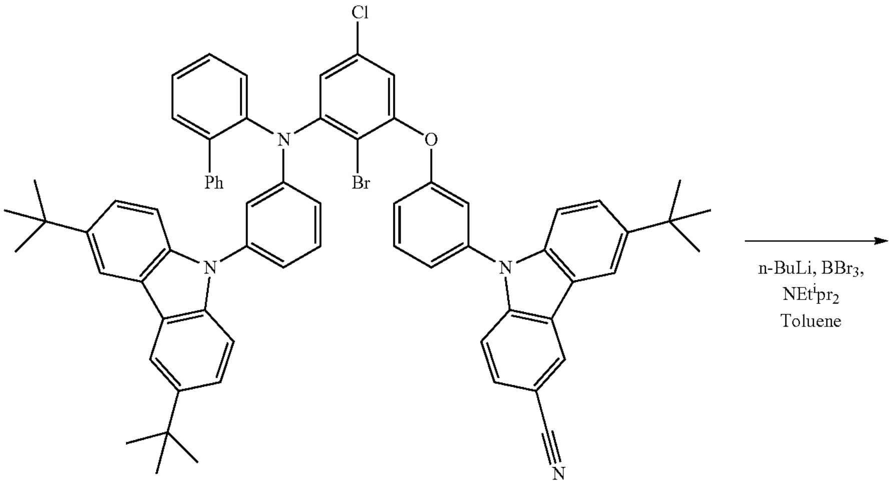
4-2

-continued
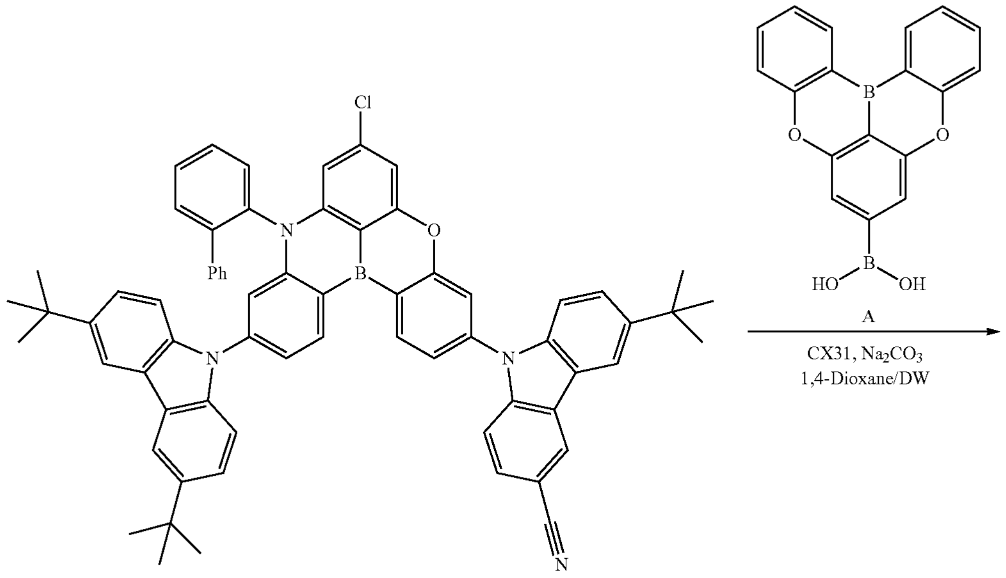
4-3
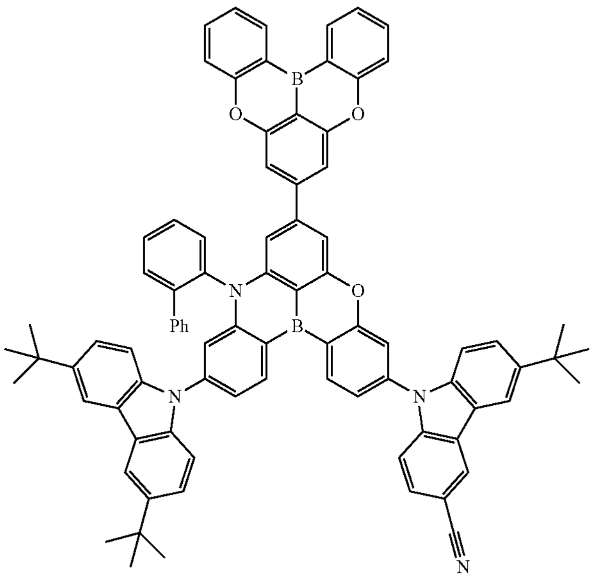
4

Synthesis of Intermediate 4-1

1,2-dibromo-5-chloro-3-fluorobenzene (2.5 eq), N-(3-(3,6-di-tert-butyl-9H-carbazol-9-yl)phenyl)-[1,1'-biphenyl]-2-amine (1 eq), tris(dibenzylideneacetone)dipalladium(0) (0.05 eq), tri-tert-butylphosphine (0.1 eq), and sodium tert-butoxide (3 eq) were dissolved in toluene and stirred under a nitrogen atmosphere at about 110 degrees centigrade for about 6 hours. After cooling, by drying under a reduced pressure, toluene was removed. An organic layer obtained by washing with ethyl acetate and water was dried with $MgSO_4$ and dried under a reduced pressure. Through separation by column chromatography and recrystallization (dichloromethane:n-hexane), Intermediate 4-1 was obtained (yield: 65%).

Synthesis of Intermediate 4-2

Intermediate 4-1 (1 eq), 6-(tert-butyl)-9-(3-hydroxyphenyl)-9H-carbazole-3-carbonitrile (1 eq), potassium phosphate tribasic (2.5 eq), and 18 crown 6 (1.5 eq) were dissolved in DMF and stirred under a nitrogen atmosphere at about 150 degrees centigrade for about 10 hours. After cooling, by drying under a reduced pressure, DMF was removed. An organic layer obtained by washing with ethyl acetate and water was dried with $MgSO_4$ and dried under a reduced pressure. Through separation by column chromatography and recrystallization (dichloromethane:n-hexane), Intermediate 4-2 was obtained (yield: 53%).

Synthesis of Intermediate 4-3

Intermediate A-2 (1 eq) was dissolved in toluene and stirred at about −50° C.; and n-butyllithium (2 eq, 1.6 M) was slowly injected thereto, followed by heating to about 60° C. and stirring for about 30 minutes. At about −60° C., boron tribromide (1.1 eq) was slowly injected, followed by stirring at room temperature for about 30 minutes. N,N-diisopropylethylamine (1.5 eq) was injected at about 0° C., followed by stirring at room temperature for about 1 hour. After stirring at about 110° C. for about 24 hours, the reaction product was cooled and dried under a reduced pressure to remove the solvent. An organic layer obtained by washing with ethyl acetate and water was dried and dried under a reduced pressure. Through separation by column chromatography and recrystallization (dichloromethane:n-hexane), Intermediate 4-3 was obtained (yield: 34%).

Synthesis of Compound 4

Intermediate 4-3 (1 eq), 5,9-dioxa-13b-boranaphtho[3,2,1-de]anthracen-7-ylboronic acid (1.1 eq), CX31 (0.1 eq), and sodium carbonate were dissolved in 1,4-dioxane:distilled water=4:1 and stirred under a nitrogen atmosphere at about 110 degrees centigrade for about 20 hours. After cooling, an organic layer obtained by washing with ethyl acetate and water was dried with $MgSO_4$ and dried under a reduced pressure. Through separation by column chromatography and recrystallization (dichloromethane:n-hexane), Compound 4 was obtained. Final separation was performed by sublimation purification (yield: 12.8%).

3. Synthesis of Compound 19

Compound 19 according to an embodiment may be synthesized by, for example, the steps of Reaction 3.

[Reaction 3]

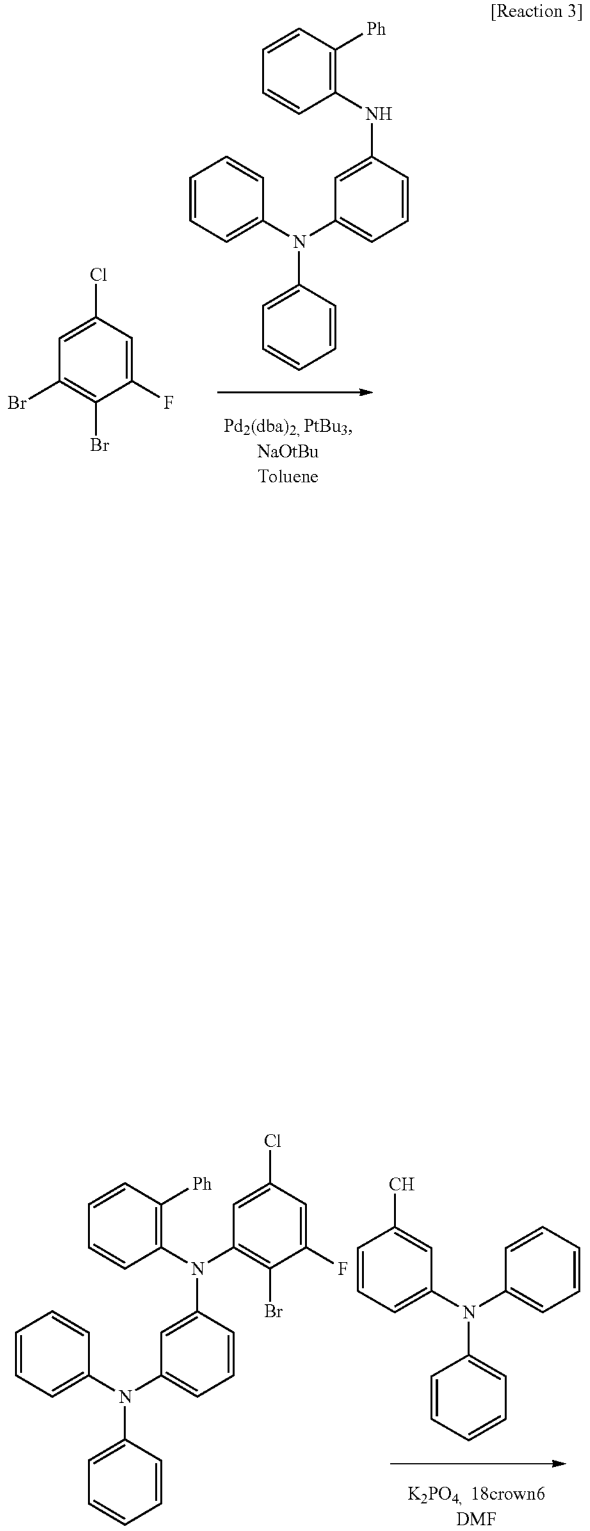

19-1

-continued

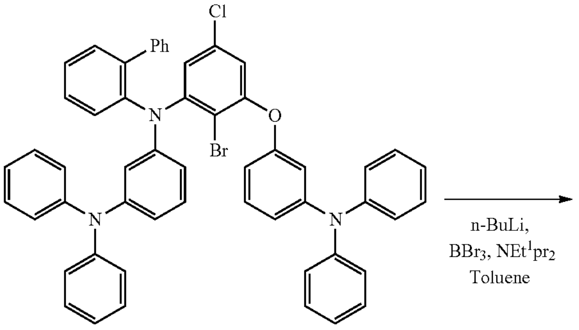

19-2

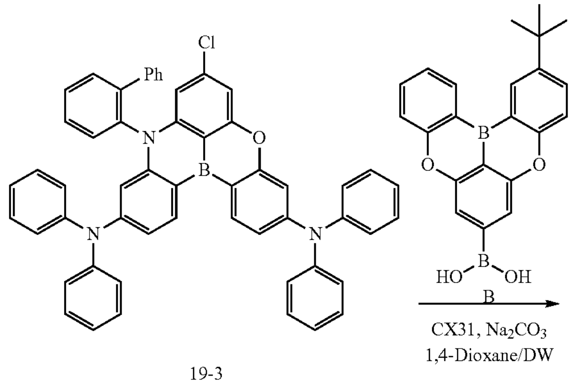

19-3

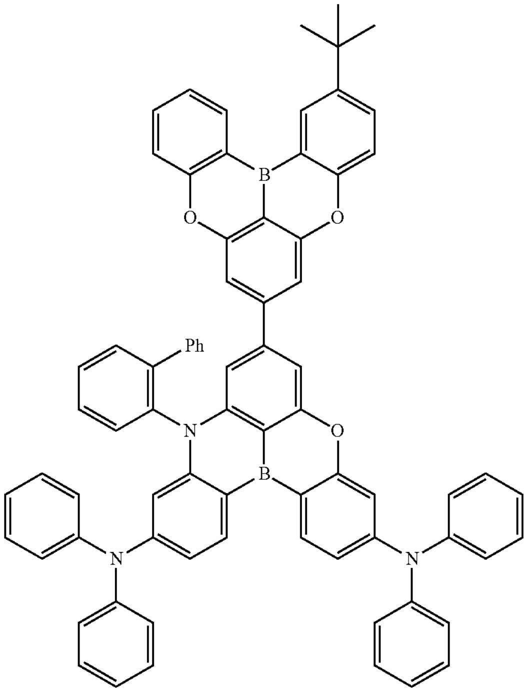

19

Synthesis of Intermediate 19-1

1,2-dibromo-5-chloro-3-fluorobenzene (2.5 eq), N1-([1, 1'-biphenyl]-2-yl)-N3,N3-diphenylbenzene-1,3-diamine (1 eq), tris(dibenzylideneacetone)dipalladium(0) (0.05 eq), tri-tert-butylphosphine (0.1 eq), and sodium tert-butoxide (3 eq) were dissolved in toluene and stirred under a nitrogen atmosphere at about 110 degrees centigrade for about 6 hours. After cooling, by drying under a reduced pressure, toluene was removed. An organic layer obtained by washing with ethyl acetate and water was dried with $MgSO_4$ and dried under a reduced pressure. Through separation by column chromatography and recrystallization (dichloromethane:n-hexane), Intermediate 19-1 was obtained (yield: 71%).

Synthesis of Intermediate 19-2

Intermediate 19-1 (1 eq), 3-(diphenylamino)phenol (1 eq), potassium phosphate tribasic (2.5 eq), and 18 crown 6 (1.5 eq) were dissolved in DMF and stirred under a nitrogen atmosphere at about 150 degrees centigrade for about 10 hours. After cooling, by drying under a reduced pressure, DMF was removed. An organic layer obtained by washing with ethyl acetate and water was dried with $MgSO_4$ and dried under a reduced pressure. Through separation by column chromatography and recrystallization (dichloromethane:n-hexane), Intermediate 19-2 was obtained (yield: 42%).

Synthesis of Intermediate 19-3

Intermediate 19-2 (1 eq) was dissolved in toluene and stirred at about −50° C.; and n-butyllithium (2 eq, 1.6 M) was slowly injected thereto, followed by heating to about 60° C. and stirring for about 30 minutes. At about −60° C., boron tribromide (1.1 eq) was slowly injected, followed by stirring at room temperature for about 30 minutes. N,N-diisopropylethylamine (1.5 eq) was injected at about 0° C., followed by stirring at room temperature for about 1 hour. After stirring at about 110° C. for about 24 hours, the reaction product was cooled and dried under a reduced pressure to remove the solvent. An organic layer obtained by washing with ethyl acetate and water was dried and dried under a reduced pressure. Through separation by column chromatography and recrystallization (dichloromethane:n-hexane), Intermediate 19-3 was obtained (yield: 26%).

Synthesis of Compound 19

Intermediate 19-3 (1 eq), (12-(tert-butyl)-5,9-dioxa-13b-boranaphtho[3,2,1-de]anthracen-7-yl)boronic acid (1.1 eq), CX31 (0.1 eq), and sodium carbonate were dissolved in 1,4-dioxane:distilled water=4:1 and stirred under a nitrogen atmosphere at about 110 degrees centigrade for about 20 hours. After cooling, an organic layer obtained by washing with ethyl acetate and water was dried with $MgSO_4$ and dried under a reduced pressure. Through separation by column chromatography and recrystallization (dichloromethane:n-hexane), Compound 19 was obtained. Final separation was performed by sublimation purification (yield after sublimation: 15.9%).

4. Synthesis of Compound 39

Compound 39 according to an embodiment may be synthesized by, for example, the steps of Reaction 4.

[Reaction 4]
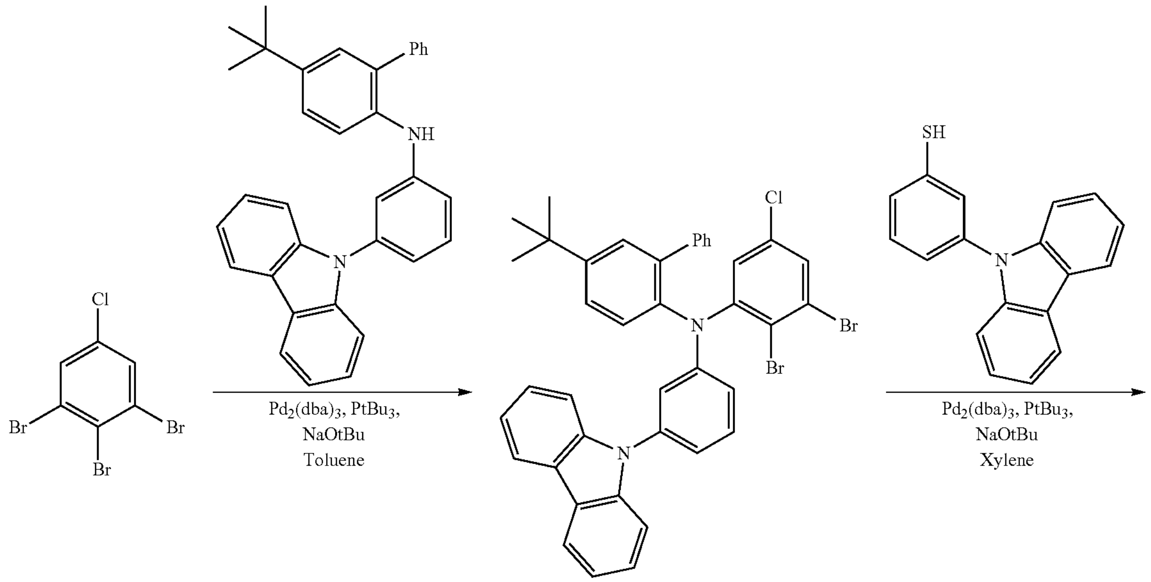
39-1
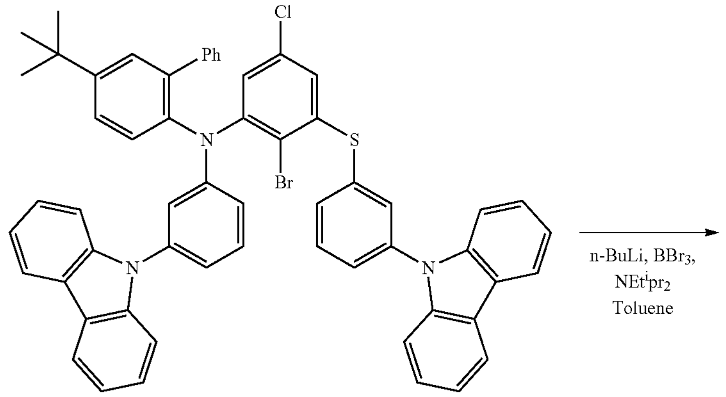
39-2
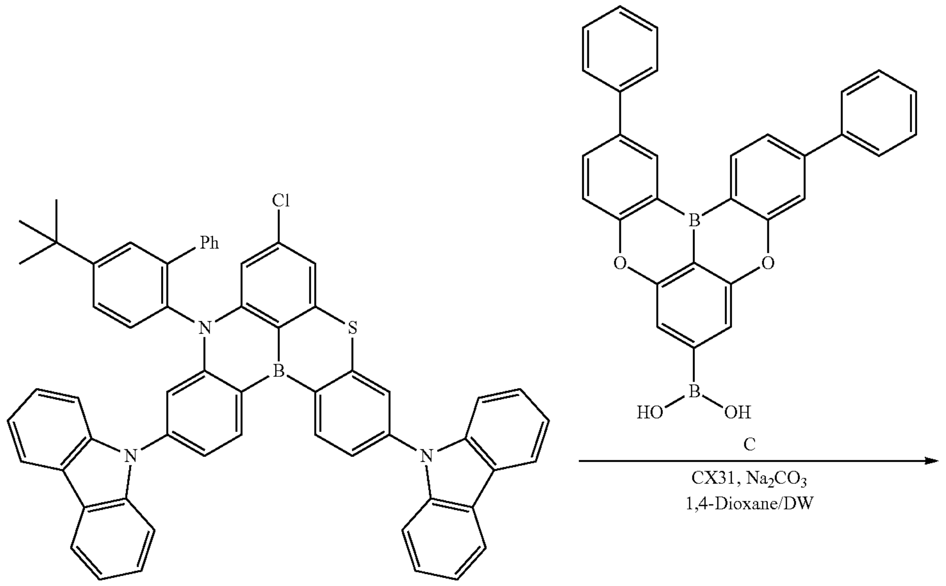
39-3

-continued

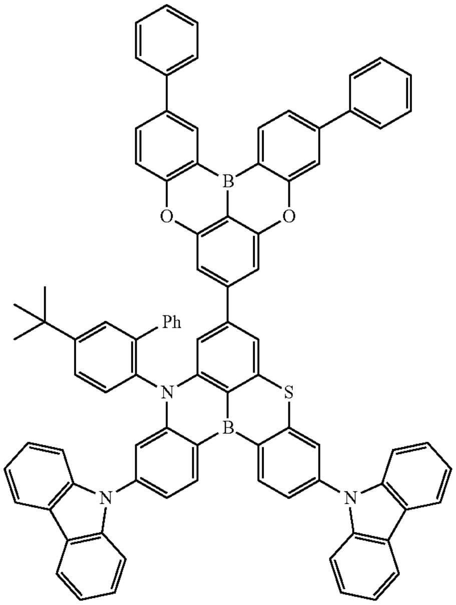

39

Synthesis of Intermediate 39-1

1,2,3-tribromo-5-chlorobenzene (2.5 eq), N1-([1,1'-biphenyl]-2-yl)-N3,N3-diphenylbenzene-1,3-diamine (1 eq), tris(dibenzylideneacetone)dipalladium(0) (0.05 eq), tri-tert-butylphosphine (0.1 eq), and sodium tert-butoxide (3 eq) were dissolved in toluene and stirred under a nitrogen atmosphere at about 80 degrees centigrade for about 6 hours. After cooling, by drying under a reduced pressure, toluene was removed. An organic layer obtained by washing with ethyl acetate and water was dried with $MgSO_4$ and dried under a reduced pressure. Through separation by column chromatography and recrystallization (dichloromethane:n-hexane), Intermediate 39-1 was obtained (yield: 51%).

Synthesis of Intermediate 39-2

Intermediate 39-1 (1 eq), 3-(9H-carbazol-9-yl)benzenethiol (1 eq), tris(dibenzylideneacetone)dipalladium(0) (0.05 eq), tri-tert-butylphosphine (0.1 eq), and sodium tert-butoxide (2 eq) were dissolved in DMF and stirred under a nitrogen atmosphere at about 150 degrees centigrade for about 15 hours. After cooling, by drying under a reduced pressure, DMF was removed. An organic layer obtained by washing with ethyl acetate and water was dried with $MgSO_4$ and dried under a reduced pressure. Through separation by column chromatography and recrystallization (dichloromethane:n-hexane), Intermediate 39-2 was obtained (yield: 36%).

Synthesis of Intermediate 39-3

Intermediate 39-2 (1 eq) was dissolved in toluene and stirred at about −50° C.; and n-butyllithium (2 eq, 1.6 M) was slowly injected thereto, followed by heating to about 60° C. and stirring for about 30 minutes. At about −60° C., boron tribromide (1.1 eq) was slowly injected, followed by stirring at room temperature for about 30 minutes. N,N-diisopropylethylamine (1.5 eq) was injected at about 0° C., followed by stirring at room temperature for about 1 hour. After stirring at about 110° C. for about 24 hours, the reaction product was cooled and dried under a reduced pressure to remove the solvent. An organic layer obtained by washing with ethyl acetate and water was dried and dried under a reduced pressure. Through separation by column chromatography and recrystallization (dichloromethane:n-hexane), Intermediate 39-3 was obtained (yield: 16%).

Synthesis of Compound 39

Intermediate 39-3 (1 eq), (2,11-diphenyl-5,9-dioxa-13b-boranaphtho[3,2,1-de]anthracen-7-yl)boronic acid (1.1 eq), CX31 (0.1 eq), and sodium carbonate were dissolved in 1,4-dioxane:distilled water=4:1 and stirred under a nitrogen atmosphere at about 110 degrees centigrade for about 20 hours. After cooling, an organic layer obtained by washing with ethyl acetate and water was dried with $MgSO_4$ and dried under a reduced pressure. Through separation by column chromatography and recrystallization (dichloromethane:n-hexane), Compound 39 was obtained. Final separation was performed by sublimation purification (yield after sublimation: 11.4%).

5. Synthesis of Compound 44

Compound 44 according to an embodiment may be synthesized by, for example, the steps of Reaction 5.

[Reaction 5]
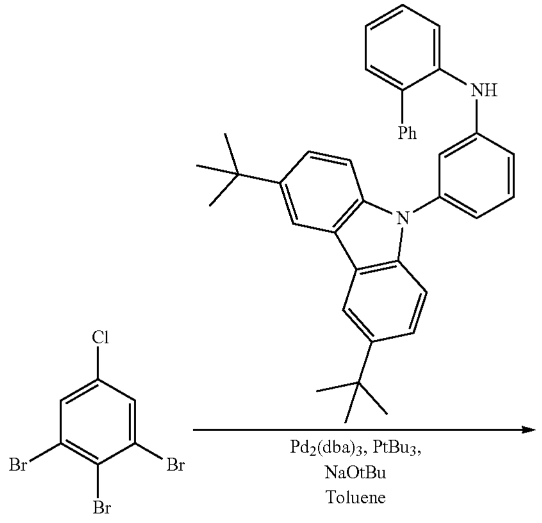
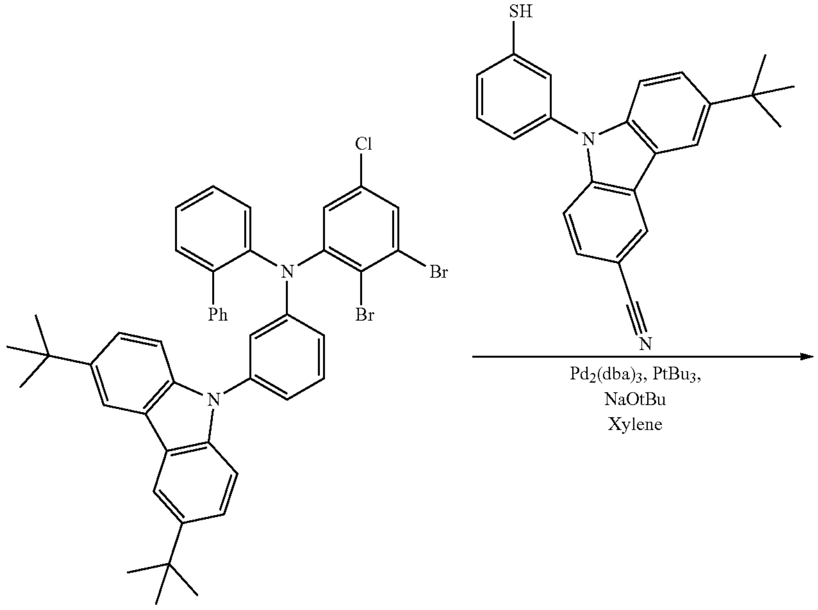
44-1
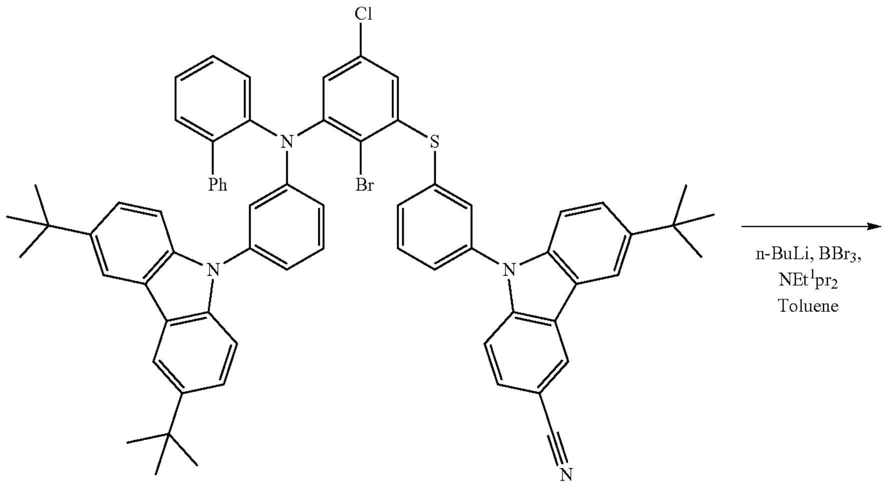
44-2

-continued

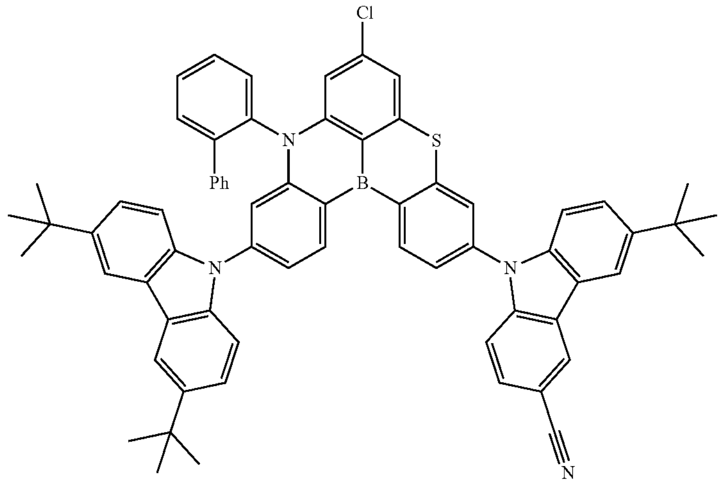

44-3

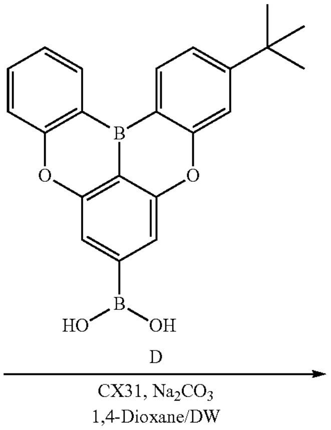

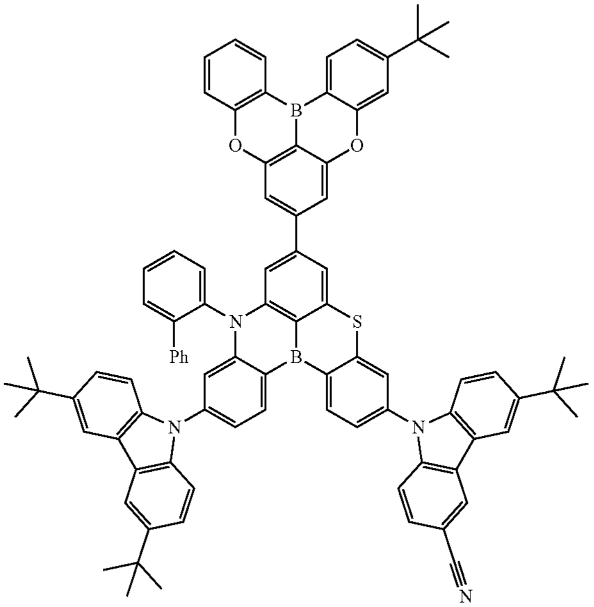

44

Synthesis of Intermediate 44-1

1,2,3-tribromo-5-chlorobenzene (2.5 eq), N-(3-(3,6-di-tert-butyl-9H-carbazol yl)phenyl)-[1,1'-biphenyl]-2-amine (1 eq), tris(dibenzylideneacetone)dipalladium(0) (0.05 eq), tri-tert-butylphosphine (0.1 eq), and sodium tert-butoxide (2 eq) were dissolved in toluene and stirred under a nitrogen atmosphere at about 80 degrees centigrade for about 6 hours. After cooling, by drying under a reduced pressure, toluene was removed. An organic layer obtained by washing with ethyl acetate and water was dried with $MgSO_4$ and dried under a reduced pressure. Through separation by column chromatography and recrystallization (dichloromethane:n-hexane), Intermediate 44-1 was obtained (yield: 63%).

Synthesis of Intermediate 44-2

Intermediate 44-1 (1 eq), 6-(tert-butyl)-9-(3-mercaptophenyl)-9H-carbazole-3-carbonitrile (1 eq), tris(dibenzylideneacetone)dipalladium(0) (0.05 eq), tri-tert-butylphosphine (0.1 eq), and sodium tert-butoxide (2 eq) were dissolved in DMF and stirred under a nitrogen atmosphere at about 150 degrees centigrade for about 15 hours. After cooling, by drying under a reduced pressure, DMF was removed. An organic layer obtained by washing with ethyl acetate and water was dried with $MgSO_4$ and dried under a reduced pressure. Through separation by column chromatography and recrystallization (dichloromethane:n-hexane), Intermediate 44-2 was obtained (yield: 43%).

Synthesis of Intermediate 44-3

Intermediate 44-2 (1 eq) was dissolved in toluene and stirred at about −50° C.; and n-butyllithium (2 eq, 1.6 M) was slowly injected thereto, followed by heating to about 60° C. and stirring for about 30 minutes. At about −60° C., boron tribromide (1.1 eq) was slowly injected, followed by stirring at room temperature for about 30 minutes. N,N-diisopropylethylamine (1.5 eq) was injected at about 0° C., followed by stirring at room temperature for about 1 hour. After stirring at about 110° C. for about 24 hours, the reaction product was cooled and dried under a reduced pressure to remove the solvent. An organic layer obtained by washing with ethyl acetate and water was dried and dried under a reduced pressure. Through separation by column chromatography and recrystallization (dichloromethane:n-hexane), Intermediate 44-3 was obtained (yield: 24%).

Synthesis of Compound 44

Intermediate 44-3 (1 eq), (2,11-diphenyl-5,9-dioxa-13b-boranaphtho[3,2,1-de]anthracen-7-yl)boronic acid (1.1 eq), CX31 (0.1 eq), and sodium carbonate were dissolved in 1,4-dioxane:distilled water=4:1 and stirred under a nitrogen atmosphere at about 110 degrees centigrade for about 20 hours. After cooling, an organic layer obtained by washing with ethyl acetate and water was dried with $MgSO_4$ and dried under a reduced pressure. Through separation by column chromatography and recrystallization (dichloromethane:n-hexane), Compound 44 was obtained. Final separation was performed by sublimation purification (yield after sublimation: 11.4%).

2. Identification of Polycyclic Compound

The molecular weights and NMR analysis results of the polycyclic compounds synthesized are shown in Table 1.

TABLE 1

| Compound | H NMR (δ) | Calculated value | Measured value |
|---|---|---|---|
| 4 | 9.32 (1H, d), 9.15 (1H, d), 8.85 (2H, d), 8.23 (1H, s), 7.85 (2H, s). 7.76 (1H, s), 7.54-7.41 (8H, m), 7.34-7.21 (11H, m), 6.73-6.52 (9H, m), 6.41 (1H, d), 6.35 (2H, d), 1.37 (9H, s), 1.35 (18H, s) | 1212.53 | 1212.80 |
| 19 | 9.13 (1H, d), 9.08 (1H, d), 8.78 (1H, d), 8.65 (1H, d), 7.61-7.46 (12H, m), 7.32-7.18 (14H, m), 6.61-6.47 (13H, m), 6.38-6.31 (3H, m), 1.36 (9H, s) | 1079.91 | 1080.43 |
| 39 | 9.27 (1H, d), 9.18 (1H, d), 8.91 (1H, d), 8.85 (1H, d), 7.91 (1H, s), 7.83 (1H, s). 7.63-7.47 (15H, m), 7.31-7.19 (16H, m), 6.81-6.67 (10H, m), 6.31-6.25 (3H, m), 1.34 (9H, s), | 1244.14 | 1245.34 |
| 44 | 9.26 (1H, d), 9.07 (1H, d), 8.72 (2H, d), 8.17 (1H, s), 7.75 (2H, s). 7.64 (1H, s), 7.47-7.31 (8H, m), 7.27-7.15 (10H, m), 6.63-6.47 (9H, m), 6.38 (1H, d), 6.27 (2H, d), 1.38 (9H, s), 1.36 (18H, s), 1.33 (9H, s) | 1285.28 | 1285.82 |

3. Manufacture and Evaluation of Light Emitting Element (Manufacture of Light Emitting Element 1)

A light emitting element of an embodiment, including a polycyclic compound of an embodiment was manufactured by a method below. Light emitting elements of Examples 1 to 4 were manufactured using Compounds 4, 19, 39, and 44, respectively, as light emitting dopants of emission layers.

In Comparative Example 1 to Comparative Example 5, light emitting elements were manufactured using Comparative Compounds X1 to X5, respectively, as light emitting dopant materials of emission layers.

(Comparative Compounds)

X1

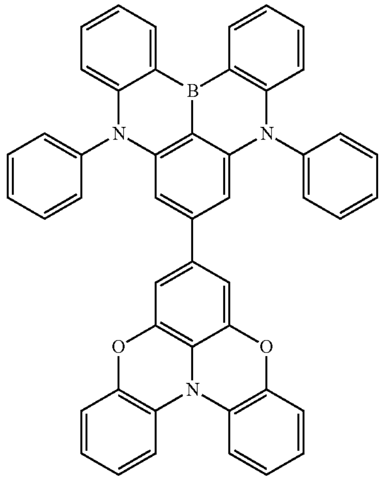

X2

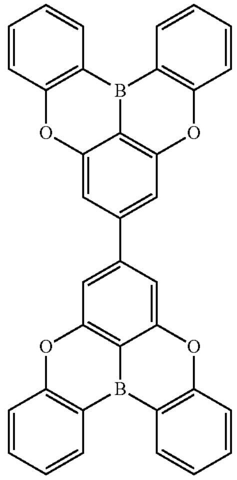

X3

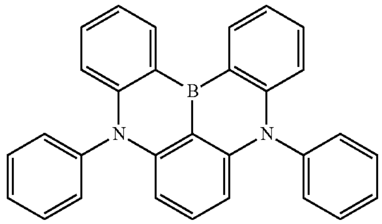

-continued

X4

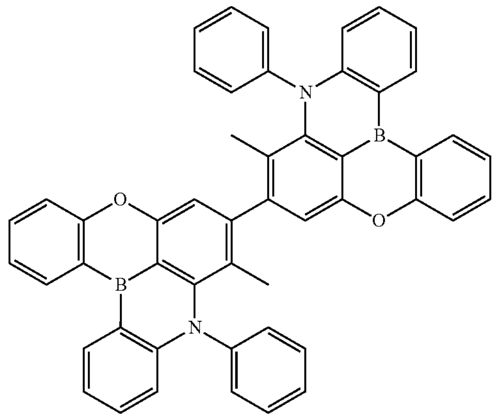

X5

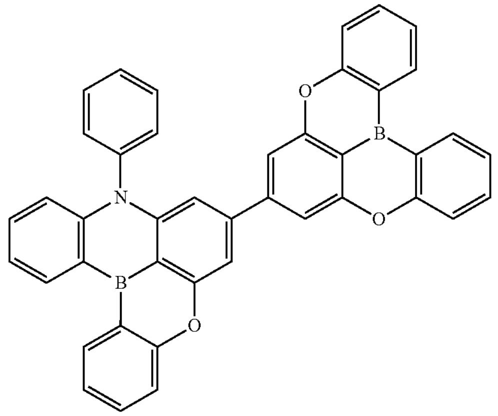

[Other Compounds Used for the Manufacture of Elements]

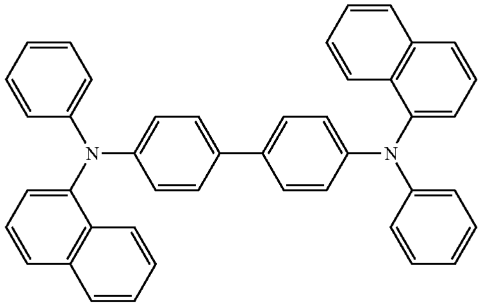

NPD

-continued
HT3
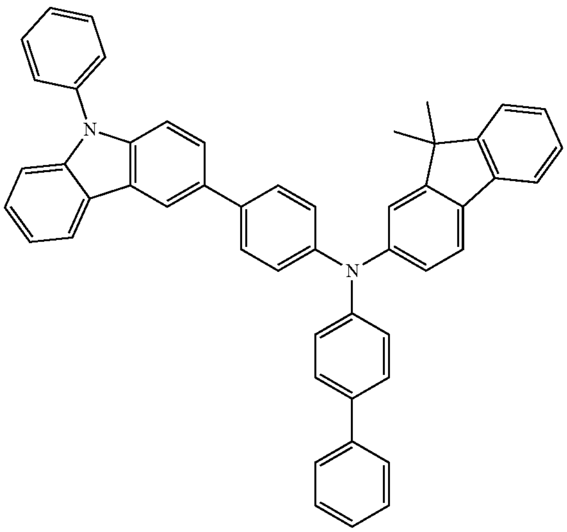
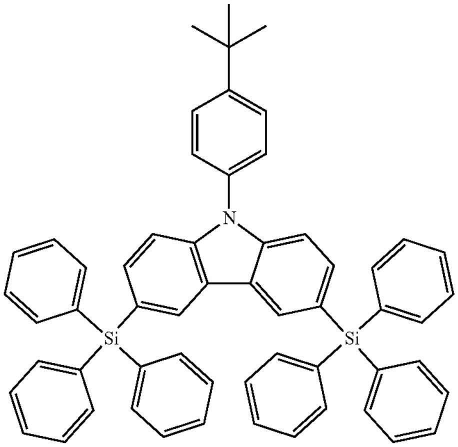
CzSi
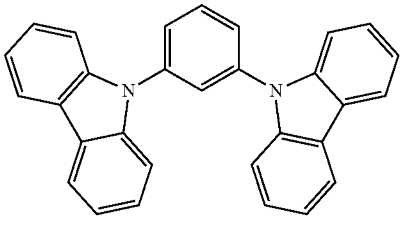
mCP
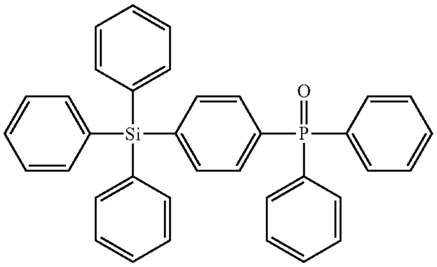
TSPO1
-continued
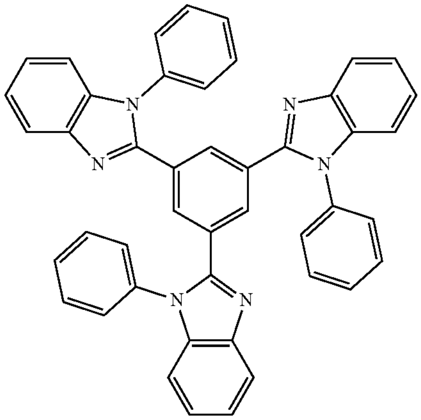
TPBI
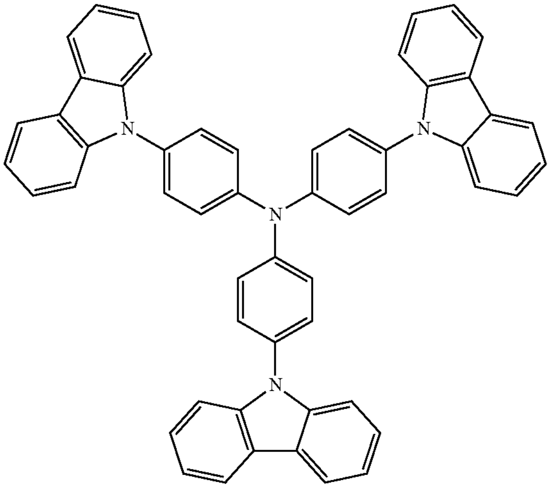
TCTA
HT-1
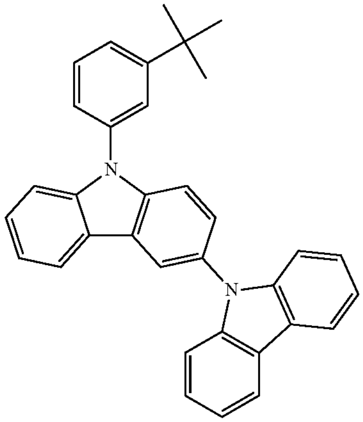

-continued

ET-1

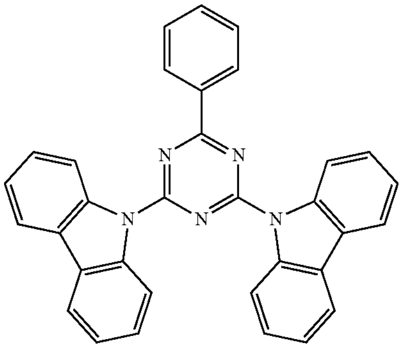

PS-1

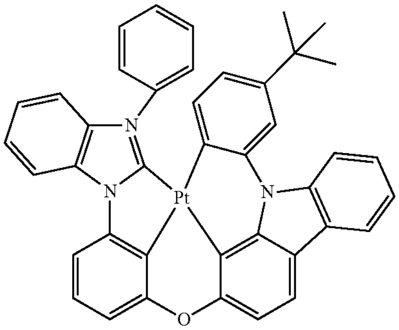

H28

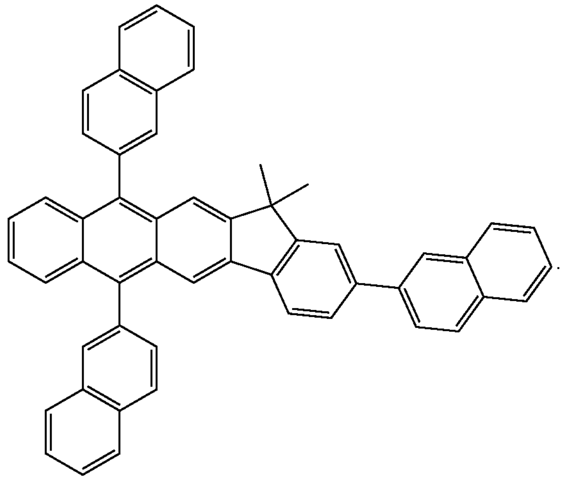

A glass substrate on which ITO of 15 Ω/cm$^2$ (1,200 Å) was patterned was cut into a size of 50 mm×50 mm×0.7 mm, washed by ultrasonic waves using isopropyl alcohol and pure water for about 5 minutes each, and cleaned by exposing to ultraviolet rays for about 30 minutes and exposing to ozone.

NPD was deposited to a thickness of about 300 Å to form a hole injection layer. TCTA was deposited to a thickness of about 200 Å to form a hole transport layer. On the hole transport layer, CzSi was vacuum deposited to form an emission auxiliary layer with a thickness of about 100 Å.

On the emission auxiliary layer, a mixture of a first host and a second host: an auxiliary dopant: a light emitting dopant, were co-deposited in a weight ratio of 85:14:1 to form an emission layer with a thickness of about 200 Å.

On the emission layer, TSPO1 was deposited to form a hole blocking layer with a thickness of about 200 Å. On the hole blocking layer, TPBI was deposited to form an electron transport layer with a thickness of about 300 Å. On the electron transport layer, LiF was deposited to form an electron injection layer with a thickness of about 10 Å. On the electron injection layer, Al was deposited to form a second electrode with a thickness of about 2,000 Å, and on the second electrode, HT28 was deposited to form a capping layer with a thickness of about 700 Å to manufacture a light emitting element.

In the Comparative Examples and Examples, Compound HT-1 was used as the first host, Compound ET-1 was used as the second host, and PS-1 was used as the auxiliary dopant during forming an emission layer. The Comparative Compounds and the Example Compounds were used as the light emitting dopants.

(Manufacture of Light Emitting Element 2)

The light emitting elements of Example 5 to Example 8 were manufactured by the same method as the light emitting elements of Example 1 to Example 4, except for forming an emission layer with a thickness of about 200 Å by co-depositing a host of mCP and a light emitting dopant in a weight ratio of 99:1.

The light emitting elements of Comparative Example 6 to Comparative Example 10 were manufactured by the same method as the light emitting elements of Comparative Example 1 to Comparative Example 5, except for forming an emission layer with a thickness of about 200 Å by co-depositing a host of mCP and a light emitting dopant in a weight ratio of 99:1.

(Evaluation of Properties of Light Emitting Element)

In Table 2, the evaluation results of the light emitting elements of Example 1 to Example 4, and Comparative Example 1 to Comparative Example 5 are shown. In Table 3, the evaluation results of the light emitting elements of Example 5 to Example 8, and Comparative Example 6 to Comparative Example 10 are shown. In Table 2 and Table 3m the driving voltages, the emission efficiency, the maximum external quantum efficiency, and emission color of the light emitting elements thus manufactured are compared and shown. In the evaluation results on the properties of the Examples and Comparative Examples, shown in Table and 2 Table 3, emission efficiency values at a current density of about 10 mA/cm$^2$ are shown.

The external quantum efficiency may be calculated by [internal quantum efficiency×charge balance×out coupling efficiency]. The internal quantum efficiency is a conversion ratio of produced excitons into a light type. The charge balance means the balance of holes and electrons forming excitons, and generally has a value of "1" supposing a case where a ratio of 1:1 of holes and electrons.

The driving voltage and emission efficiency of the light emitting elements of the Examples and Comparative Examples were measured using a 2400 series source meter of Keithley Instrument Co., a luminance and color meter CS-200 which is a product of Konica Minolta Co, and PC Program LabVIEW 2.0 for measurement, which is a product of Japanese National Instrument Co., in a dark room.

TABLE 2

| Division | Host (HT:ET = 5:5) | Auxiliary dopant | Dopant compound | Driving voltage (V) | Efficiency (cd/A) | Maximum external quantum efficiency (%) | Emission color | Oscillator strength |
|---|---|---|---|---|---|---|---|---|
| Example 1 | HT-1/ET-1 | PS-1 | Compound 4 | 4.7 | 25.8 | 24.7 | Blue | 0.2868 |
| Example 2 | HT-1/ET-1 | PS-1 | Compound 19 | 4.5 | 24.6 | 23.4 | Blue | 0.3359 |
| Example 3 | HT-1/ET-1 | PS-1 | Compound 39 | 4.6 | 23.1 | 22.6 | Blue | 0.3067 |
| Example 4 | HT-1/ET-1 | PS-1 | Compound 44 | 4.7 | 23.5 | 22.1 | Blue | 0.3026 |
| Comparative Example 1 | HT-1/ET-1 | PS-1 | X1 | 5.4 | 17.4 | 16.3 | Blue | 0.2080 |
| Comparative Example 2 | HT-1/ET-1 | PS-1 | X2 | 5.6 | 13.3 | 12.5 | Blue | 0.0258 |
| Comparative Example 3 | HT-1/ET-1 | PS-1 | X3 | 4.9 | 15.4 | 14.3 | Blue | 0.1974 |
| Comparative Example 4 | HT-1/ET-1 | PS-1 | X4 | 5.7 | 15.7 | 13.9 | Blue | 0.2006 |
| Comparative Example 5 | HT-1/ET-1 | PS-1 | X5 | 5.8 | 14.4 | 13.6 | Blue | 0.0797 |

Referring to the results of Table 2, it could be found that the light emitting elements of the Examples and Comparative Examples emitted blue light. Referring to the results of Table 2, it could be found that the Examples of the light emitting elements using the polycyclic compounds according to embodiments as the light emitting dopant materials of emission layers, showed a lower driving voltage and better emission efficiency when compared to the Comparative Examples. It could be found that the light emitting elements of Examples 1 to 4 have higher values of oscillator strength (OSC) by about 0.1 or more when compared to the light emitting elements of Comparative Example 1 to Comparative Example 5. The light emitting elements show improved internal quantum efficiency with the increase of the oscillator strength, and accordingly, the maximum external quantum efficiency may be large. Accordingly, light emitting elements of Examples 1 to 4 had higher maximum external quantum efficiency when compared to the light emitting elements of Comparative Example 1 to Comparative Example 5, and this is due to the greater oscillator strength.

Referring to Table 2, it could be confirmed that Example 1 to Example 4 showed high efficiency properties, because of a structure in which an electron withdrawing group is substituted at the para position to a boron atom, and electron donor groups are substituted at two para positions to the boron atom in a DABNA core structure, when compared to the light emitting dopants used in the emission layers of the light emitting elements of Comparative Example 1 to Comparative Example 5.

TABLE 3

| Division | Host (HT:ET = 5:5) | Dopant compound | Driving voltage (V) | Efficiency (cd/A) | Maximum external quantum efficiency (%) | Emission color |
|---|---|---|---|---|---|---|
| Example 5 | HT-1/ET-1 | Compound 4 | 5.5 | 8.6 | 8.2 | Blue |
| Example 6 | HT-1/ET-1 | Compound 19 | 5.3 | 8.2 | 7.8 | Blue |
| Example 7 | HT-1/ET-1 | Compound 39 | 5.4 | 7.7 | 7.5 | Blue |
| Example 8 | HT-1/ET-1 | Compound 44 | 5.5 | 7.8 | 7.4 | Blue |
| Comparative Example 6 | HT-1/ET-1 | X1 | 6.2 | 5.8 | 5.4 | Blue |
| Comparative Example 7 | HT-1/ET-1 | X2 | 6.4 | 4.4 | 4.2 | Blue |
| Comparative Example 8 | HT-1/ET-1 | X3 | 5.7 | 5.1 | 4.8 | Blue |
| Comparative Example 9 | HT-1/ET-1 | X4 | 6.5 | 5.2 | 4.6 | Blue |
| Comparative Example 10 | HT-1/ET-1 | X5 | 6.6 | 4.8 | 4.5 | Blue |

Referring to the results of Table 3, it could be found that the light emitting elements of the Examples and Comparative Examples emitted blue light. Referring to the results of Table 3, it could be found that the Examples of the light emitting elements using the polycyclic compounds according to embodiments as the light emitting dopant materials of emission layers, showed a lower driving voltage and better emission efficiency when compared to the Comparative Examples.

Referring to Table 3, it could be confirmed that Example 5 to Example 8 showed high efficiency properties, because of a structure in which an electron withdrawing group is substituted at the para position to a boron atom, and electron donor groups are substituted at two para positions to the boron atom in a DABNA core structure, when compared to the light emitting dopants used in the emission layers of the light emitting elements of Comparative Example 6 to Comparative Example 10.

As described above, it could be confirmed that the light emitting elements of the Examples showed improved emission efficiency than the light emitting elements of the Comparative Examples, in each of a case of including an auxiliary dopant (PS1) in the emission layer (Table 2) and a case of not including an auxiliary dopant (PS1) in the emission layer (Table 3).

The polycyclic compound according to an embodiment has a structure in which an electron withdrawing group is substituted at a para position to a boron atom, and electron donor groups are substituted at two para positions to the boron atom in a DABNA core structure, and is used as a thermally activated delayed fluorescence emitting material to contribute to the increase of the efficiency of a light emitting element. The light emitting element according to an embodiment includes the polycyclic compound of an embodiment in an emission layer and may show high efficiency properties.

The light emitting element of an embodiment includes the polycyclic compound of an embodiment and may show high efficiency properties.

Embodiments have been disclosed herein, and although terms are employed, they are used and are to be interpreted in a generic and descriptive sense only and not for purpose of limitation. In some instances, as would be apparent by one of ordinary skill in the art, features, characteristics, and/or elements described in connection with an embodiment may be used singly or in combination with features, characteristics, and/or elements described in connection with other embodiments unless otherwise specifically indicated. Accordingly, it will be understood by those of ordinary skill in the art that various changes in form and details may be made without departing from the spirit and scope of the disclosure as set forth in the following claims.

What is claimed is:

1. A light emitting element, comprising:

a first electrode;

a second electrode disposed on the first electrode; and an emission layer disposed between the first electrode and the second electrode, wherein the emission layer comprises a first compound, a second compound, and a third compound, the first compound, the second compound, and the third compound are different from each other, and the first compound is represented by Formula 1:

[Formula 1]

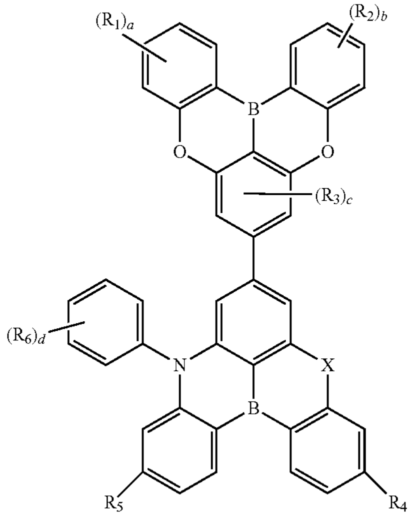

wherein in Formula 1, a and b are each independently an integer from 0 to 4, c is an integer from 0 to 2, d is an integer from 0 to 5, X is $N(R_x)$, O, or S, $R_x$, $R_1$ to $R_3$, and $R_6$ are each independently a deuterium atom, a substituted or unsubstituted alkyl group of 1 to 20 carbon atoms, a substituted or unsubstituted alkenyl group of 2 to 20 carbon atoms, a substituted or unsubstituted aryl group of 6 to 30 ring-forming carbon atoms, or a substituted or unsubstituted heteroaryl group of 2 to 30 ring-forming carbon atoms, or are combined with an adjacent group to form a ring, and $R_4$ and $R_5$ are each independently a substituted or unsubstituted amine group, or a substituted or unsubstituted carbazole group.

2. The light emitting element of claim 1, wherein in Formula 1, $R_4$ and $R_5$ are each independently a group represented by Formula A-1 or Formula A-2:

[Formula A-1]

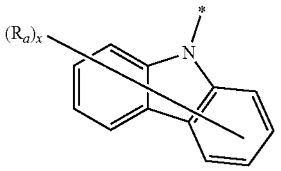

[Formula A-2]

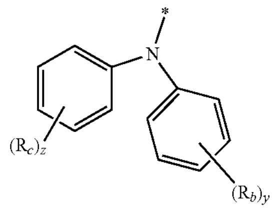

wherein in Formula A-1, x is an integer from 0 to 8, and $R_a$ is a deuterium atom, a substituted or unsubstituted aryl group of 6 to 20 ring-forming carbon atoms, a substituted or unsubstituted alkyl group of 1 to 6 carbon atoms, or a cyano group, wherein in Formula A-2, y and z are each independently an integer from 0 to 5, and $R_b$ and $R_c$ are each independently a deuterium atom, or a substituted or unsubstituted alkyl group of 1 to 6 carbon atoms, and wherein in Formula A-1 and Formula A-2, ——— * indicates a bonding site of $R_4$ or $R_5$ to Formula 1.

3. The light emitting element of claim 2, wherein the group represented by Formula A-1 is represented by one of Formulas A1 to A6:

A1

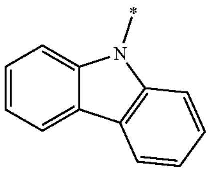

A2

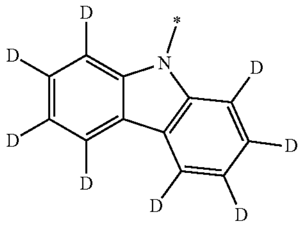

A3

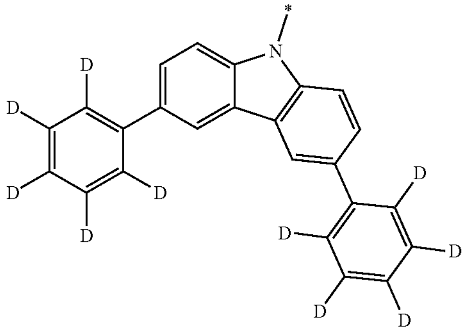

A4

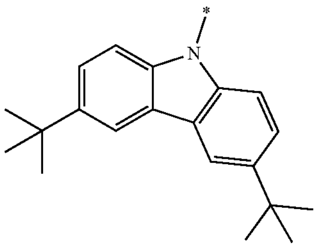

-continued

A5

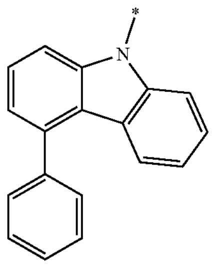

A6

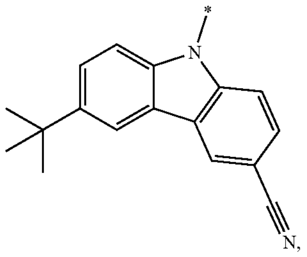

wherein in Formulas A1 to A6,

——— * indicates a bonding site of $R_4$ or $R_5$ to Formula 1.

4. The light emitting element of claim 2, wherein the group represented by Formula A-2 is represented by one of Formulas A7 to A9:

A7

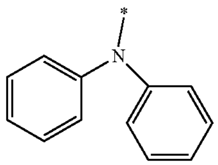

A8

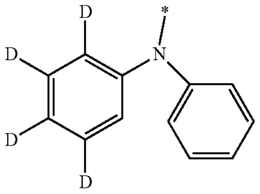

A9

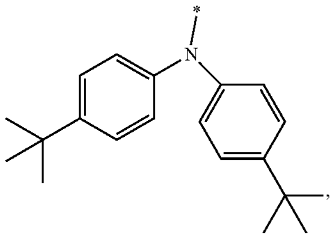

wherein in Formulas A7 to A9,

——— * indicates a bonding site of $R_4$ or $R_5$ to Formula 1.

5. The light emitting element of claim 1, wherein in Formula 1,
$R_1$ and $R_2$ are each independently a group represented by one of Formulas B1 to B18:
B1
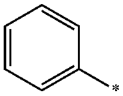
B2
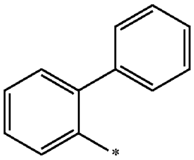
B3
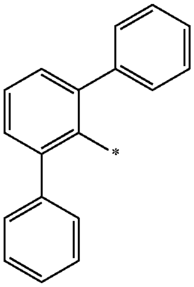
B4
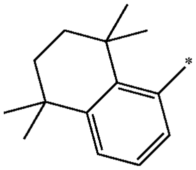
B5
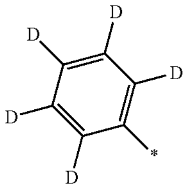
B6
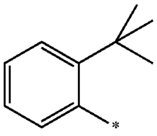
B7
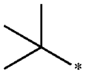
B8
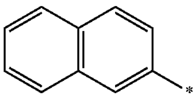
B9
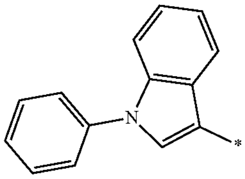
-continued
B10
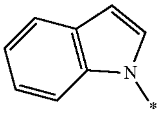
B11
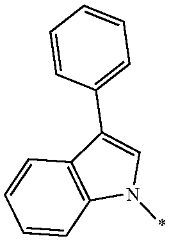
B12
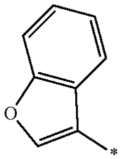
B13
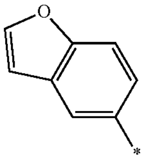
B14
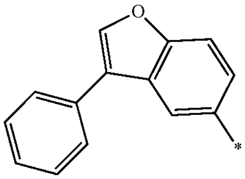
B15
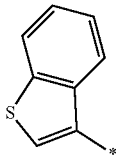
B16
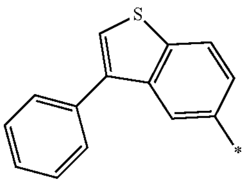
B17
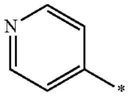
B18
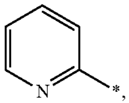,
wherein in Formulas B1 to B18,
* indicates a bonding site of $R_1$ or $R_2$ to Formula 1.

6. The light emitting element of claim 1, wherein in Formula 1, $R_3$ is a group represented by one of Formulas C1 to C5:

C1

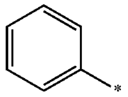

C2

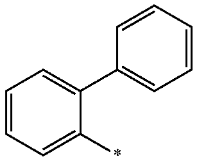

C3

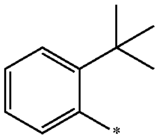

C4

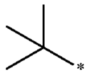

C5

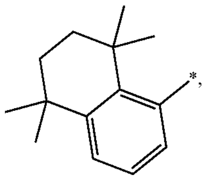

wherein in Formulas C1 to C5,

* indicates a bonding site of $R_3$ to Formula 1.

7. The light emitting element of claim 1, wherein in Formula 1, $R_6$ is a group represented by one of Formulas D1 to D3:

D1

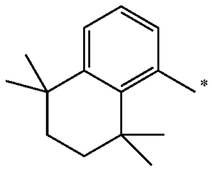

D2

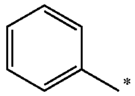

D3

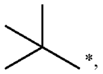

wherein in Formulas D1 to D3,

* indicates a bonding site of $R_6$ to Formula 1.

8. The light emitting element of claim 1, wherein the emission layer emits blue light.

9. The light emitting element of claim 1, wherein the first compound emits thermally activated delayed fluorescence.

10. The light emitting element of claim 1, wherein the second compound is represented by one of Compounds HT-1 to HT-4:

HT-1

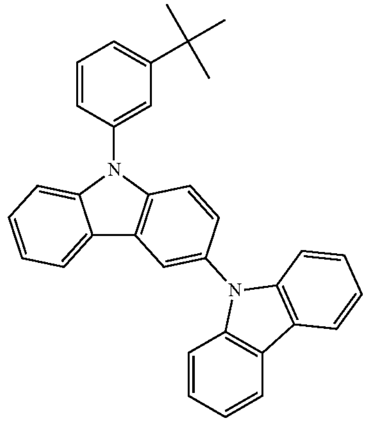

HT-2

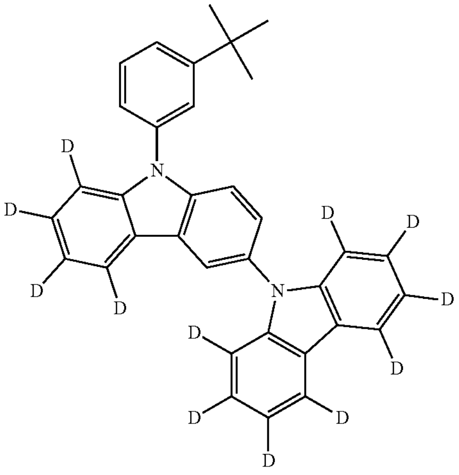

HT-3

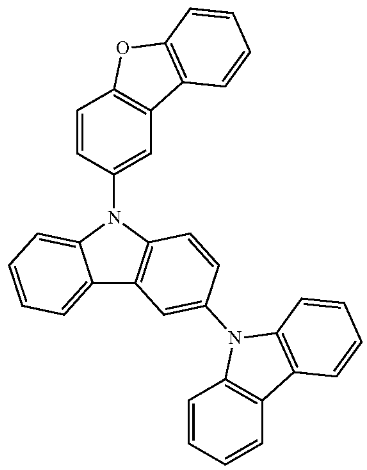

-continued

HT-4

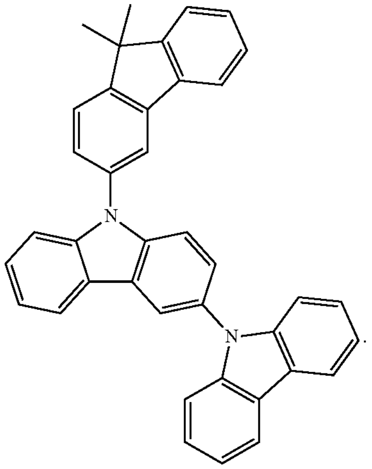

11. The light emitting element of claim 1, wherein the third compound is represented by one of Compounds ET-1 to ET-3:

ET-1

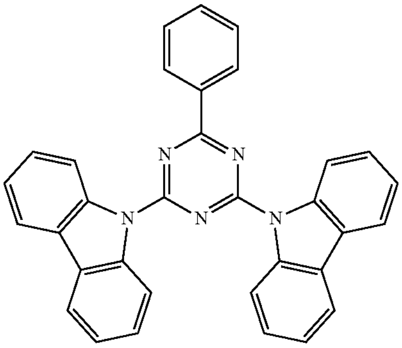

ET-2

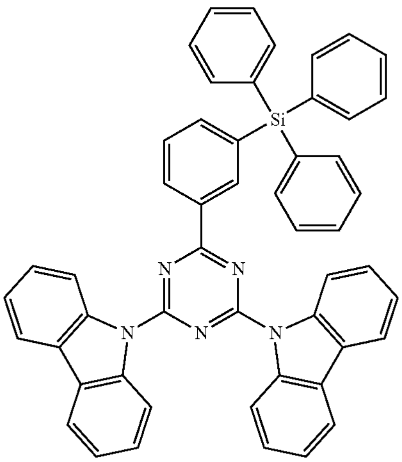

-continued

ET-3

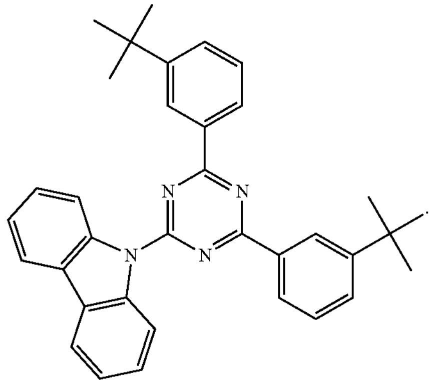

12. The light emitting element of claim 1, wherein the emission layer further comprises a fourth compound represented by Formula M-b:

[Formula M-b]

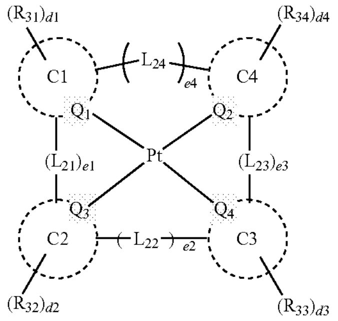

wherein in Formula M-b, $Q_1$ to $Q_4$ are each independently C or N,

C1 to C4 are each independently a substituted or unsubstituted hydrocarbon ring of 5 to 30 ring-forming carbon atoms, or a substituted or unsubstituted heterocycle of 2 to 30 ring-forming carbon atoms, $L_{21}$ to $L_{24}$ are each independently a direct linkage,

*—O—*,

*—S—*,

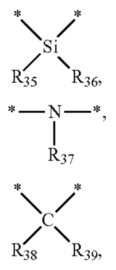

-continued

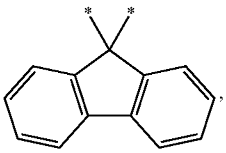

, a substituted or unsubstituted divalent alkyl group of 1 to 20 carbon atoms, a substituted or unsubstituted arylene group of 6 to 30 ring-forming carbon atoms, or a substituted or unsubstituted heteroarylene group of 2 to 30 ring-forming carbon atoms, e1 to e4 are each independently 0 or 1, $R_{31}$ to $R_{39}$ are each independently a hydrogen atom, a deuterium atom, a halogen atom, a cyano group, a substituted or unsubstituted amine group, a substituted or unsubstituted alkyl group of 1 to 20 carbon atoms, a substituted or unsubstituted aryl group of 6 to 30 ring-forming carbon atoms, or a substituted or unsubstituted heteroaryl group of 2 to 30 ring-forming carbon atoms, or are combined with an adjacent group to form a ring, and d1 to d4 are each independently an integer from 0 to 4.

13. The light emitting element of claim 12, wherein the first compound is a light emitting dopant, the second compound is a hole transport host, the third compound is an electron transport host, and the fourth compound is an auxiliary dopant.

14. The light emitting element of claim 1, wherein the emission layer comprises at least one selected from Compound Group 1:

[Compound Group 1]

1

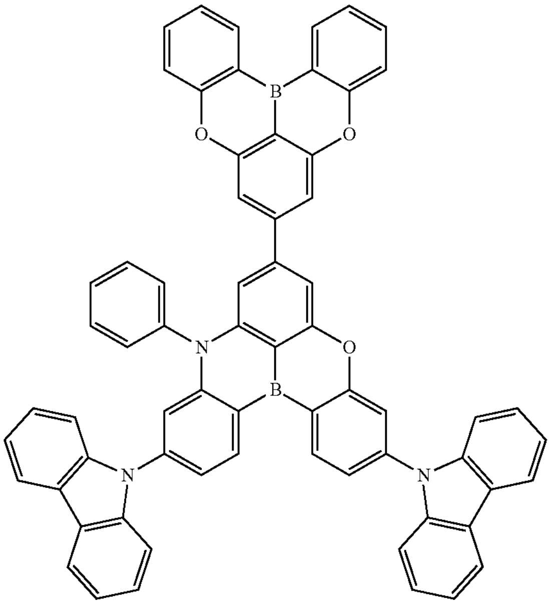

-continued

2

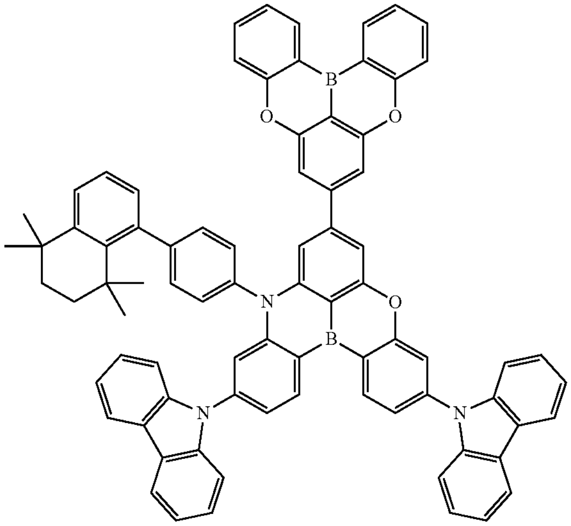

3

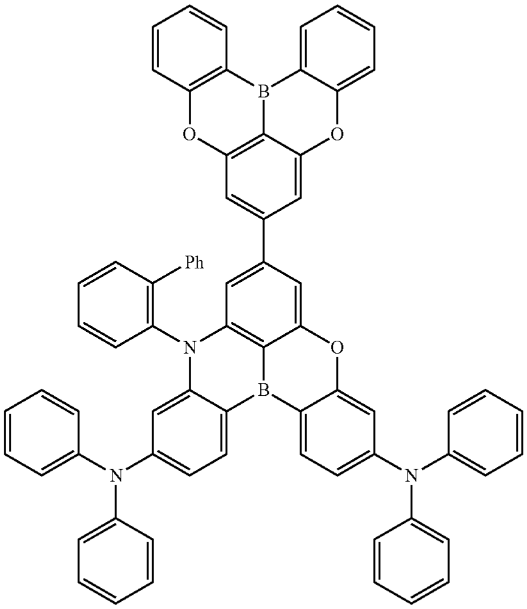

-continued
4
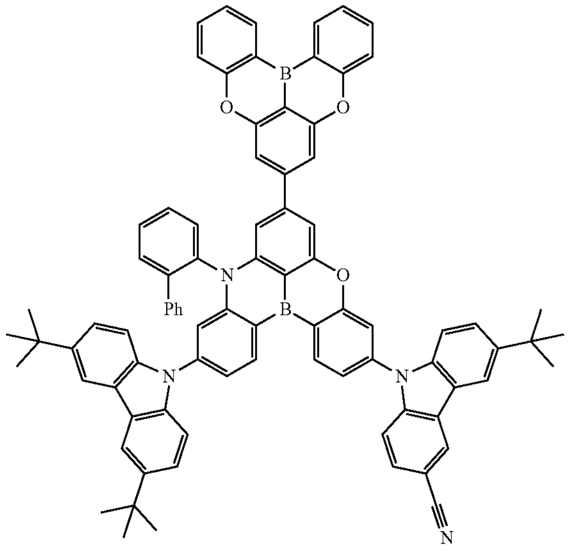
5
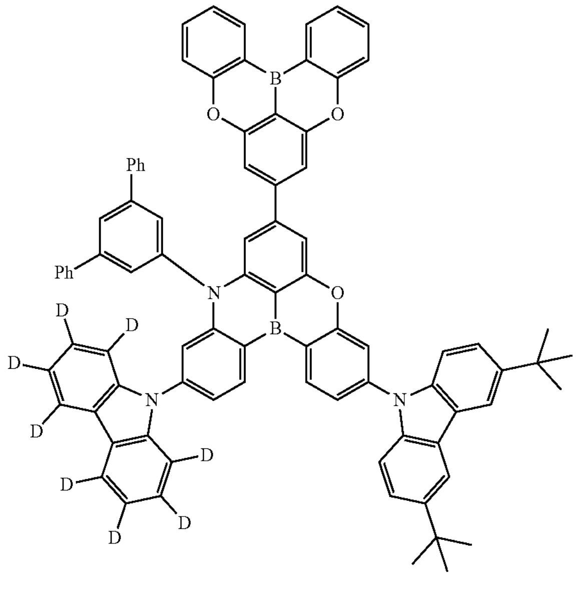
-continued
6
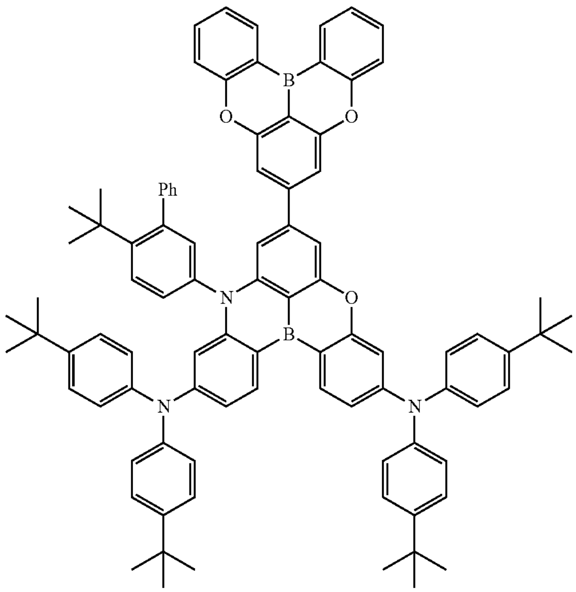
7
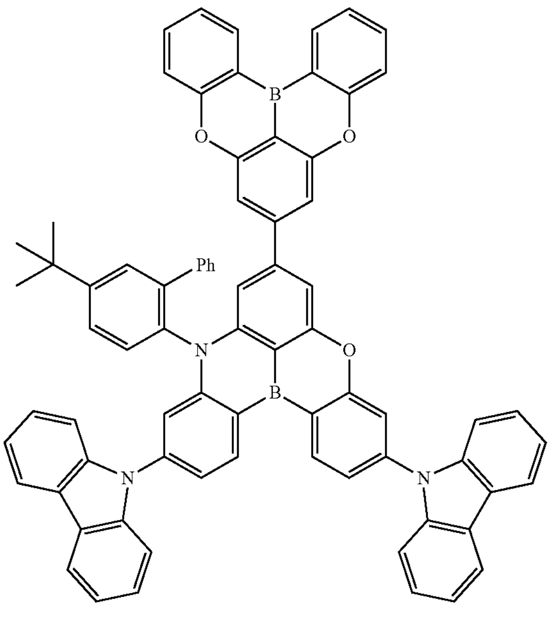

-continued
8
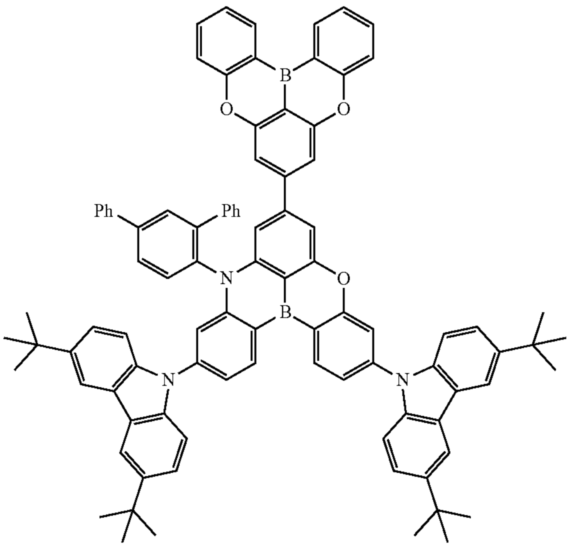
9
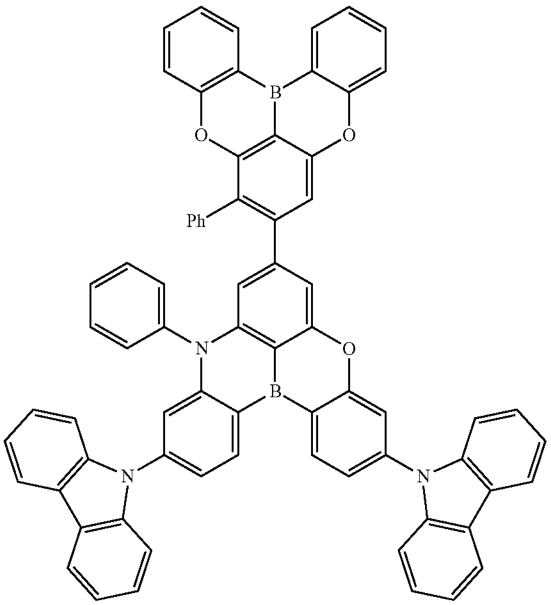
-continued
10
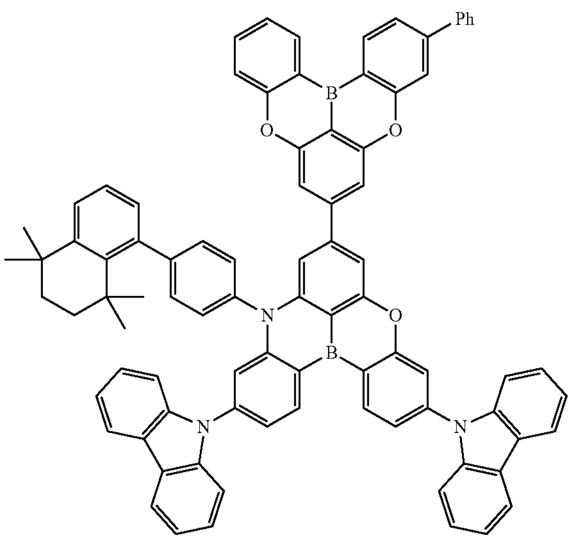
11
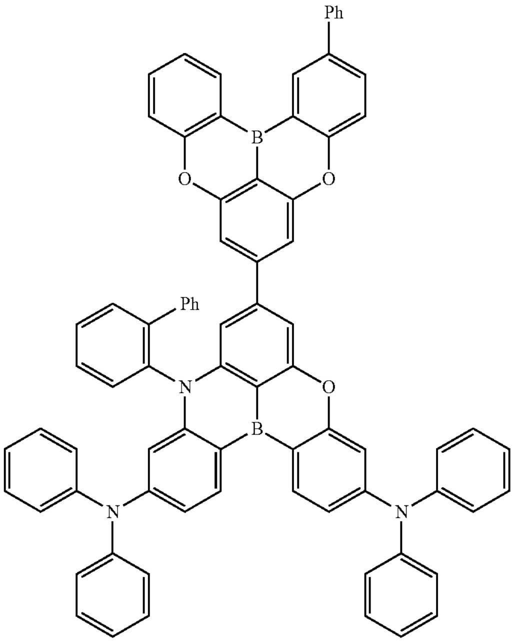

-continued
12
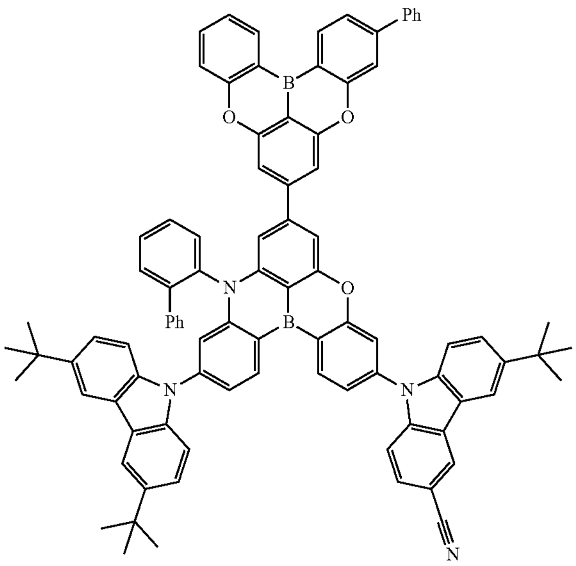
13
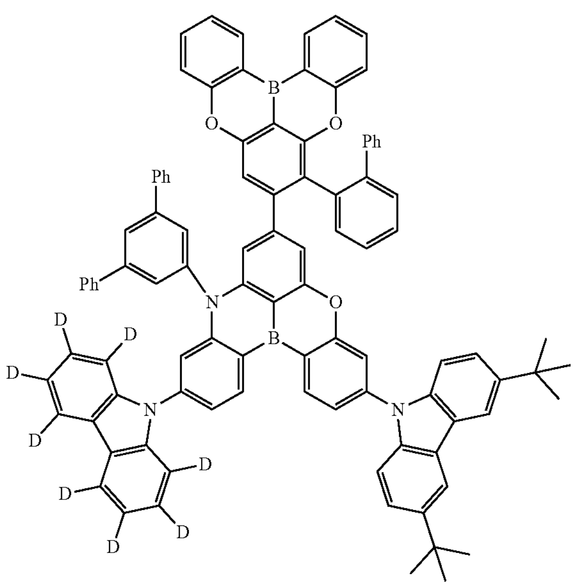
-continued
14
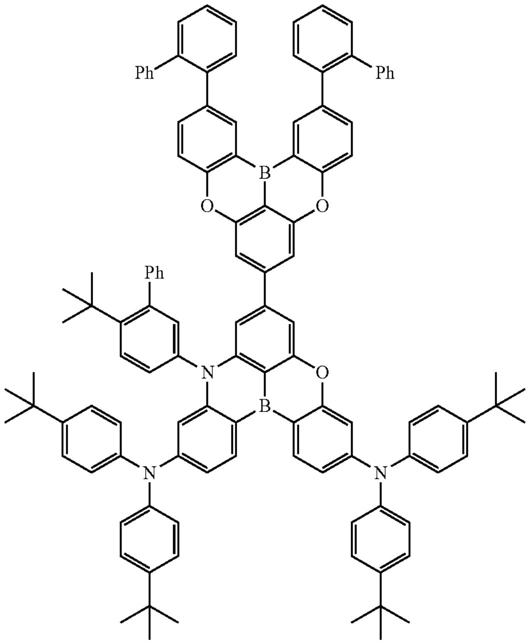
15
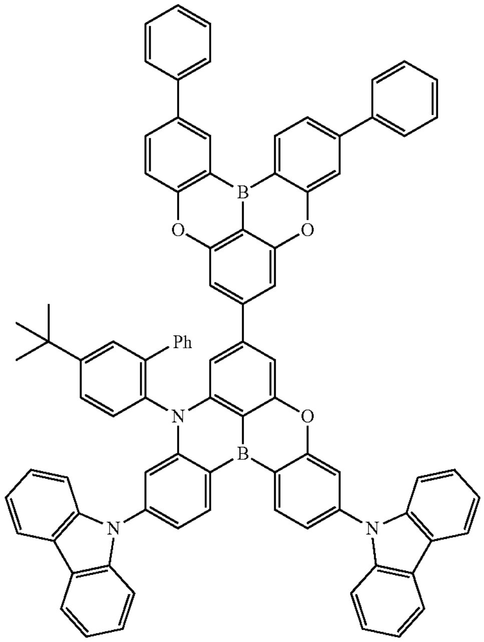

-continued
16
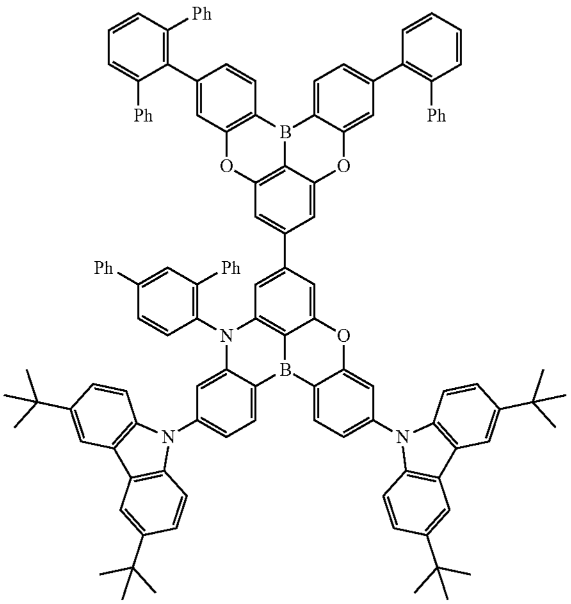
17
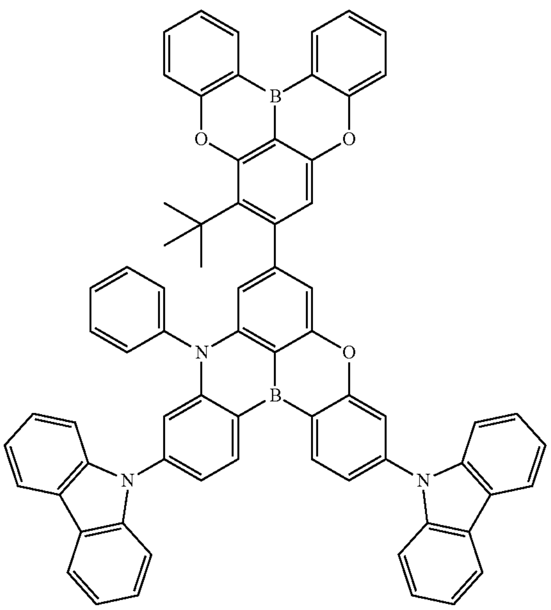
-continued
18
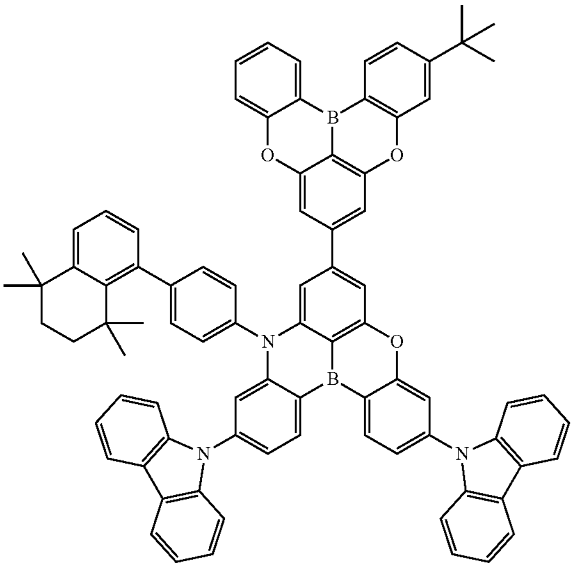
19
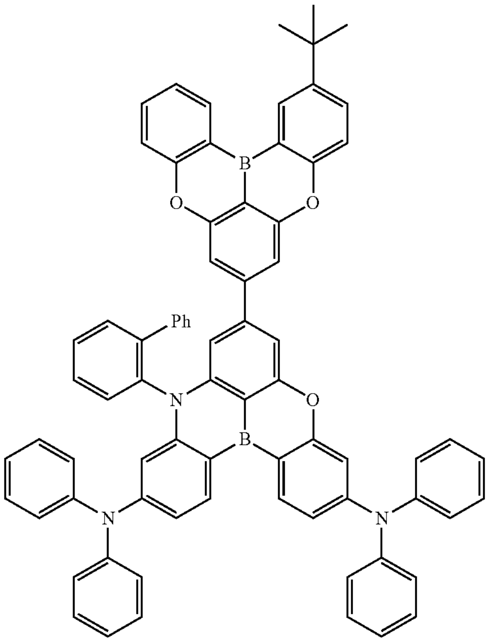

-continued
20
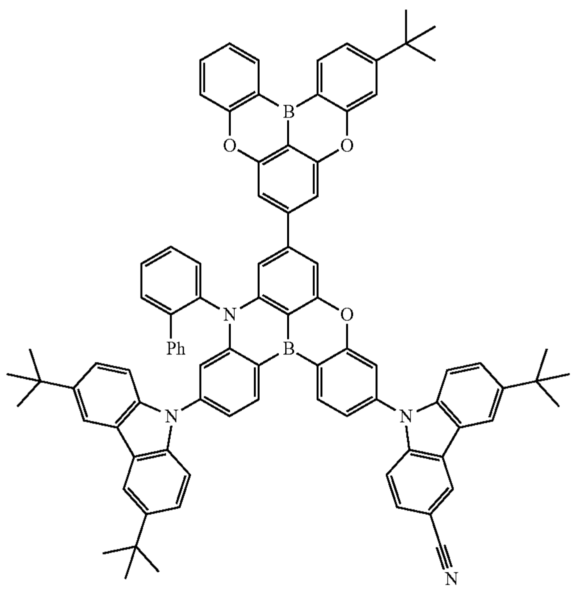
21
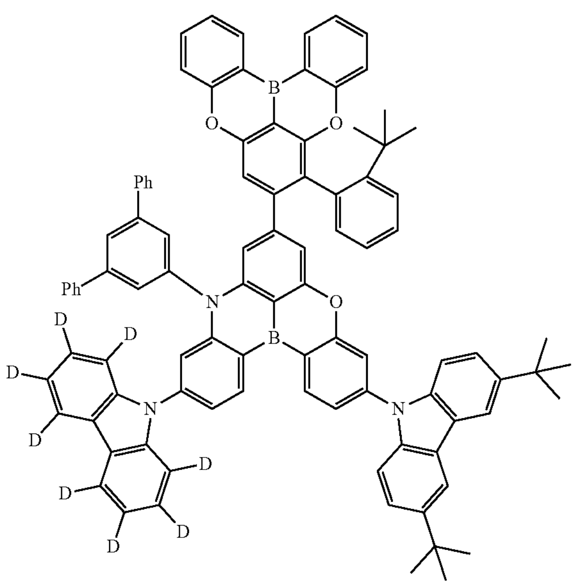
-continued
22
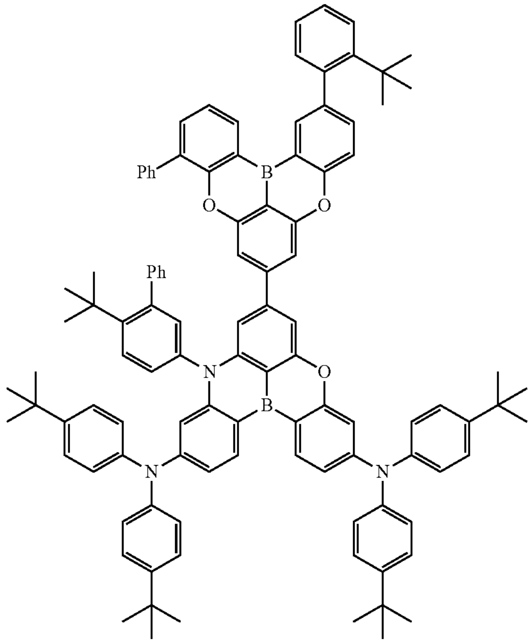
23
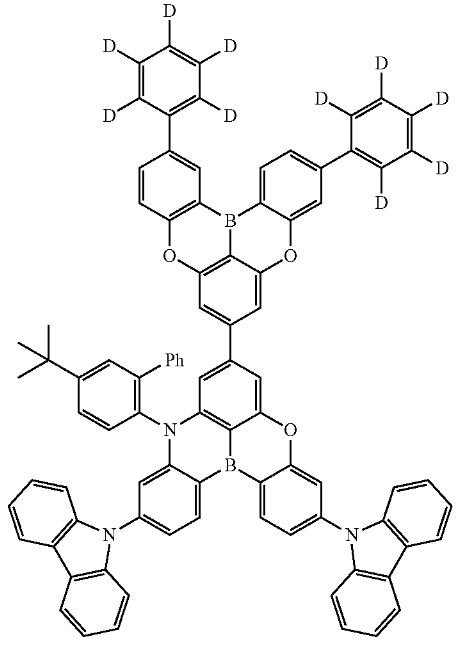

24
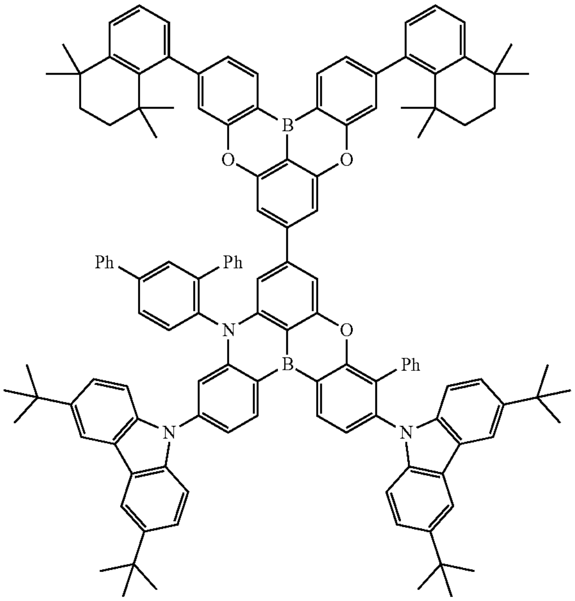
25
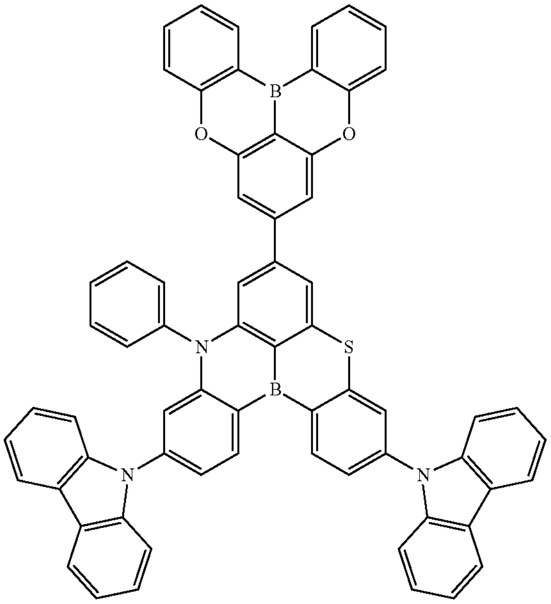
26
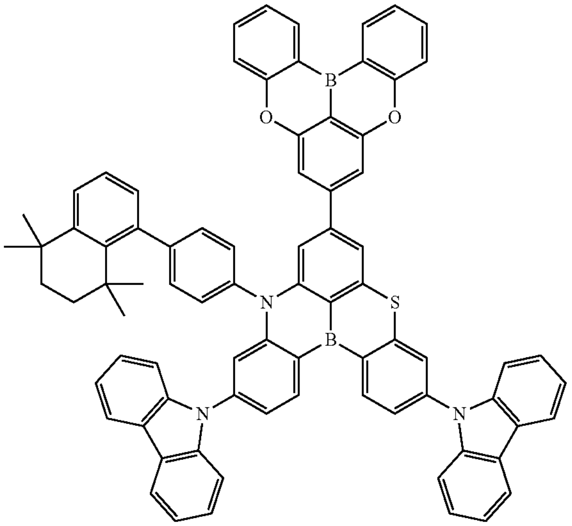
27
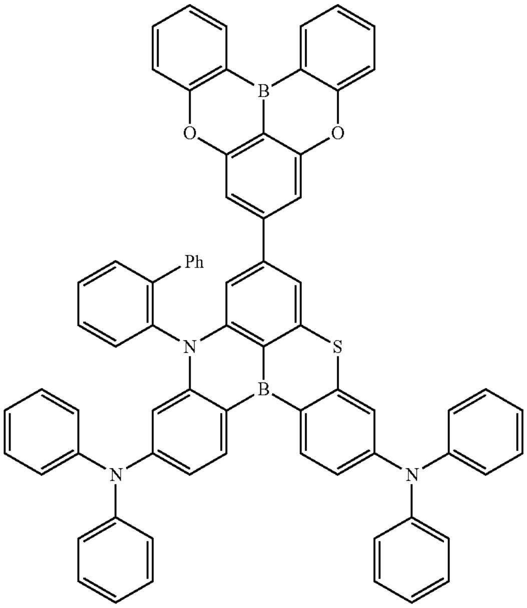

-continued
28
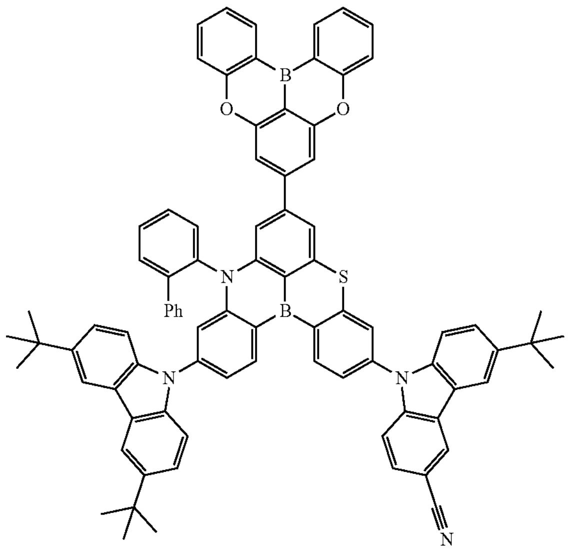
30
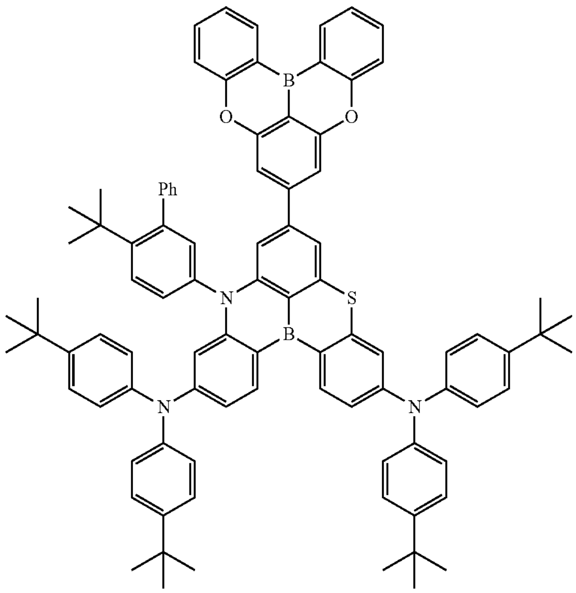
29
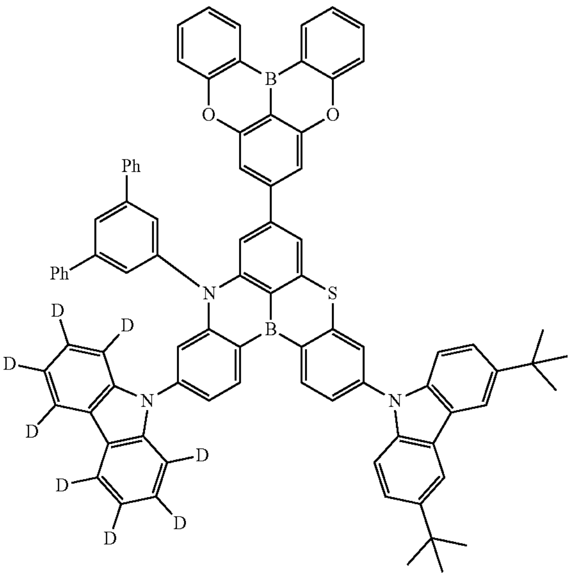
31
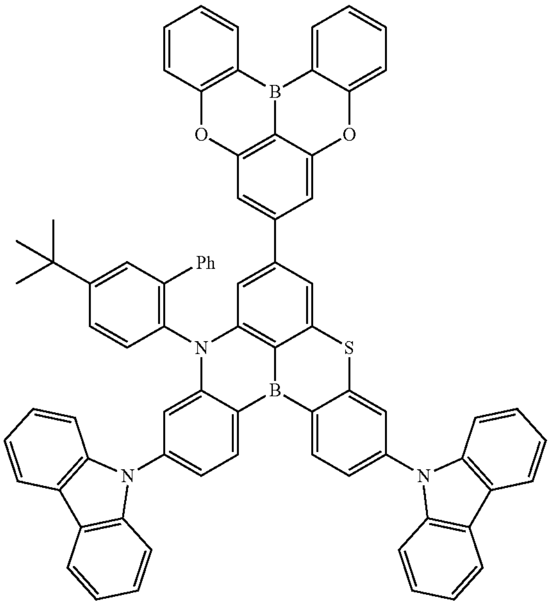

-continued
32
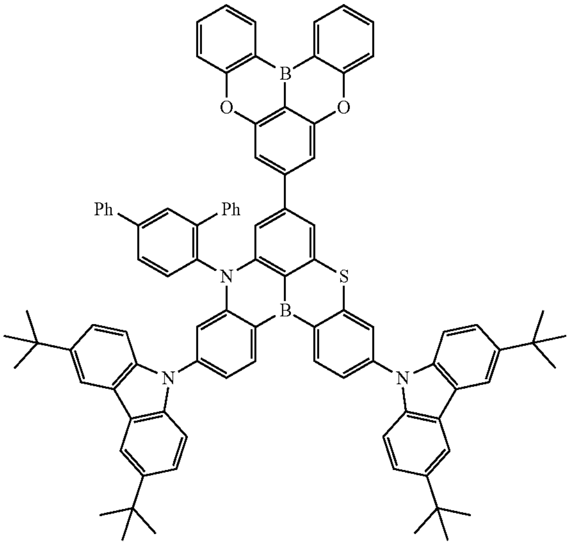
34
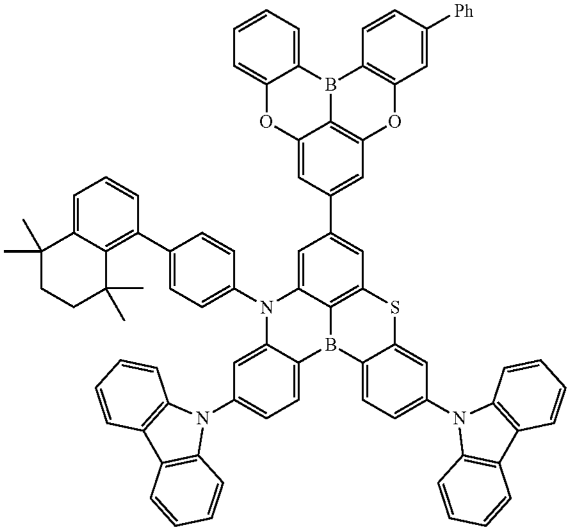
33
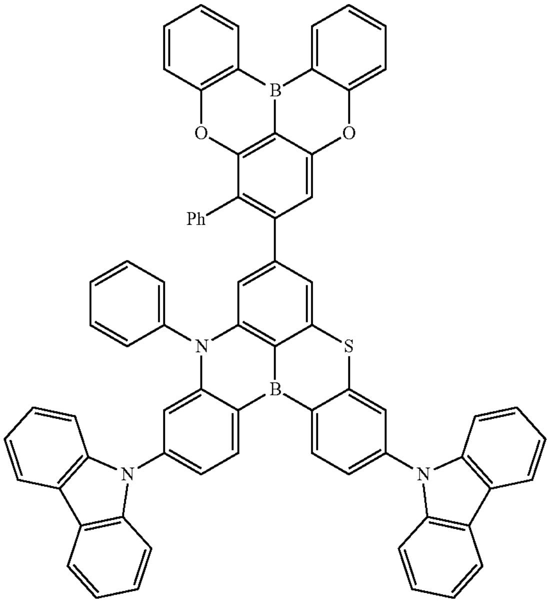
35
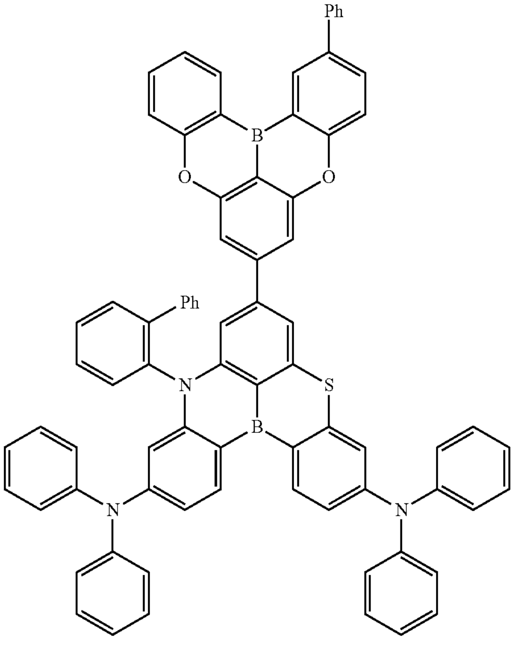

-continued
36
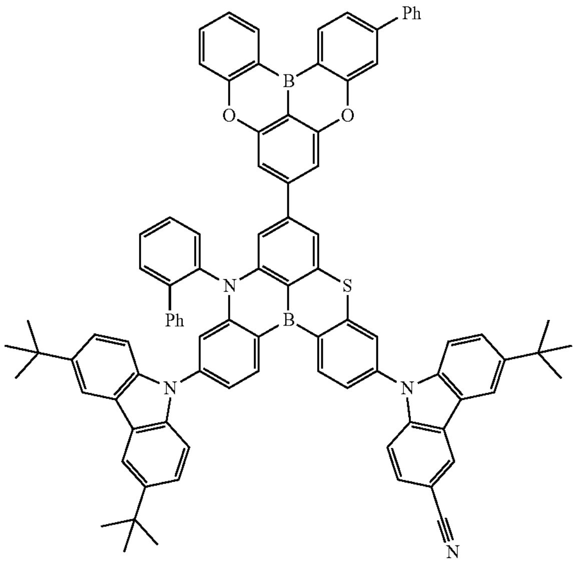
37
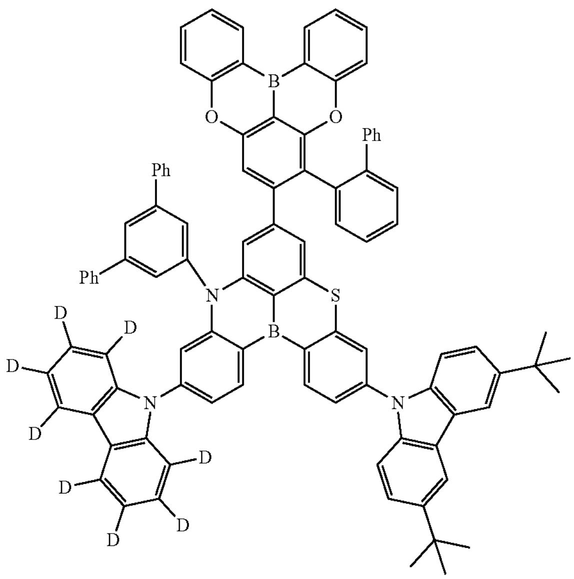
-continued
38
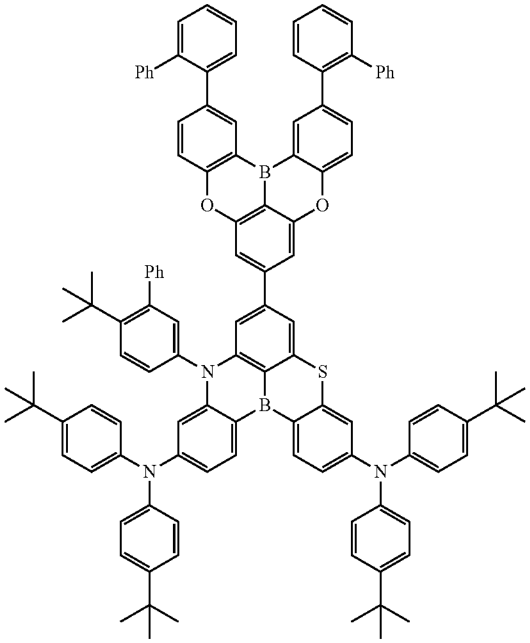
39
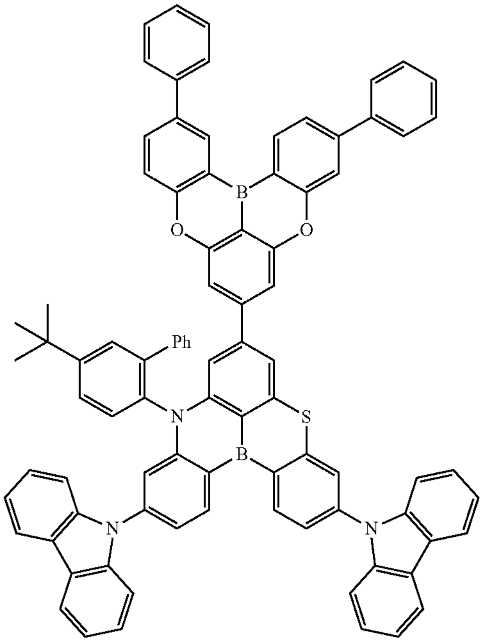

-continued
40
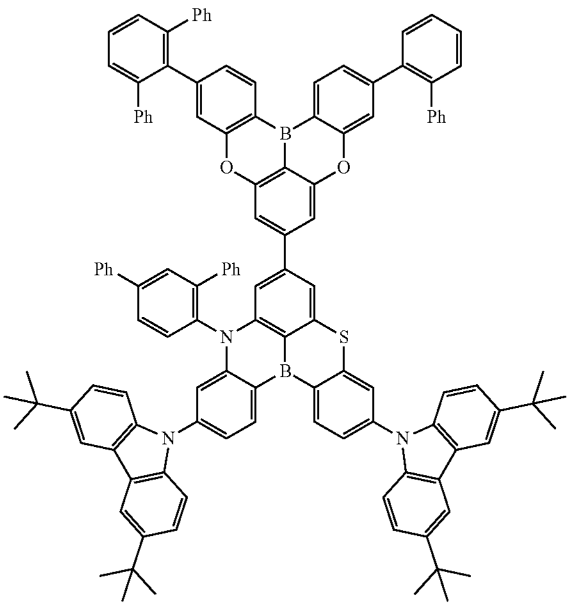
-continued
42
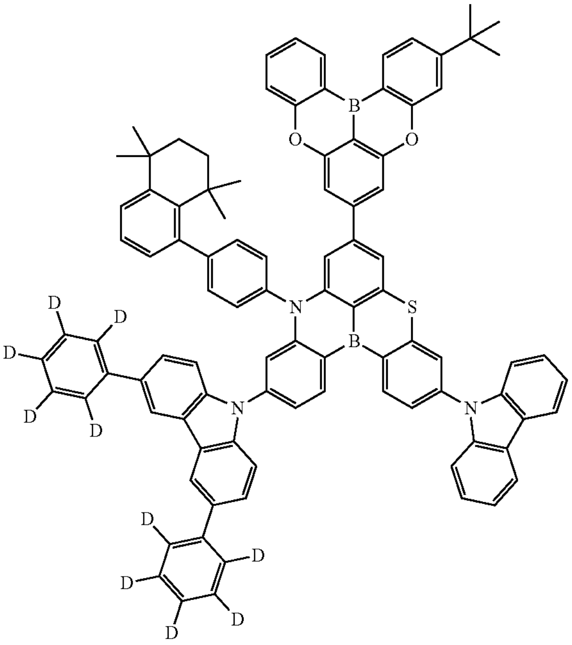
41
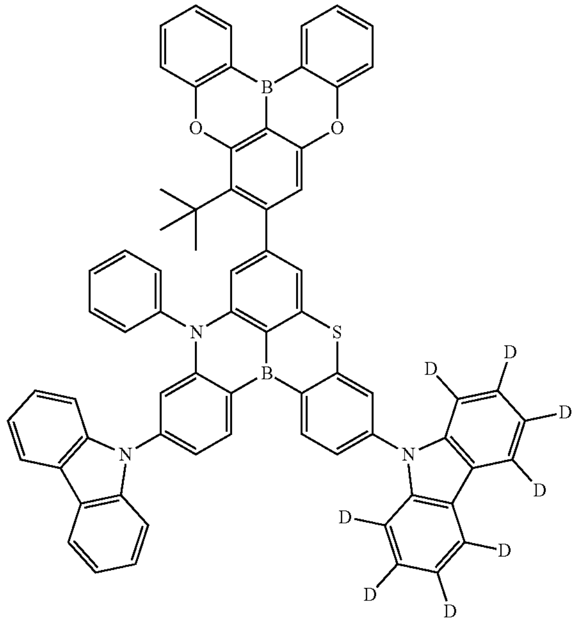
43
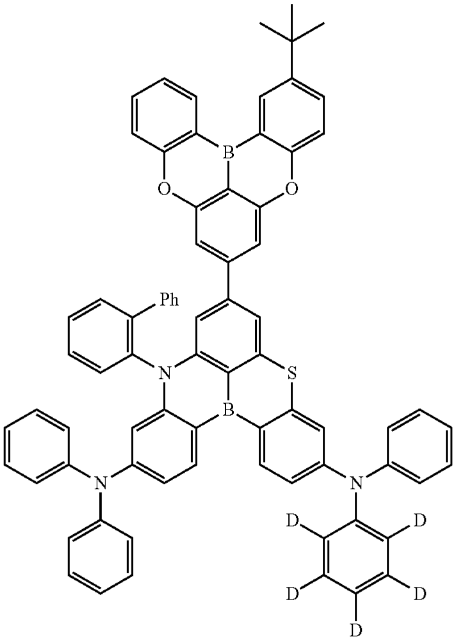

-continued
44
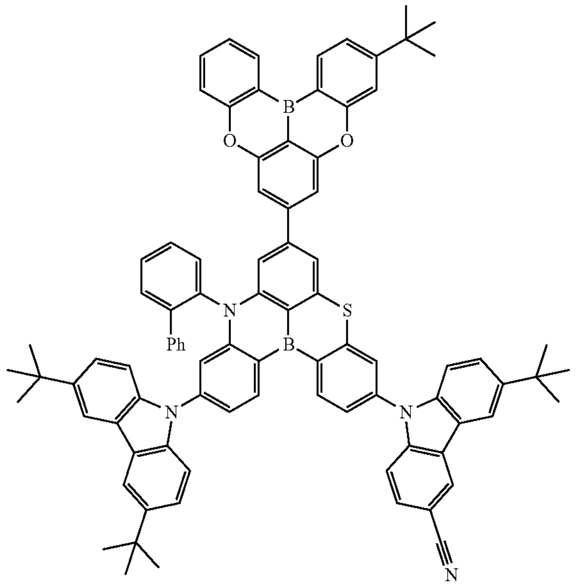
45
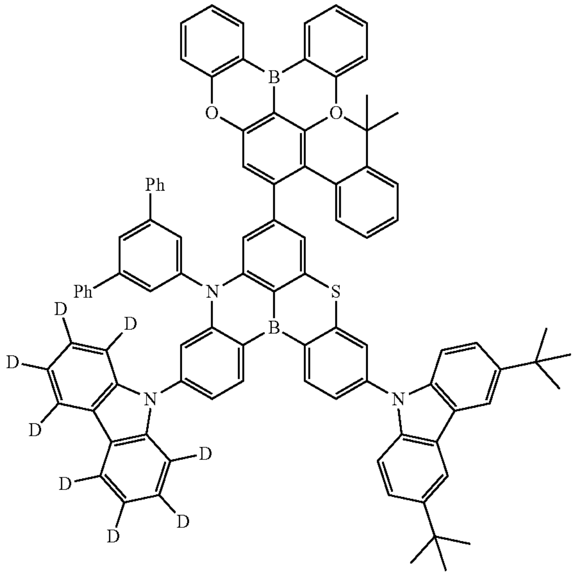
-continued
46
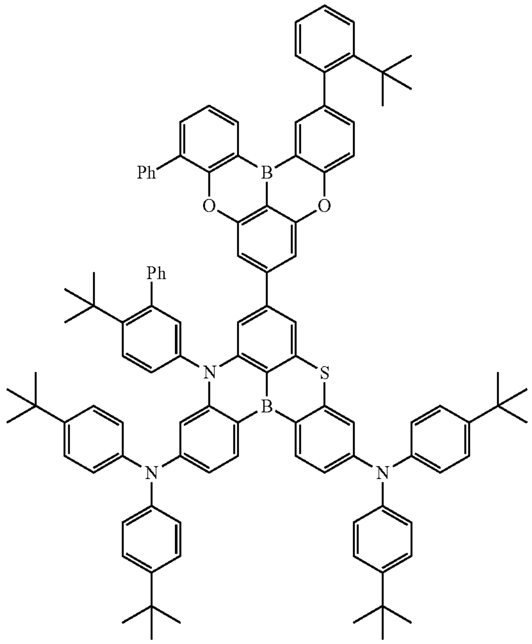
47
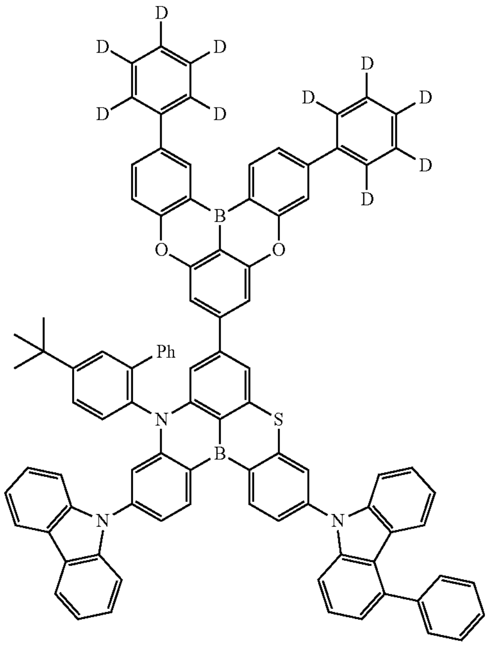

-continued
48
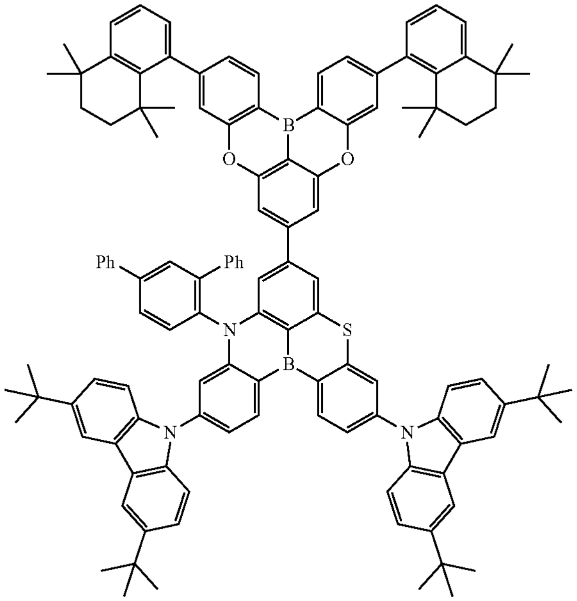
49
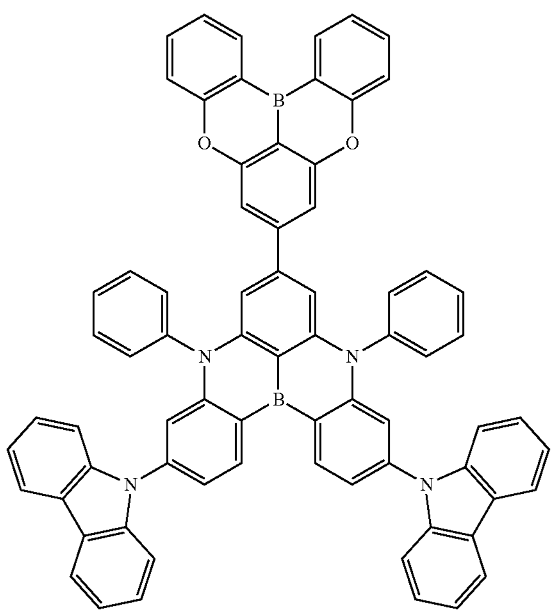
-continued
50
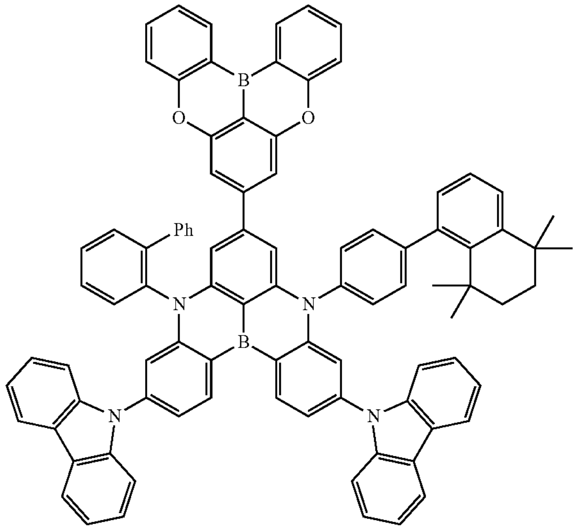
51
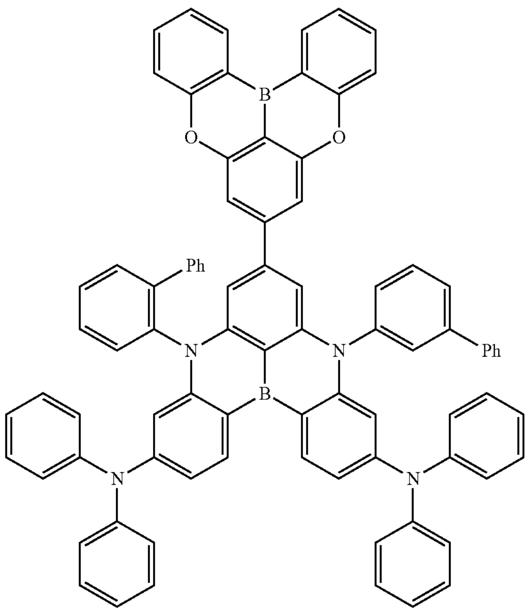

-continued
52
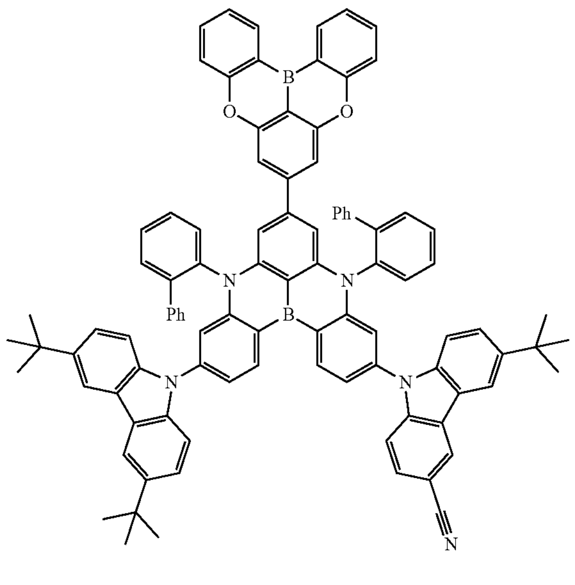
53
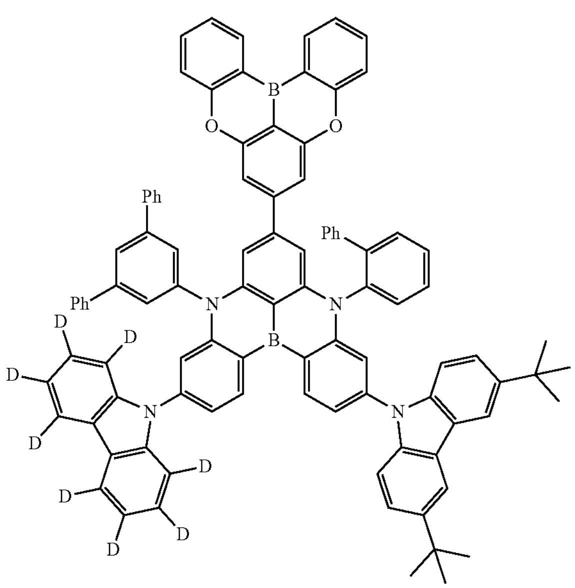
-continued
54
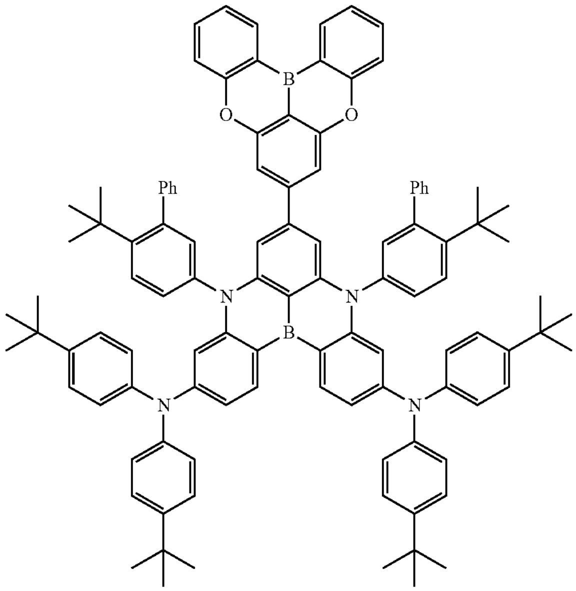
55
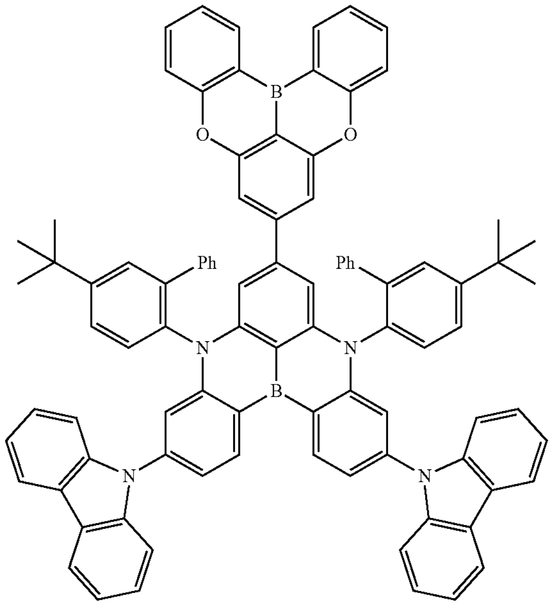

-continued
56
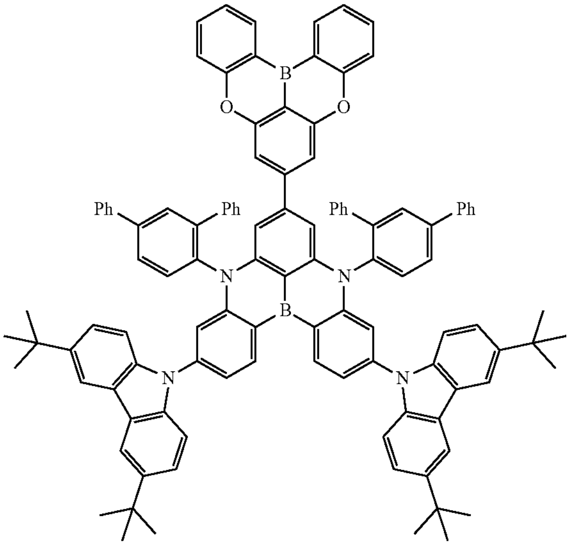
57
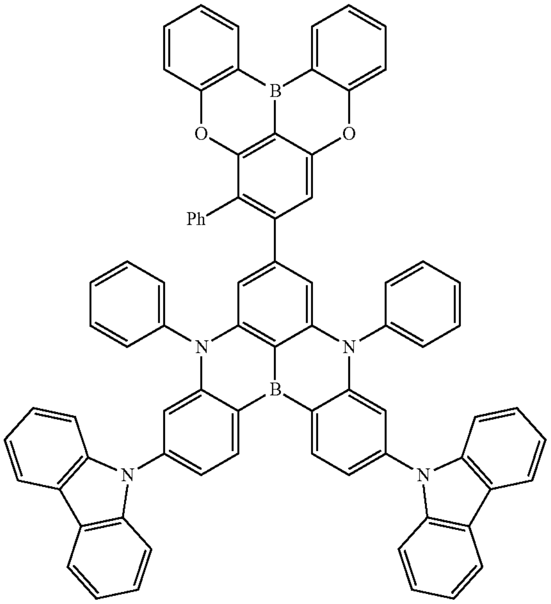
-continued
58
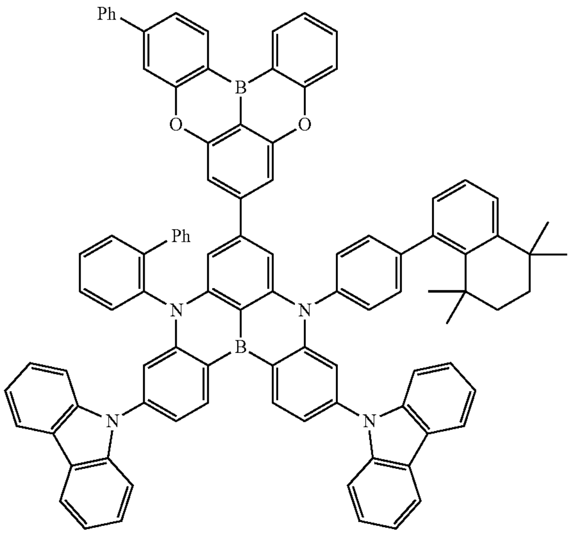
59
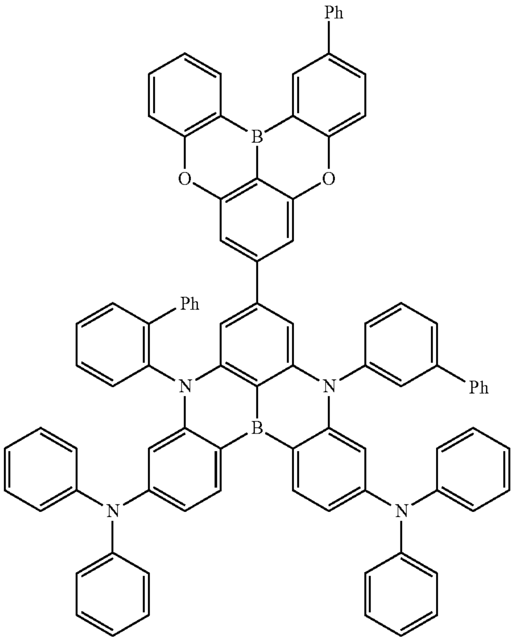

-continued
60
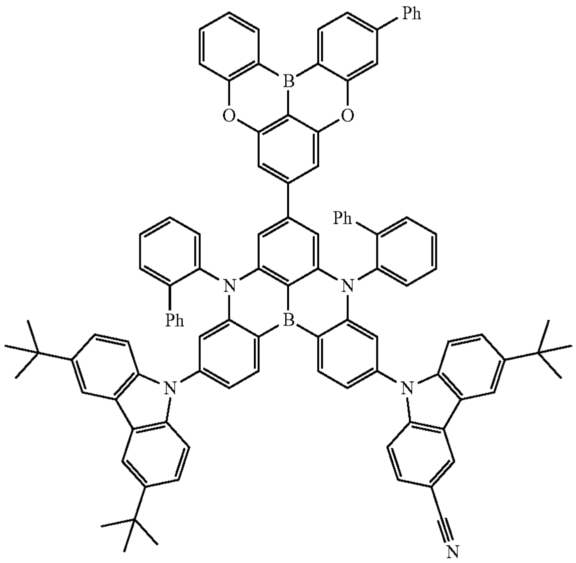
61
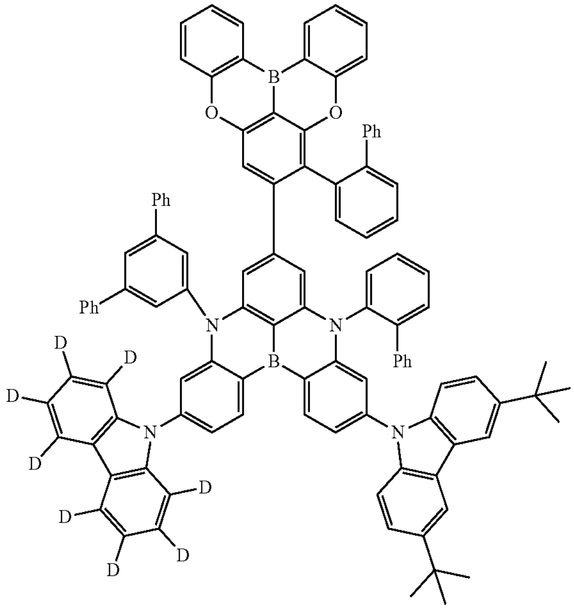
-continued
62
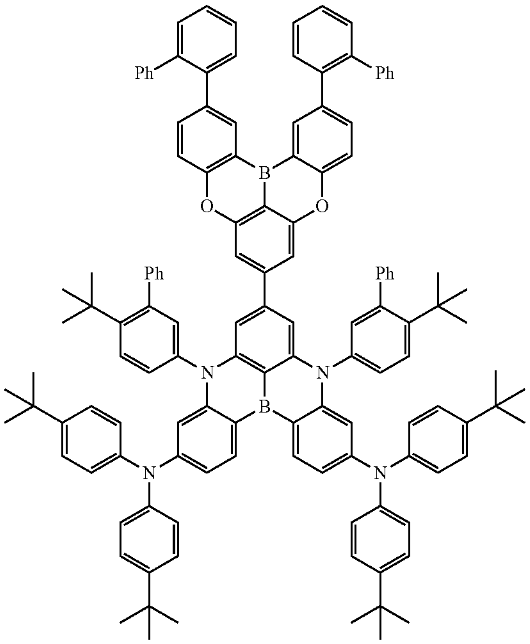
63
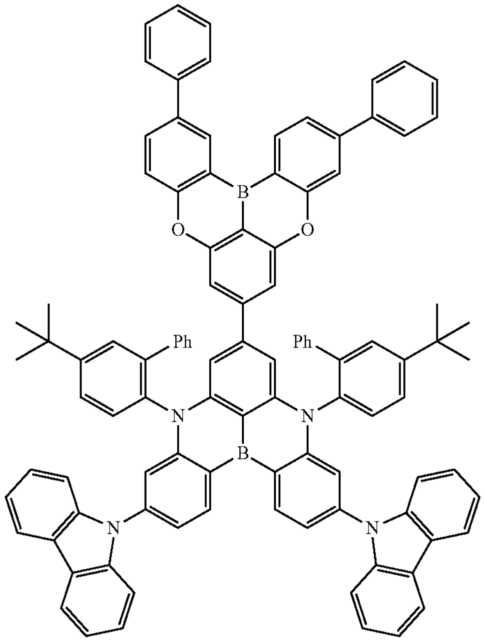

-continued
64
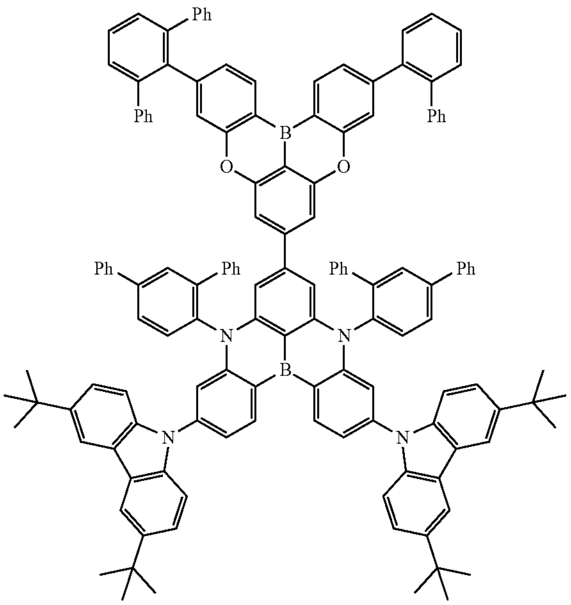
-continued
66
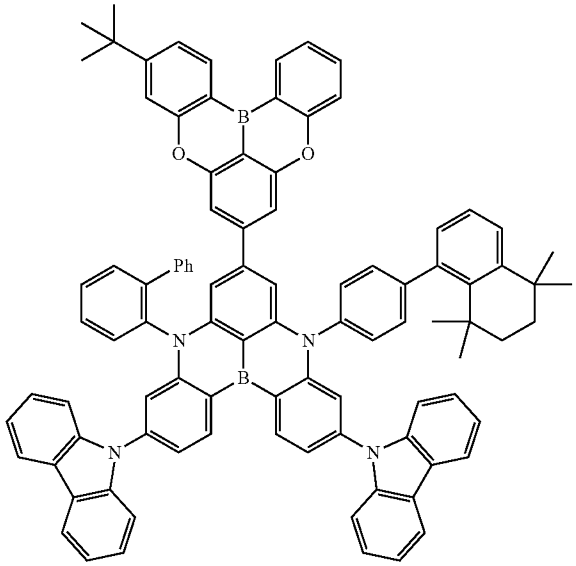
65
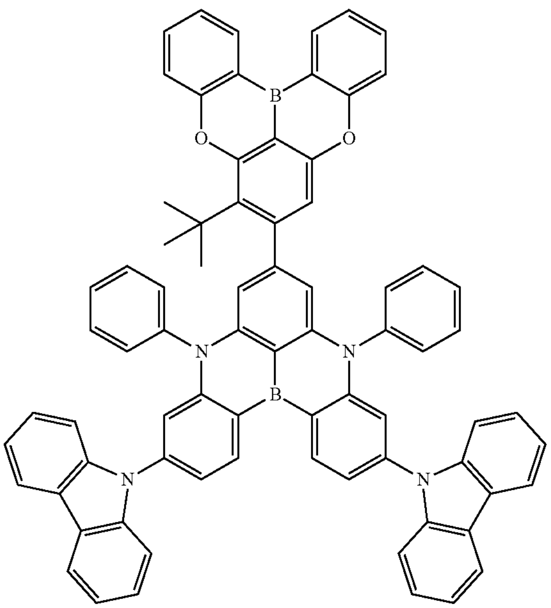
67
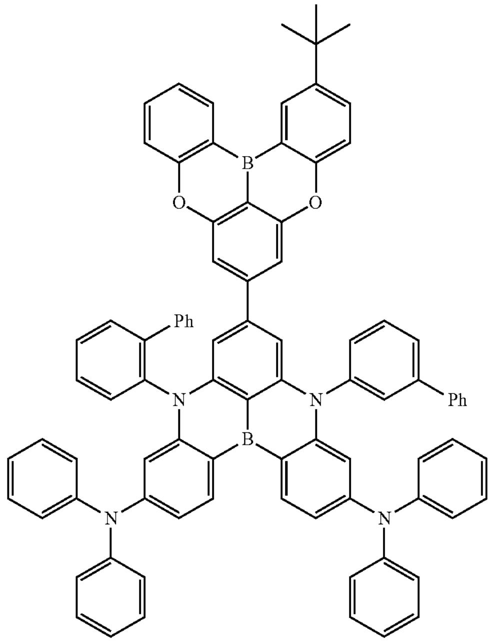

-continued
68
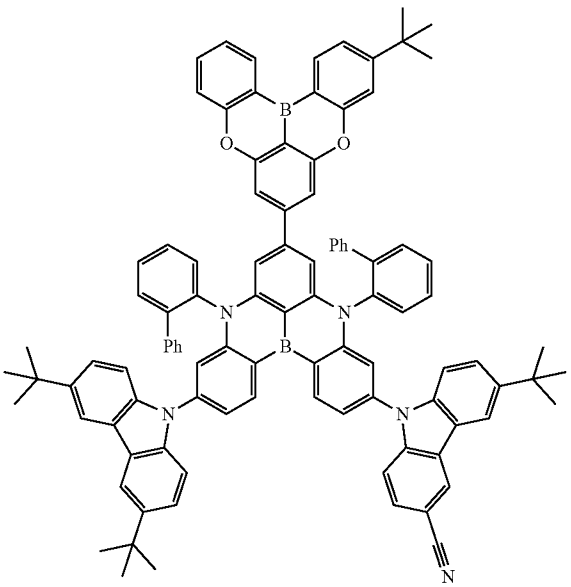
69
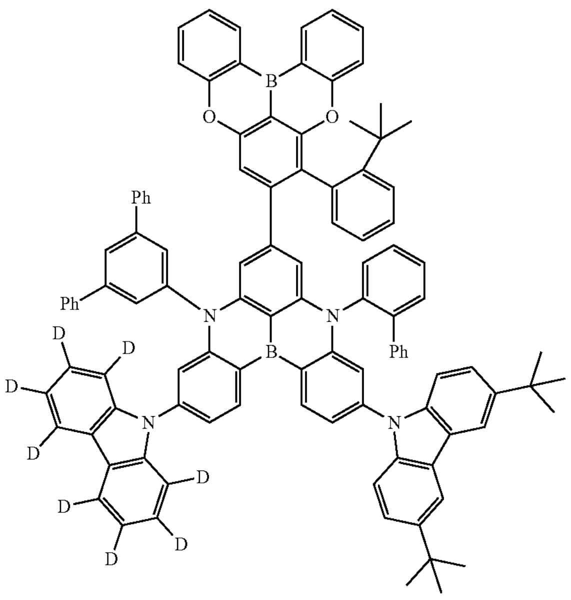
-continued
70
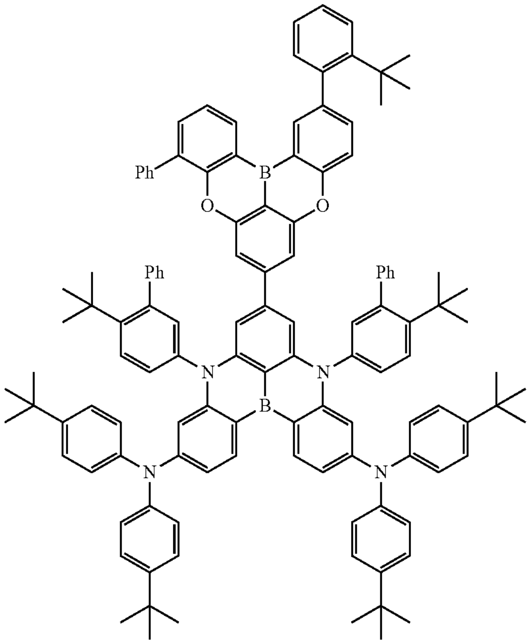
71
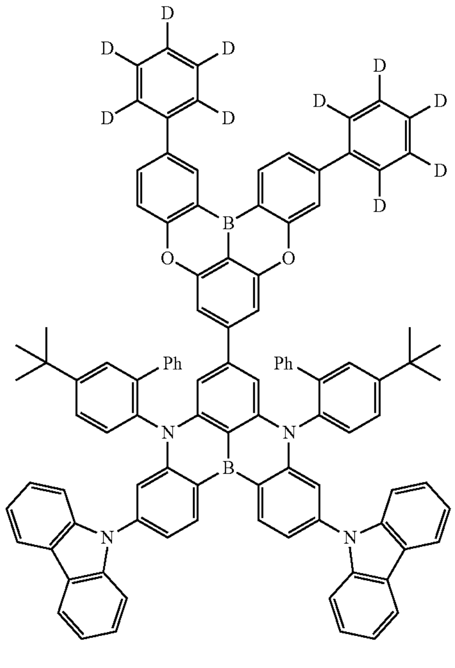

72
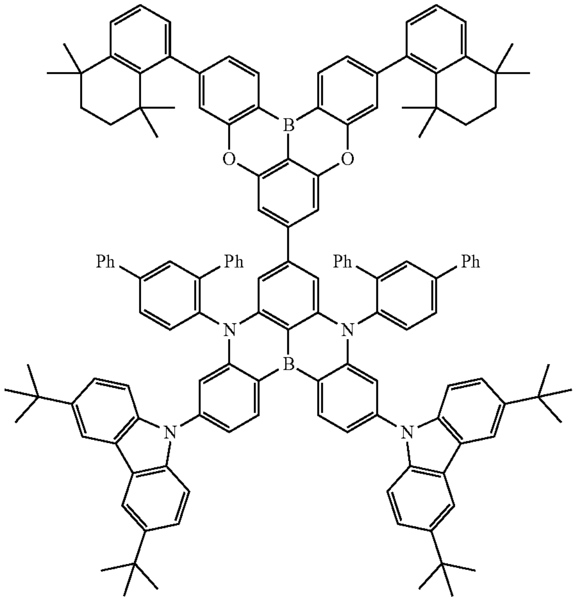
73
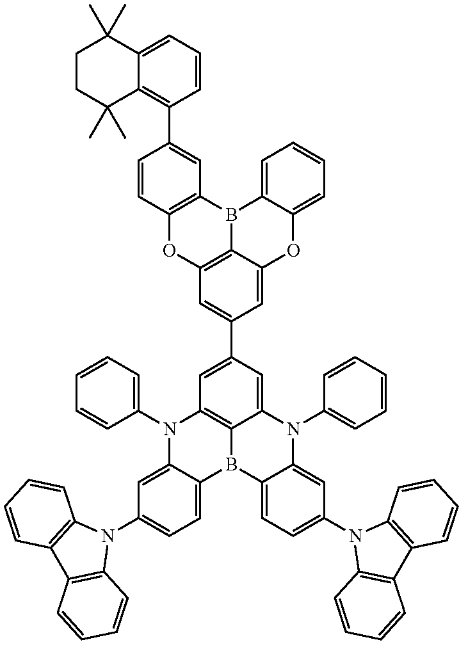
74
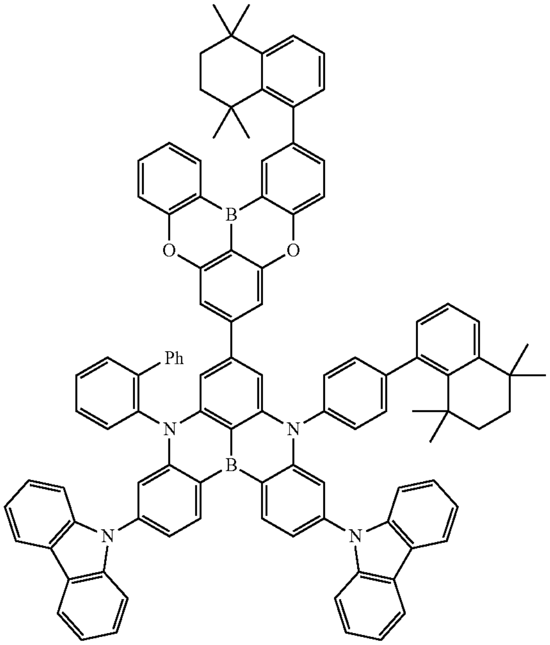
75
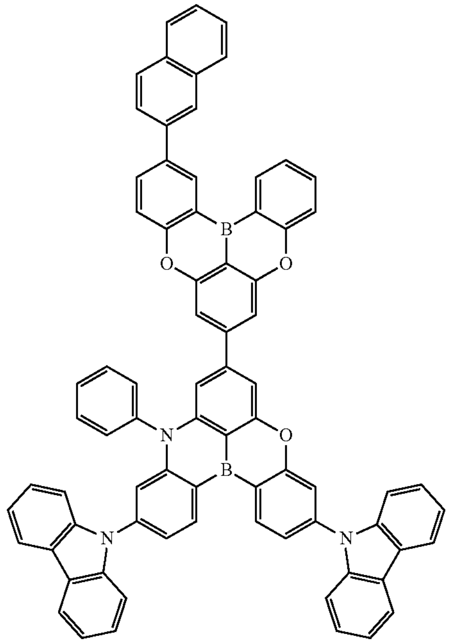

-continued
76
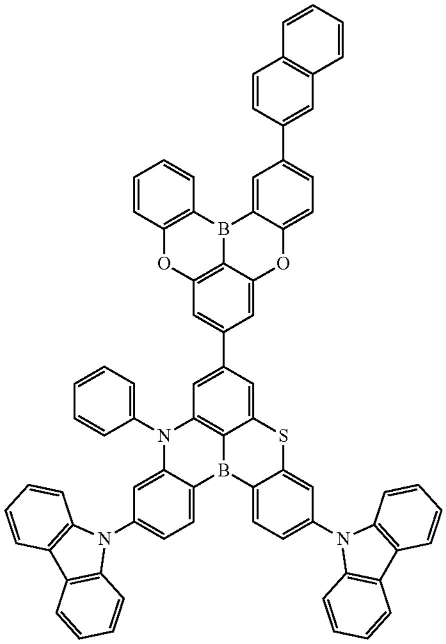
78
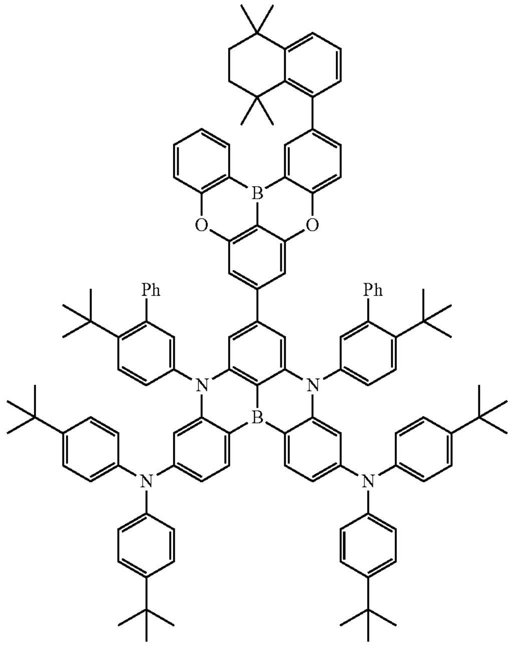
77
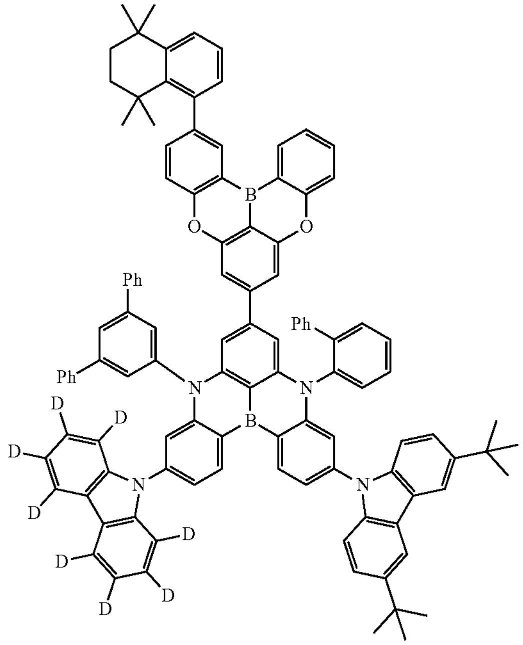
79
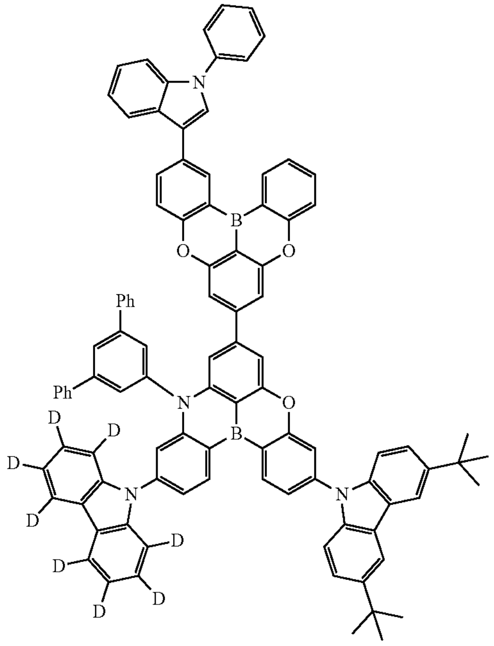

-continued
80
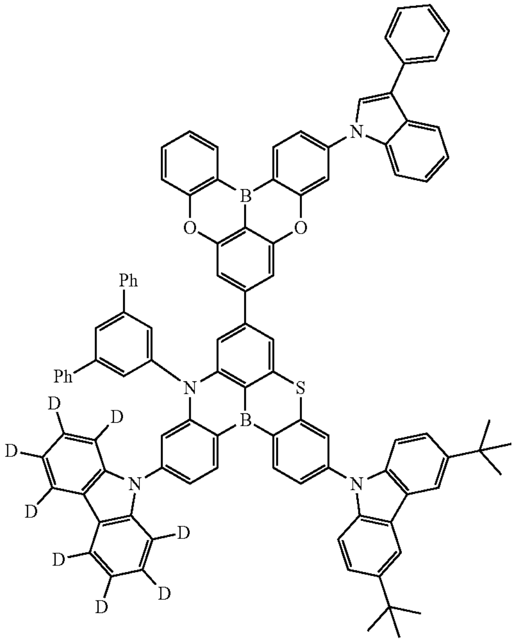
82
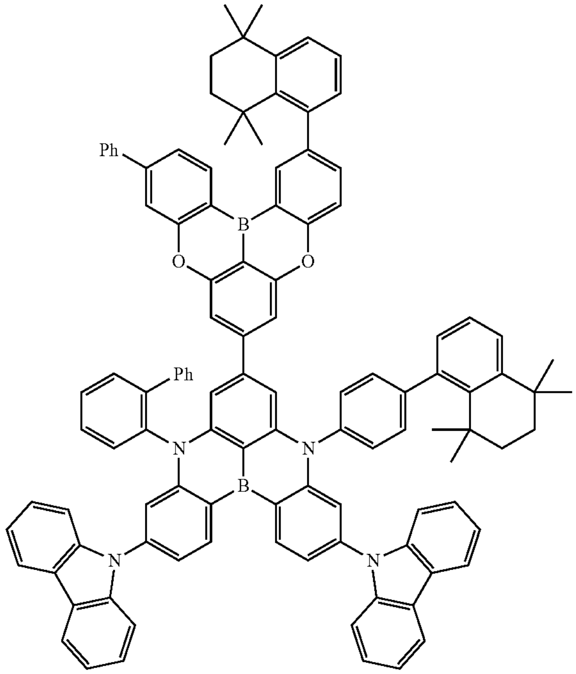
81
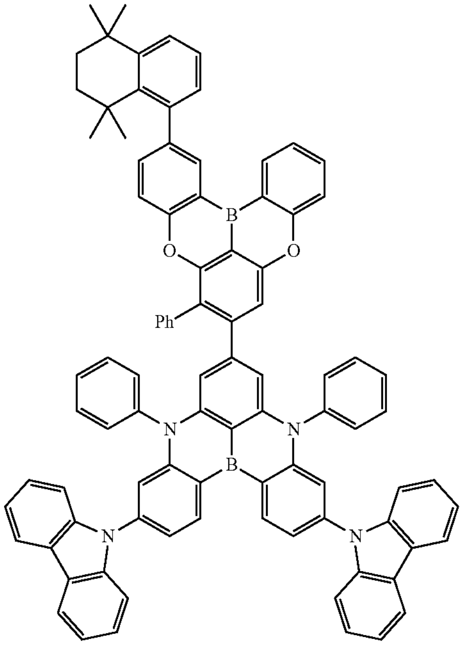
83
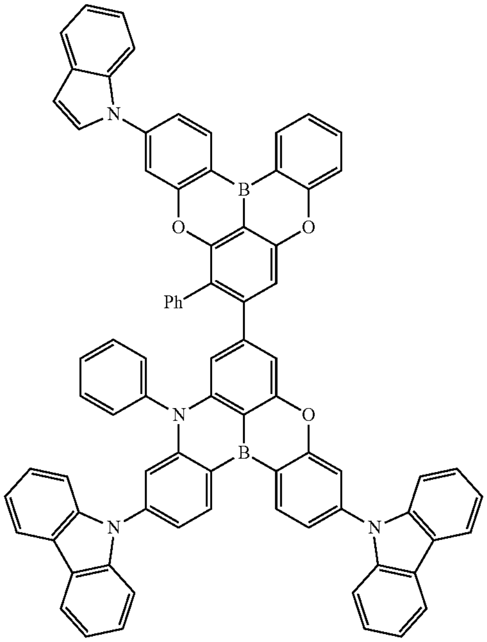

-continued
84
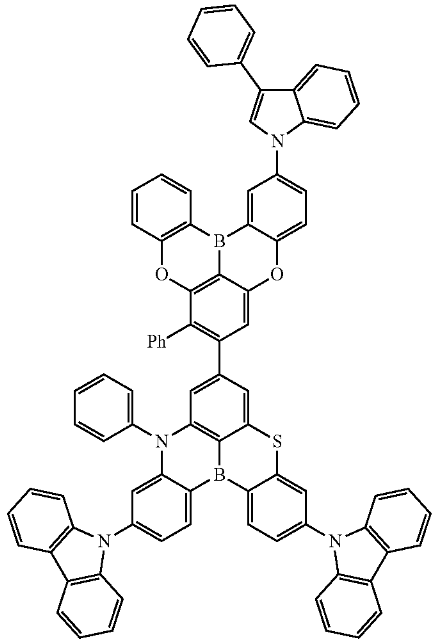
85
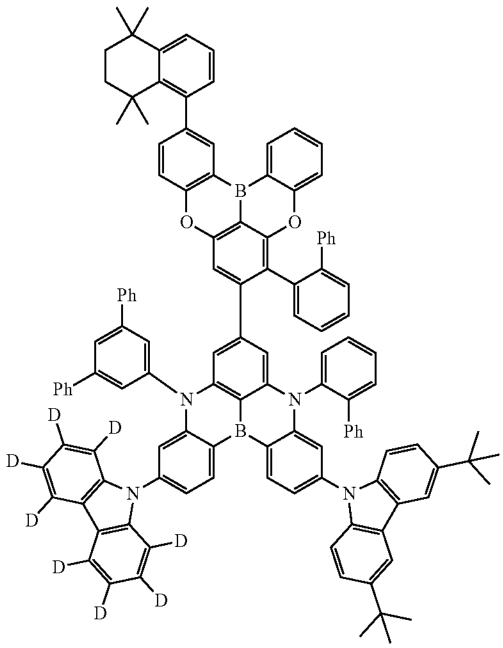
-continued
86
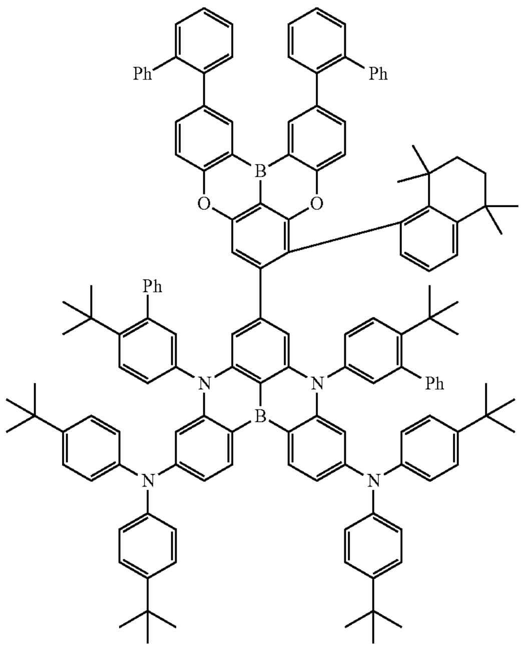
87
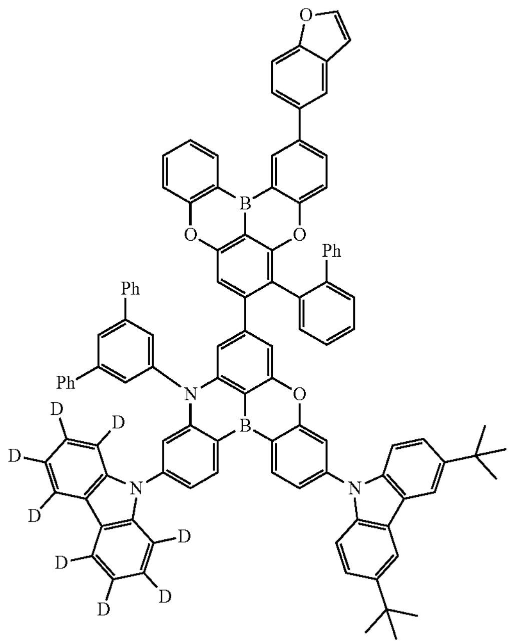

-continued
88
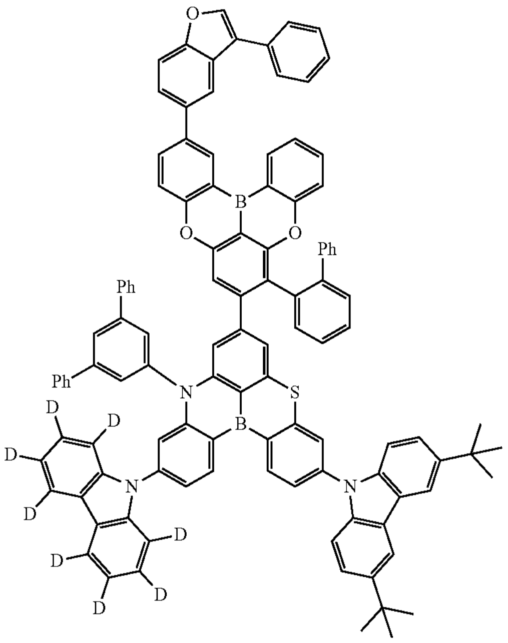
89
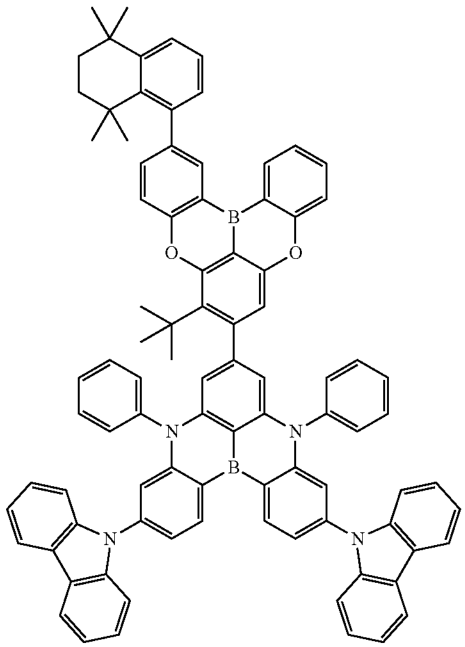
-continued
90
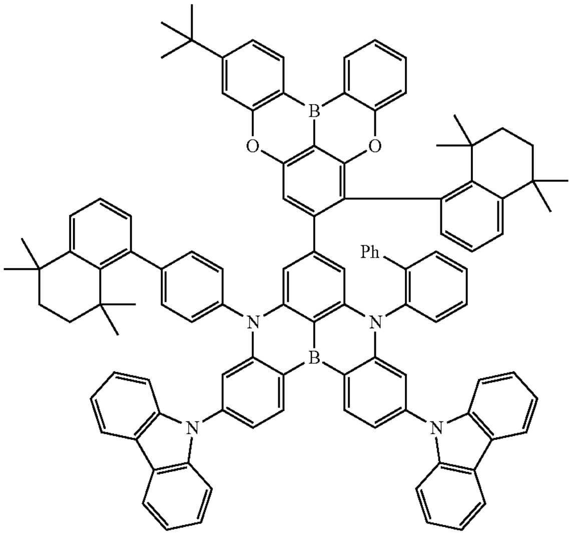
91
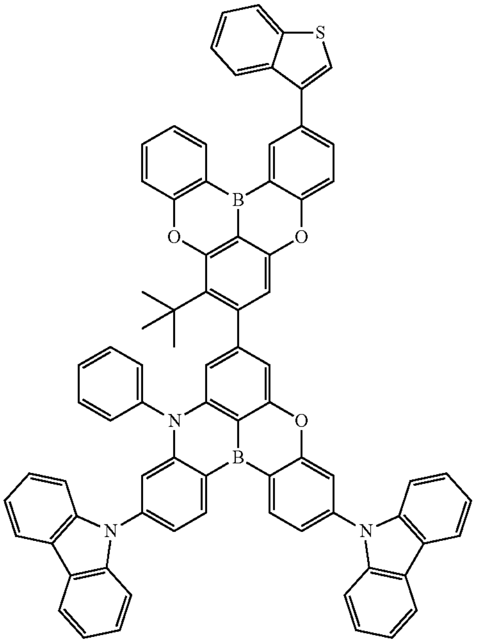

-continued
92
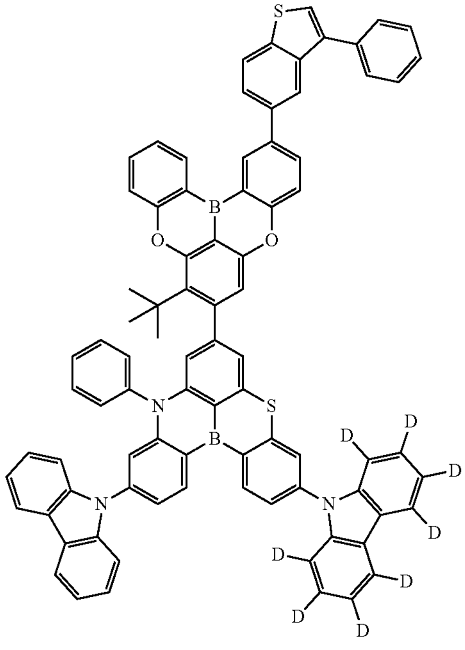
93
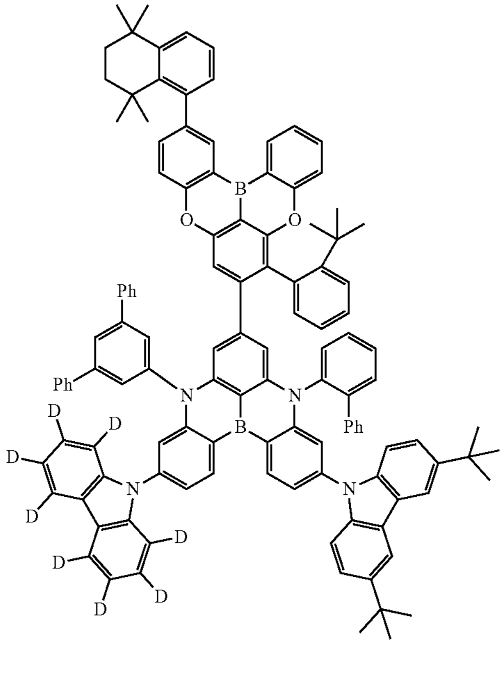
-continued
94
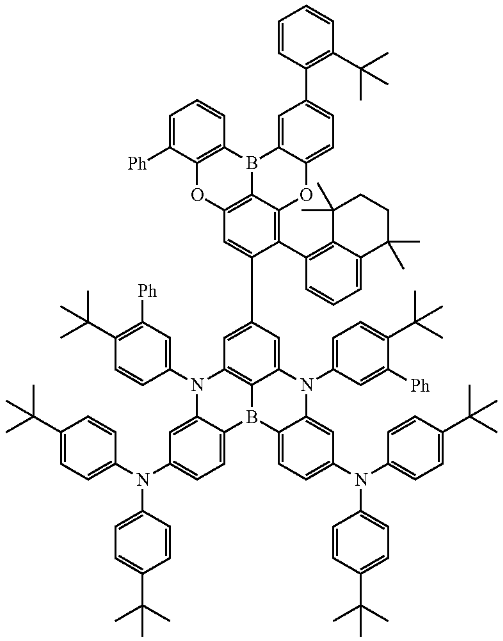
95
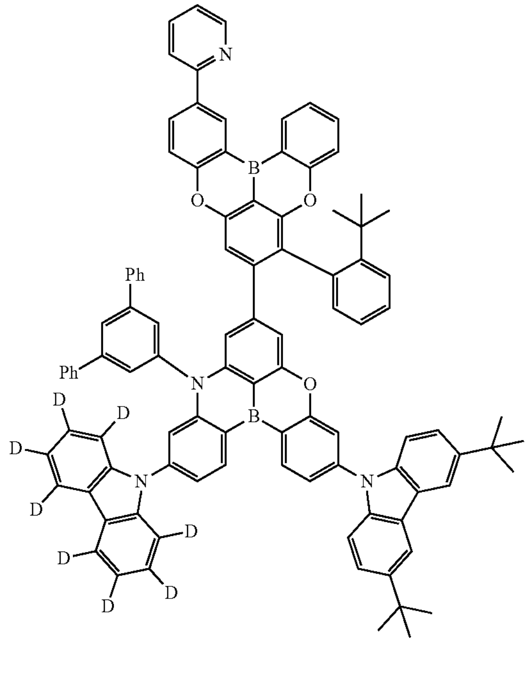

-continued

96

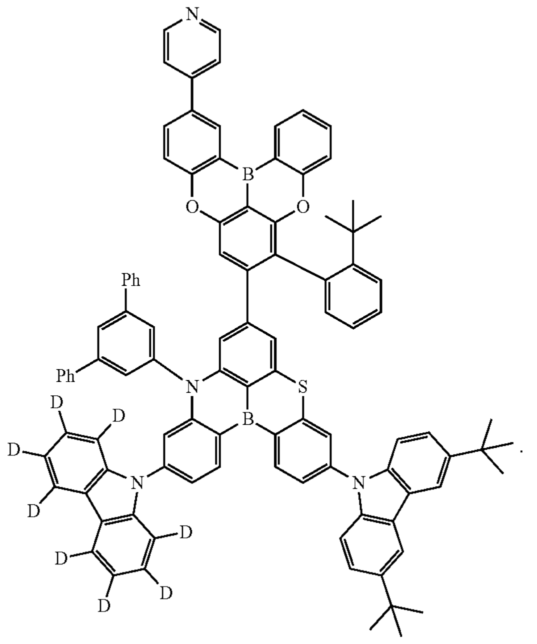

15. A light emitting element, comprising:

a first electrode;

a second electrode disposed on the first electrode; and an emission layer disposed between the first electrode and the second electrode, wherein;

the emission layer comprises a first compound, a second compound, and a third compound, the first compound, the second compound, and the third compound are different from each other, the first compound is represented by Formula 3, and an oscillator strength of the first compound is equal to or greater than about 0.2500:

[Formula 3]

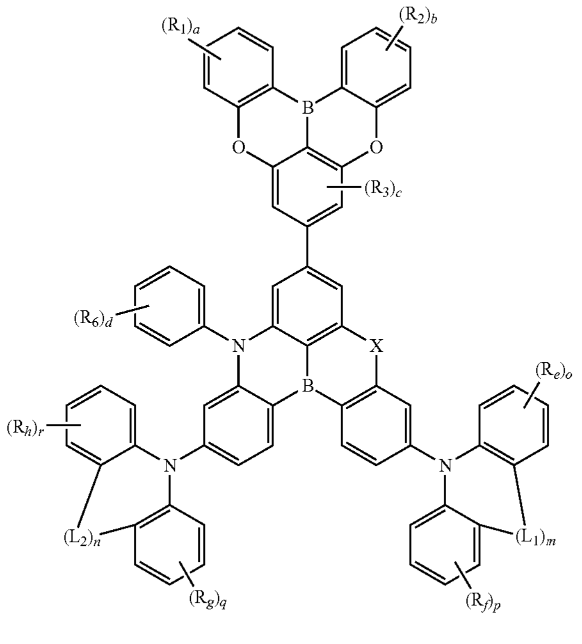

wherein in Formula 3, a and b are each independently an integer from 0 to 4, c is an integer from 0 to 2, d is an integer from 0 to 5, m and n are each independently 0 or 1, in case that m is 0, o and p are each independently an integer from 0 to 5, in case that m is 1, o and p are each independently an integer from 0 to 4, in case that n is 0, r and q are each independently an integer from 0 to 5, in case that n is 1, r and q are each independently an integer from 0 to 4, $L_1$ and $L_2$ are each a direct linkage, X is $N(R_x)$, O, or S, and $R_x$, $R_e$ to $R_h$, $R_1$ to $R_3$, and $R_6$ are each independently a deuterium atom, a substituted or unsubstituted alkyl group of 1 to 20 carbon atoms, a substituted or unsubstituted alkenyl group of 2 to 20 carbon atoms, a substituted or unsubstituted aryl group of 6 to 30 ring-forming carbon atoms, or a substituted or unsubstituted heteroaryl group of 2 to 30 ring-forming carbon atoms, or are combined with an adjacent group to form a ring.

16. The light emitting element of claim 15, wherein the first compound represented by Formula 3 is represented by Formula 4-1 or Formula 4-2:

[Formula 4-1]

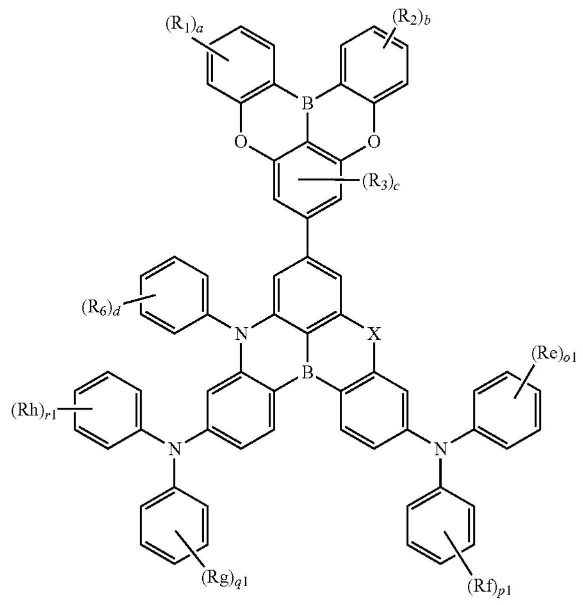

-continued

[Formula 4-2]

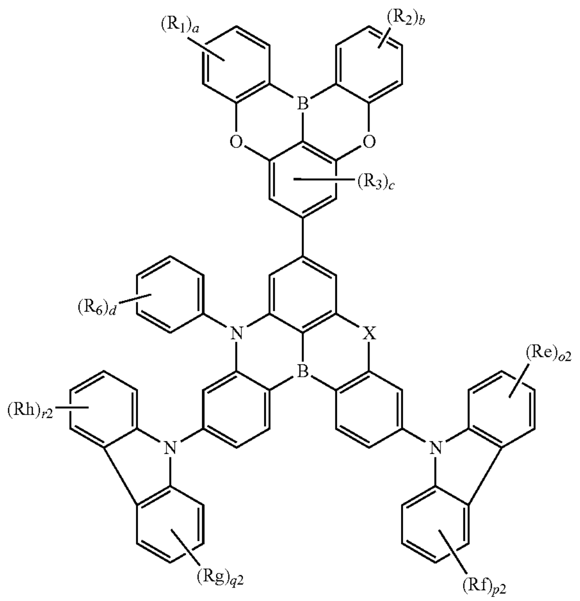

wherein in Formula 4-1, o1 to r1 are each independently an integer from 0 to 5, wherein in Formula 4-2, o2 to r2 are each independently an integer from 0 to 4, and wherein in Formula 4-1 and Formula 4-2, a to d, $R_1$ to $R_3$, $R_6$, X, and $R_e$ to $R_h$ are the same as defined in Formula 3.

17. The light emitting element of claim 16, wherein in Formula 4-1, $R_e$ to $R_h$ are each independently a deuterium atom, or a substituted or unsubstituted t-butyl group.

18. The light emitting element of claim 16, wherein in Formula 4-2, $R_e$ to $R_h$ are each independently a deuterium atom, a cyano group, a substituted or unsubstituted phenyl group, or a substituted or unsubstituted t-butyl group.

19. The light emitting element of claim 15, wherein in Formula 3, $R_1$ and $R_2$ are each independently a substituted or unsubstituted t-butyl group, a substituted or unsubstituted phenyl group, a substituted or unsubstituted naphthyl group, a substituted or unsubstituted indole group, a substituted or unsubstituted benzofuran group, a substituted or unsubstituted benzothiophene group, a substituted or unsubstituted pyridine group, or a substituted or unsubstituted tetrahydrozoline naphthyl group.

20. The light emitting element of claim 15, wherein in Formula 3, $R_3$ is a substituted or unsubstituted phenyl group, a substituted or unsubstituted tetrahydrozoline naphthyl group, or a substituted or unsubstituted t-butyl group.

21. The light emitting element of claim 15, wherein in Formula 3, $R_6$ is a substituted or unsubstituted phenyl group, a substituted or unsubstituted t-butyl group, or a substituted or unsubstituted tetrahydrozoline naphthyl group.

22. The light emitting element of claim 15, wherein the emission layer further comprises a fourth compound represented by Formula M-b:

[Formula M-b]

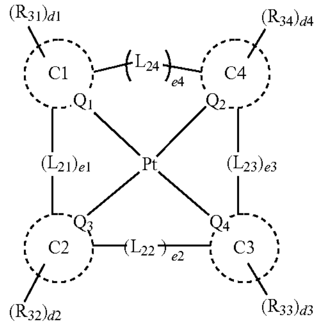

wherein in Formula M-b, $Q_1$ to $Q_4$ are each independently C or N,

C1 to C4 are each independently a substituted or unsubstituted hydrocarbon ring of 5 to 30 ring-forming carbon atoms, or a substituted or unsubstituted heterocycle of 2 to 30 ring-forming carbon atoms, $L_{21}$ to $L_{24}$ are each independently a direct linkage,

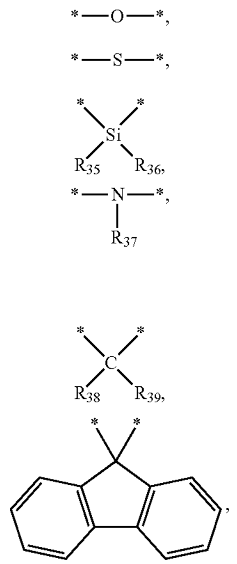

a substituted or unsubstituted divalent alkyl group of 1 to 20 carbon atoms, a substituted or unsubstituted arylene group of 6 to 30 ring-forming carbon atoms, or a substituted or unsubstituted heteroarylene group of 2 to 30 ring-forming carbon atoms, e1 to e4 are each independently 0 or 1, $R_{31}$ to $R_{39}$ are each independently a hydrogen atom, a deuterium atom, a halogen atom, a cyano group, a substituted or unsubstituted amine group, a substituted or unsubstituted alkyl group of 1 to 20 carbon atoms, a substituted or unsubstituted aryl group of 6 to 30 ring-forming carbon atoms, or a substituted or unsubstituted heteroaryl group of 2 to 30 ring-forming carbon atoms, or are combined with an adjacent group to form a ring, and d1 to d4 are each independently an integer from 0 to 4.

23. The light emitting element of claim 15, wherein the emission layer comprises at least one selected from Compound Group 1:
[Compound Group 1]
1
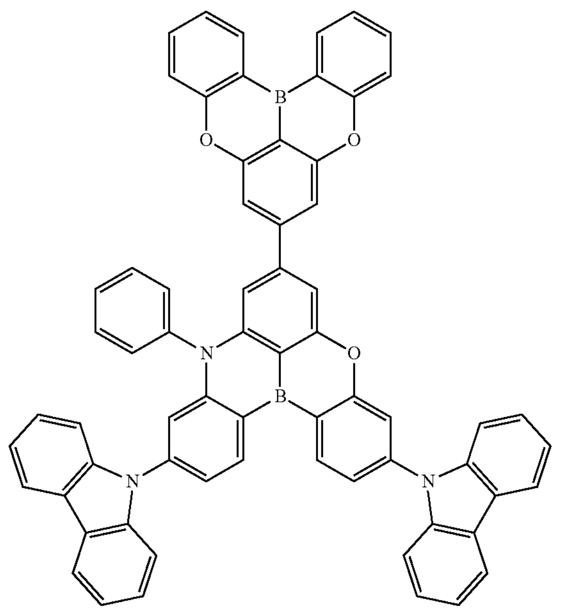
2
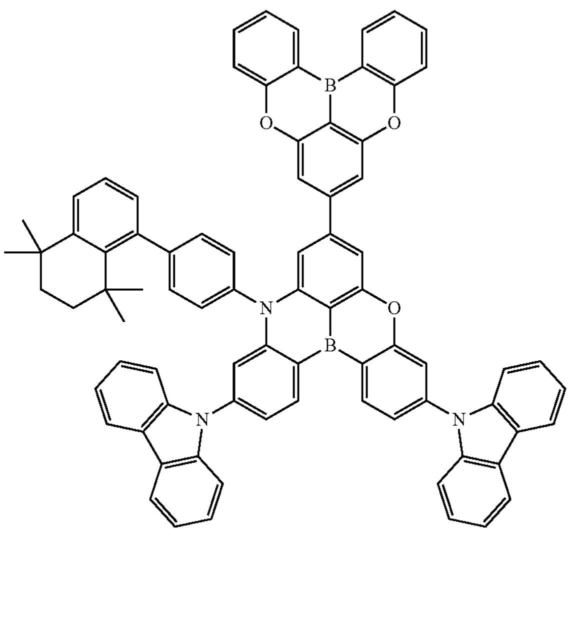
-continued
3
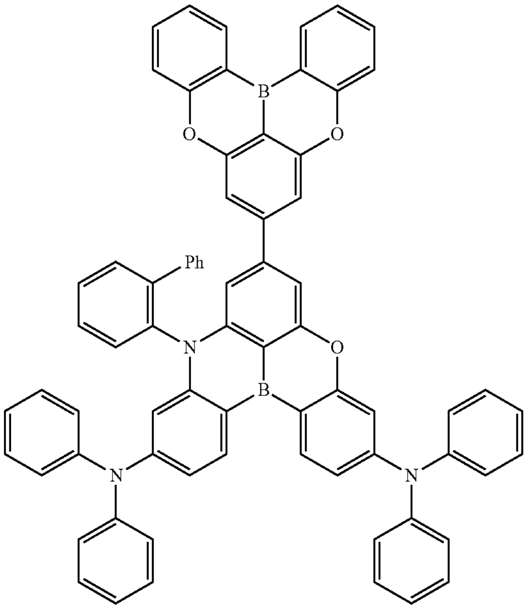
4
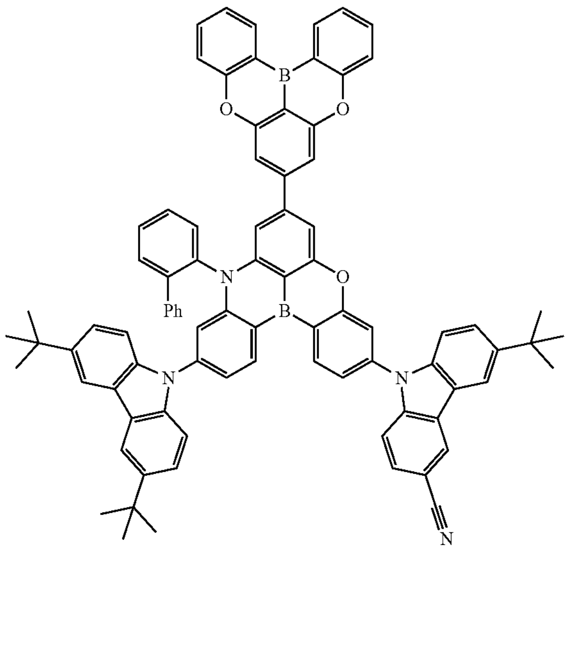

-continued
5
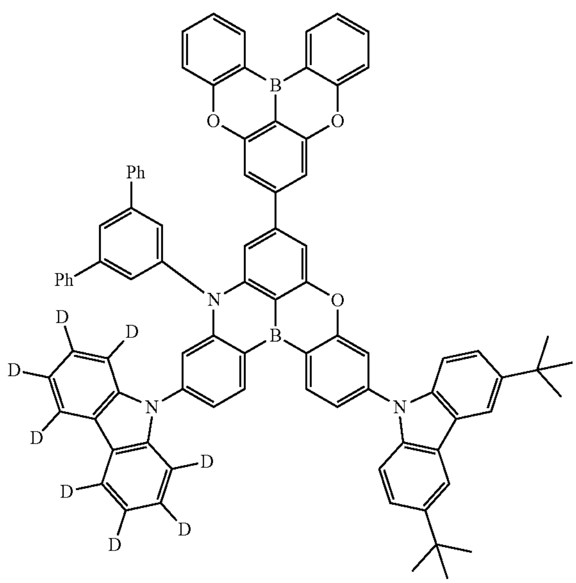
7
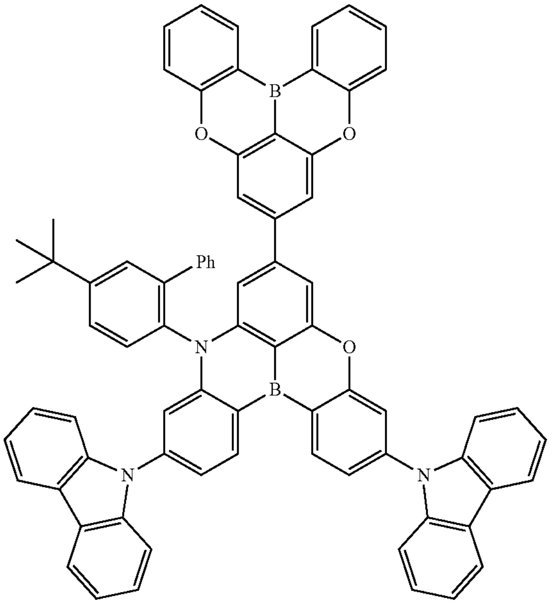
6
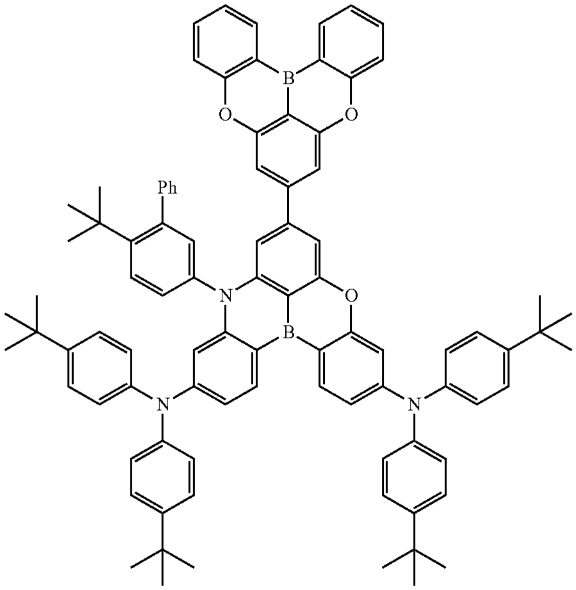
8
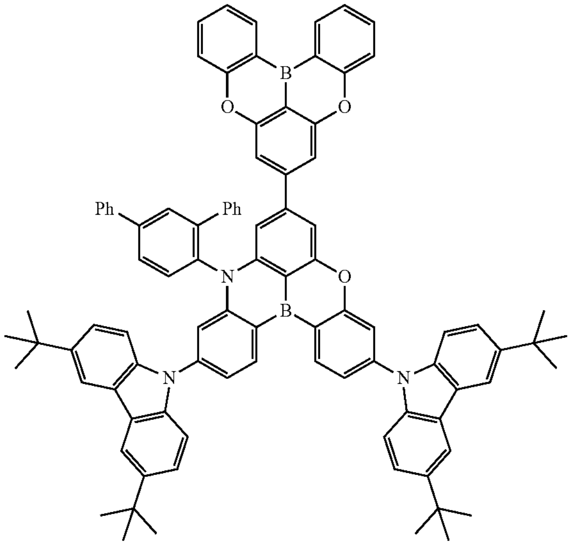

-continued
9
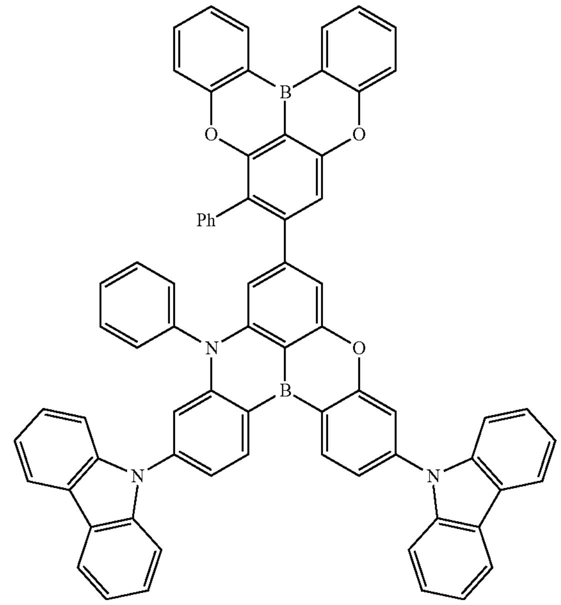
10
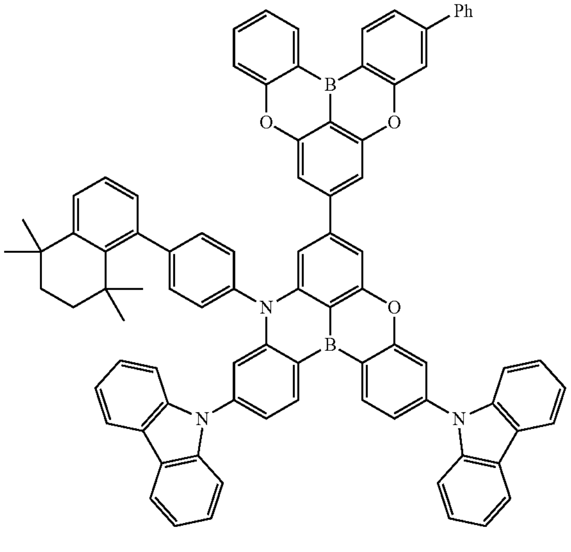
-continued
11
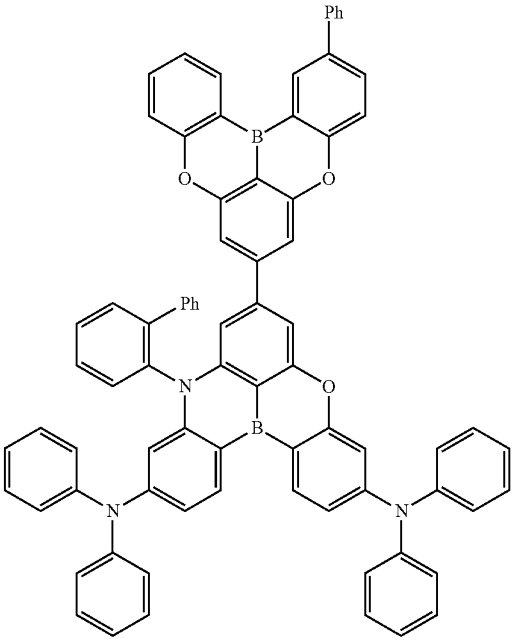
12
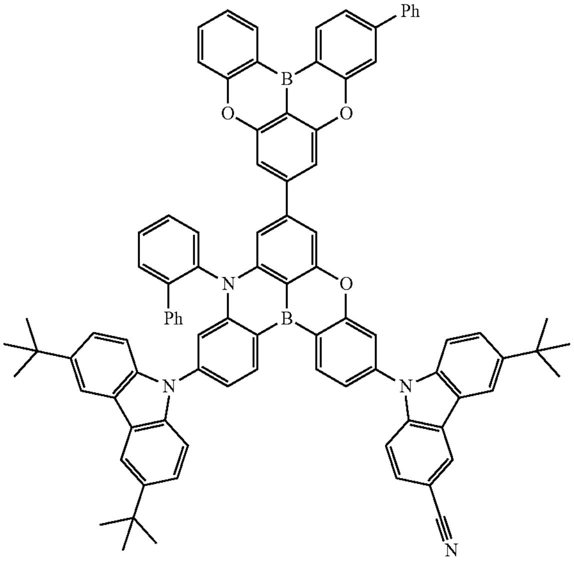

-continued
13
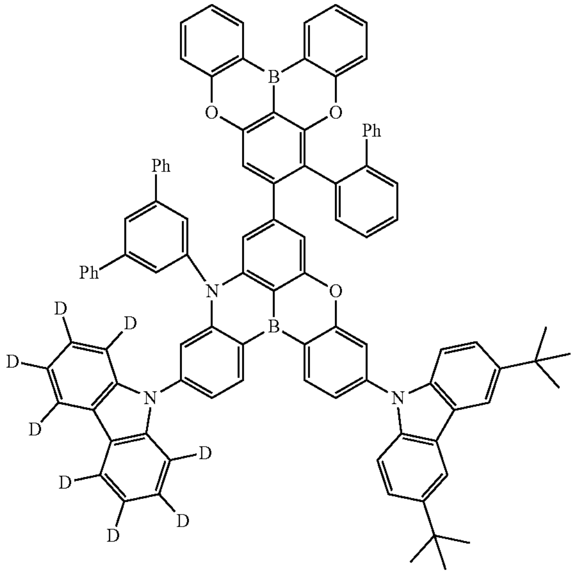
14
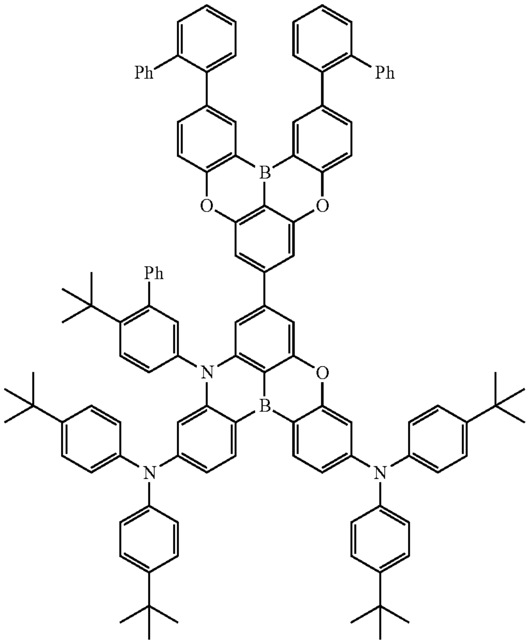
-continued
15
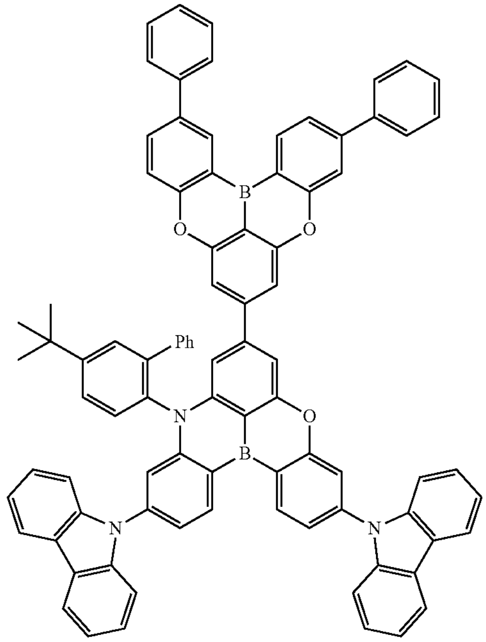
16
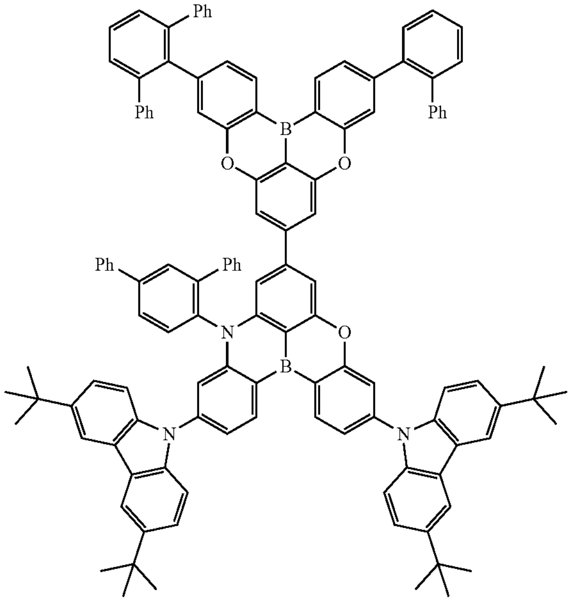

17
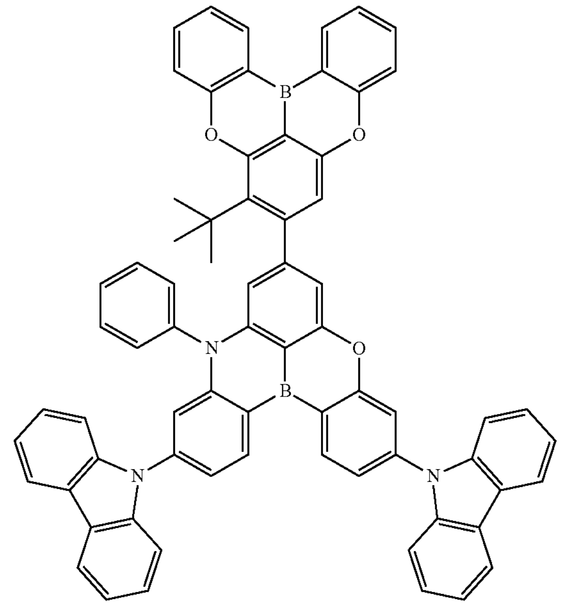
18
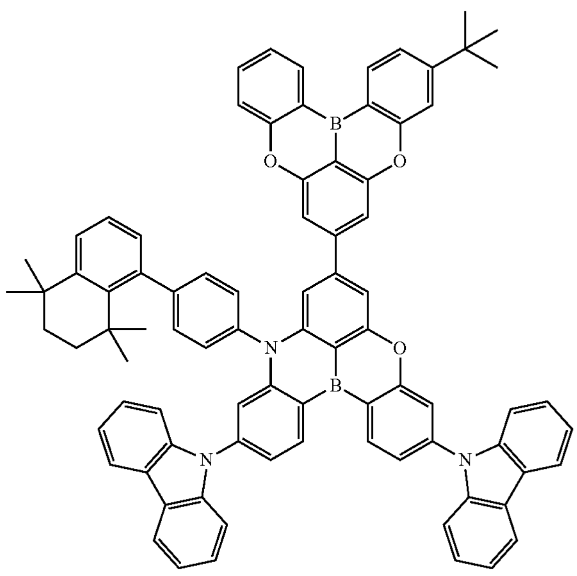
19
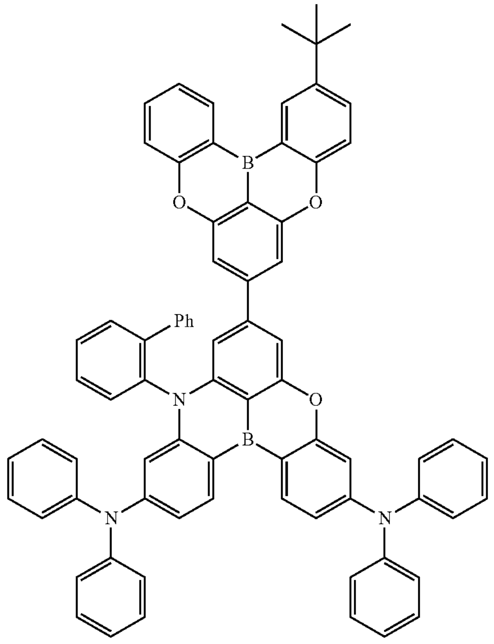
20
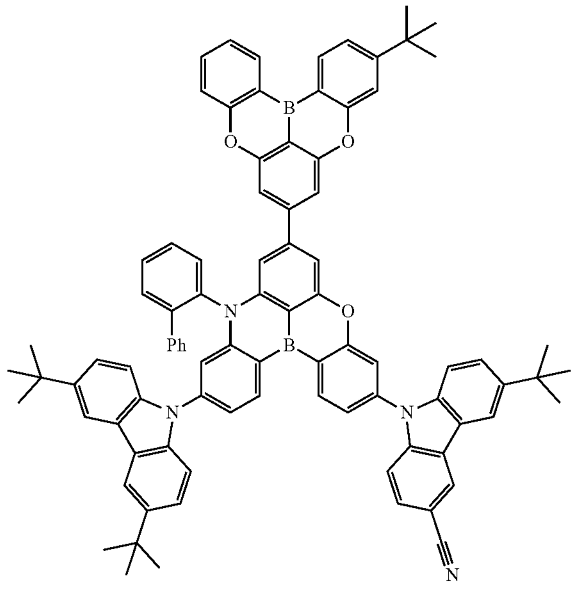

-continued
21
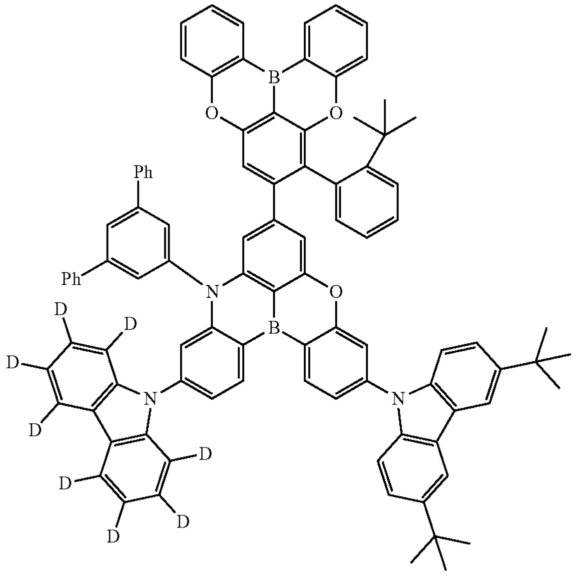
22
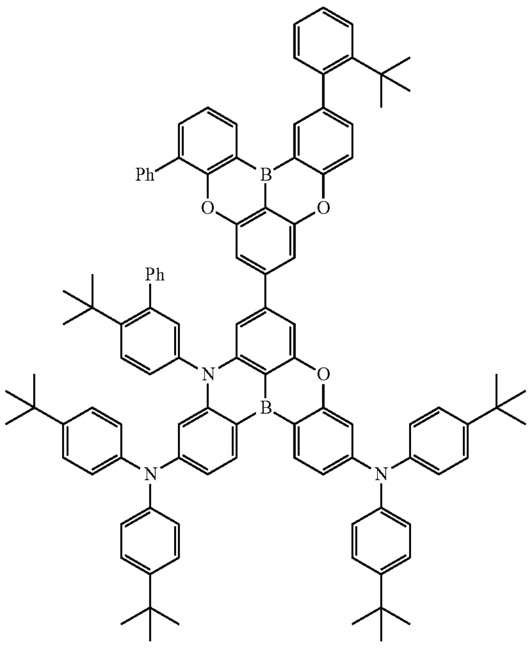
-continued
23
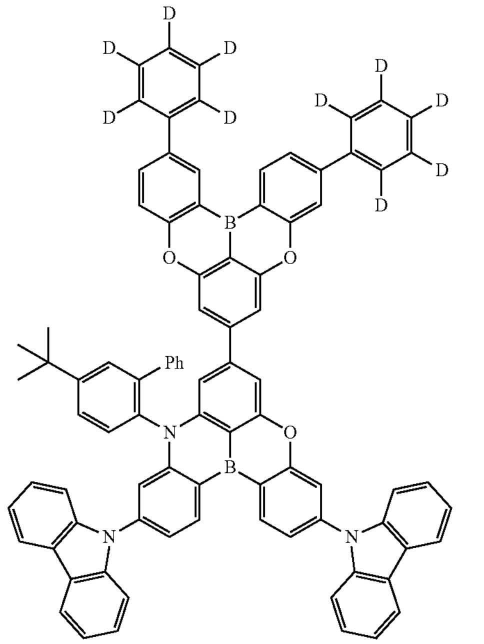
24
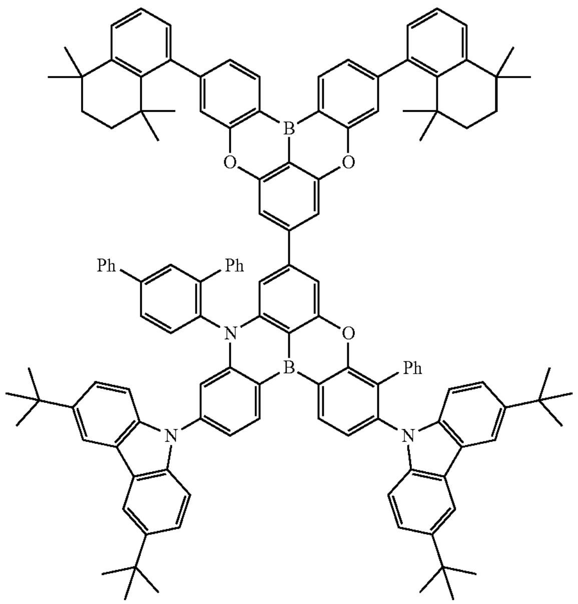

25
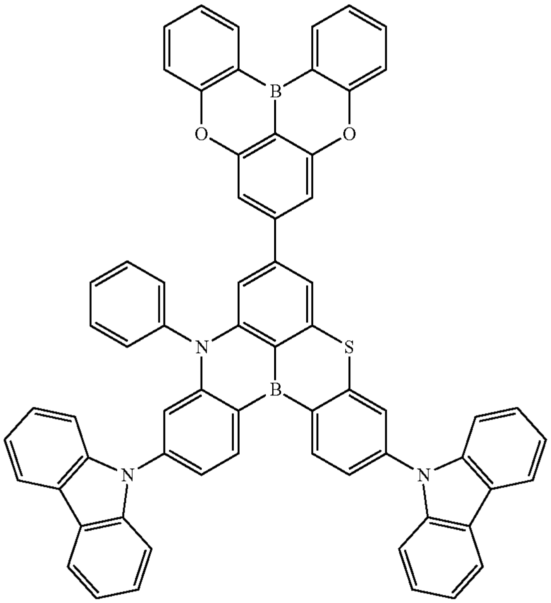
26
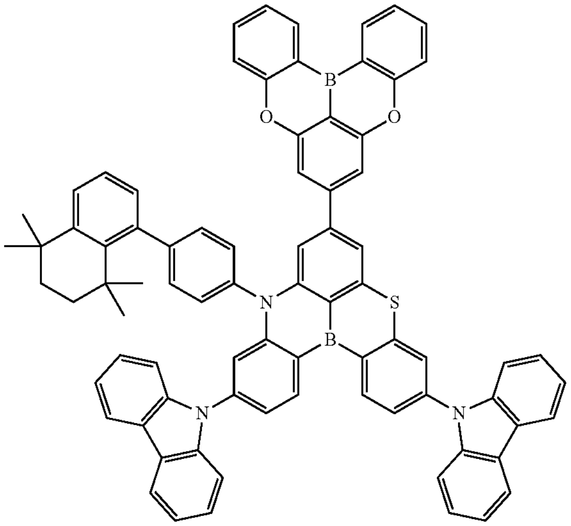
27
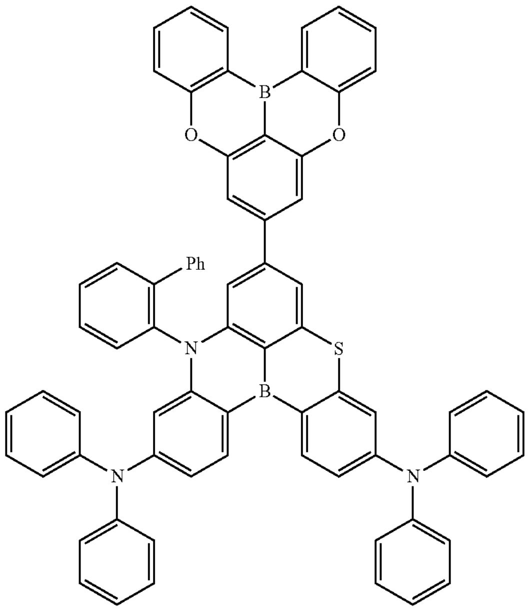
28
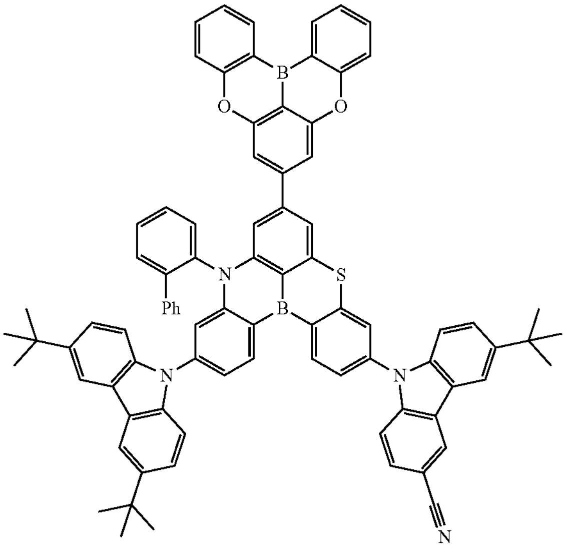

29
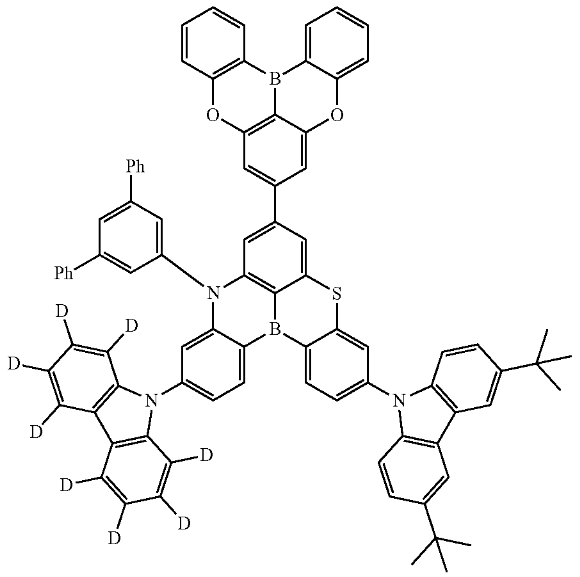
30
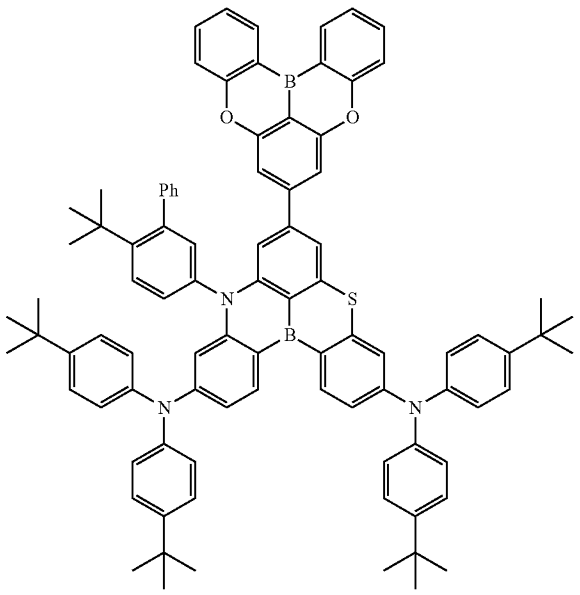
31
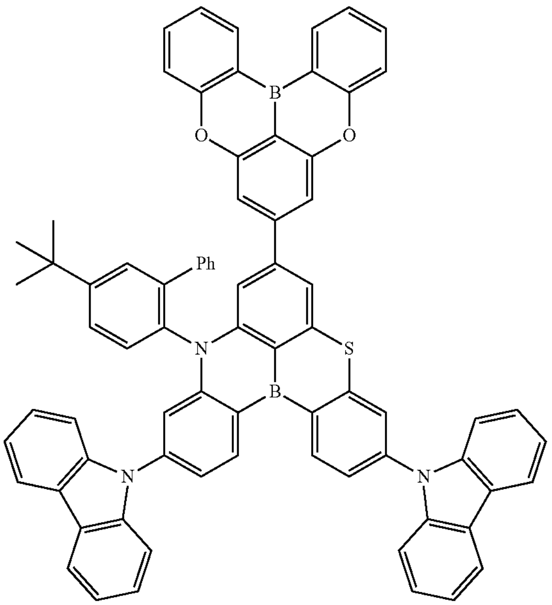
32
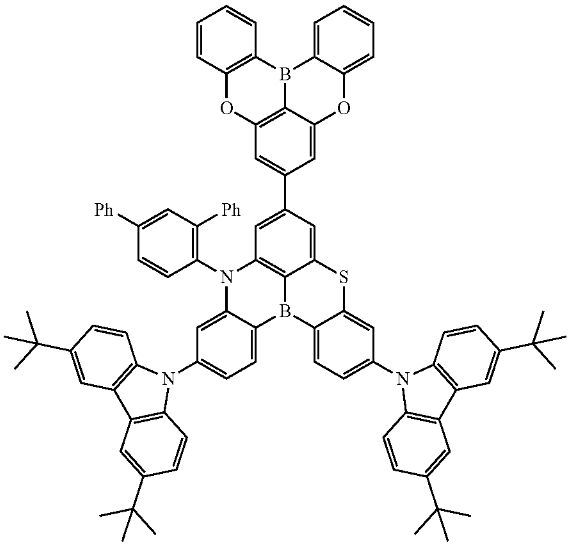

-continued
33
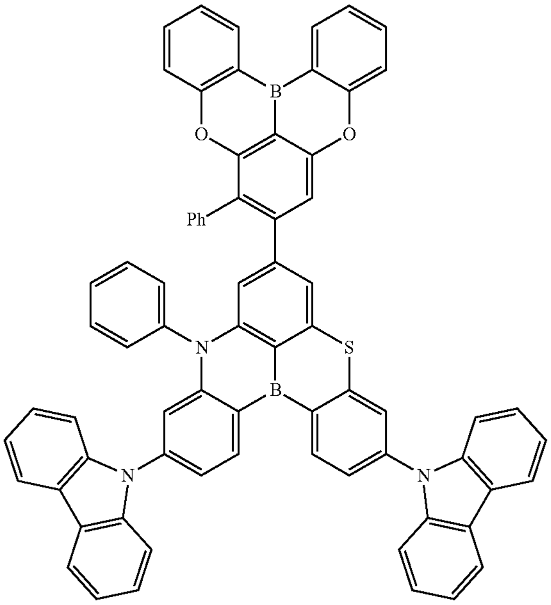
34
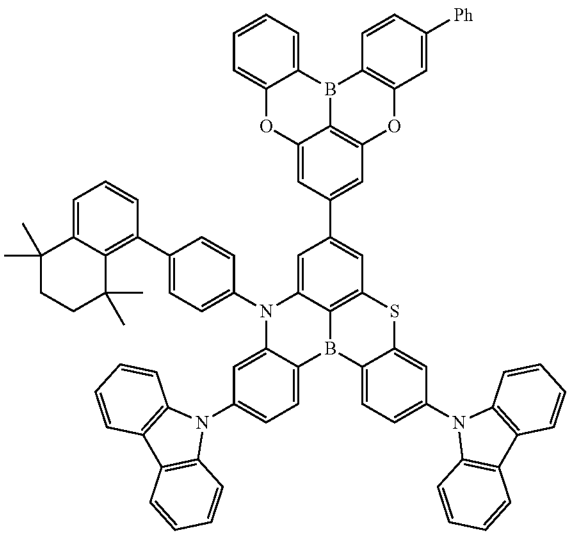
-continued
35
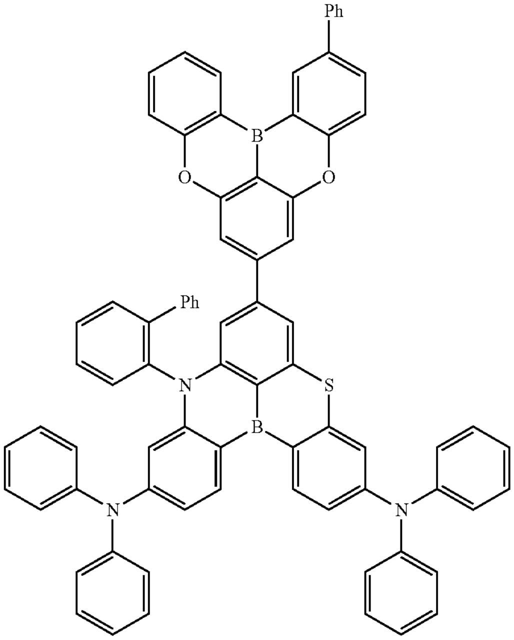
36
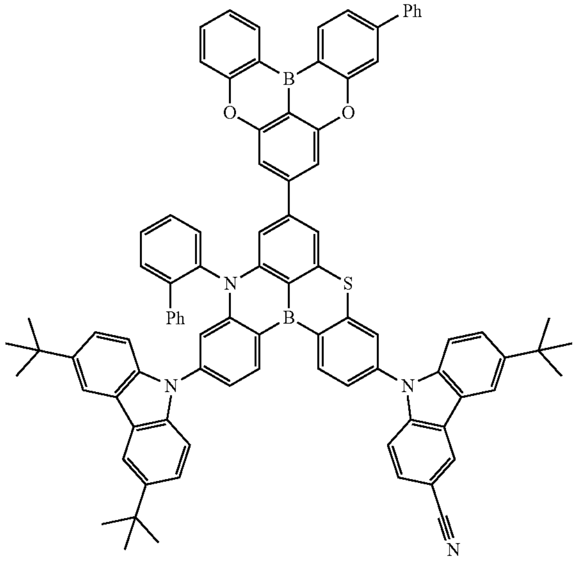

-continued
37
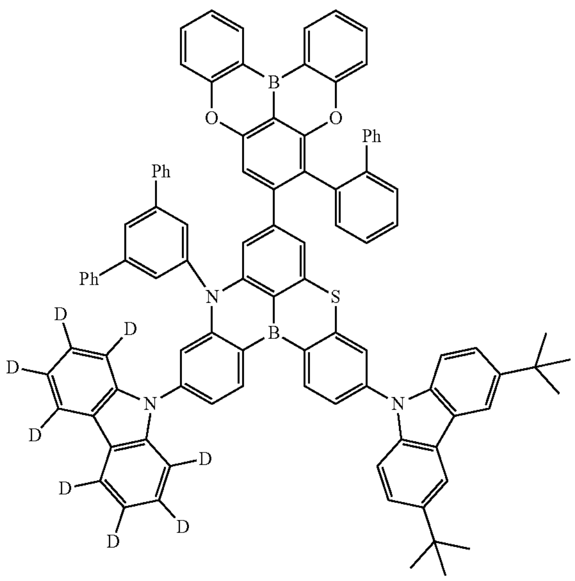
38
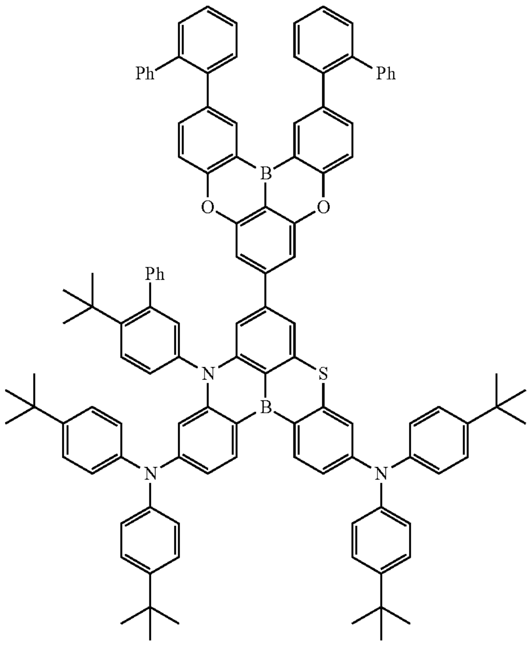
-continued
39
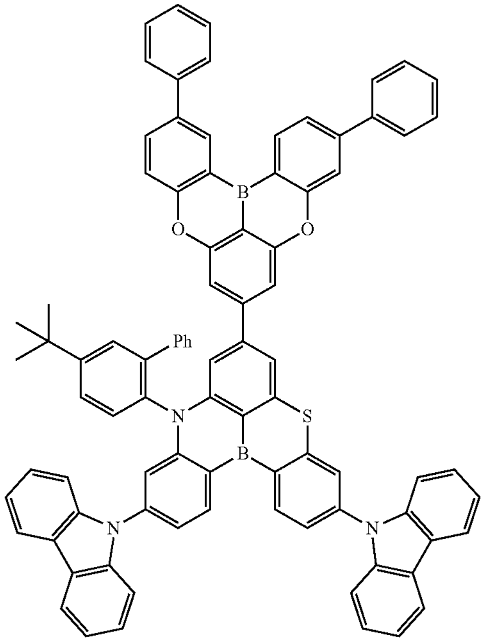
40
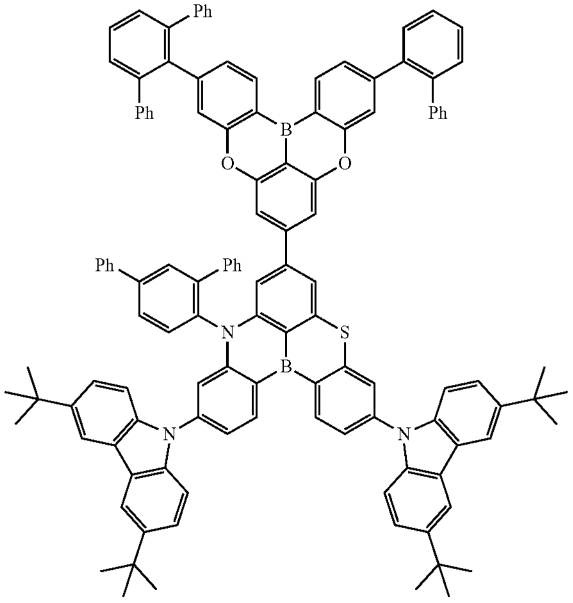

41
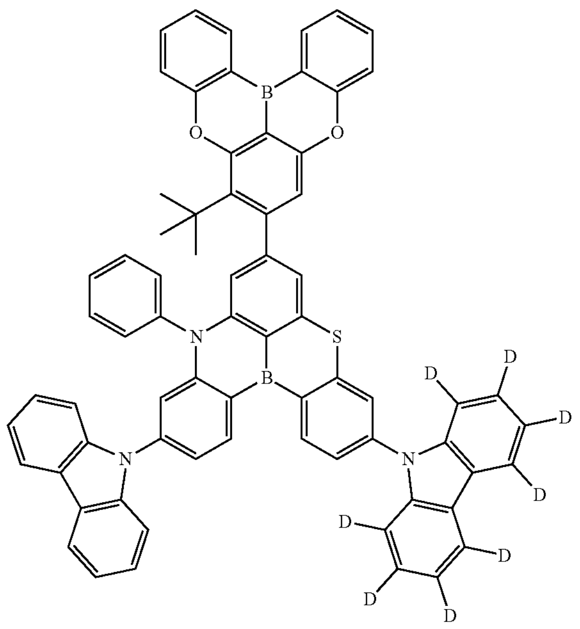
42
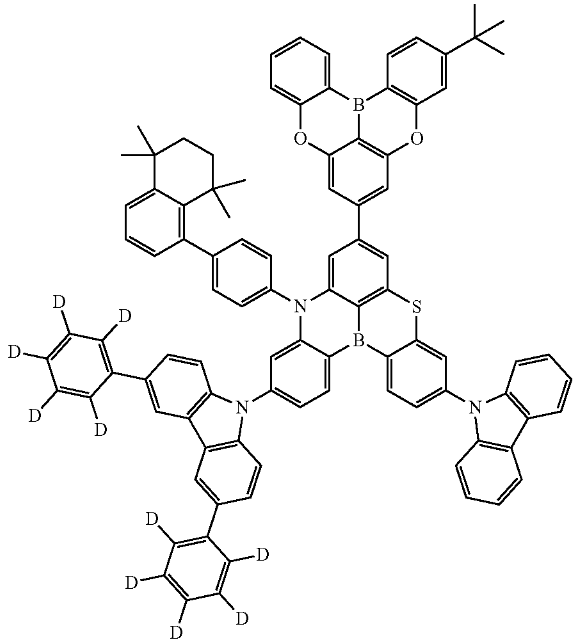
43
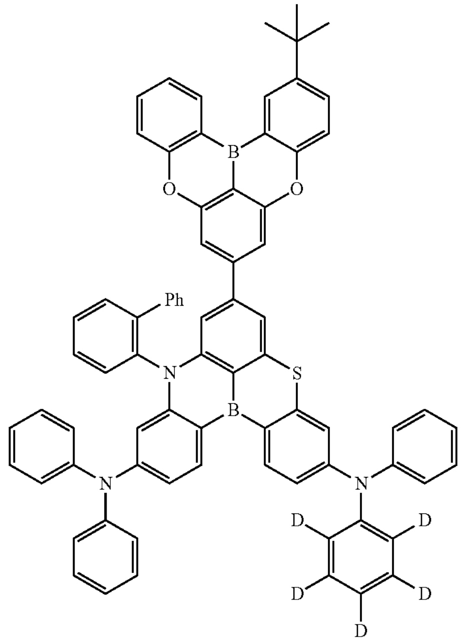
44
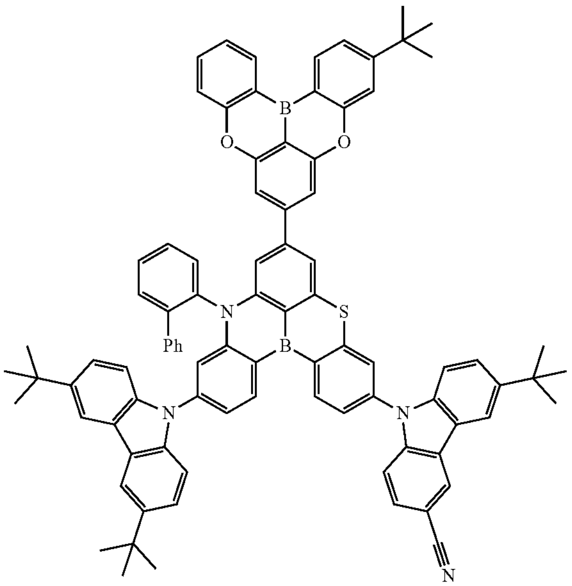

-continued
45
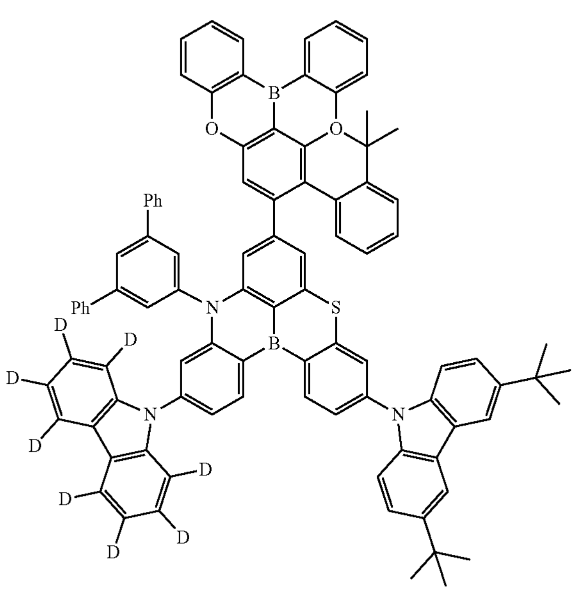
46
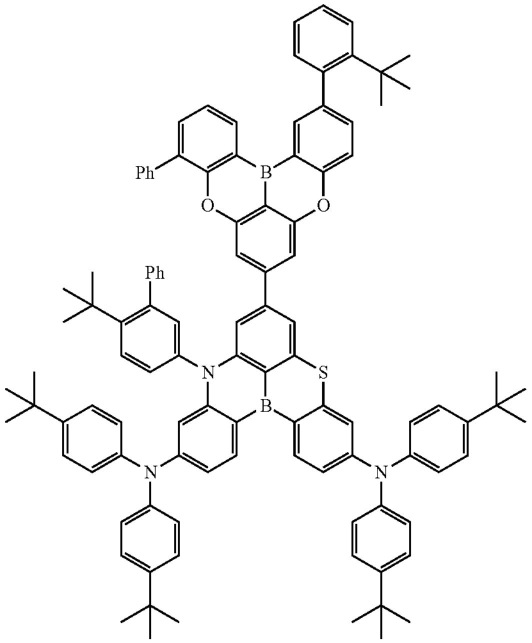
-continued
47
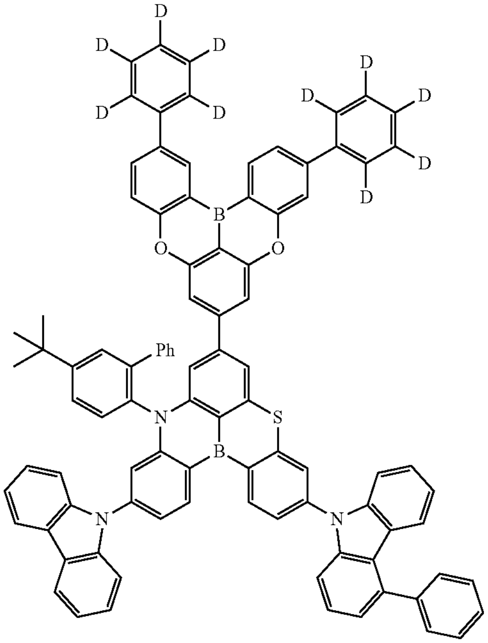
48
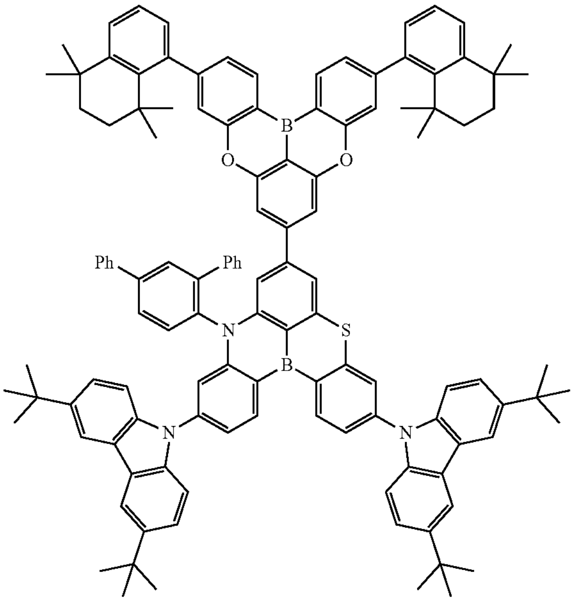

-continued
49
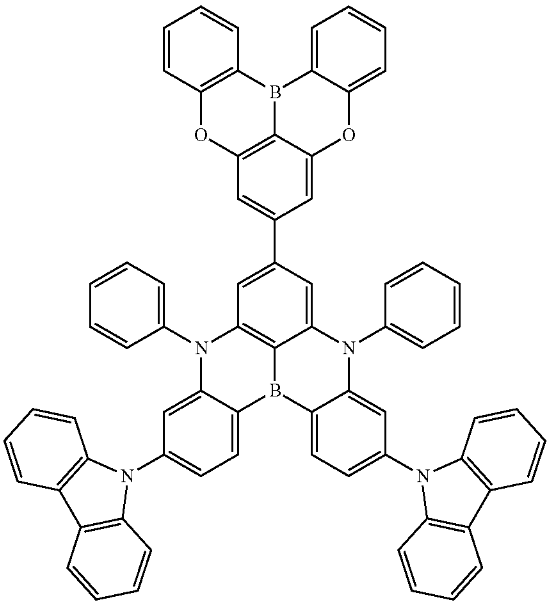
50
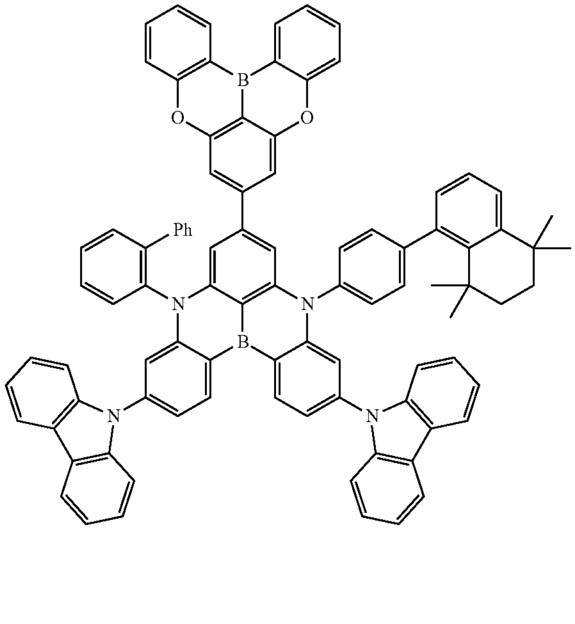
-continued
51
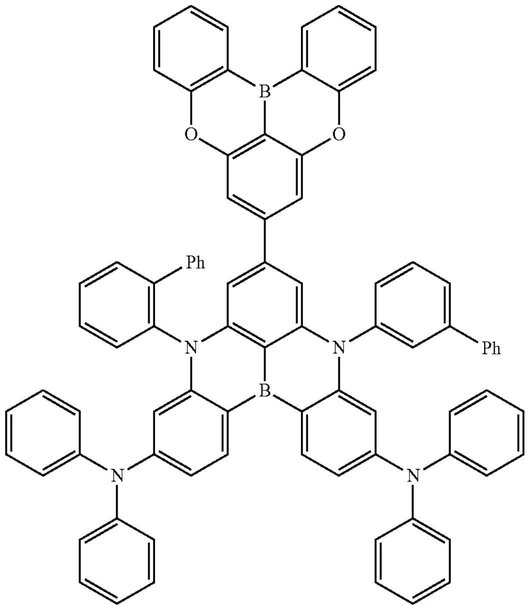
52
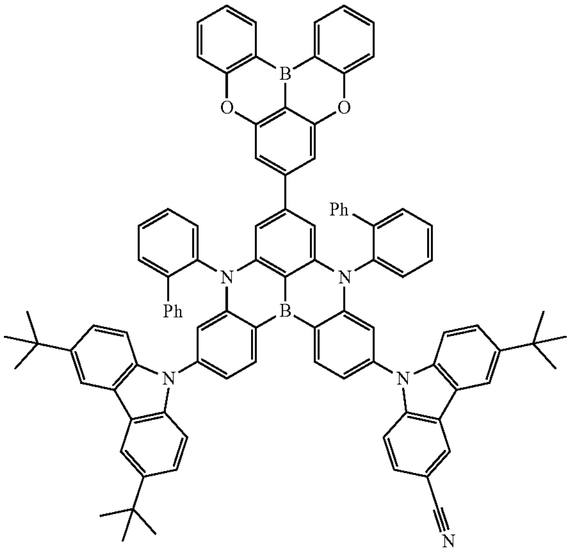

-continued
53
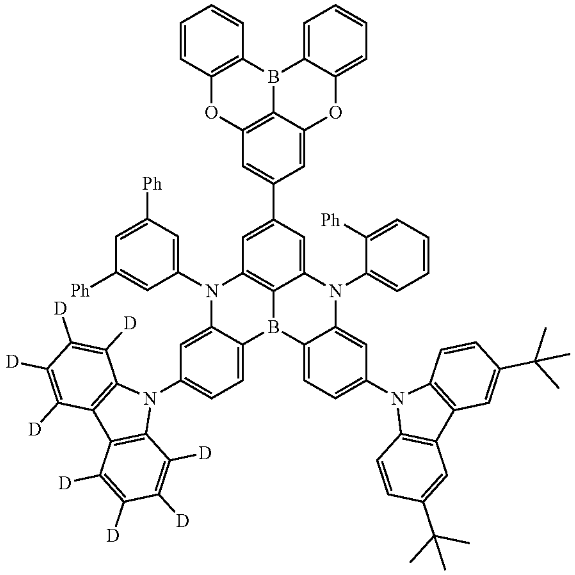
54
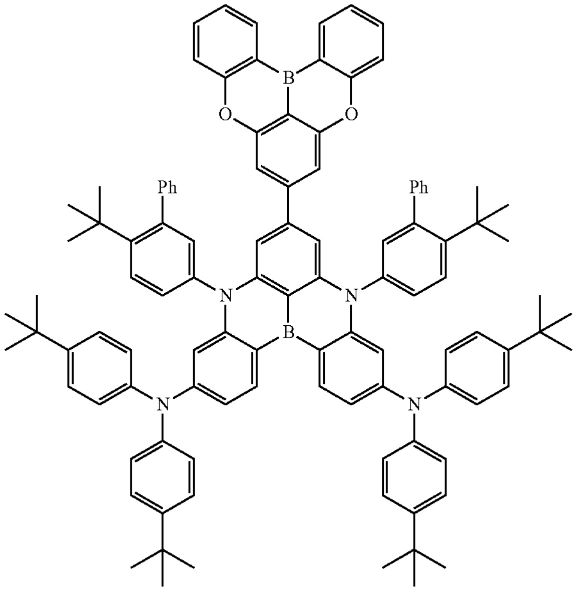
-continued
55
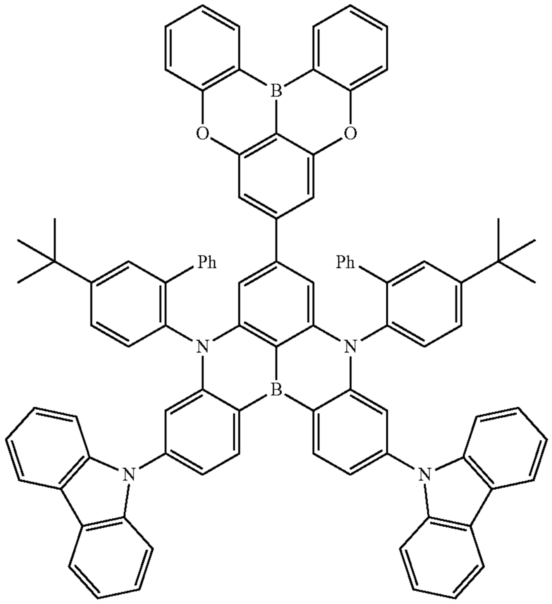
56
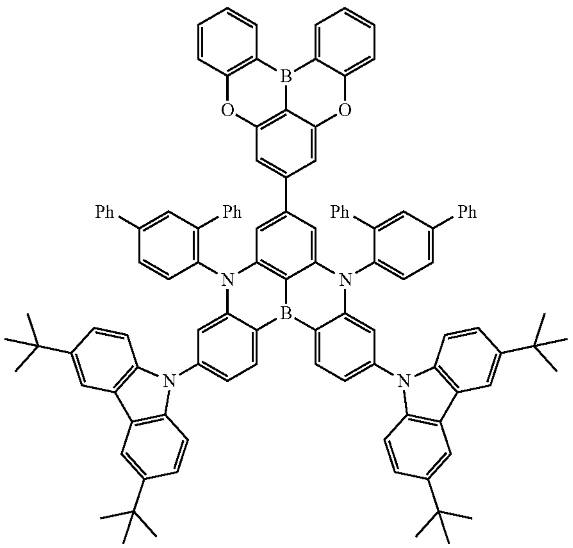

-continued
57
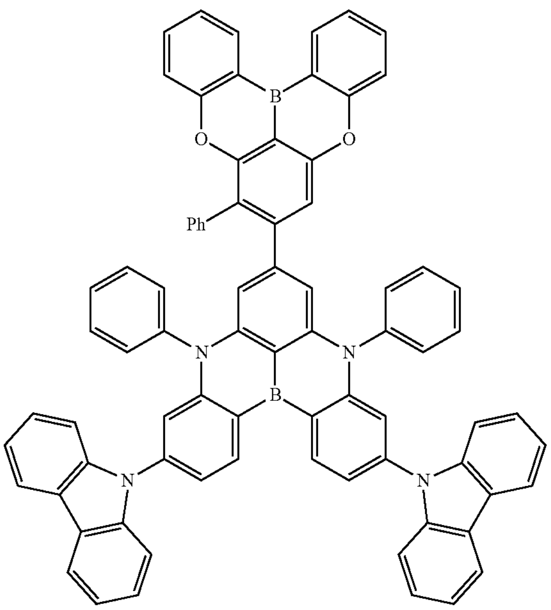
58
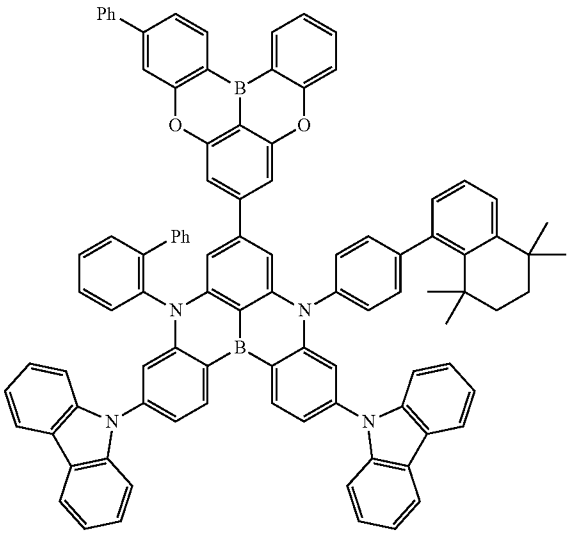
-continued
59
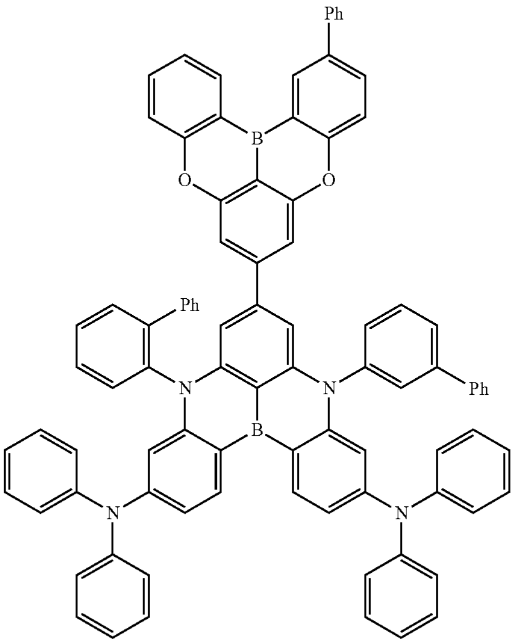
60
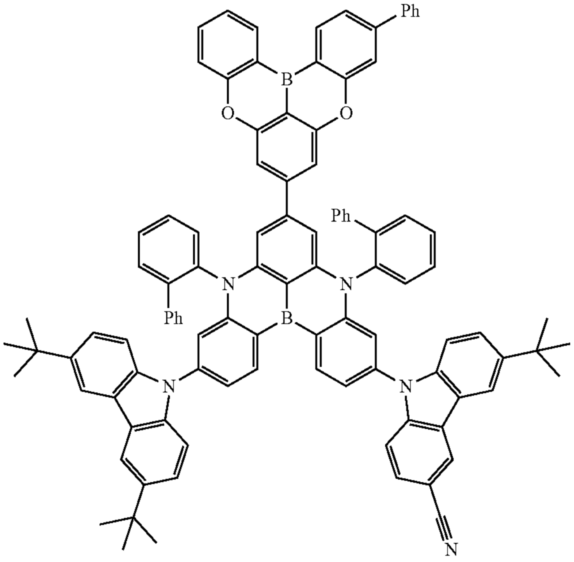

-continued
61
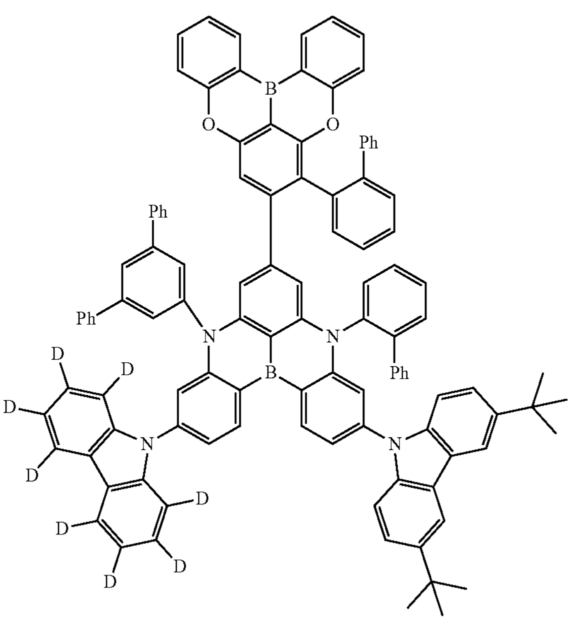
62
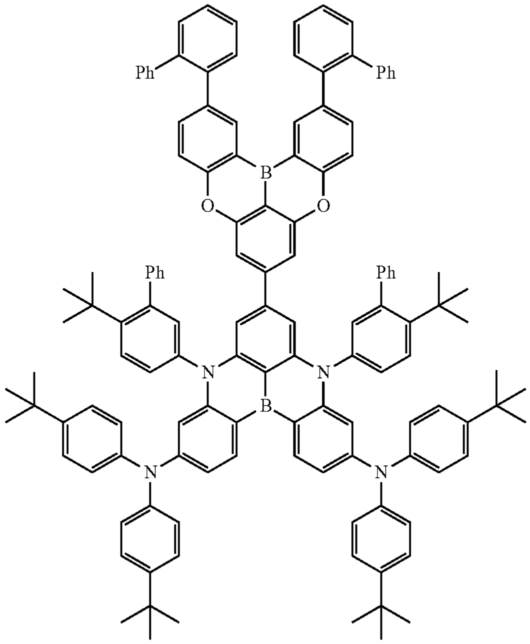
-continued
63
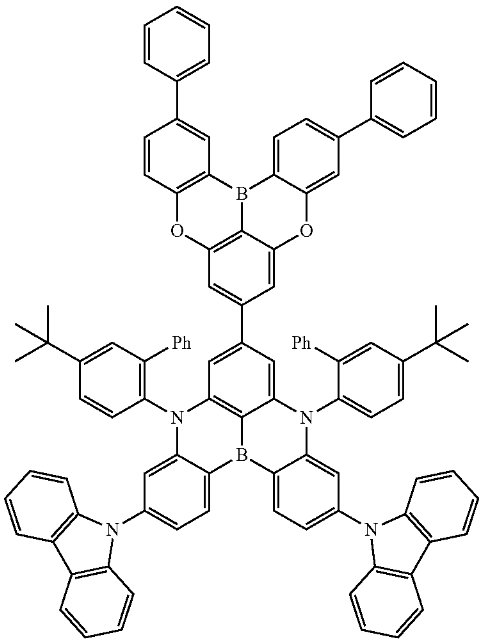
64
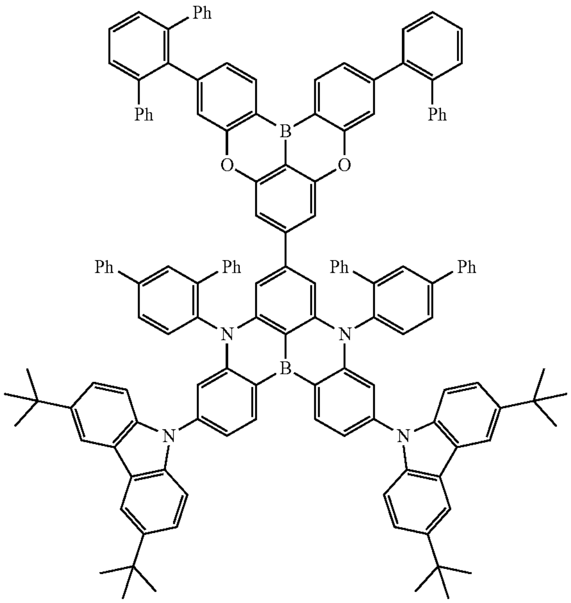

-continued
65
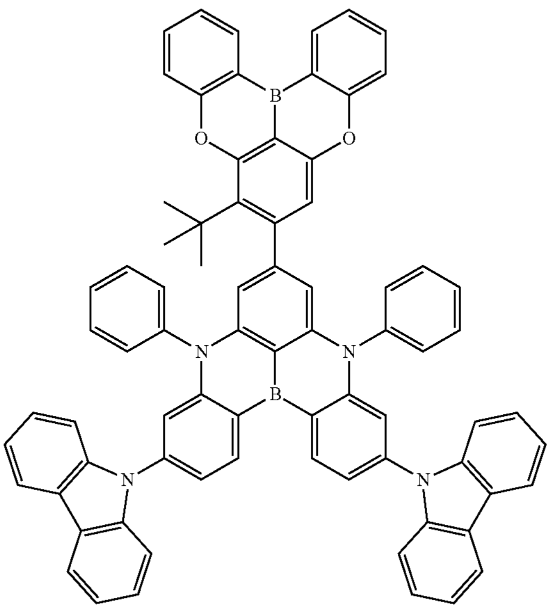
66
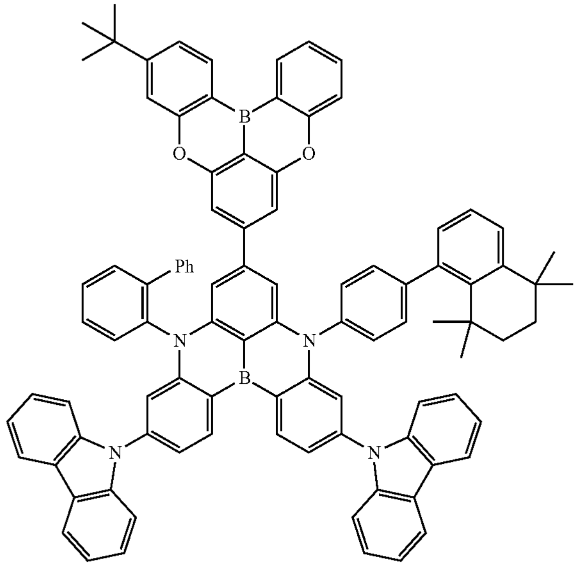
-continued
67
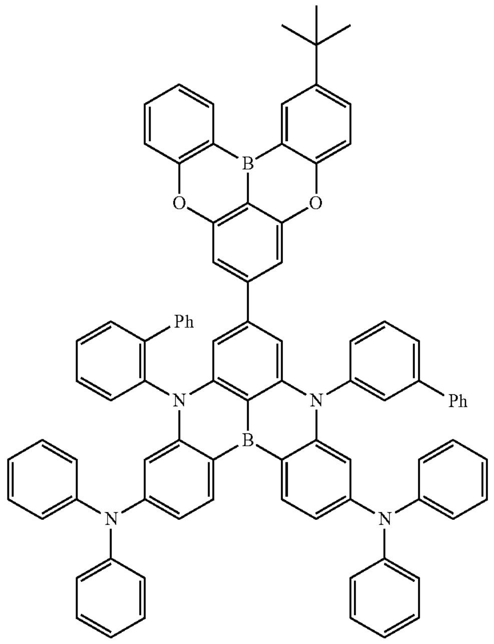
68
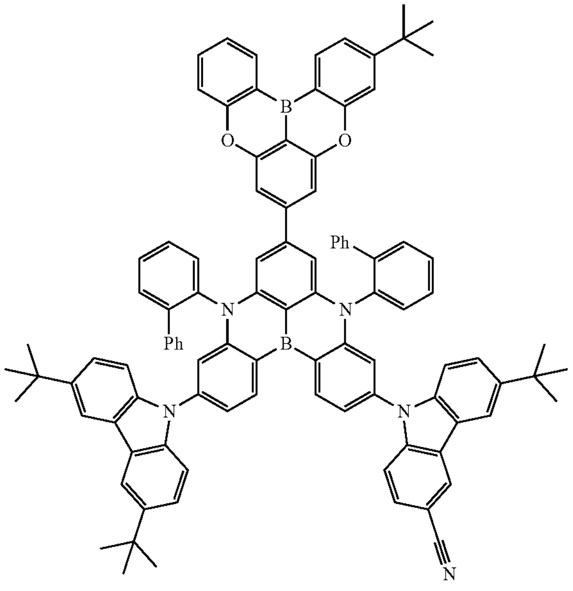

69
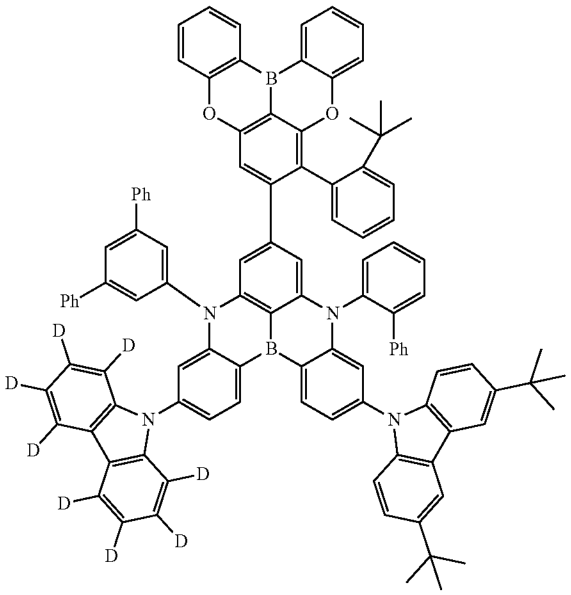
70
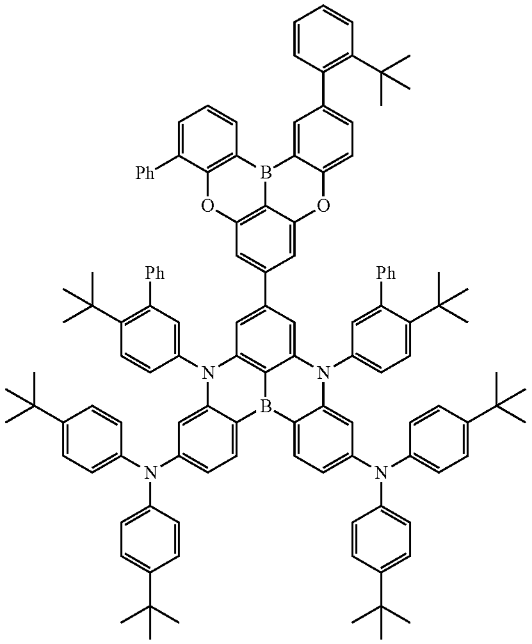
71
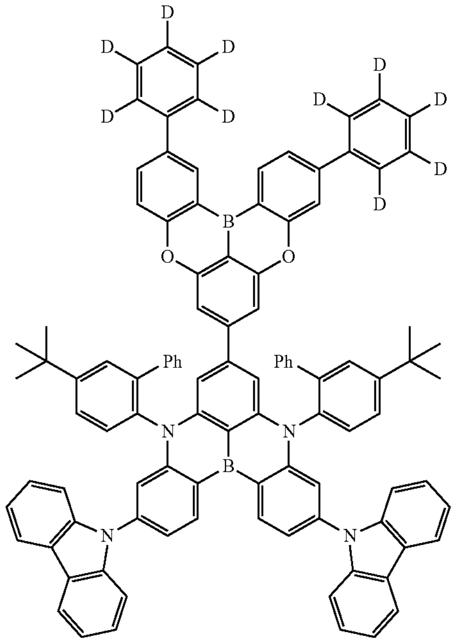
72
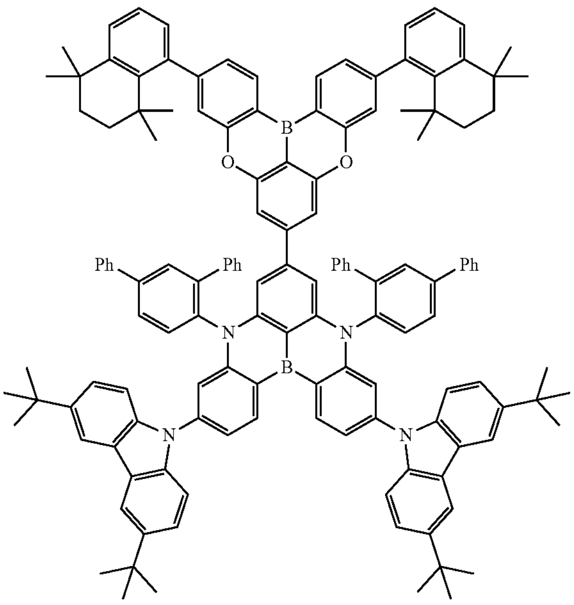

-continued
73
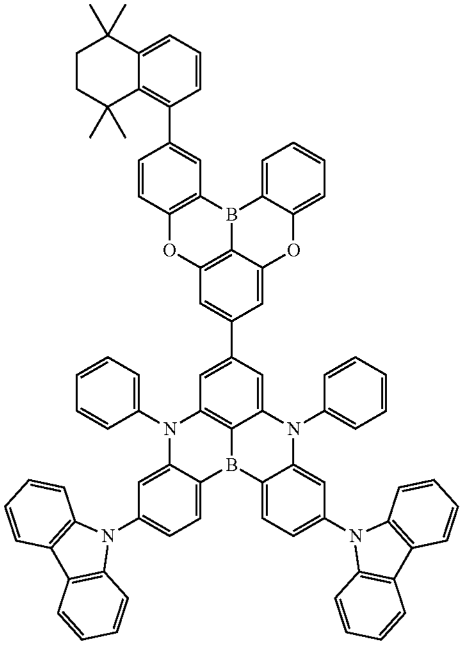
74
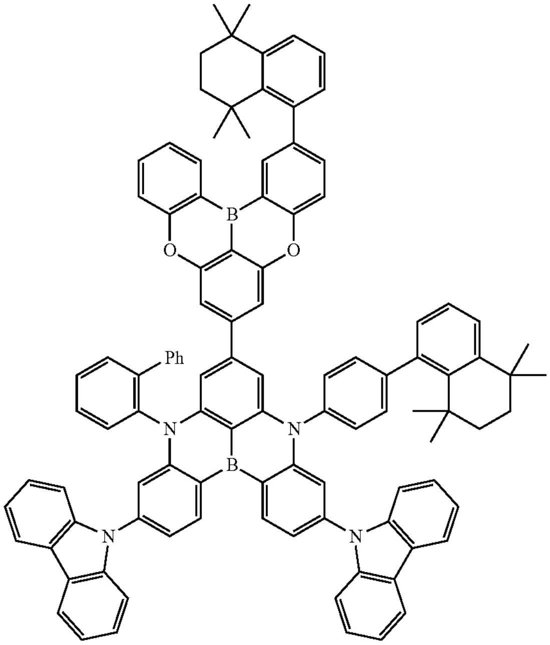
-continued
75
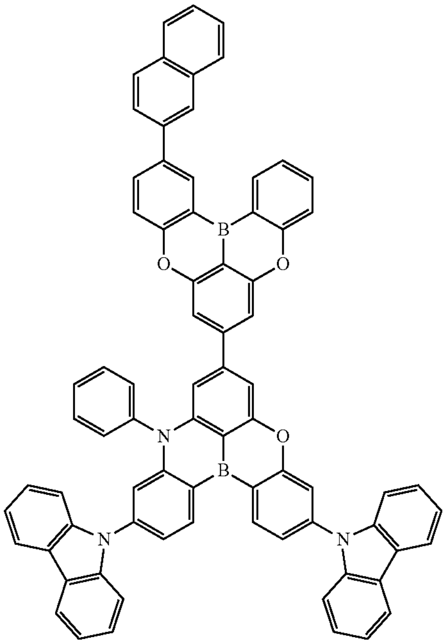
76
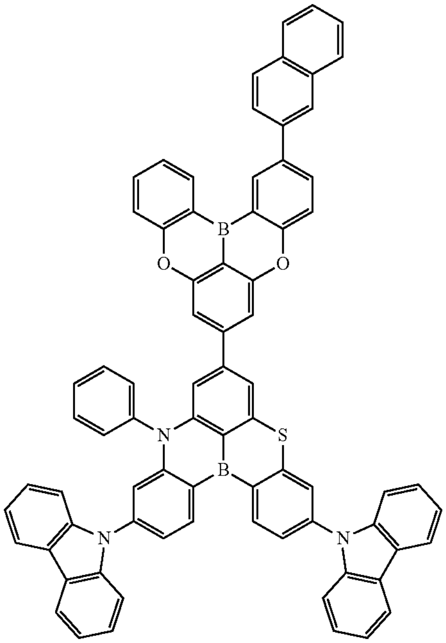

-continued
77
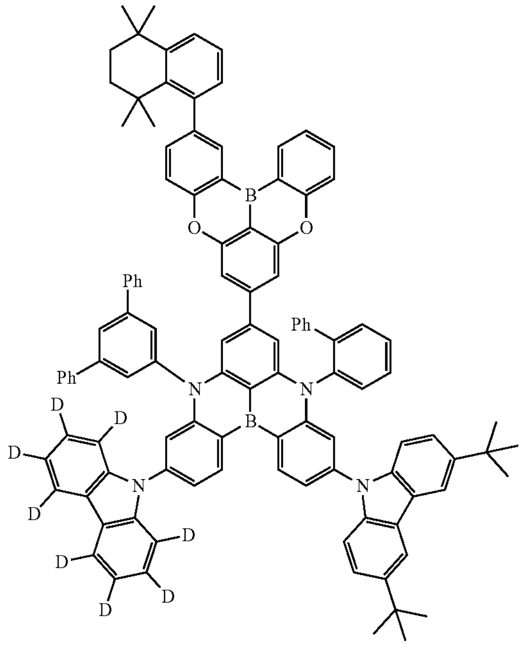
79
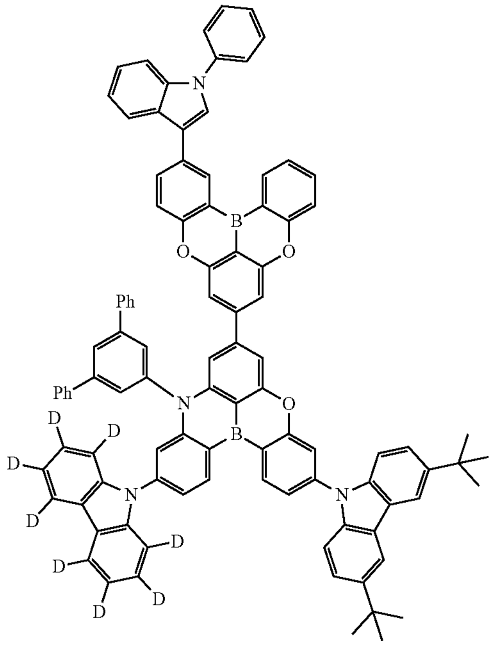
78
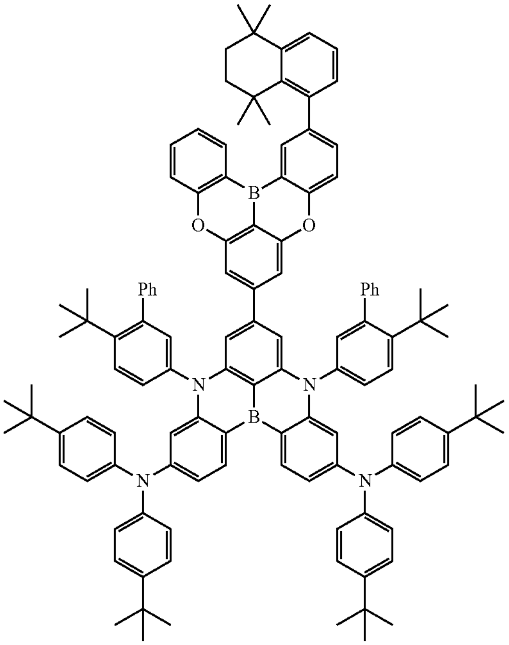
80
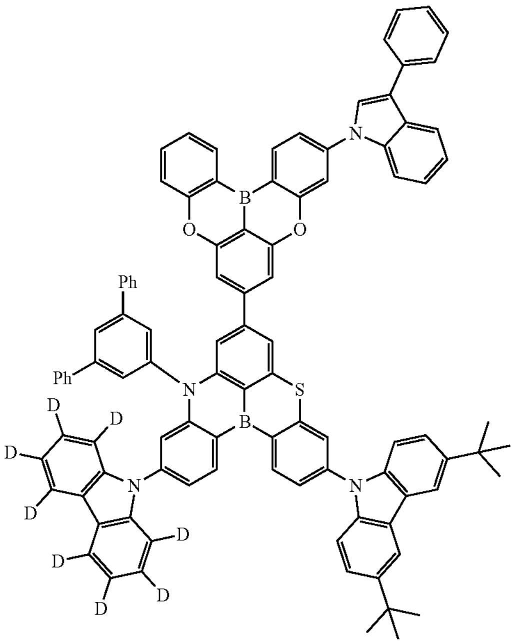

-continued
81
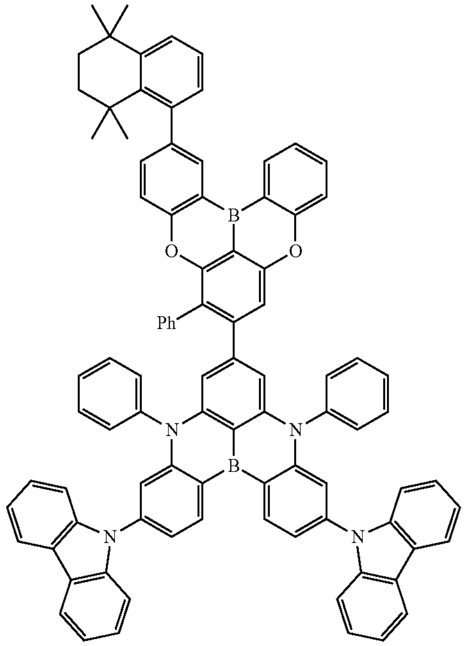
83
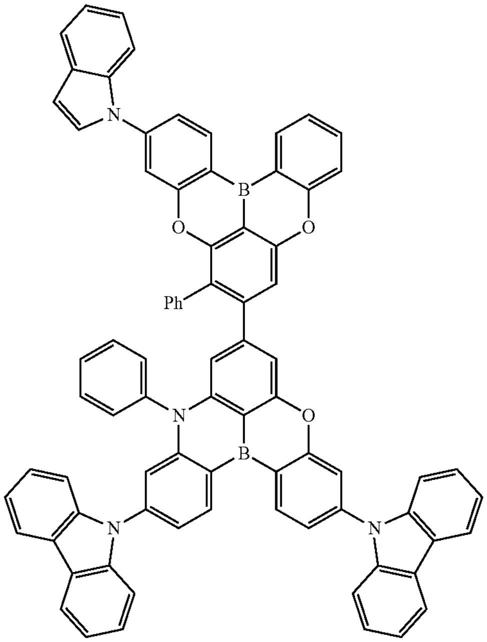
82
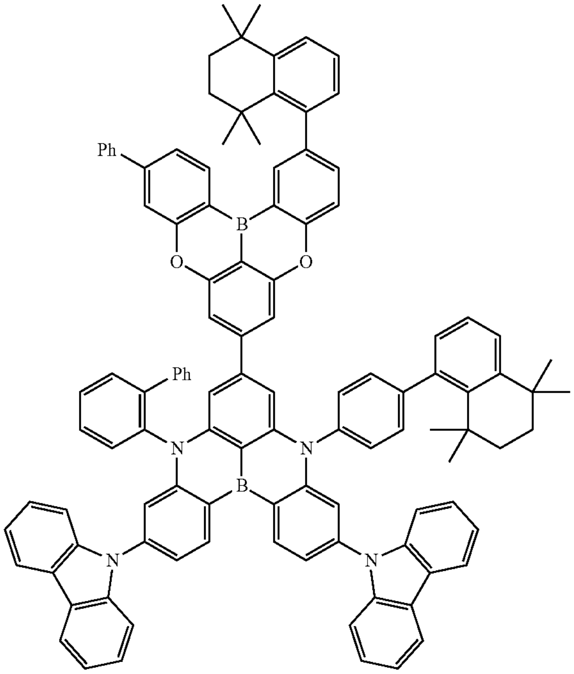
84
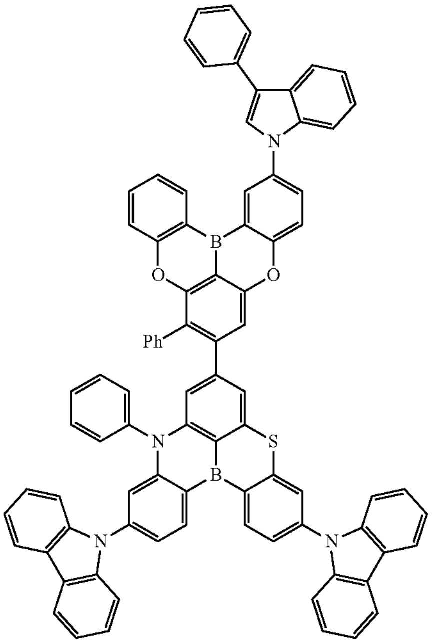

-continued
85
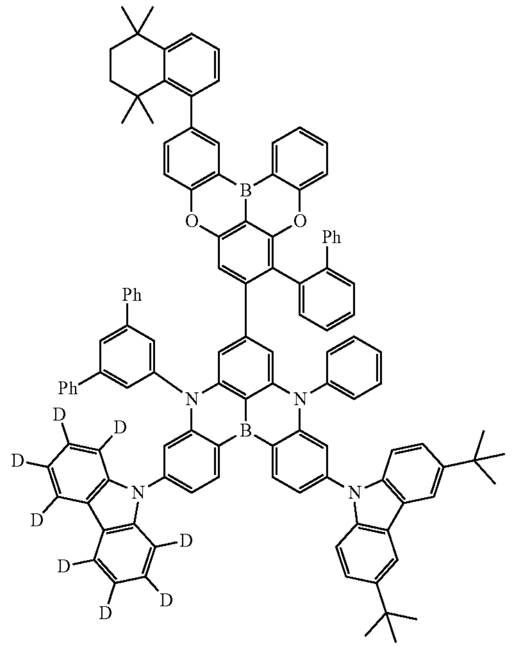
86
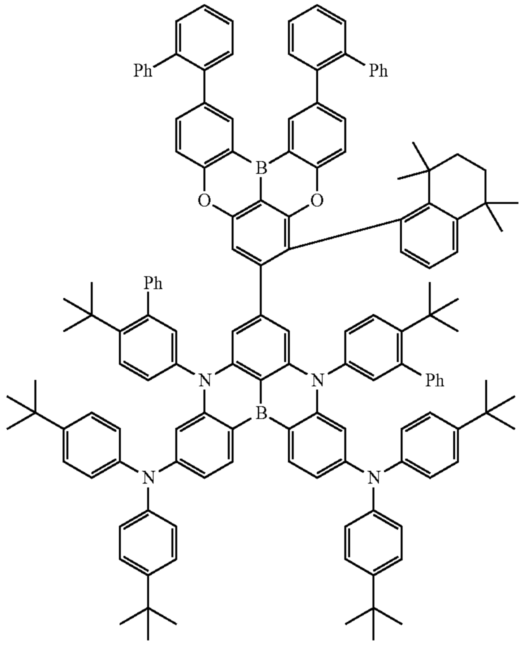
-continued
87
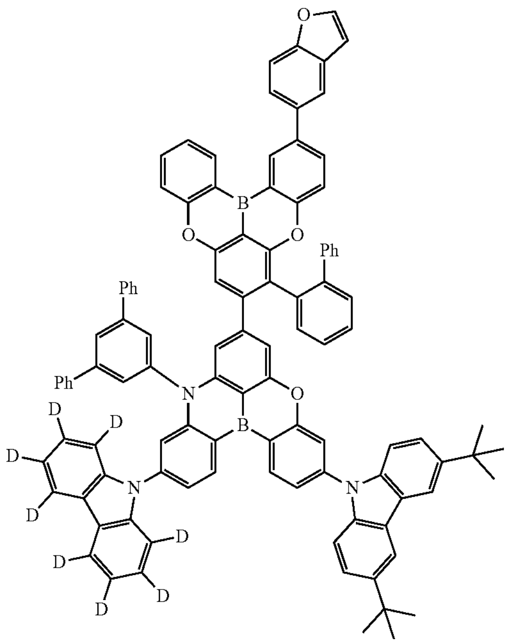
88
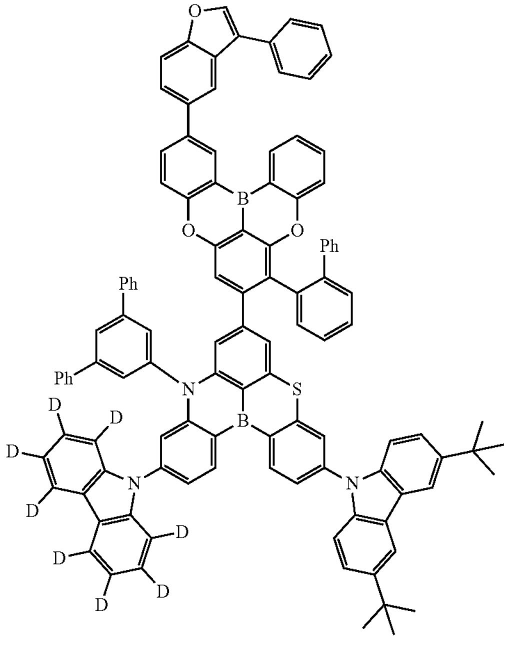

89
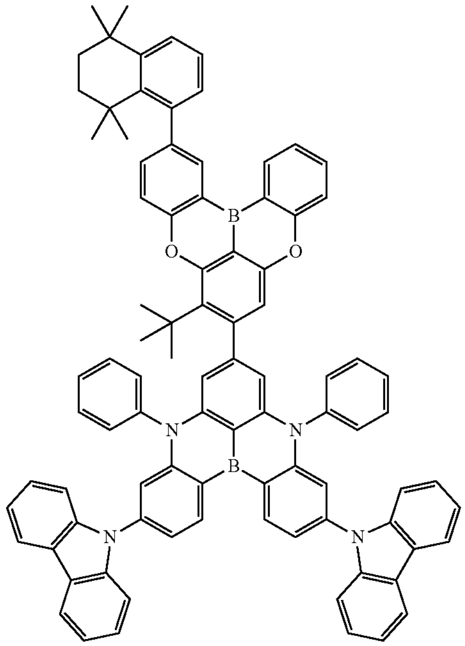
90
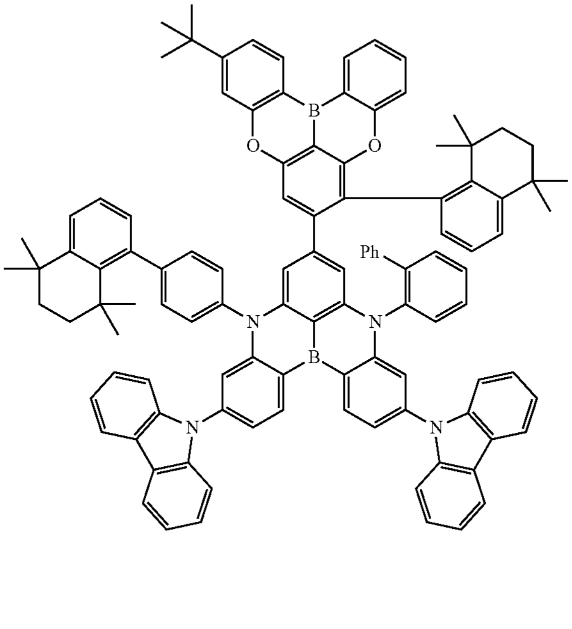
91
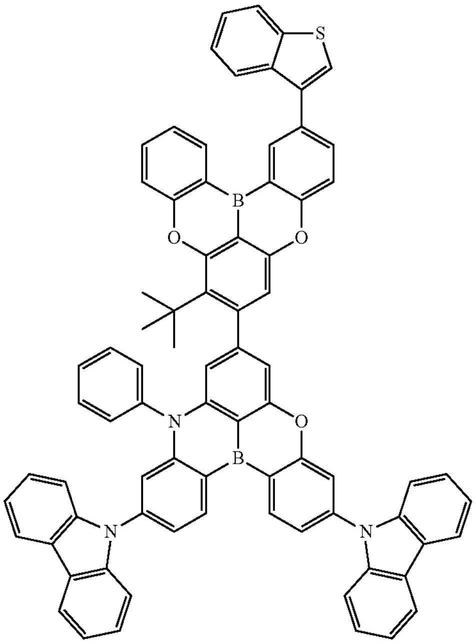
92
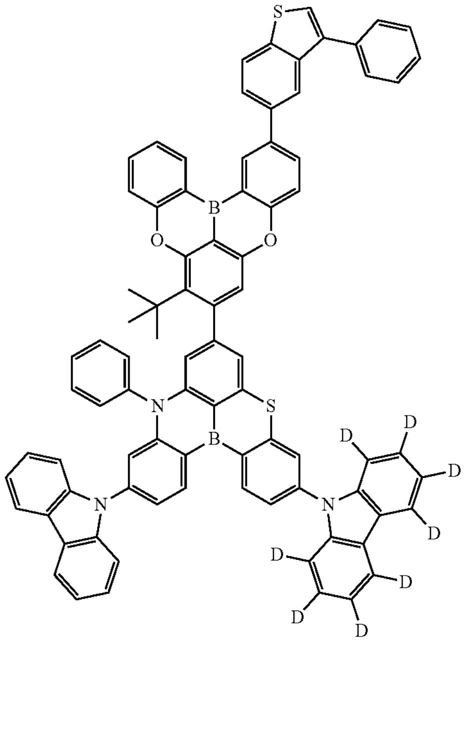

-continued
93
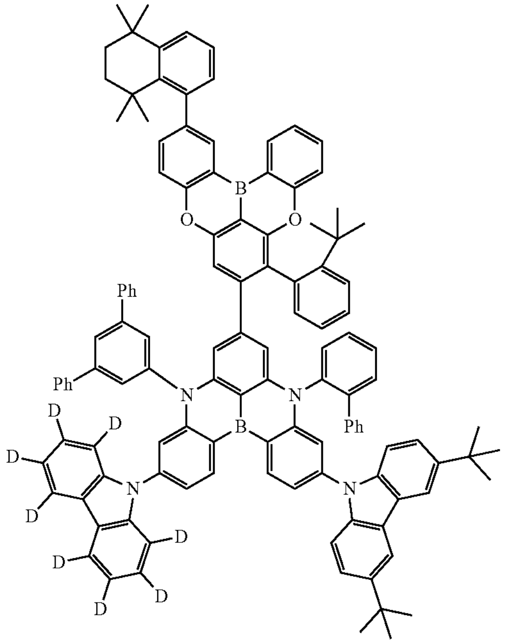
94
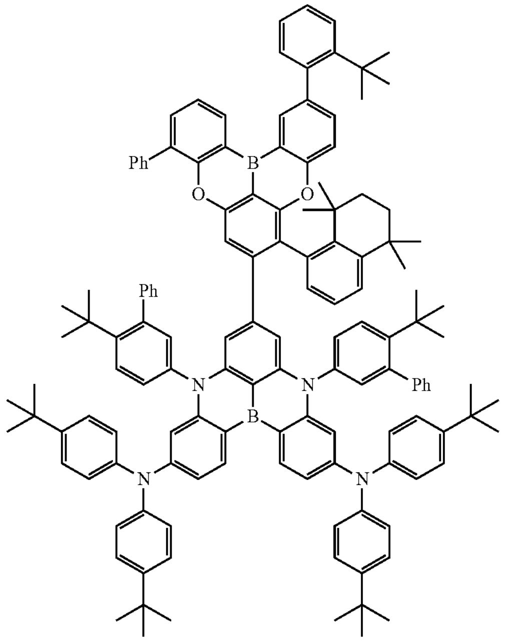
-continued
95
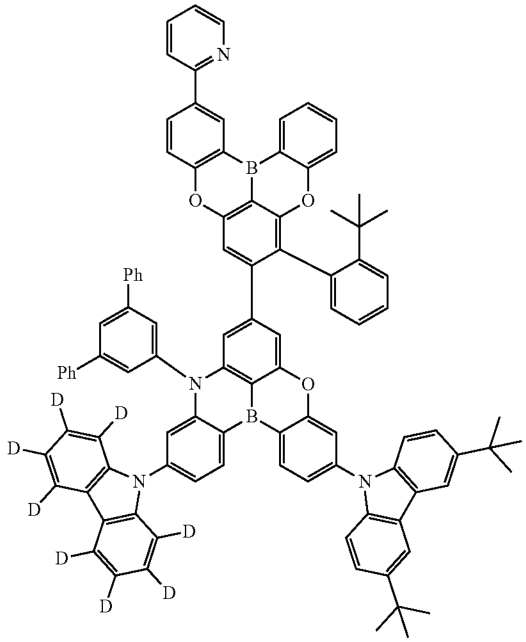
96
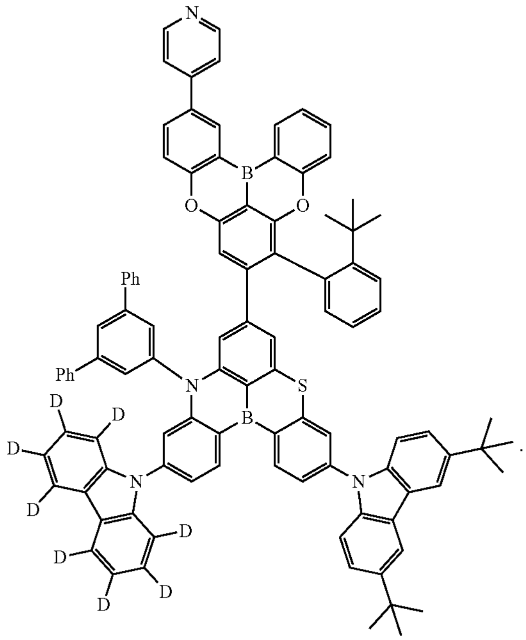
.
* * * * *